(12) United States Patent
Kim et al.

(10) Patent No.: US 12,006,335 B2
(45) Date of Patent: Jun. 11, 2024

(54) HETEROCYCLIC COMPOUND AND ORGANIC LIGHT EMITTING DEVICE COMPRISING SAME

(71) Applicant: LG CHEM, LTD., Seoul (KR)

(72) Inventors: Kyunghee Kim, Daejeon (KR); Tae Yoon Park, Daejeon (KR); Wanpyo Hong, Daejeon (KR); Sujeong Geum, Daejeon (KR); Jongsoo Song, Daejeon (KR)

(73) Assignee: LG Chem, Ltd., Seoul (KR)

( * ) Notice: Subject to any disclaimer, the term of this patent is extended or adjusted under 35 U.S.C. 154(b) by 571 days.

(21) Appl. No.: 17/293,340

(22) PCT Filed: Jan. 14, 2020

(86) PCT No.: PCT/KR2020/000669
§ 371 (c)(1),
(2) Date: May 12, 2021

(87) PCT Pub. No.: WO2020/184834
PCT Pub. Date: Sep. 17, 2020

(65) Prior Publication Data
US 2021/0403489 A1      Dec. 30, 2021

(30) Foreign Application Priority Data

Mar. 8, 2019   (KR) ................. 10-2019-0026874

(51) Int. Cl.
*C07F 5/02*       (2006.01)
*C07F 7/08*       (2006.01)
(Continued)

(52) U.S. Cl.
CPC .............. *C07F 5/02* (2013.01); *C07F 7/0812* (2013.01); *H10K 85/40* (2023.02);
(Continued)

(58) Field of Classification Search
CPC .......... C07F 5/02; C07F 5/027; H10K 85/657
See application file for complete search history.

(56) References Cited

U.S. PATENT DOCUMENTS

| | | | |
|---|---|---|---|
| 11,723,263 B2 * | 8/2023 | Hatakeyama | ........ C07D 209/80 428/690 |
| 2015/0236274 A1 | 8/2015 | Hatakeyama et al. | |

(Continued)

FOREIGN PATENT DOCUMENTS

| | | |
|---|---|---|
| CN | 107501311 A | 12/2017 |
| CN | 109155368 A | 1/2019 |

(Continued)

OTHER PUBLICATIONS

Translation of the PCT Written Opinion (ETWOS) (no date) (Year: 0000).*

*Primary Examiner* — Amanda C. Walke
(74) *Attorney, Agent, or Firm* — Bryan Cave Leighton Paisner LLP

(57) ABSTRACT

A compound represented by Formula 1 and an organic light emitting device including the same, and the compound providing lower driving voltage, improved light efficiency, and improved service life characteristics of the organic light emitting device.

(Continued)

```
┌─────────────────────────────┐
│                             │
│           104               │
│                             │
├─────────────────────────────┤
│                             │
│           103               │
│                             │
├─────────────────────────────┤
│                             │
│           102               │
│                             │
├─────────────────────────────┤
│                             │
│           101               │
│                             │
└─────────────────────────────┘
```

[Formula 1]

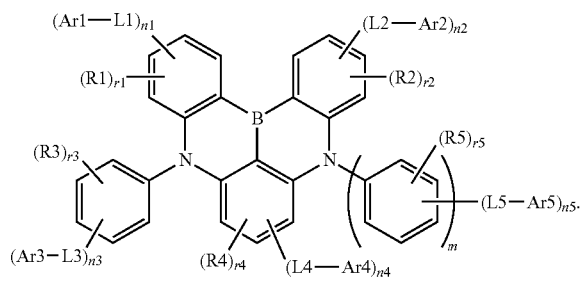

15 Claims, 5 Drawing Sheets

(51) Int. Cl.
    *H10K 85/40* (2023.01)
    *H10K 85/60* (2023.01)
    *H10K 50/16* (2023.01)
    *H10K 50/17* (2023.01)

(52) U.S. Cl.
    CPC ......... *H10K 85/6572* (2023.02); *H10K 50/16* (2023.02); *H10K 50/171* (2023.02)

(56) References Cited

U.S. PATENT DOCUMENTS

| | | | |
|---|---|---|---|
| 2018/0301629 A1* | 10/2018 | Hatakeyama | ........ H10K 85/657 |
| 2019/0013478 A1 | 1/2019 | Iijima et al. | |
| 2019/0207112 A1 | 7/2019 | Hatakeyama et al. | |
| 2019/0372023 A1 | 12/2019 | Hatakeyama et al. | |
| 2020/0052212 A1 | 2/2020 | Tasaki et al. | |
| 2020/0058885 A1 | 2/2020 | Hong et al. | |
| 2020/0127202 A1 | 4/2020 | Yoon et al. | |
| 2020/0176679 A1 | 6/2020 | Jeong et al. | |
| 2020/0321537 A1* | 10/2020 | Jeon | ....................... C09K 11/02 |
| 2022/0093878 A1* | 3/2022 | Kim | ..................... H10K 50/121 |
| 2022/0102363 A1* | 3/2022 | Xiao | ...................... H10B 10/18 |

FOREIGN PATENT DOCUMENTS

| | | | | |
|---|---|---|---|---|
| JP | 5935199 B2 | 6/2016 | | |
| KR | 10-2017-0130434 A | 11/2017 | | |
| KR | 10-2018-0051331 A | 5/2018 | | |
| KR | 10-1876763 B1 | 7/2018 | | |
| KR | 10-2018-0122298 A | 11/2018 | | |
| KR | 10-2018-0134850 A | 12/2018 | | |
| WO | WO-2016152418 A1 * | 9/2016 | ................ C07F 5/02 | |
| WO | 2017/018326 A1 | 2/2017 | | |
| WO | 2018/146962 A1 | 8/2018 | | |
| WO | 2018/186404 A1 | 10/2018 | | |
| WO | 2018203666 A1 | 11/2018 | | |
| WO | 2018216990 A1 | 11/2018 | | |
| WO | 2019/009052 A1 | 1/2019 | | |
| WO | 2019/240464 A1 | 12/2019 | | |

\* cited by examiner

| 104 |
|---|
| 107 |
| 103 |
| 106b |
| 106a |
| 105 |
| 102 |
| 101 |

HETEROCYCLIC COMPOUND AND ORGANIC LIGHT EMITTING DEVICE COMPRISING SAME

CROSS-REFERENCE TO RELATED APPLICATION(S)

This application is a National Stage Application of International Application No. PCT/KR2020/000669 filed on Jan. 14, 2020, which claims priority to and the benefit of Korean Patent Application No. 10-2019-0026874 filed on Mar. 8, 2019, the disclosures of which are incorporated herein by reference in their entireties.

FIELD OF DISCLOSURE

The present specification relates to a heterocyclic compound and an organic light emitting device comprising the same.

BACKGROUND

In general, an organic light emitting phenomenon refers to a phenomenon in which electric energy is converted into light energy by using an organic material. An organic light emitting device using the organic light emitting phenomenon usually has a structure including an anode, a cathode, and an organic material layer interposed therebetween. Here, the organic material layer may have a multi-layered structure composed of different materials in many cases in order to improve the efficiency and stability of the organic light emitting device, and may be composed of, for example, a hole injection layer, a hole transport layer, a light emitting layer, an electron transport layer, an electron injection layer, and the like. In such a structure of the organic light emitting device, if a voltage is applied between the two electrodes, holes are injected from the anode into the organic material layer and electrons are injected from the cathode into the organic material layer, and when the injected holes and electrons meet each other, an exciton is formed, and light is emitted when the exciton falls down again to a ground state.

A host/dopant system may be used as a light emitting material in order to enhance color purity and light emitting efficiency through an energy transfer. The principle is that when a small amount of dopant which has a smaller energy band gap and better light emitting efficiency than those of a host mainly constituting a light emitting layer is mixed with the host in the light emitting layer, the excitons generated by the host are transported to the dopant to emit light with high efficiency. In this case, it is possible to obtain light with a desired wavelength according to the type of dopant used because the wavelength of the host moves to the wavelength range of the dopant.

In a host and dopant system that emits general fluorescence, singlet energy of a host is transferred to a dopant in the form of light energy through Foster energy transfer. The excited singlet energy of the dopant receiving the energy emits fluorescent light while becoming singlet energy in the ground state. In contrast, in the case of a compound having a small triplet energy—singlet energy value ($\Delta E_{ST}$), the triplet energy of the compound may be partially harvested as singlet energy by reverse intersystem crossing (hereinafter, referred to as the 'RISC'). When the compound is applied to an organic light emitting device, the efficiency of the device is increased.

In general, an exciton in a singlet state falls quickly from the excited state to the ground state while emitting light, but the excited state lifetime of the exciton in the triplet state may get longer than that of the exciton in the singlet state, and thus the exciton may be recovered by the RISC, but may also be annihilated in a non-emission form.

RELATED ARTS

International Patent Application Publication No. 2017-018326

SUMMARY

The present specification has been made in an effort to provide a heterocyclic compound and an organic light emitting device including the same.

The present specification provides a compound represented by the following Formula 1.

[Formula 1]

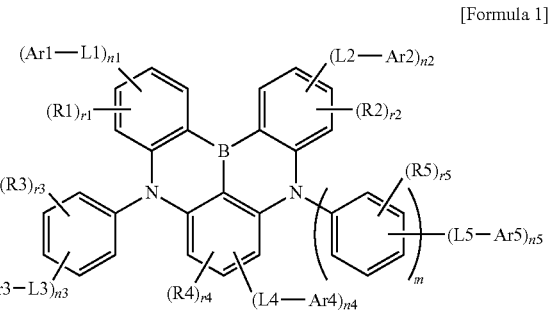

In Formula 1,

L1 to L5 are the same as or different from each other, and are each independently a substituted or unsubstituted alkylene group, Ar1 to Ar5 are the same as or different from each other, and are each independently a substituted or unsubstituted aryl group; or a substituted or unsubstituted heteroaryl group, R1 to R5 are the same as or different from each other, and are each independently hydrogen; deuterium; a halogen group; a nitrile group; a substituted or unsubstituted alkyl group; a substituted or unsubstituted cycloalkyl group; a substituted or unsubstituted silyl group; a substituted or unsubstituted arylamine group; a substituted or unsubstituted arylheteroarylamine group; a substituted or unsubstituted aryl group; or a substituted or unsubstituted heteroaryl group, r1, r2, n1, and n2 are the same as or different from each other, and are each independently an integer from 0 to 4, r4 is an integer from 0 to 3, n4 is 0, r3, r5, n3, and n5 are the same as or different from each other, and are each independently an integer from 0 to 5, m is 0 or 1, and when m is 0, L5 is directly linked to N, a value of n1+n2+n3+n4+n5 is an integer from 1 to 21, a value of r1+n1 is an integer from 0 to 4, a value of r2+n2 is an integer from 0 to 4, a value of r3+n3 is an integer from 0 to 5, a value of r4+n4 is an integer from 0 to 3, and a value of r5+n5 is an integer from 0 to 5, and when r1 to r5, n1 to n3, and n5 is 2 or higher, substituents in the parenthesis are the same as or different from each other.

Further, the present specification provides an organic light emitting device including: a first electrode; a second electrode provided to face the first electrode; and an organic material layer having one or more layers provided between the first electrode and the second electrode, in which one or more layers of the organic material layer include the compound represented by Formula 1.

Advantageous Effects

The compound according to an exemplary embodiment of the present specification can be used for an organic light emitting device to lower the driving voltage of the organic light emitting device and improve the light efficiency. Further, the service life characteristics of the device can be improved by the thermal stability of the compound.

DESCRIPTION OF REFERENCE NUMERALS

Figure 1:
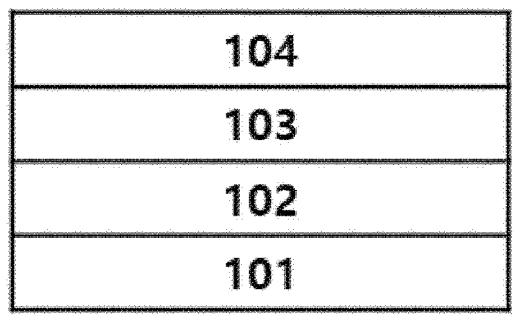
FIGS. 1 to 3 illustrate an example of an organic light emitting device according to an exemplary embodiment of the present specification.

101: Substrate
102: Anode
103: Light emitting layer
104: Cathode
105: Hole injection layer
106: Hole transport layer
106a: First hole transport layer
106b: Second hole transport layer
107: Electron injection and transport layer

DETAILED DESCRIPTION

Hereinafter, the present specification will be described in more detail.

Since the compound represented by Formula 1 includes an alkylene group substituted with an aryl group (arylalkyl group) in a polycyclic hetero ring including boron, aggregation of molecules is prevented by minimizing the stacking among the molecules, so that it is possible to expect high efficiency when the compound represented by Formula 1 is applied to an organic light emitting device.

Specifically, by introducing a sterically large substituent into a terminal substituent far away from an electrically influential core, the molecules become structurally bulky and the distance between adjacent molecules is increased. Dexter energy transfer occurs more when the distance between molecules is short and the number of molecular orbital overlaps is large, and the interaction between molecules (dopant-dopant and dopant-host) is suppressed by introducing a large substituent into a terminal group so as to affect only the steric effect and increasing the distance between the molecules. The suppression of interaction prevents annihilation of excitons by interrupting Dexter energy transfer between the triplet of the host and the dopant, and enables hosts to be transferred to the dopant through Foster energy transfer.

In Formula 1, an alkylene group substituted with an aryl group (arylalkyl group) is linked to one or more of the benzene rings represented by a dotted circle in the following core (that is, the value of n1+n2+n3+n5 of Formula 1 is 1 or higher), and a benzene ring located between N and N does not have an alkylene group substituted with an aryl group (arylalkyl group)(n4 of Formula 1=0). In this case, the molecular orientation is increased, so that the efficiency is increased when the compound of Formula 1 is applied to the device.

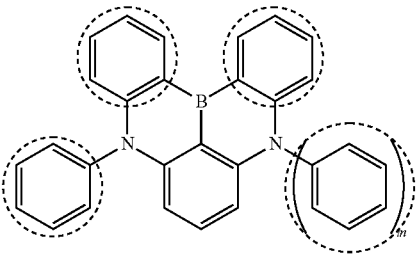

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; a nitrile group; an alkyl group; a cycloalkyl group; an amine group; a silyl group; an aryl group; and a heteroaryl group including one or more of N, O, and S atoms, being substituted with a substituent to which two or more substituents among the substituents exemplified above are linked, or having no substituent.

In the present specification, the fact that two or more substituents are linked indicates that hydrogen of any one substituent is replaced with another substituent. For example, an isopropyl group and a phenyl group may be linked to each other to become a substituent of

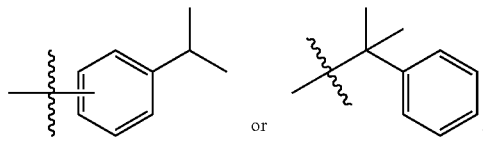

In the present specification, the case where three substituents are linked to one another includes not only a case where (Substituent 1)-(Substituent 2)-(Substituent 3) are consecutively linked to one another, but also a case where (Substituent 2) and (Substituent 3) are linked to (Substituent 1). For example, two phenyl groups and an isopropyl group may be linked to each other to become a substituent of

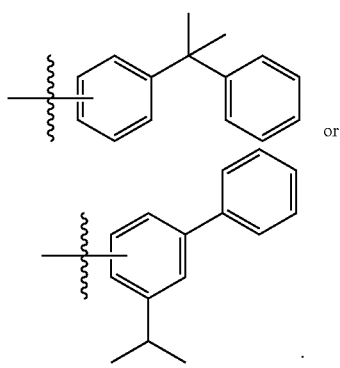

or

The same also applies to the case where four or more substituents are linked to one another.

In the present specification,

means a moiety to be linked.

In the present specification, examples of a halogen group include fluorine, chlorine, bromine or iodine.

In the present specification, an alkyl group may be straight-chained or branched, and the number of carbon atoms thereof is not particularly limited, but is preferably 1 to 30; 1 to 20; 1 to 10; or 1 to 5. Specific examples thereof include methyl, ethyl, propyl, n-propyl, isopropyl, butyl, n-butyl, isobutyl, t-butyl, sec-butyl, 1-methylbutyl, 1-ethylbutyl, pentyl, n-pentyl, isopentyl, neopentyl, t-pentyl, hexyl, n-hexyl, 1-methylpentyl, 2-methylpentyl, 3,3-dimethylbutyl, 2-ethylbutyl, heptyl, n-heptyl, 1-methylhexyl, cyclopentylmethyl, cyclohexylmethyl, octyl, n-octyl, t-octyl, 1-methylheptyl, 2-ethylhexyl, 2-propylpentyl, n-nonyl, 2,2-dimethylheptyl, 1-ethylpropyl, 1,1-dimethylpropyl, isohexyl, 4-methylhexyl, 5-methylhexyl, and the like, but are not limited thereto.

In the present specification, a cycloalkyl group is not particularly limited, but has preferably 3 to 30 carbon atoms; 3 to 20 carbon atoms; 3 to 10 carbon atoms; or 3 to 6 carbon atoms, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-t-butylcyclohexyl, cycloheptyl, cyclooctyl, and the like, but are not limited thereto.

In the present specification, a silyl group is a substituent which includes Si and to which the Si atom is directly linked as a radical, and is represented by —SiR$_{201}$R$_{202}$R$_{203}$, and R$_{201}$ to R$_{203}$ are the same as or different from each other, and may be each independently a substituent composed of at least one of hydrogen; deuterium; a halogen group; an alkyl group; an alkenyl group; an alkoxy group; a cycloalkyl group; an aryl group; and a heterocyclic group. Specific examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a methyldiphenylsilyl group, a t-butyldiphenylsilyl group, a phenylsilyl group, and the like, but are not limited thereto.

In the present specification, an aryl group means a monovalent aromatic hydrocarbon or a monovalent group of an aromatic hydrocarbon derivative. In the present specification, an aromatic hydrocarbon means a compound in which pi electrons are completely conjugated and which contains a planar ring, and a group derived from an aromatic hydrocarbon means a structure in which an aromatic hydrocarbon or a cyclic aliphatic hydrocarbon is fused with an aromatic hydrocarbon. Further, in the present specification, an aryl group intends to include a monovalent group in which two or more aromatic hydrocarbons or derivatives of an aromatic hydrocarbon are linked to each other. The aryl group is not particularly limited, but preferably has 6 to 50 carbon atoms; 6 to 30 carbon atoms; 6 to 25 carbon atoms; 6 to 20 carbon atoms; 6 to 18 carbon atoms; or 6 to 13 carbon atoms, and the aryl group may be monocyclic or polycyclic. Specific examples of the monocyclic aryl group include a phenyl group, a biphenyl group, a terphenyl group, and the like, but are not limited thereto. Specific examples of the polycyclic aryl group include a naphthyl group, an anthracenyl group, a phenanthryl group, a triphenyl group, a pyrenyl group, a perylenyl group, a chrysenyl group, a fluorenyl group, and the like, but are not limited thereto.

In the present specification, the fluorenyl group may be substituted, and adjacent substituents may be bonded to each other to form a ring.

In the present specification, when it is said that a fluorenyl group may be substituted, the substituted fluorenyl group includes all the compounds in which substituents of a pentagonal ring of fluorene are spiro-bonded to each other to form an aromatic hydrocarbon ring. Examples of the substituted fluorenyl group include 9,9'-spirobifluorene, spiro[cyclopentane-1,9'-fluorene], spiro[benzo[c]fluorene-7,9-fluorene], and the like, but are not limited thereto.

In the present specification, a heterocyclic group includes one or more atoms other than carbon, that is, one or more heteroatoms, and specifically, the heteroatom may include one or more atoms selected from the group consisting of O, N, S, and the like. The number of carbon atoms thereof is not particularly limited, but is preferably 2 to 50; 2 to 30; 2 to 20; 2 to 18; or 2 to 13. Examples of the heterocyclic group include a thiophene group, a furanyl group, a pyrrole group, an imidazole group, a thiazole group, an oxazole group, an oxadiazole group, a pyridine group, a bipyridine group, a pyrimidine group, a triazine group, a triazole group, an acridine group, a pyridazine group, a pyrazine group, a quinoline group, a quinazoline group, a quinoxaline group, a phthalazine group, a pyridopyrimidine group, a pyridopyrazine group, a pyrazinopyrazine group, an isoquinoline group, an indole group, a carbazole group, a benzoxazole group, a benzimidazole group, a benzothiazole group, a benzocarbazole group, a benzothiophene group, a dibenzothiophene group, a benzofuran group, a phenanthrolinyl group, a thiazole group, an isoxazole group, an oxadiazole group, a thiadiazole group, a benzothiazole group, a phenothiazine group, a dibenzofuran group, a dihydrophenothiazine group, a dihydrobenzoisoquinoline group, a chromene group, and the like, but are not limited thereto.

In the present specification, a heterocyclic group may be monocyclic or polycyclic, may be an aromatic ring, an aliphatic ring, or a fused ring of the aromatic ring and the aliphatic ring, and may be selected from the examples of the heterocyclic group.

In the present specification, a heteroaryl group means a monovalent aromatic hetero ring. Here, the aromatic hetero ring is a monovalent group of an aromatic ring or a derivative of the aromatic ring, and means a group including one or more of N, O, and S as a heteroatom in the ring. The derivative of the aromatic ring includes a structure in which an aromatic ring or an aliphatic ring is fused with an aromatic ring. Further, in the present specification, the heteroaryl group intends to include a monovalent group in which an aromatic ring including two or more heteroatoms or derivatives of an aromatic ring including a heteroatom are linked to each other. The number of carbon atoms of the heteroaryl group is preferably 2 to 50; 2 to 30; 2 to 20; 2 to 18; or 2 to 13.

In the present specification, an arylene group means a group having two bonding positions in an aryl group, that is, a divalent group. The above-described description on the aryl group may be applied to the arylene group, except for a divalent arylene group.

In the present specification, a heteroarylene group means a group having two bonding positions in a heteroaryl group, that is, a divalent group. The above-described description on the heteroaryl group may be applied to the heteroarylene group, except for a divalent heteroarylene group.

Hereinafter, the compound represented by Formula 1 will be described in detail.

In an exemplary embodiment of the present specification, L1 to L5 are the same as or different from each other, and are each independently a substituted or unsubstituted alkylene group.

In an exemplary embodiment of the present specification, L1 to L5 are the same as or different from each other, and are each independently a substituted or unsubstituted branched alkylene group.

In an exemplary embodiment of the present specification, L1 to L5 are the same as or different from each other, and are each independently a substituted or unsubstituted alkylene group having 1 to 10 carbon atoms.

In an exemplary embodiment of the present specification, L1 to L5 are the same as or different from each other, and are each independently a substituted or unsubstituted alkylene group having 2 to 5 carbon atoms.

In an exemplary embodiment of the present specification, L1 to L5 are the same as or different from each other, and are each independently a substituted or unsubstituted branched alkylene group having 3 to 5 carbon atoms.

In an exemplary embodiment of the present specification, L1 to L5 are the same as or different from each other, and are each independently an alkylene group having 2 to 5 carbon atoms.

In an exemplary embodiment of the present specification, L1 to L5 are the same as or different from each other, and are each independently a branched alkylene group having 3 to 5 carbon atoms.

In an exemplary embodiment of the present specification, L1 to L5 are the same as or different from each other, and are each independently a methylene group which is unsubstituted or substituted with an alkyl group or an aryl group.

In an exemplary embodiment of the present specification, L1 to L5 are the same as or different from each other, and are each independently methylene group which is unsubstituted or substituted with an alkyl group having 1 to 5 carbon atoms or an aryl group having 6 to 20 carbon atoms.

In an exemplary embodiment of the present specification, L1 to L5 are the same as or different from each other, and are each independently a methylene group which is unsubstituted or substituted with a methyl group or a phenyl group.

In an exemplary embodiment of the present specification, L1 to L5 are the same as or different from each other, and are each independently —$CH_2(G1)(G2)$-, G1 and G2 are the same as or different from each other, and are each independently an alkyl group having 1 to 5 carbon atoms or an aryl group having 6 to 20 carbon atoms, and one or more of G1 and G2 are an alkyl group having 1 to 5 carbon atoms.

In an exemplary embodiment of the present specification, L1 to L5 are the same as or different from each other, and are each independently —$CH_2(G1)(G2)$-, G1 and G2 are the same as or different from each other, and are each independently a methyl group or a phenyl group, and one or more of G1 and G2 are a methyl group.

In an exemplary embodiment of the present specification, L1 to L5 are the same as or different from each other, and are each independently a methylene group substituted with an alkyl group.

In an exemplary embodiment of the present specification, L1 to L5 are the same as or different from each other, and are each independently a methylene group substituted with an alkyl group having 1 to 5 carbon atoms. In an exemplary embodiment of the present specification, L1 to L5 are the same as or different from each other, and are each independently —$CH_2(G1)(G2)$-, and G1 and G2 are the same as or different from each other, and are each independently an alkyl group having 1 to 5 carbon atoms.

In an exemplary embodiment of the present specification, L1 to L5 are the same as or different from each other, and are each independently —$CH_2(G1)(G2)$-, and G1 and G2 are a methyl group.

In an exemplary embodiment of the present specification, Ar1 to Ar5 are the same as or different from each other, and are each independently a substituted or unsubstituted aryl group; or a substituted or unsubstituted heteroaryl group.

In an exemplary embodiment of the present specification, Ar1 to Ar5 are the same as or different from each other, and are each independently a substituted or unsubstituted aryl group having 6 to 30 carbon atoms; or a substituted or unsubstituted heteroaryl group having 2 to 30 carbon atoms.

In an exemplary embodiment of the present specification, Ar1 to Ar5 are the same as or different from each other, and are each independently a substituted or unsubstituted aryl group having 6 to 20 carbon atoms. In an exemplary embodiment of the present specification, Ar1 to Ar5 are the same as or different from each other, and are each independently a substituted or unsubstituted phenyl group; a substituted or unsubstituted biphenyl group; a substituted or unsubstituted terphenyl group; a substituted or unsubstituted naphthyl group; a substituted or unsubstituted phenanthrenyl group; a substituted or unsubstituted anthracenyl group; a substituted or unsubstituted triphenylene group; a substituted or unsubstituted fluoranthenyl group; a substituted or unsubstituted phenalene group; a substituted or unsubstituted pyrenyl group; a substituted or unsubstituted chrysenyl group; a substituted or unsubstituted fluorenyl group; or a substituted or unsubstituted spirobifluorenyl group.

In an exemplary embodiment of the present specification, Ar1 to Ar5 are an aryl group having 6 to 20 carbon atoms, which is unsubstituted or substituted with a substituent selected from the group consisting of deuterium, a halogen group, an alkyl group having 1 to 6 carbon atoms, an aryl group having 6 to 20 carbon atoms, a trialkylsilyl group having 3 to 30 carbon atoms, and a triarylsilyl group having 6 to 50 carbon atoms, or a substituent formed by linking two or more groups thereof.

In an exemplary embodiment of the present specification, Ar1 to Ar5 are an aryl group having 6 to 20 carbon atoms, which is unsubstituted or substituted with deuterium, a halogen group, an alkyl group having 1 to 6 carbon atoms, an alkyl group having 1 to 6 carbon atoms, which is substituted with deuterium, a trimethylsilyl group, or a triphenylsilyl group.

In an exemplary embodiment of the present specification, Ar1 to Ar5 are the same as or different from each other, and are each independently a substituted or unsubstituted phenyl group; or a substituted or unsubstituted biphenyl group.

In an exemplary embodiment of the present specification, Ar1 to Ar5 are a phenyl group which is unsubstituted or substituted with deuterium, a fluorine group, a methyl group, a methyl group substituted with deuterium, a t-butyl group, or a trimethylsilyl group; or a biphenyl group.

In an exemplary embodiment of the present specification, R1 to R5 are the same as or different from each other, and are each independently hydrogen; deuterium; a halogen group; a nitrile group; a substituted or unsubstituted alkyl group; a substituted or unsubstituted cycloalkyl group; a substituted or unsubstituted silyl group; a substituted or unsubstituted arylamine group; a substituted or unsubstituted arylheteroarylamine group; a substituted or unsubstituted aryl group; or a substituted or unsubstituted heteroaryl group.

In an exemplary embodiment of the present specification, R1 to R5 are the same as or different from each other, and are each independently hydrogen; deuterium; a halogen group; a nitrile group; a substituted or unsubstituted alkyl group having 1 to 10 carbon atoms; a substituted or unsubstituted cycloalkyl group having 3 to 30 carbon atoms; a substituted or unsubstituted trialkylsilyl group having 1 to 30 carbon atoms; a substituted or unsubstituted triarylsilyl group having 6 to 60 carbon atoms; a substituted or unsubstituted arylamine group having 6 to 50 carbon atoms; a substituted or unsubstituted arylheteroarylamine group having 6 to 50 carbon atoms; a substituted or unsubstituted aryl group having 6 to 30 carbon atoms; or a substituted or unsubstituted heteroaryl group having 2 to 30 carbon atoms.

In an exemplary embodiment of the present specification, R1 to R5 are the same as or different from each other, and are each independently hydrogen; deuterium; a halogen group; a nitrile group; a substituted or unsubstituted alkyl group having 1 to 5 carbon atoms; a substituted or unsubstituted cycloalkyl group having 3 to 20 carbon atoms; a trialkylsilyl group having 1 to 20 carbon atoms; a triarylsilyl group having 6 to 50 carbon atoms; a substituted or unsubstituted arylamine group having 6 to 40 carbon atoms; a substituted or unsubstituted arylheteroarylamine group having 6 to 40 carbon atoms; a substituted or unsubstituted aryl group having 6 to 20 carbon atoms; or a substituted or unsubstituted heteroaryl group having 2 to 20 carbon atoms.

In an exemplary embodiment of the present specification, R1 to R5 are the same as or different from each other, and are each independently hydrogen; deuterium; a nitrile group; an alkyl group having 1 to 6 carbon atoms, which is unsubstituted or substituted with deuterium; a cycloalkyl group having 3 to 20 carbon atoms; a trialkylsilyl group having 1 to 20 carbon atoms; a triarylsilyl group having 6 to 50 carbon atoms; an aryl group having 6 to 20 carbon atoms, which is unsubstituted or substituted with a substituent selected from the group consisting of deuterium and an alkyl group having 1 to 6 carbon atoms or a substituent to which two or more groups selected from the group are linked; or an arylamine group having 6 to 40 carbon atoms, which is unsubstituted or substituted with a substituent selected from the group consisting of deuterium, an alkyl group having 1 to 6 carbon atoms, a trialkylsilyl group having 3 to 30 carbon atoms, and a triarylsilyl group having 6 to 50 carbon atoms, or a substituent formed by linking two or more groups thereof.

In an exemplary embodiment of the present specification, R1 to R3 and R5 are the same as or different from each other, and are each independently hydrogen; deuterium; a nitrile group; an alkyl group having 1 to 6 carbon atoms, which is unsubstituted or substituted with deuterium; a cycloalkyl group having 3 to 20 carbon atoms; a trialkylsilyl group having 1 to 20 carbon atoms; a triarylsilyl group having 6 to 50 carbon atoms; or an aryl group having 6 to 20 carbon atoms, which is unsubstituted or substituted with a substituent selected from the group consisting of deuterium and an alkyl group having 1 to 6 carbon atoms, or a substituent formed by linking two or more groups thereof.

In an exemplary embodiment of the present specification, R4's are the same as or different from each other, and are each independently hydrogen; deuterium; an alkyl group having 1 to 6 carbon atoms, which is unsubstituted or substituted with deuterium; or an arylamine group having 6 to 40 carbon atoms, which is unsubstituted or substituted with a substituent selected from the group consisting of deuterium, an alkyl group having 1 to 6 carbon atoms, a trialkylsilyl group having 3 to 30 carbon atoms, and a triarylsilyl group having 6 to 50 carbon atoms, or a substituent formed by linking two or more groups thereof.

In an exemplary embodiment of the present specification, R1 to R5 are the same as or different from each other, and are each independently hydrogen; deuterium; a nitrile group; a methyl group; a t-butyl group; a methyl substituted with deuterium; a cyclohexyl group; a trimethylsilyl group; a diphenylamine group; a diphenylamine group substituted with a t-butyl group, a trimethylsilyl group, or a triphenylsilyl group; a phenyl group; a biphenyl group; a naphthyl group; a phenyl group substituted with a t-butyl group; or a phenyl group substituted with deuterium.

In an exemplary embodiment of the present specification, R1 to R3 and R5 are the same as or different from each other, and are each independently hydrogen; deuterium; a nitrile group; a methyl group; a t-butyl group; a cyclohexyl group; a trimethylsilyl group; a phenyl group; a biphenyl group; a naphthyl group; a phenyl group substituted with a t-butyl group; or a phenyl group substituted with deuterium.

In an exemplary embodiment of the present specification, R4 is a methyl group; a methyl group substituted with deuterium; a diphenylamine group; or a diphenylamine group substituted with a t-butyl group, a trimethylsilyl group, or a triphenylsilyl group.

In an exemplary embodiment of the present specification, r1, r2, n1, and n2 are the same as or different from each other, and are each independently an integer from 0 to 4.

In an exemplary embodiment of the present specification, r4 and n4 are the same as or different from each other, and are each independently an integer from 0 to 3.

In an exemplary embodiment of the present specification, r3, r5, n3, and n5 are the same as or different from each other, and are each independently an integer from 0 to 5.

In an exemplary embodiment of the present specification, a value of n1+n2+n3+n4+n5 is an integer from 1 to 21.

In an exemplary embodiment of the present specification, a value of n1+n2+n3+n4+n5 is an integer from 1 to 5.

In an exemplary embodiment of the present specification, a value of n1+n2+n3+n4+n5 is an integer from 1 to 4.

In an exemplary embodiment of the present specification, a value of n1+n2+n3+n4+n5 is 1. According to another exemplary embodiment, a value of n1+n2+n3+n4+n5 is 2. According to still another exemplary embodiment, a value of n1+n2+n3+n4+n5 is 3. According to yet another exemplary embodiment, a value of n1+n2+n3+n4+n5 is 4.

In an exemplary embodiment of the present specification, a value of r1+n1 is an integer from 0 to 4, a value of r2+n2 is an integer from 0 to 4, a value of r3+n3 is an integer from 0 to 5, a value of r4+n4 is an integer from 0 to 3, and a value of r5+n5 is an integer from 0 to 5.

In an exemplary embodiment of the present specification, R1's are the same as or different from each other when r1 is 2 or higher, R2's are the same as or different from each other when r2 is 2 or higher, R3's are the same as or different from each other when r3 is 2 or higher, R4's are the same as or different from each other when r4 is 2 or higher, -L1-Ar1's are the same as or different from each other when n1 is 2 or higher, -L2-Ar2's are the same as or different from each other when n2 is 2 or higher, -L3-Ar3's are the same as or different from each other when n3 is 2 or higher, -L4-Ar4's are the same as or different from each other when n4 is 2 or higher, and -L5-Ar5's are the same as or different from each other when n5 is 2 or higher.

In an exemplary embodiment of the present specification, m is 0 or 1, and when m is 0, L5 is directly linked to N.

In an exemplary embodiment of the present specification, n1 to n5 are the same as or different from each other, and are each independently 0 or 1.

In an exemplary embodiment of the present specification, n1 is 1.

In an exemplary embodiment of the present specification, n2 is 1.

In an exemplary embodiment of the present specification, n3 is 1.

In an exemplary embodiment of the present specification, n5 is 1.

In an exemplary embodiment of the present specification, n4 is 0.

In an exemplary embodiment of the present specification, n1+n2+n3+n5 is 1 or higher.

In an exemplary embodiment of the present specification, n1+n2+n3+n5 is an integer from 1 to 4. In an exemplary embodiment of the present specification, r1 is 0 or 1.

In an exemplary embodiment of the present specification, r2 is 0 or 1.

In an exemplary embodiment of the present specification, r3 is 0 or 1.

In an exemplary embodiment of the present specification, r4 is 0 or 1.

In an exemplary embodiment of the present specification, r5 is 0 or 1.

In an exemplary embodiment of the present specification, m is 1.

In an exemplary embodiment of the present specification, m is 0.

In an exemplary embodiment of the present specification, the compound of Formula 1 is represented by the following Formula 1-1.

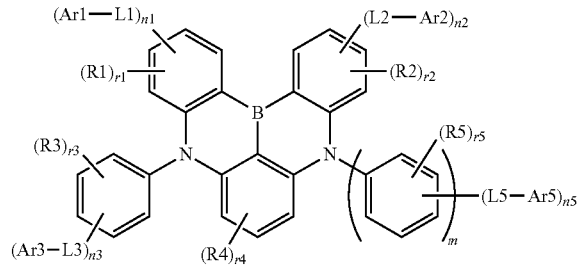

[Formula 1-1]

In Formula 1-1,
definitions of L1 to L3, L5, Ar1 to Ar3, Ar5, R1 to R5, r1 to r5, n1 to n3, and n5 are the same as defined in Formula 1.

In an exemplary embodiment of the present specification, the compound of Formula 1 is represented by the following Formula 2 or 3.

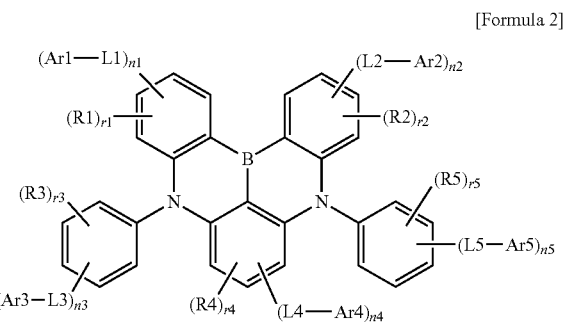

[Formula 2]

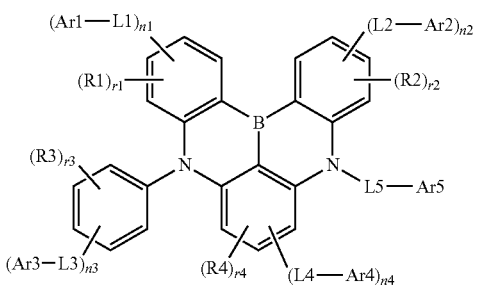

[Formula 3]

In Formulae 2 and 3,
definitions of L1 to L5, Ar1 to Ar5, R1 to R5, r1 to r5, and n1 to n5 are the same as defined in Formula 1.

In an exemplary embodiment of the present specification, the compound of Formula 1 is represented by the following Formula 2-1 or 3-1.

[Formula 2-1]

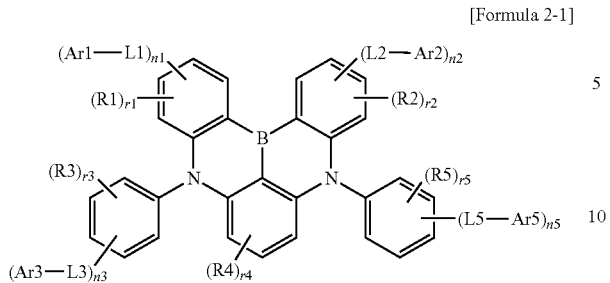

[Formula 3-1]

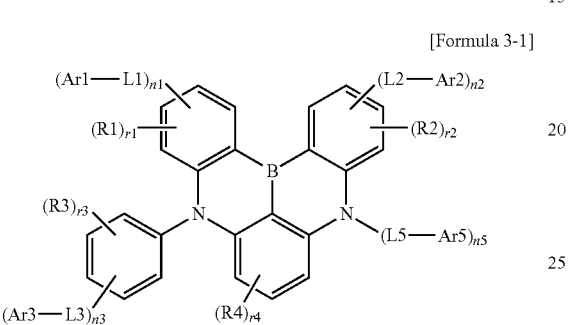

In Formulae 2-1 and 3-1, definitions of L1 to L3, L5, Ar1 to Ar3, Ar5, R1 to R5, r1 to r5, n1 to n3, and n5 are the same as defined in Formula 1.

In an exemplary embodiment of the present specification, the compound of Formula 1 is represented by any one of the following Formulae 401 to 407.

[Formula 401]

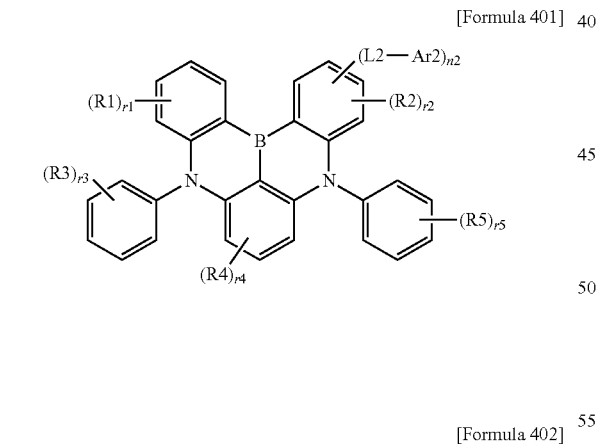

[Formula 402]

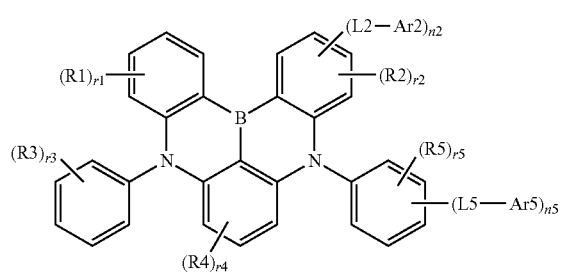

[Formula 403]

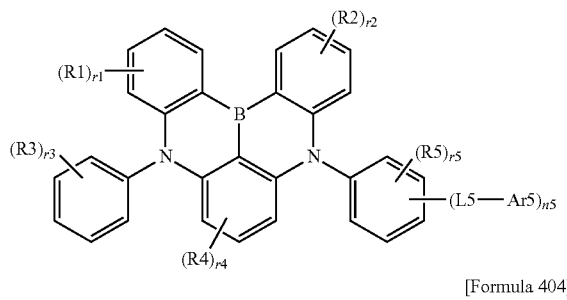

[Formula 404]

[Formula 405]

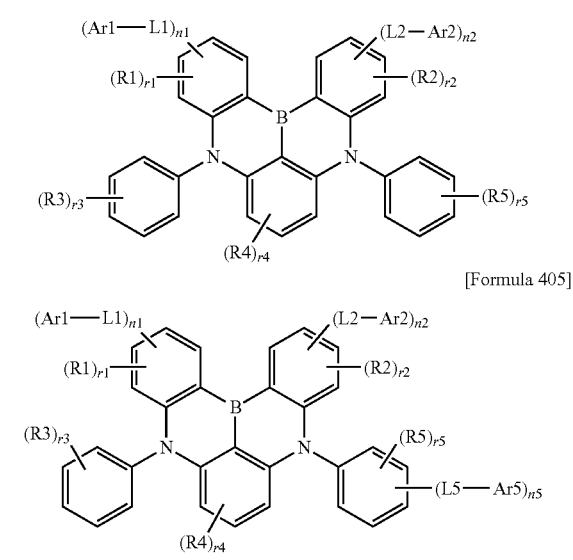

[Formula 406]

[Formula 407]

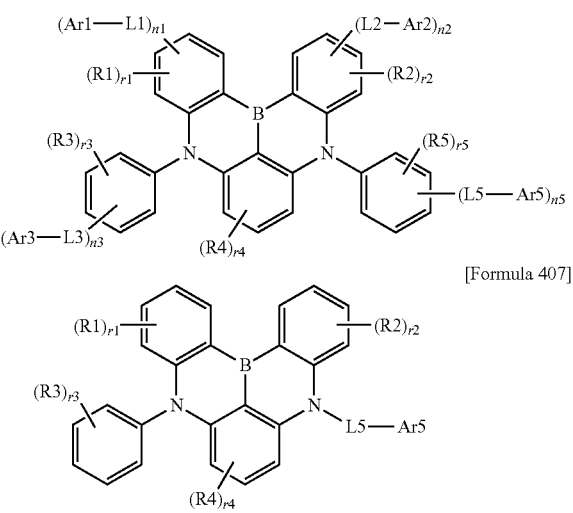

In Formulae 401 to 407, definitions of L1, L2, L3, L5, Ar1, Ar2, Ar3, Ar5, R1 to R5, r1 to r5, n1, n2, n3, and n5 are the same as defined in Formula 1.

In an exemplary embodiment of the present specification, the compound represented by Formula 1 is any one selected from the following compounds.

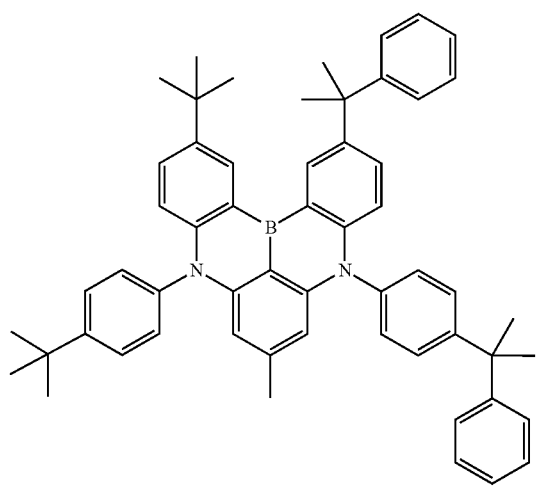
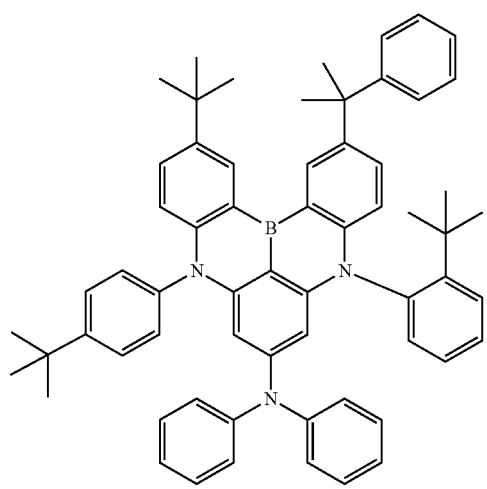
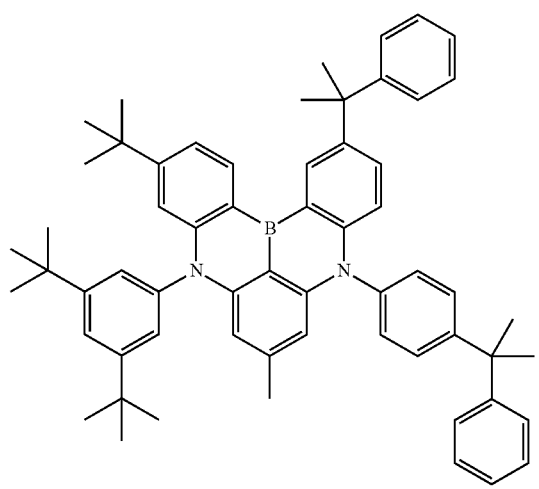
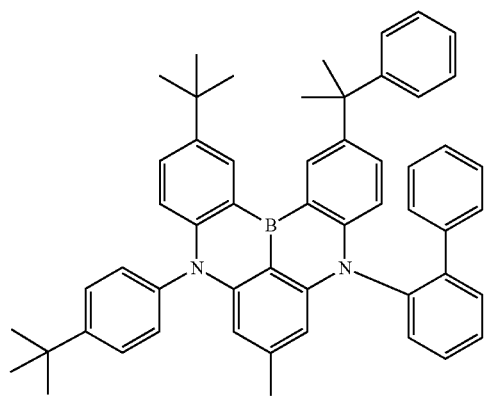
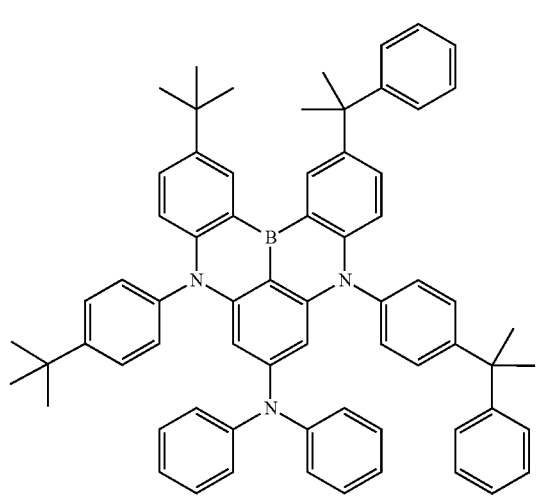
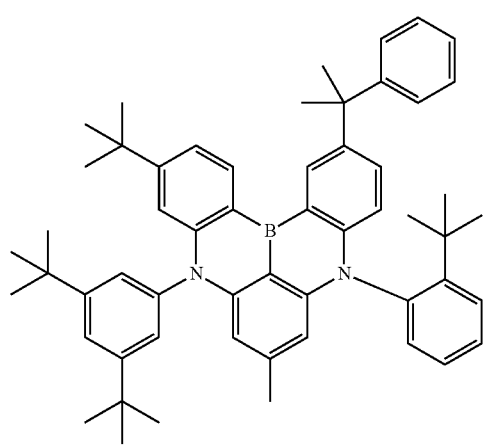

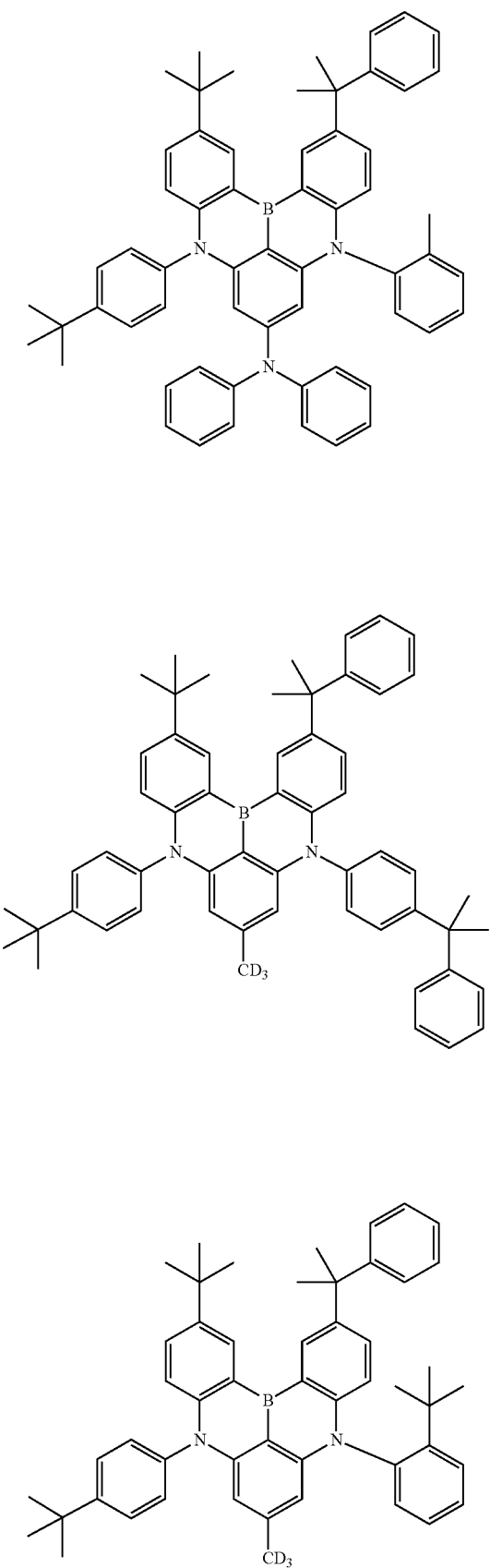
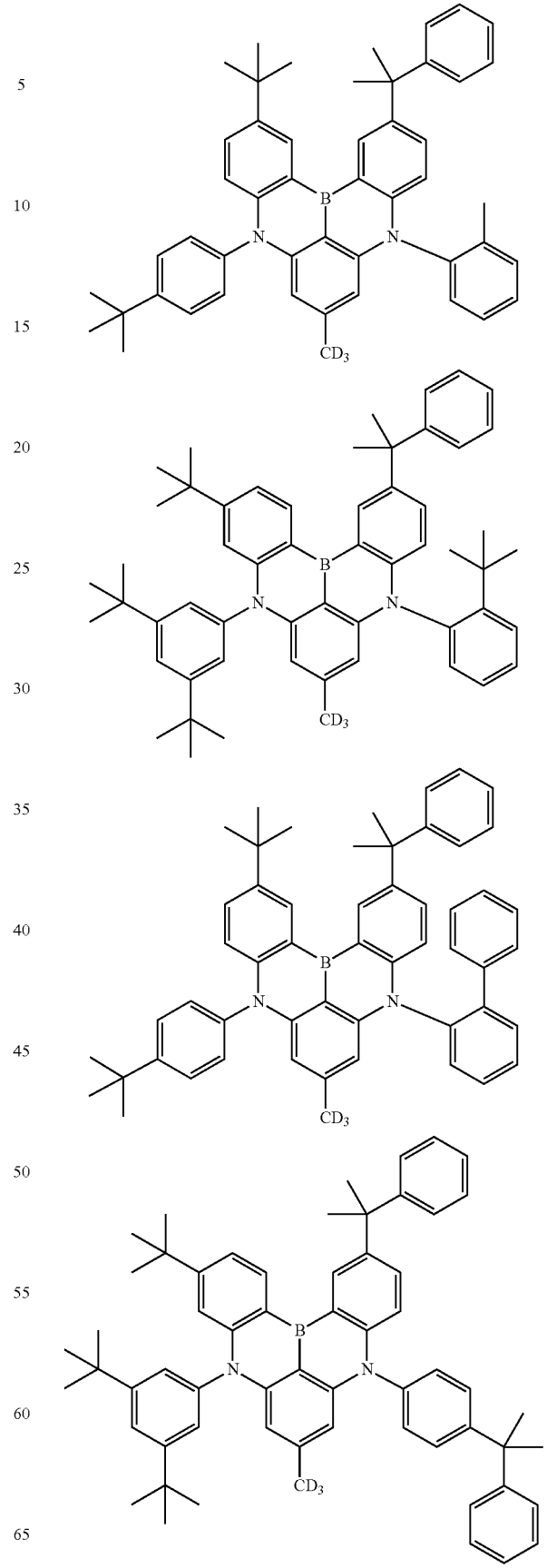

19
-continued
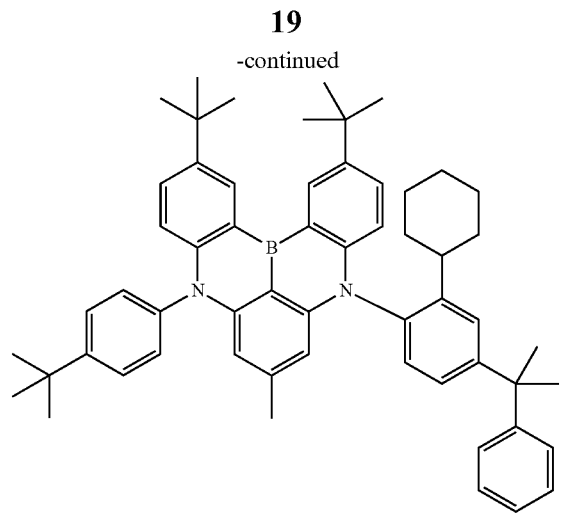
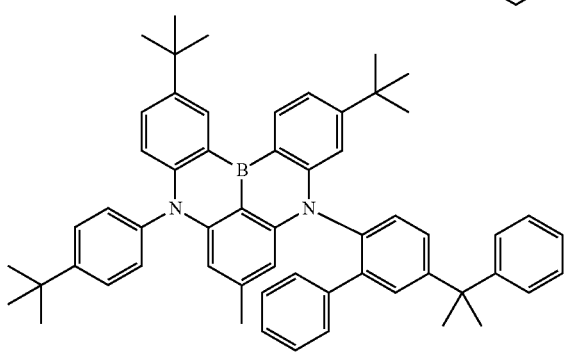
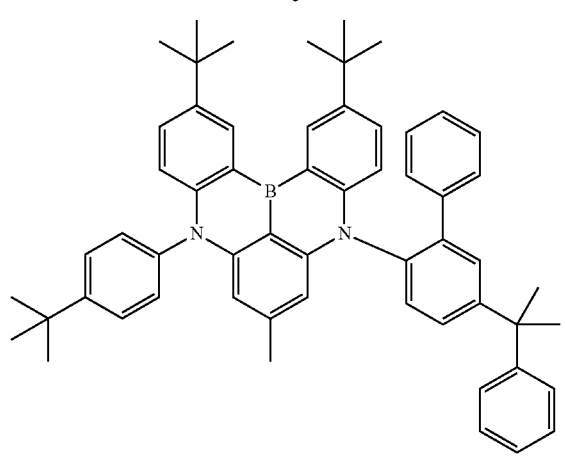
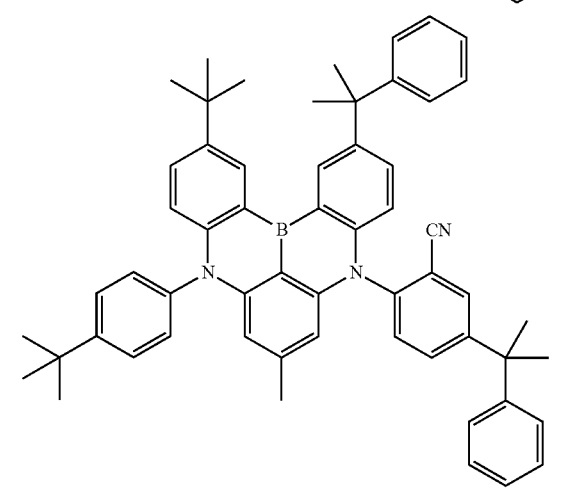
20
-continued
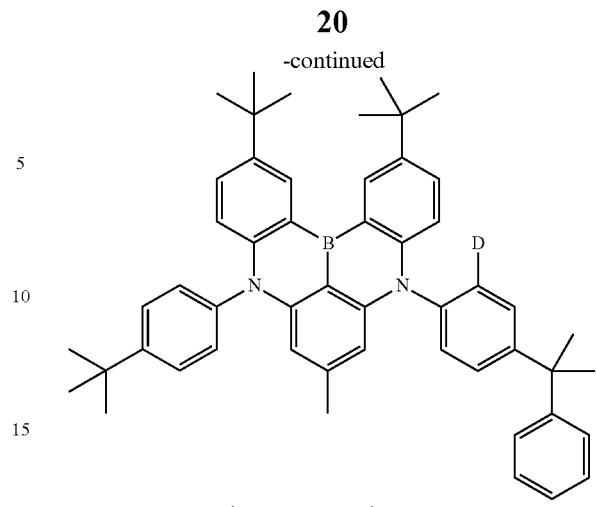
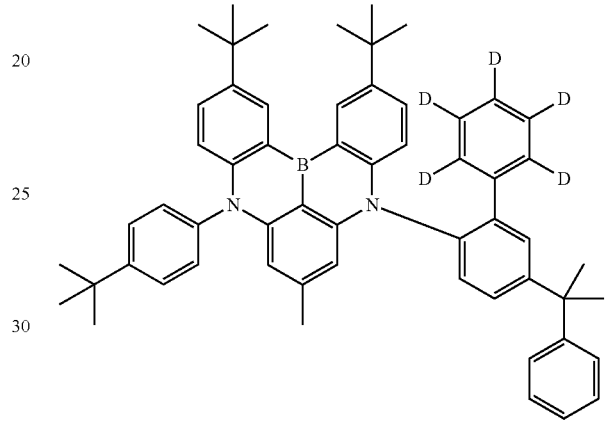
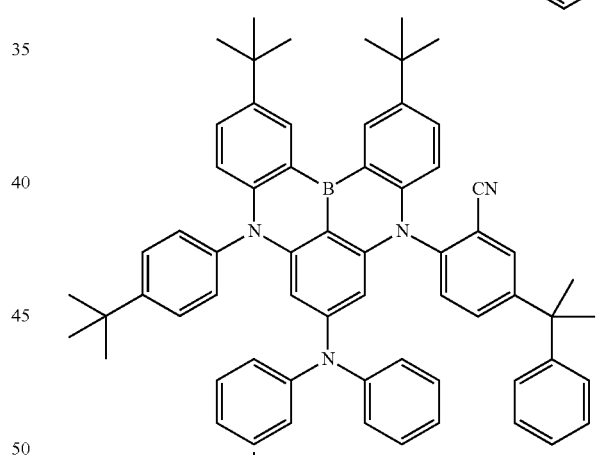
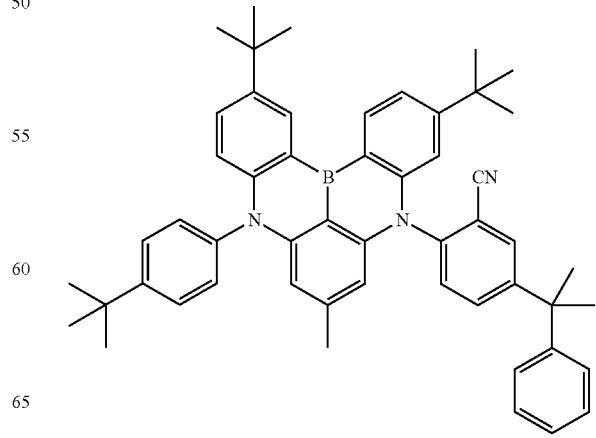

21
-continued
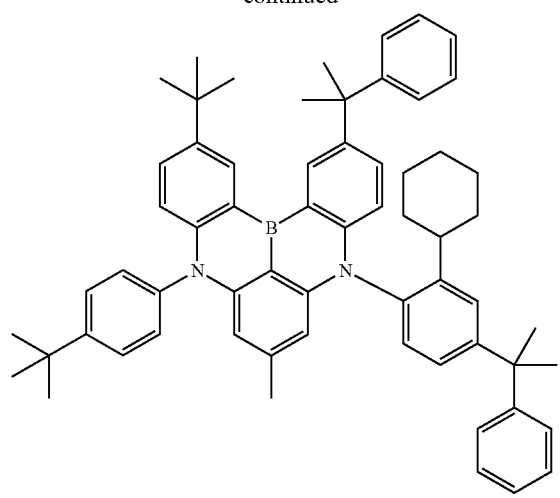
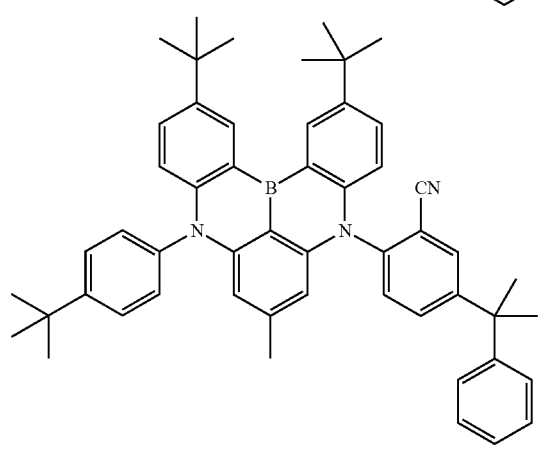
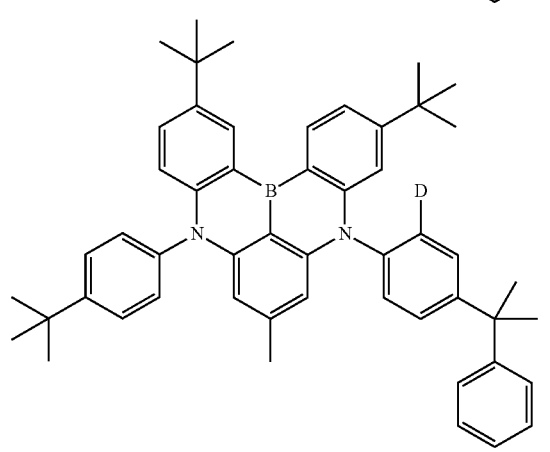
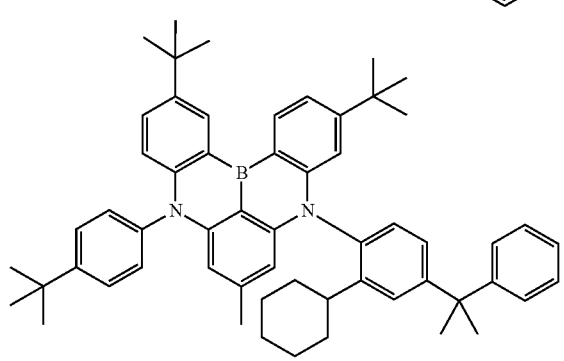
22
-continued
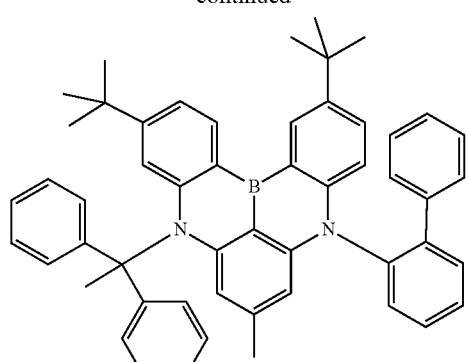
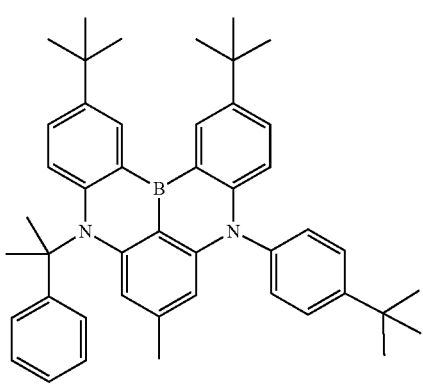
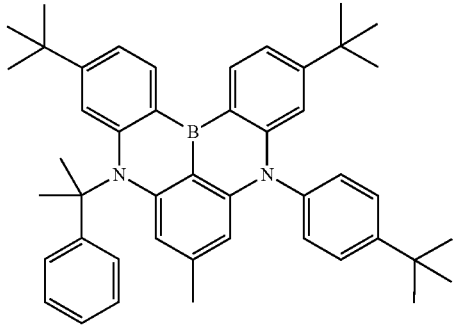
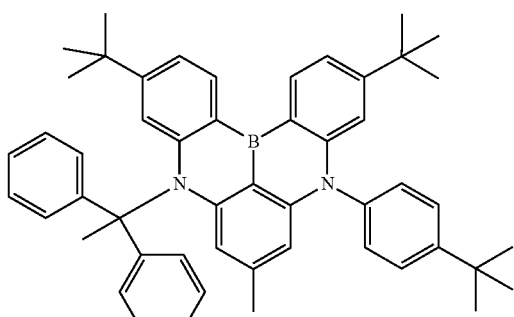

23
-continued
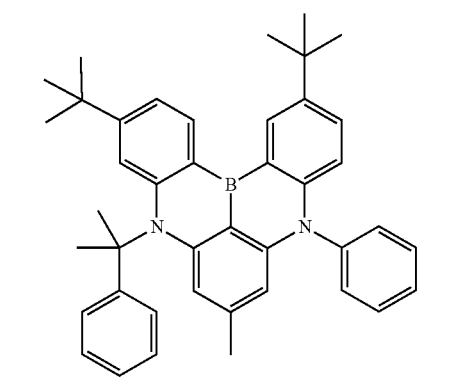
24
-continued
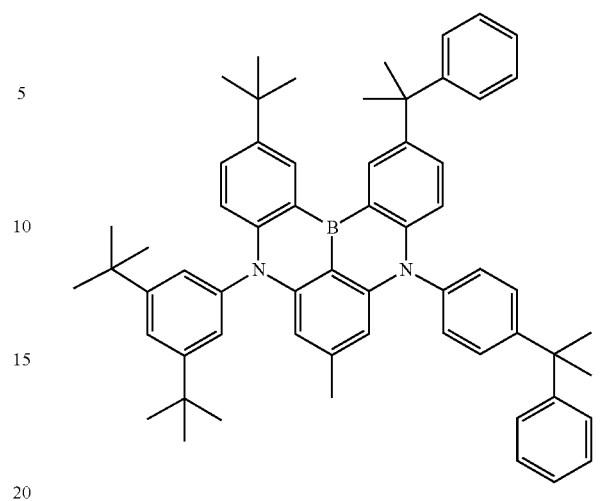
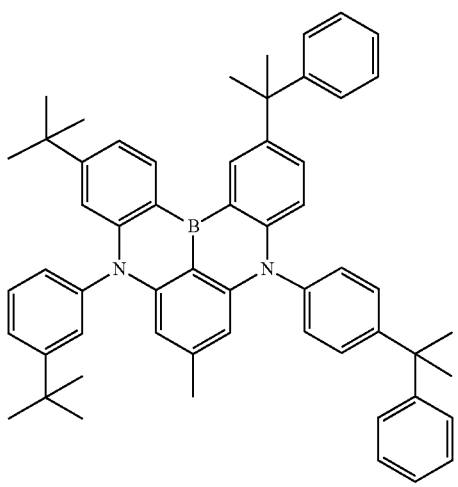
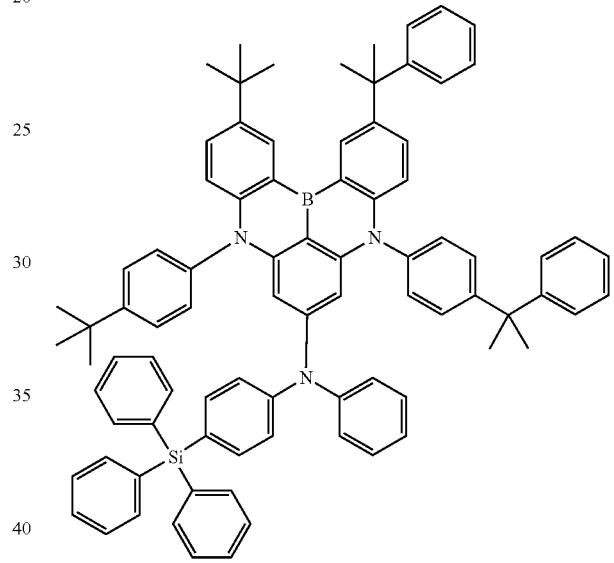
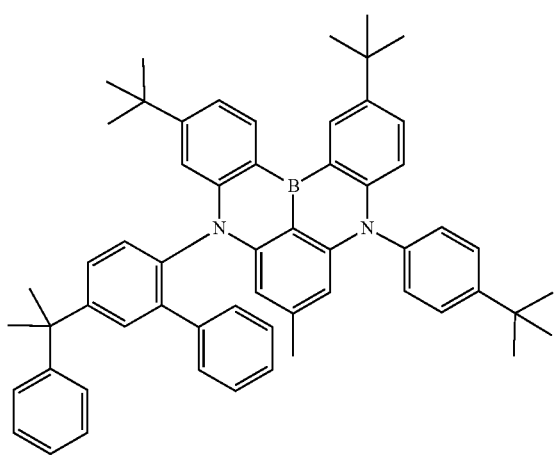
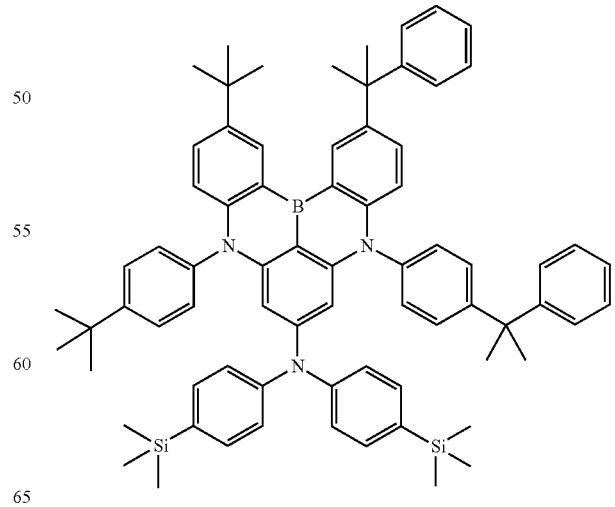

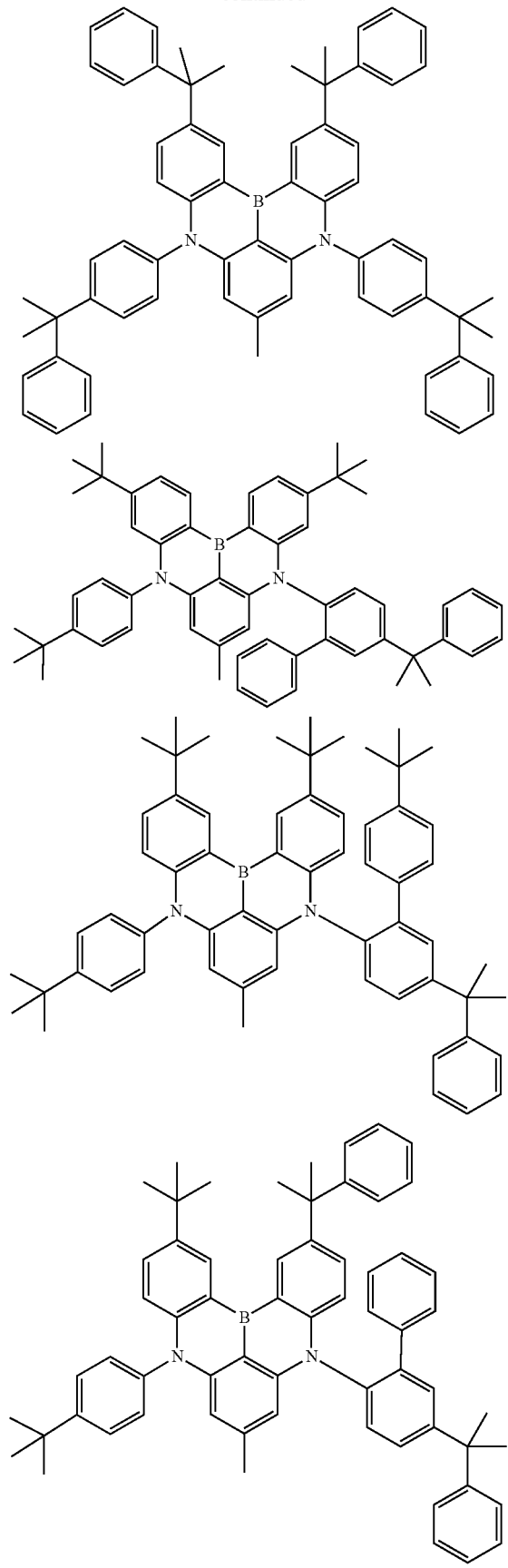
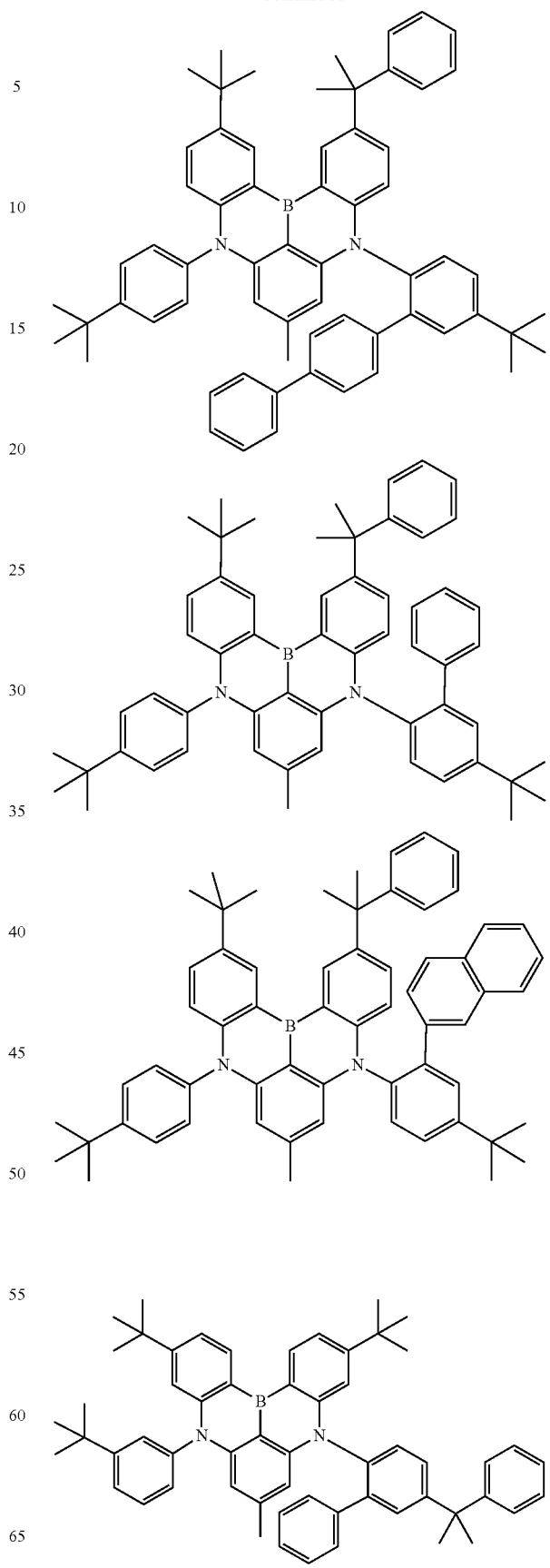

27
-continued
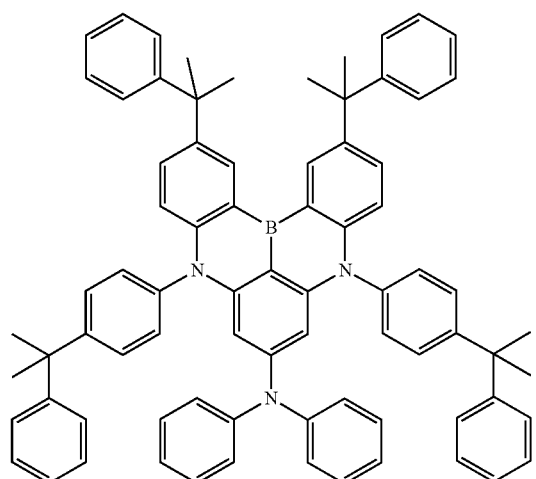
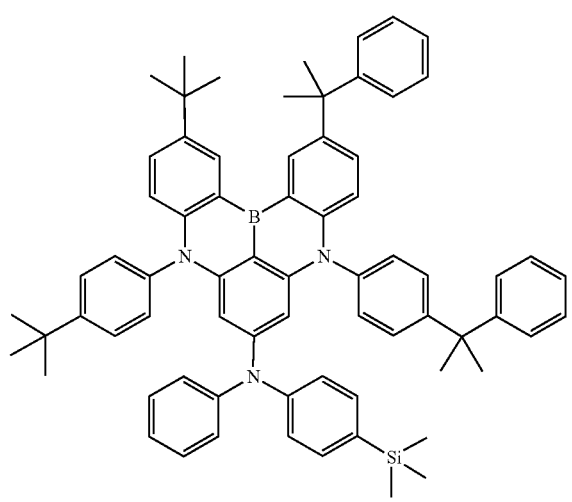
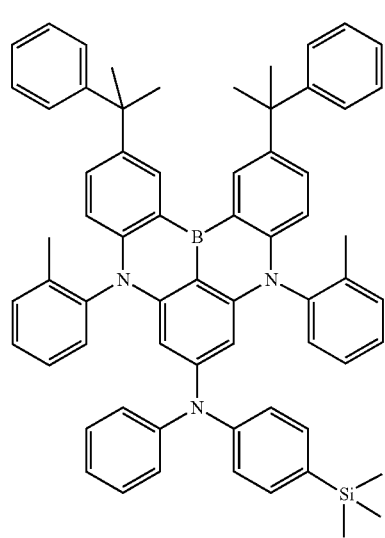
28
-continued
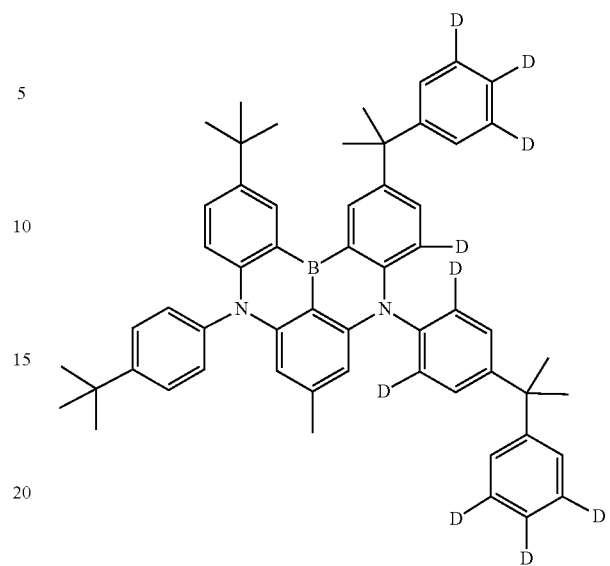
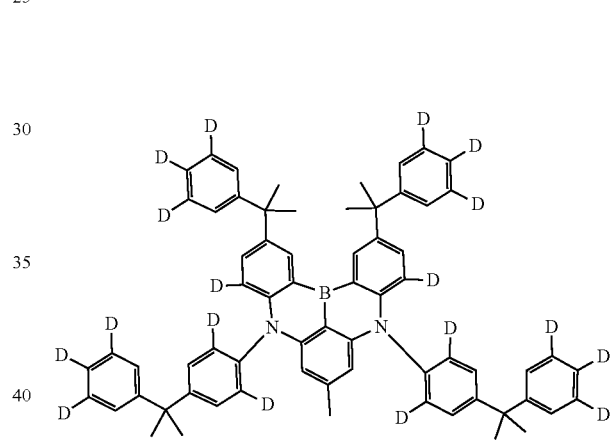
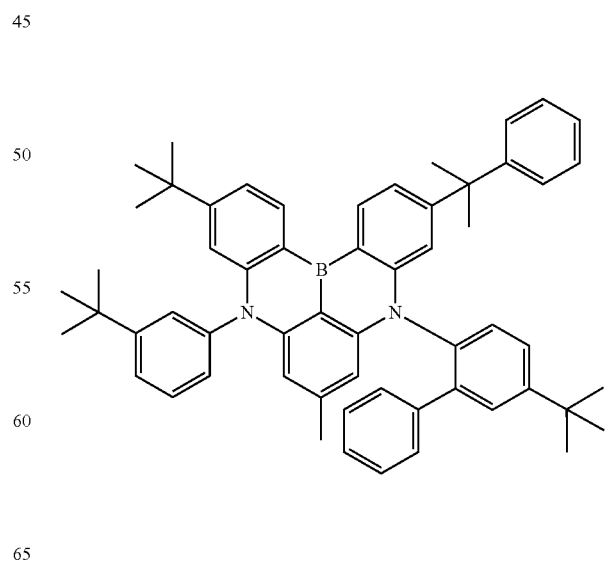

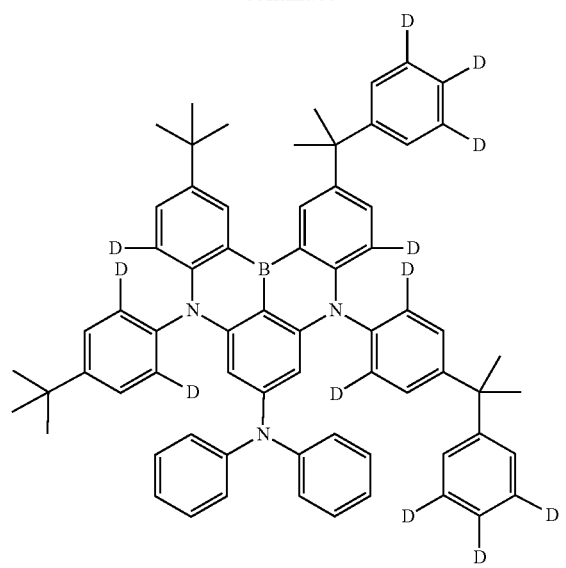
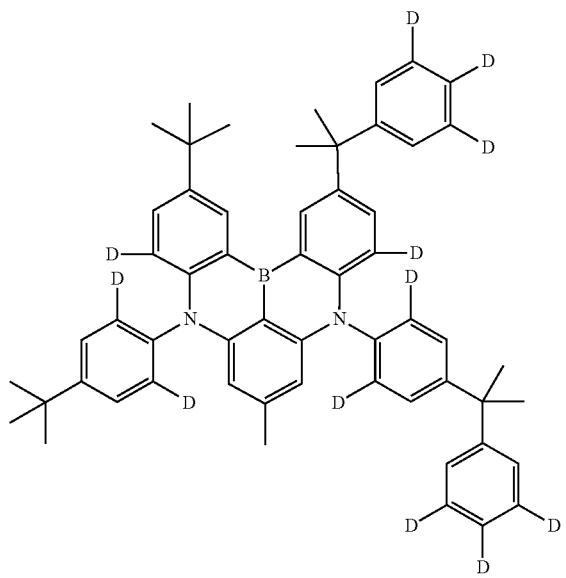
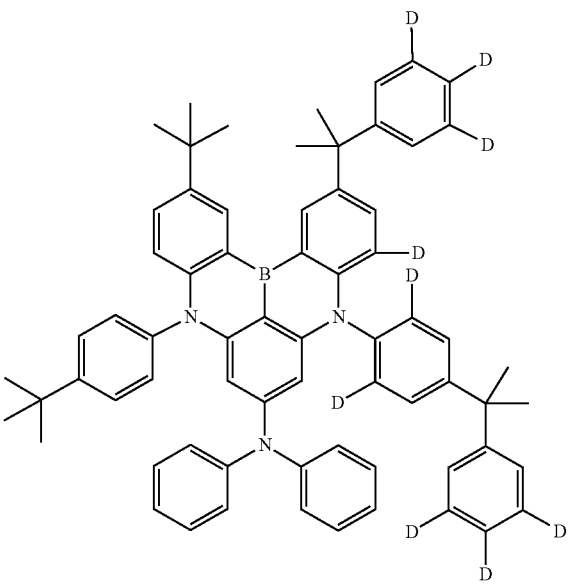
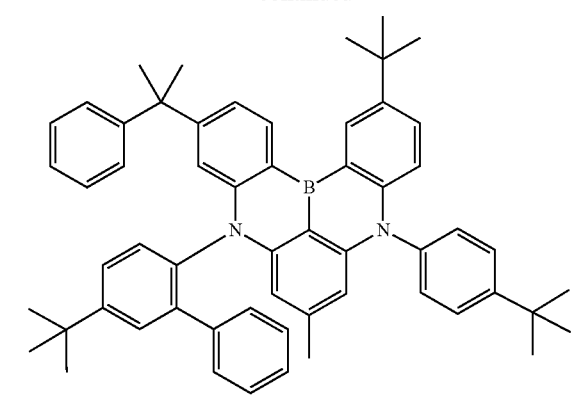
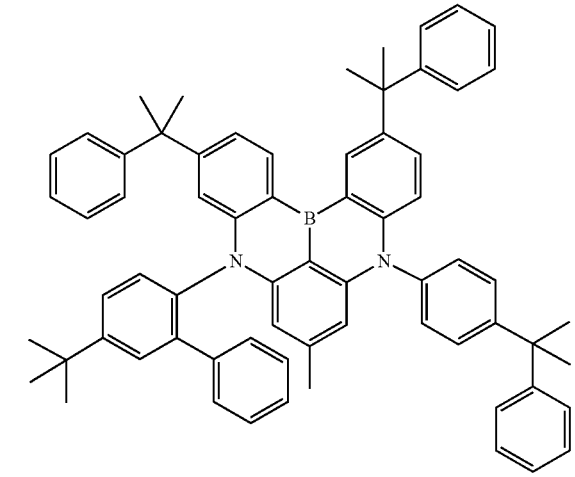
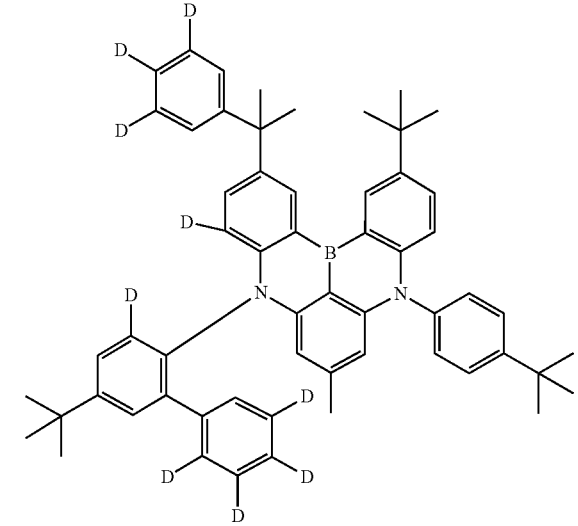

31
-continued
32
-continued
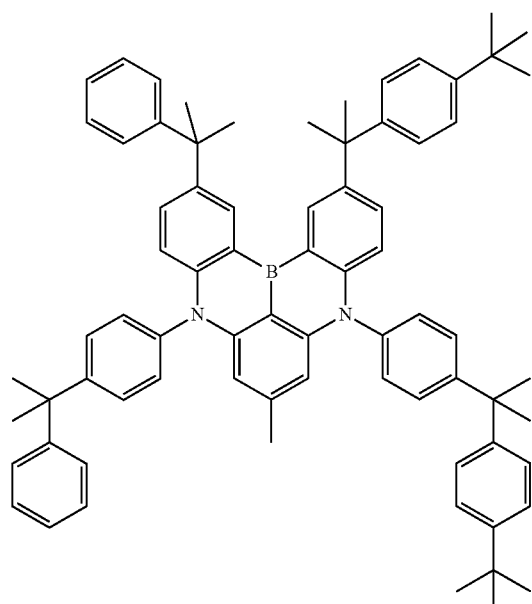
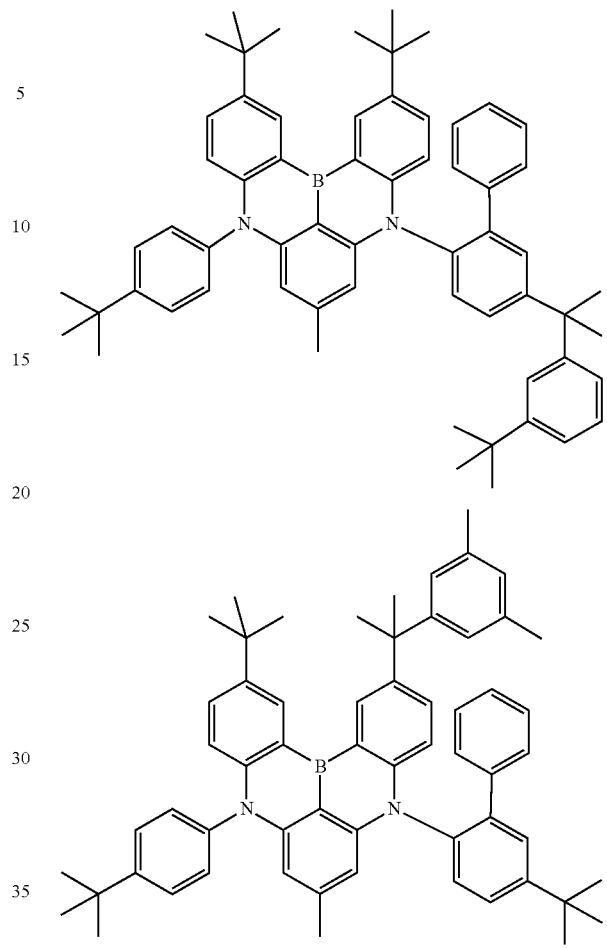
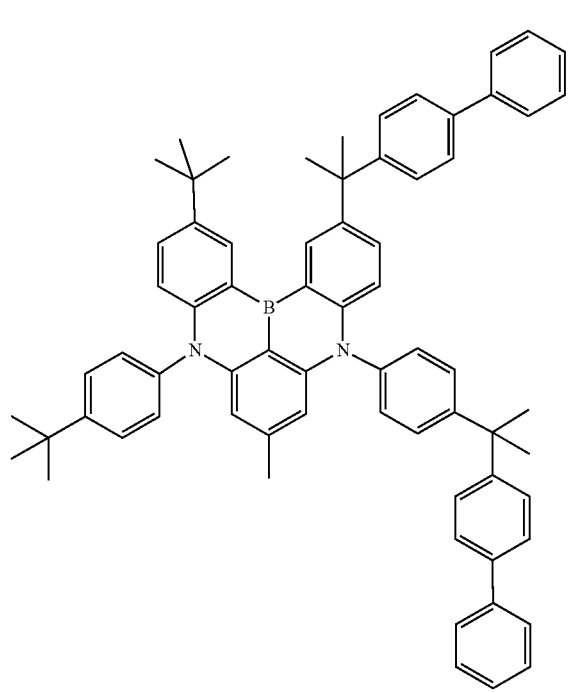
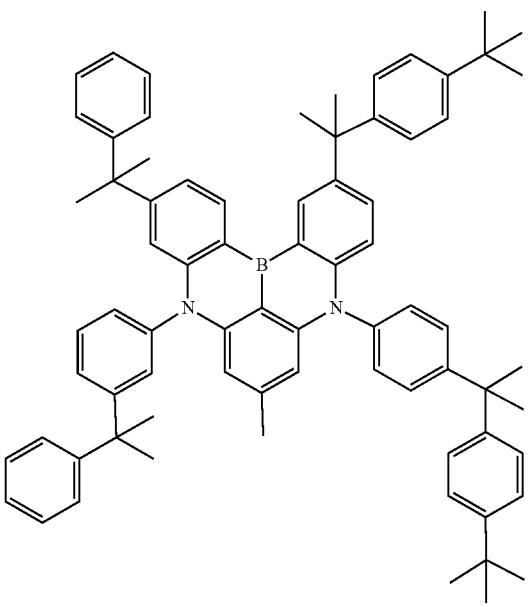

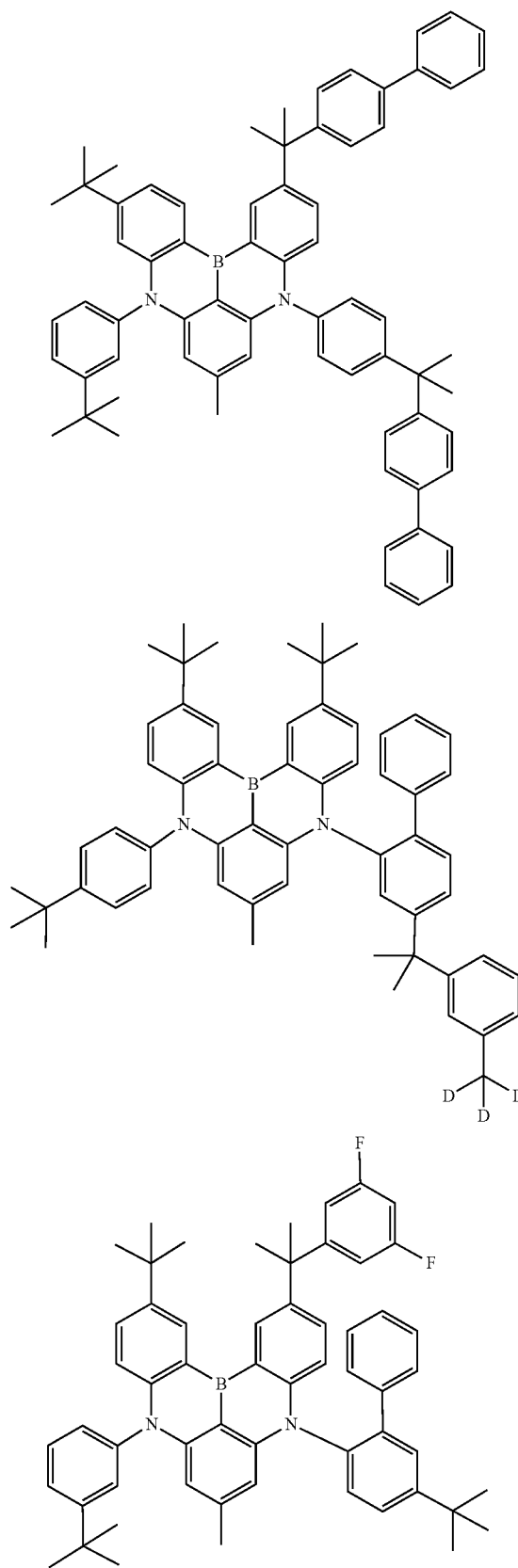
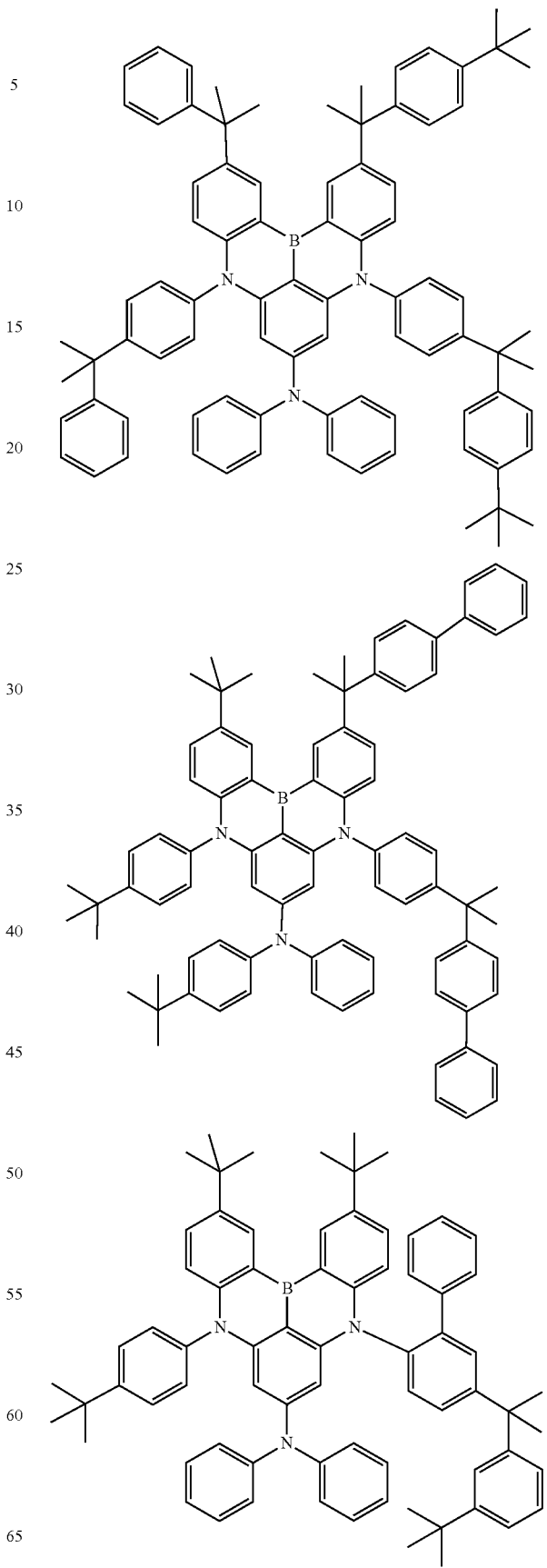

35
-continued
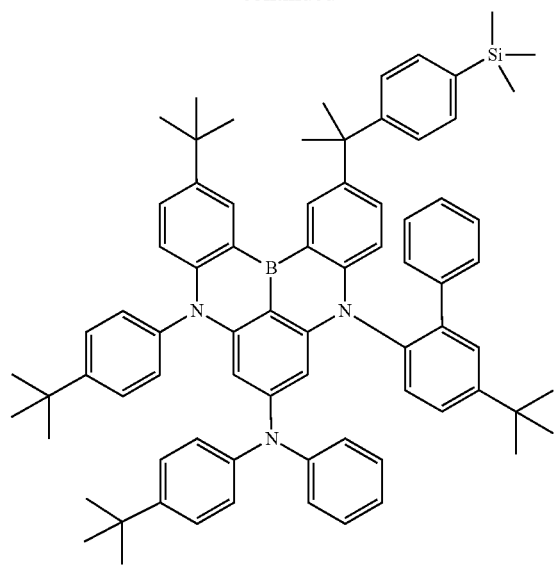
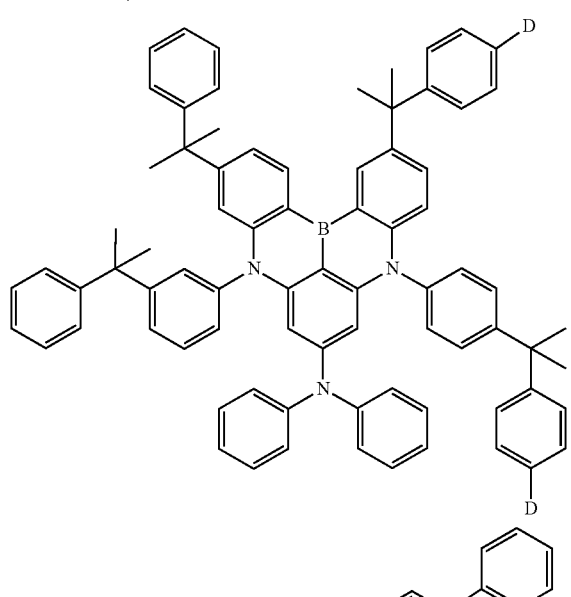
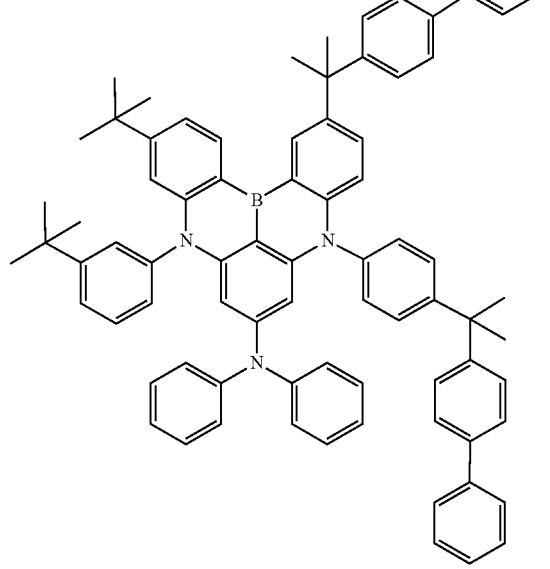
36
-continued
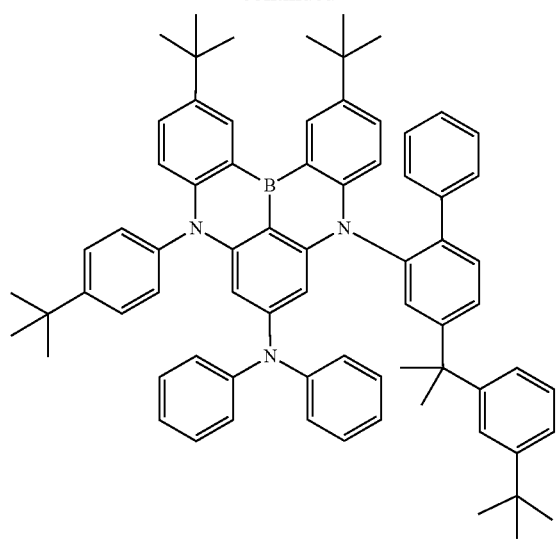
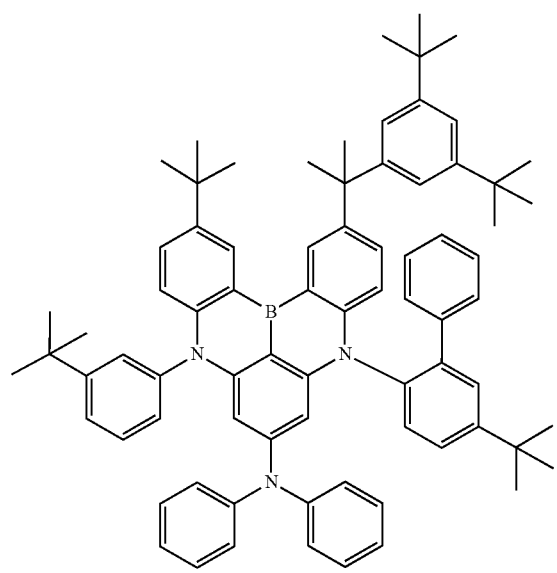
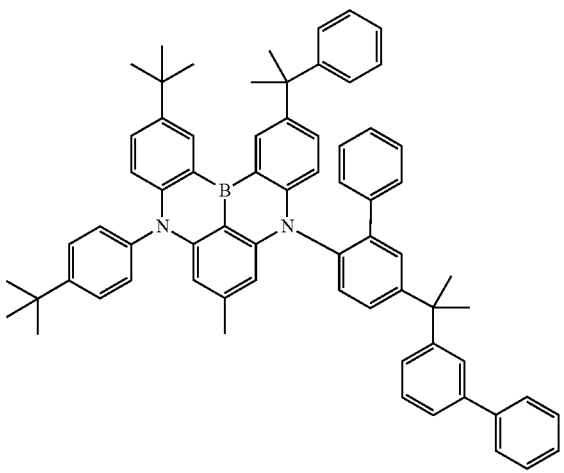

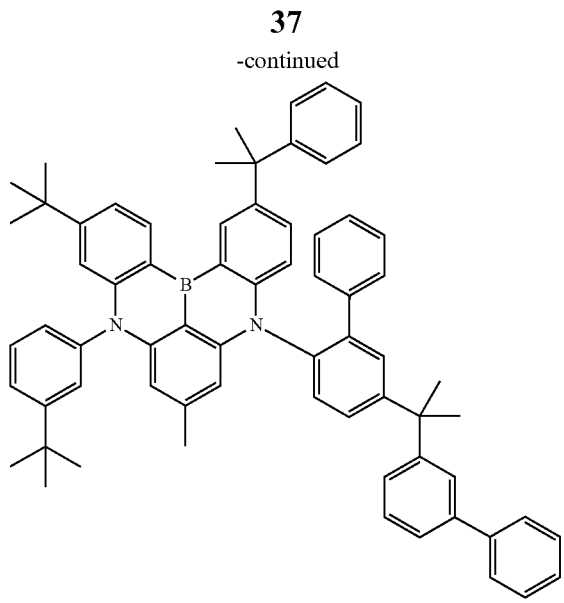

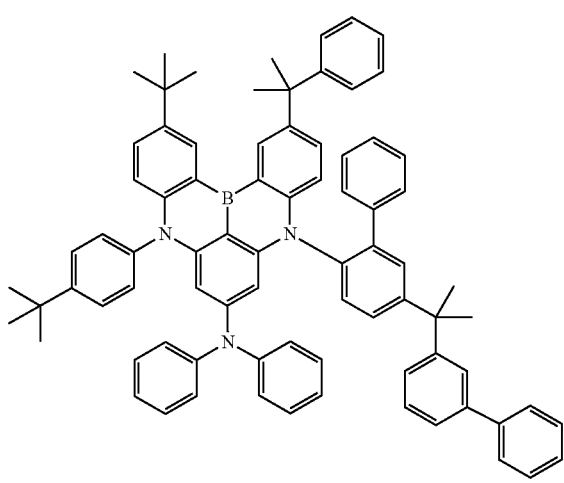

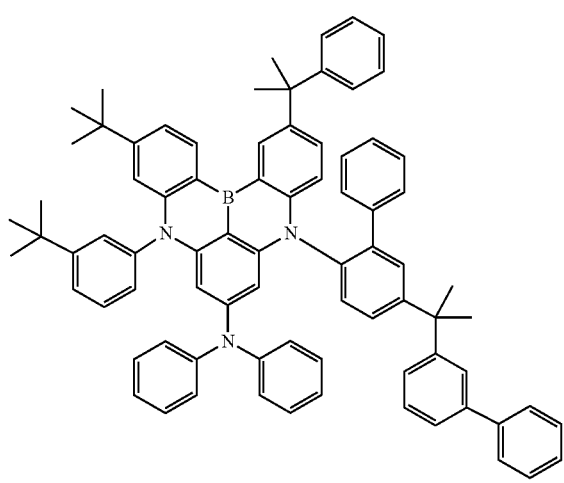

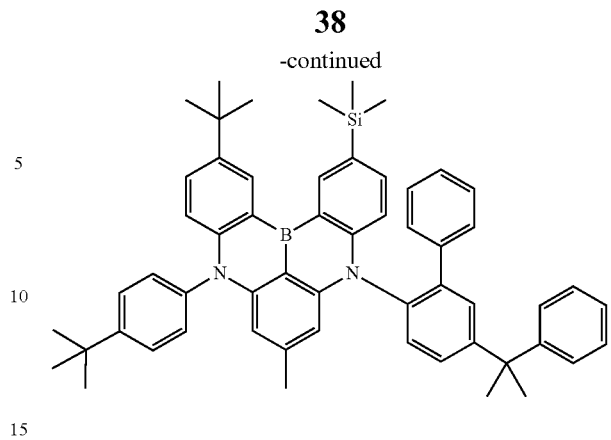

The compound according to an exemplary embodiment of the present specification may be prepared by a preparation method described below. If necessary, a substituent may be added or excluded, and a position of the substituent may be changed. Further, a starting material, a reactant, reaction conditions, and the like may be changed based on the technology known in the art.

For example, a core structure of the compound represented by Formula 1 may be prepared as in the following General Formula 1. The substituents may be bonded by a method known in the art, and the type or position of the substituent or the number of substituents may be changed according to the technology known in the art. The substituent may be bonded as in the following General Formula 1, but the bonding method is not limited thereto.

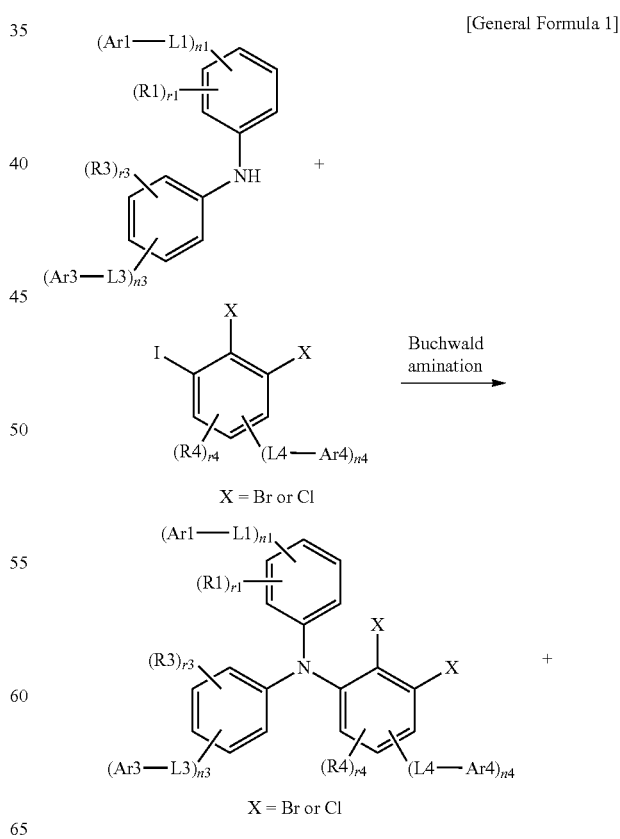

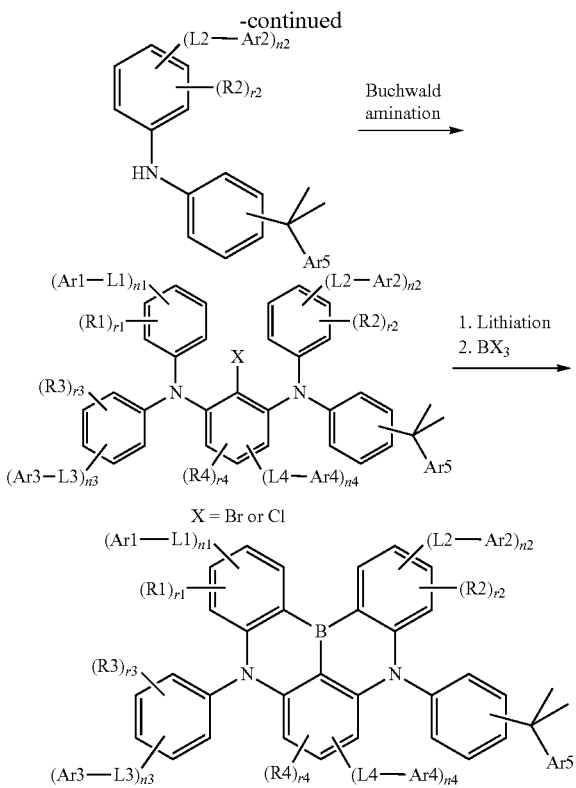

In General Formula 1, definitions of L1 to L4, Ar1 to Ar5, R1 to R4, r1 to r4, and n1 to n4 are the same as defined in Formula 1. General Formula 1 describes a preparation method when m is 1, but when an amine in which an alkylene group (L5) is directly linked to nitrogen is used in the second amination reaction, a compound in which m is 0 may be obtained. General Formula 1 describes only the case where L5 is dimethylmethylene, but when a compound, in which a methylene group is substituted with an alkyl group that is not a methyl group or an aryl group, is used, a compound in which L5 is not dimethylmethylene may be obtained.

According to an exemplary embodiment of the present specification, the compound represented by Formula 1 has a maximum emission peak of 420 nm to 470 nm. A more preferred range of the maximum emission peak is 450 nm to 465 nm. When the maximum emission peak satisfies the above range, the compound may be used as a blue light emitting dopant of a light emitting layer, thereby increasing the efficiency of a device.

The measurement equipment used to measure the maximum emission peak is a JASCO FP-8600 fluorescence spectrophotometer. Specifically, a sample for measuring fluorescence is prepared by dissolving a compound to be measured, using toluene as a solvent, at a concentration of 1 M, and the sample solution is put into a quartz cell, thereby measuring the fluorescence intensity and the maximum emission peak at room temperature (300 K) using a fluorescence measuring device.

The present specification provides an organic light emitting device including the above-described compound. When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

In the present specification, the 'layer' has a meaning compatible with a 'film' usually used in the art, and means a coating covering a target region. The size of the 'layer' is not limited, and the sizes of the respective 'layers' may be the same as or different from one another. In an exemplary embodiment, the size of the 'layer' may be the same as that of the entire device, may correspond to the size of a specific functional region, and may also be as small as a single sub-pixel.

In the present specification, when a specific A material is included in a B layer, this means both i) the fact that one or more A materials are included in one B layer and ii) the fact that the B layer is composed of one or more layers, and the A material is included in one or more layers of the multi-layered B layer.

In the present specification, when a specific A material is included in a C layer or a D layer, this means all of i) the fact that the A material is included in one or more layers of the C layer having one or more layers, ii) the fact that the A material is included in one or more layers of the D layer having one or more layers, and iii) the fact that the A material is included in each of the C layer having one or more layers and the D layer having one or more layers.

The present specification provides an organic light emitting device including: a first electrode; a second electrode provided to face the first electrode; and an organic material layer having one or more layers provided between the first electrode and the second electrode, in which the one or more layers of the organic material layer include the compound represented by Formula 1.

According to an exemplary embodiment of the present specification, the organic material layer includes a light emitting layer, and the light emitting layer includes the compound represented by Formula 1.

The organic light emitting device according to the present specification may include an additional organic material layer in addition to the light emitting layer. The organic material layer of the organic light emitting device of the present specification may also be composed of a single-layered structure, but may be composed of a multi-layered structure in which an organic material layer having two or more layers is stacked. For example, the organic light emitting device may have a structure including a hole injection layer, a hole transport layer, a light emitting layer, an electron transport layer, an electron injection layer, an electron blocking layer, a hole blocking layer, and the like. However, the structure of the organic light emitting device is not limited thereto, and may include a fewer number of organic layers.

The organic light emitting device according to an exemplary embodiment of the present specification includes a light emitting layer, and the light emitting layer includes the compound represented by Formula 1 and a compound represented by the following Formula H.

[Formula H]

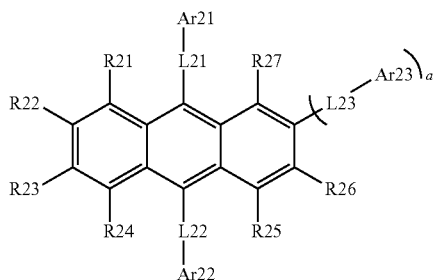

In Formula H,
L21 to L23 are the same as or different from each other, and are each independently a direct bond; a substituted or unsubstituted arylene group; or a substituted or unsubstituted heteroarylene group,
R21 to R27 are the same as or different from each other, and are each independently hydrogen; deuterium; a substituted or unsubstituted alkyl group; a substituted or unsubstituted cycloalkyl group; a substituted or unsubstituted silyl group; a substituted or unsubstituted aryl group; or a substituted or unsubstituted heteroaryl group,
Ar21 to Ar23 are the same as or different from each other, and are each independently a substituted or unsubstituted aryl group; or a substituted or unsubstituted heteroaryl group, and
a is 0 or 1.

In an exemplary embodiment of the present specification, when a is 0, hydrogen or deuterium is linked to the position of -L23-Ar23.

In an exemplary embodiment of the present specification, L21 to L23 are the same as or different from each other, and are each independently a direct bond; a substituted or unsubstituted arylene group; or a substituted or unsubstituted heteroarylene group.

In an exemplary embodiment of the present specification, L21 to L23 are the same as or different from each other, and are each independently a direct bond; a substituted or unsubstituted arylene group having 6 to 30 carbon atoms; or a heteroarylene group having 2 to 30 carbon atoms, which is substituted or unsubstituted and includes N, O, or S.

In an exemplary embodiment of the present specification, L21 to L23 are the same as or different from each other, and are each independently a direct bond; an arylene group having 6 to 30 carbon atoms; or a heteroarylene group having 2 to 30 carbon atoms, which includes N, O, or S. The arylene group or heteroarylene group is unsubstituted or substituted with an alkyl group having 1 to 10 carbon atoms, an aryl group having 6 to 30 carbon atoms, or a heteroaryl group having 2 to 30 carbon atoms.

In an exemplary embodiment of the present specification, L21 to L23 are the same as or different from each other, and are each independently a direct bond; a substituted or unsubstituted phenylene group; a substituted or unsubstituted biphenylene group; a substituted or unsubstituted naphthylene group; a substituted or unsubstituted divalent dibenzofuran group; or a substituted or unsubstituted divalent dibenzothiophene group.

In an exemplary embodiment of the present specification, L21 to L23 are the same as or different from each other, and are each independently a direct bond; a phenylene group; a biphenylene group; a naphthylene group; a divalent dibenzofuran group; or a divalent dibenzothiophene group.

In an exemplary embodiment of the present specification, L21 is a direct bond.

In an exemplary embodiment of the present specification, L22 is a direct bond; or a phenylene group. In an exemplary embodiment of the present specification, L23 is a direct bond.

In an exemplary embodiment of the present specification, Ar21 to Ar23 are the same as or different from each other, and are each independently a substituted or unsubstituted aryl group; or a substituted or unsubstituted heteroaryl group.

In an exemplary embodiment of the present specification, Ar21 to Ar23 are the same as or different from each other, and are each independently a substituted or unsubstituted aryl group having 6 to 30 carbon atoms; or a substituted or unsubstituted heteroaryl group having 2 to 30 carbon atoms.

In an exemplary embodiment of the present specification, Ar21 to Ar23 are the same as or different from each other, and are each independently a substituted or unsubstituted aryl group having 6 to 20 carbon atoms; or a substituted or unsubstituted heteroaryl group having 2 to 20 carbon atoms.

In an exemplary embodiment of the present specification, Ar21 to Ar23 are the same as or different from each other, and are each independently a substituted or unsubstituted monocyclic to tetracyclic aryl group; or a substituted or unsubstituted monocyclic to tetracyclic heteroaryl group.

In an exemplary embodiment of the present specification, Ar21 to Ar23 are the same as or different from each other, and are each independently a substituted or unsubstituted phenyl group; a substituted or unsubstituted biphenyl group; a substituted or unsubstituted terphenyl group; a substituted or unsubstituted naphthyl group; a substituted or unsubstituted anthracene group; a substituted or unsubstituted phenanthryl group; a substituted or unsubstituted phenalene group; a substituted or unsubstituted fluorenyl group; a substituted or unsubstituted benzofluorenyl group; a substituted or unsubstituted furan group; a substituted or unsubstituted thiophene group; a substituted or unsubstituted dibenzofuran group; a substituted or unsubstituted naphthobenzofuran group; a substituted or unsubstituted dibenzothiophene group; or a substituted or unsubstituted naphthobenzothiophene group.

In an exemplary embodiment of the present specification, Ar21 to Ar23 are the same as or different from each other, and are each independently a phenyl group; a biphenyl group; a terphenyl group; a naphthyl group; a phenanthryl group; a dibenzofuran group; a naphthobenzofuran group; a dibenzothiophene group; or a naphthobenzothiophene group.

In an exemplary embodiment of the present specification, Ar21 and Ar22 are the same as or different from each other, and are each independently a phenyl group; a biphenyl group; a terphenyl group; a naphthyl group; a phenanthryl group; a dibenzofuran group; a naphthobenzofuran group; a dibenzothiophene group; or a naphthobenzothiophene group.

In an exemplary embodiment of the present specification, Ar21 and Ar22 are the same as or different from each other, and are each independently a phenyl group; a biphenyl group; a terphenyl group; a 1-naphthyl group; a 2-naphthyl group; or a dibenzofuran group.

In an exemplary embodiment of the present specification, Ar23 is a phenyl group; a biphenyl group; or a naphthyl group.

In an exemplary embodiment of the present specification, Ar23 is a naphthyl group.

In an exemplary embodiment of the present specification, Ar21 and Ar22 are different from each other.

In an exemplary embodiment of the present specification, Ar21 is a substituted or unsubstituted aryl group, and Ar22 is a substituted or unsubstituted aryl group.

In an exemplary embodiment of the present specification, Ar21 is a substituted or unsubstituted aryl group, and Ar22 is a substituted or unsubstituted heteroaryl group.

In an exemplary embodiment of the present specification, Ar21 is an aryl group which is unsubstituted or substituted with deuterium, and Ar22 is an aryl group which is unsubstituted or substituted with deuterium.

In an exemplary embodiment of the present specification, Ar21 is an aryl group which is unsubstituted or substituted with deuterium, and Ar22 is a heteroaryl group which is unsubstituted or substituted with deuterium.

In an exemplary embodiment of the present specification, R21 to R27 are the same as or different from each other, and are each independently hydrogen; deuterium; a substituted or unsubstituted alkyl group; a substituted or unsubstituted cycloalkyl group; a substituted or unsubstituted silyl group; a substituted or unsubstituted aryl group; or a substituted or unsubstituted heteroaryl group.

In an exemplary embodiment of the present specification, R21 to R27 are the same as or different from each other, and are each independently hydrogen or deuterium.

In an exemplary embodiment of the present specification, R21 to R27 are hydrogen.

In an exemplary embodiment of the present specification, R21 to R27 are deuterium.

In an exemplary embodiment of the present specification, the compound of Formula H is represented by the following Formula H01 or H02.

[Formula H01]

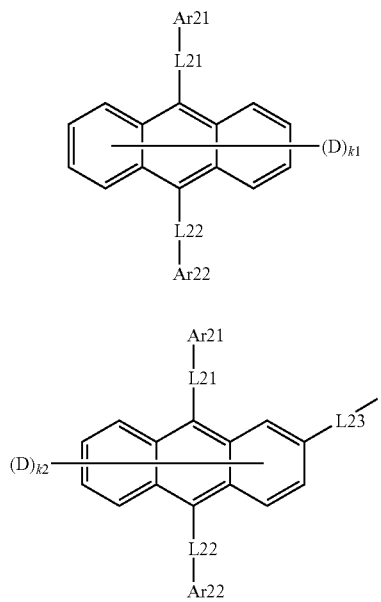

[Formula H02]

In Formulae H01 and H02,
definitions of L21 to L23 and Ar21 to Ar23 are the same as defined in Formula H, D means deuterium, k1 is an integer from 0 to 8, and k2 is an integer from 0 to 7.

In an exemplary embodiment of the present specification, the compound represented by Formula H is any one selected from the following compounds.

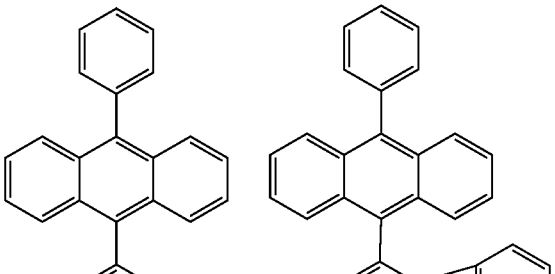

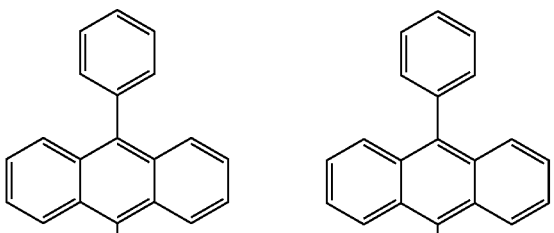

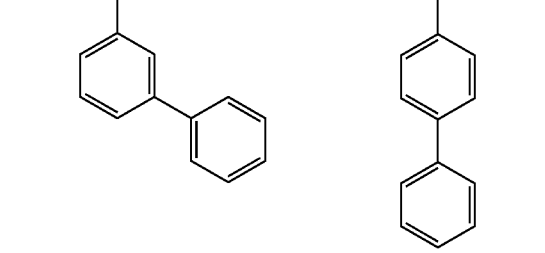

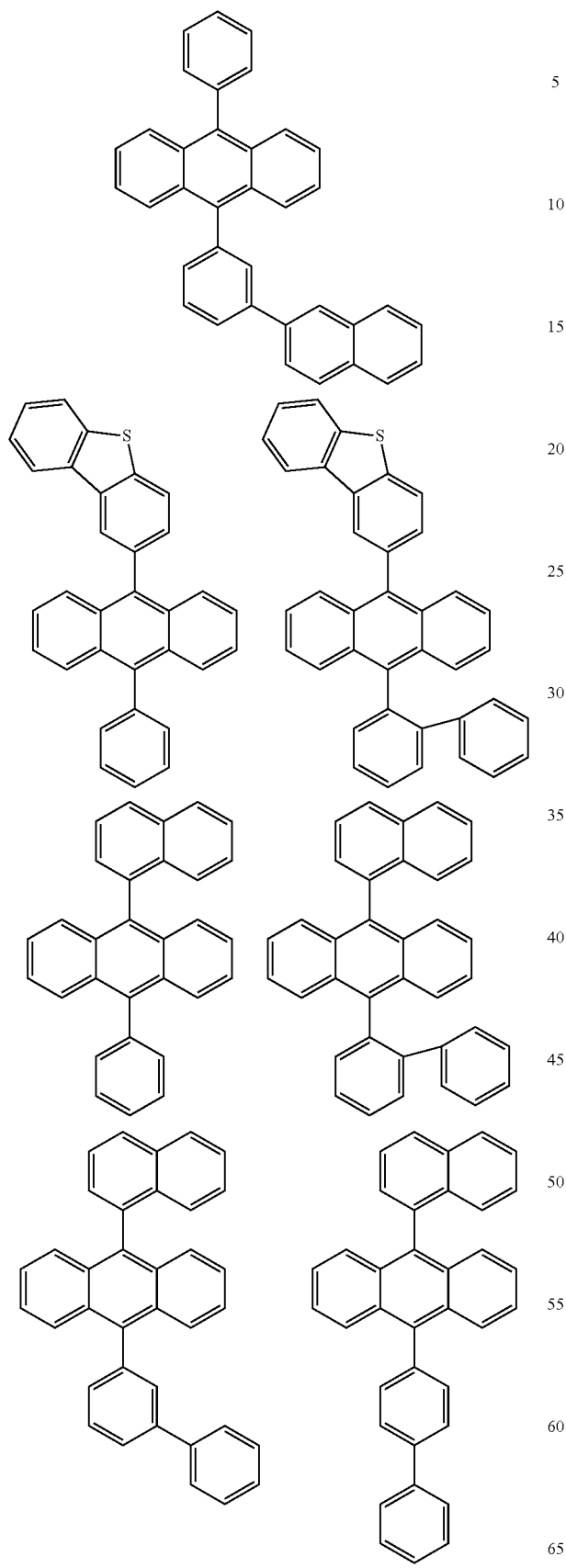
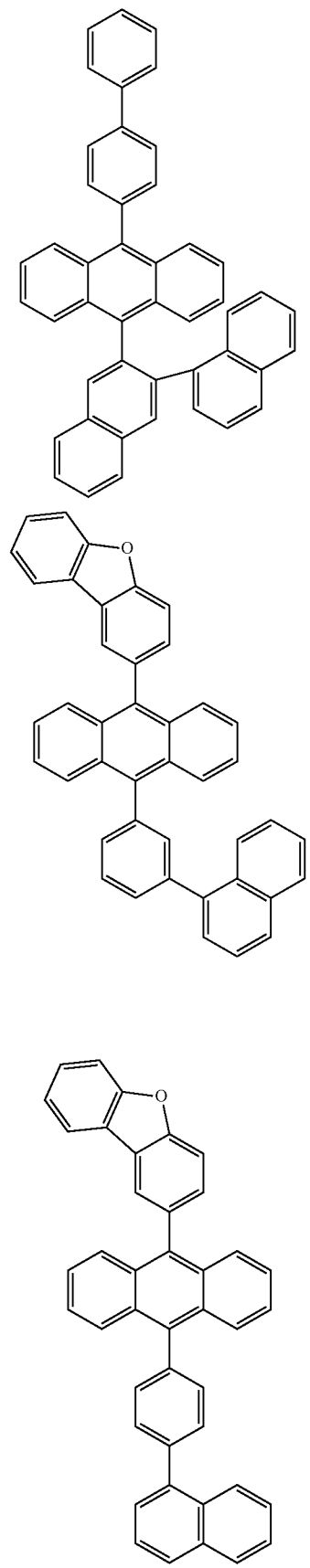

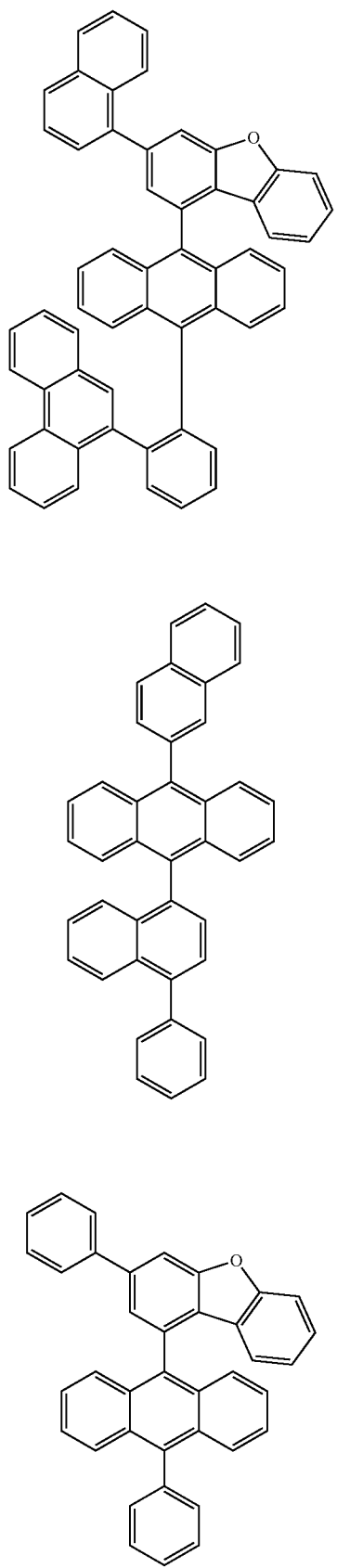
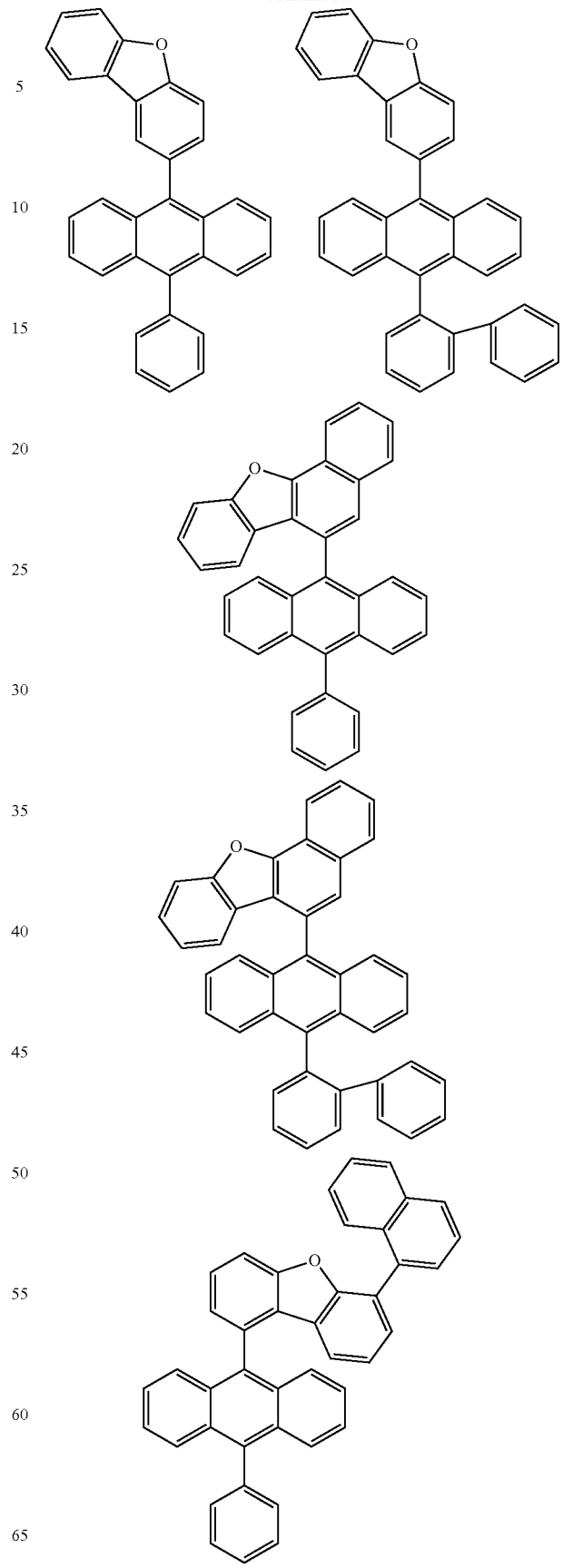

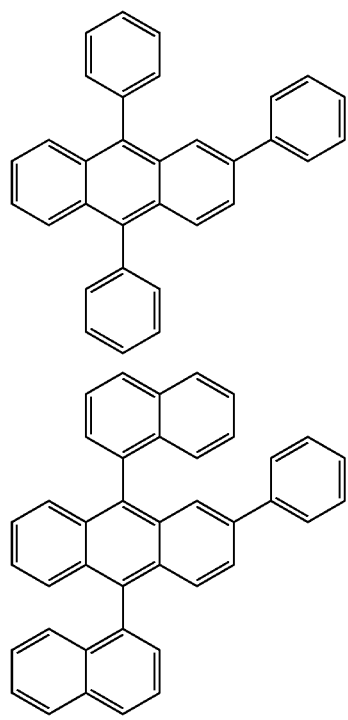
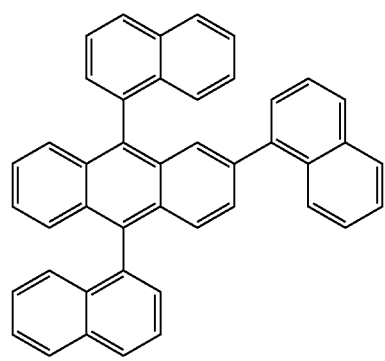
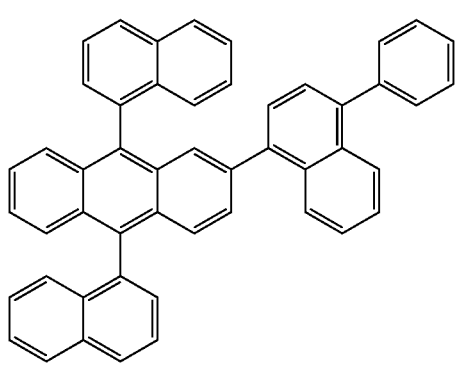
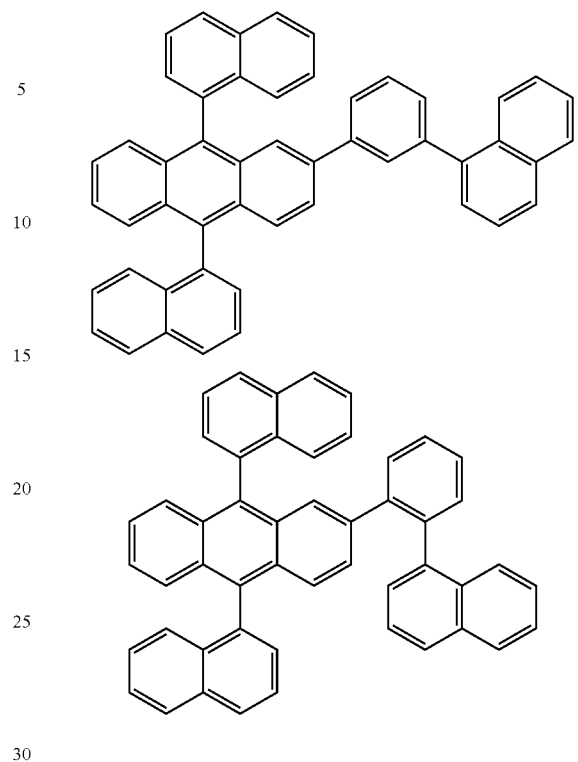

-continued
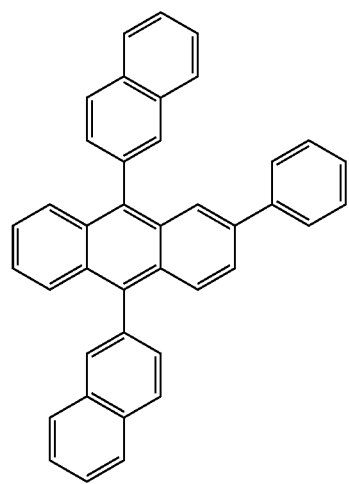
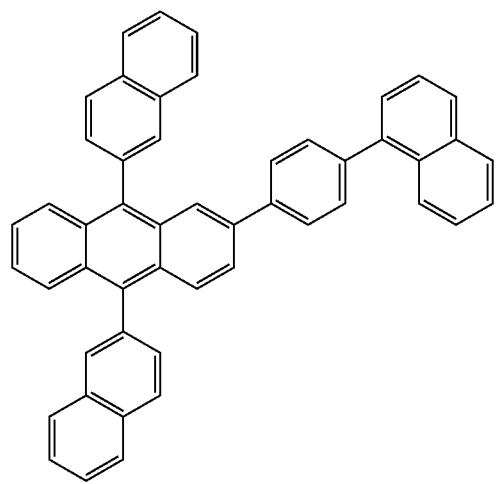
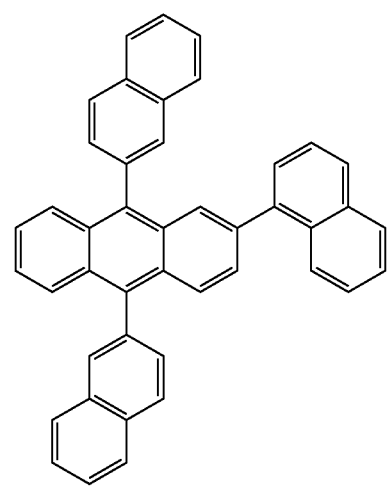
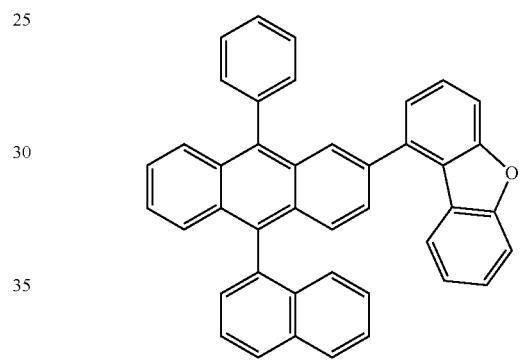
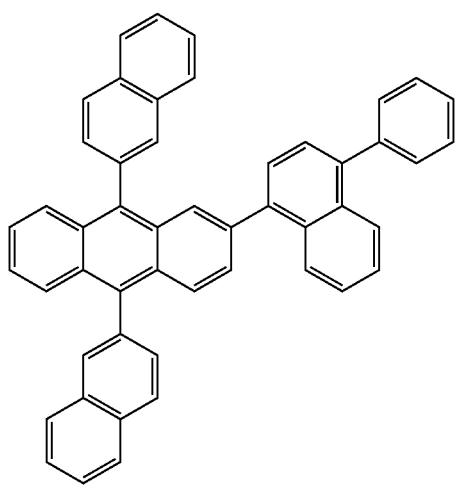
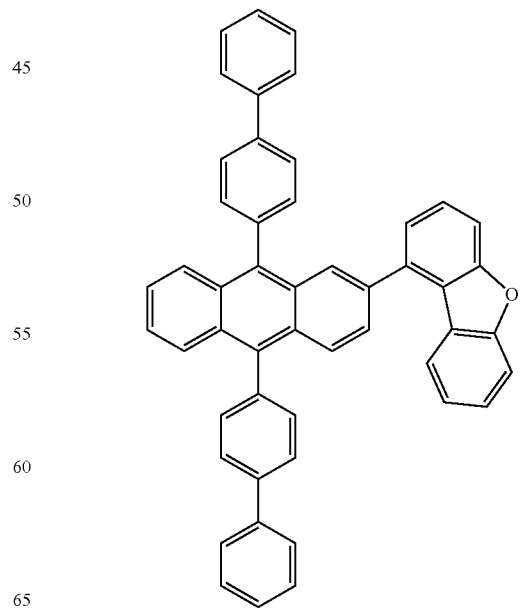

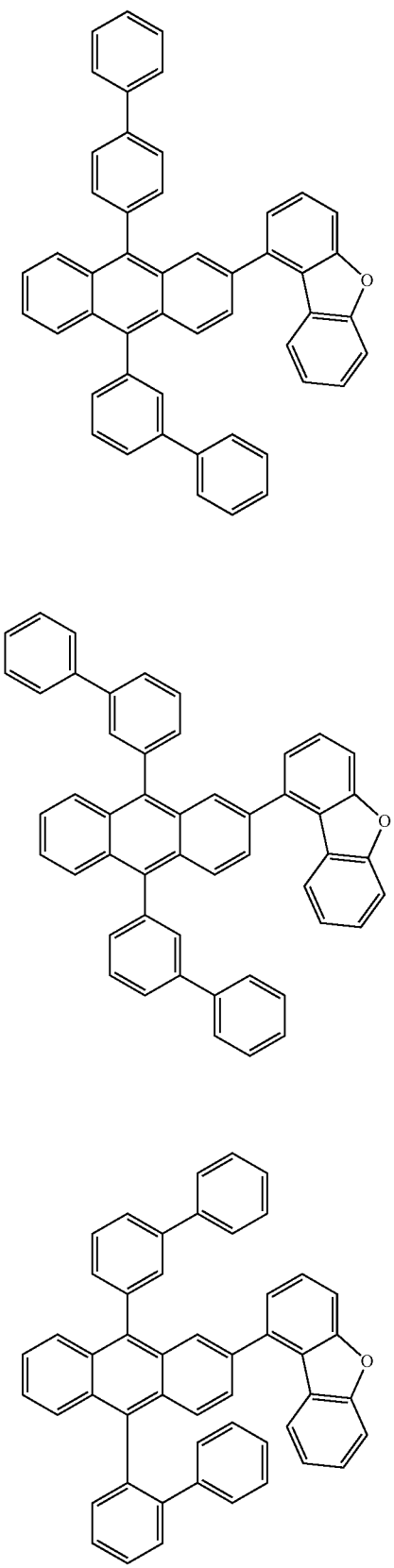
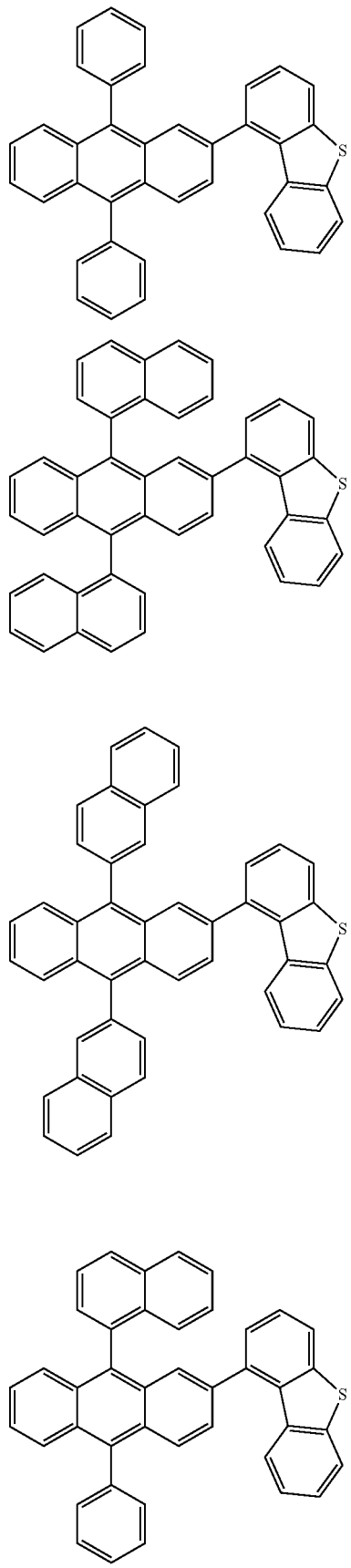

-continued
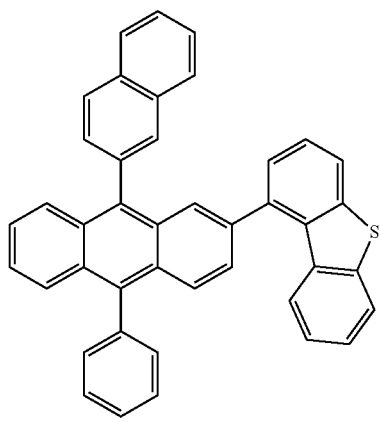
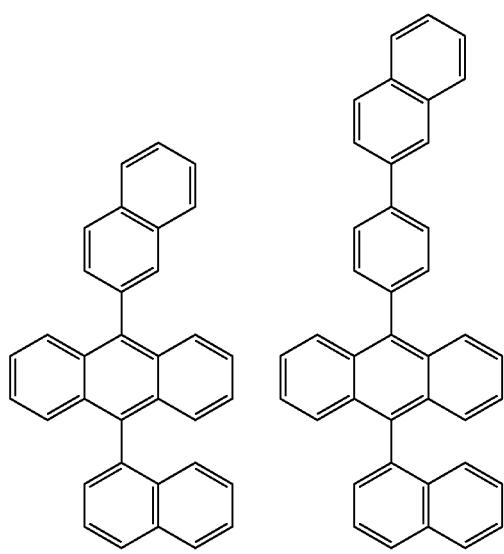
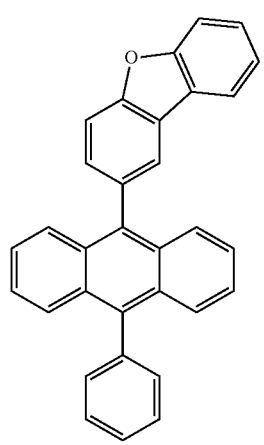
-continued
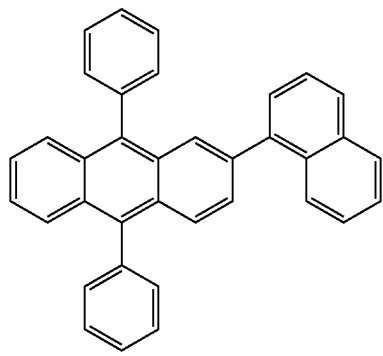
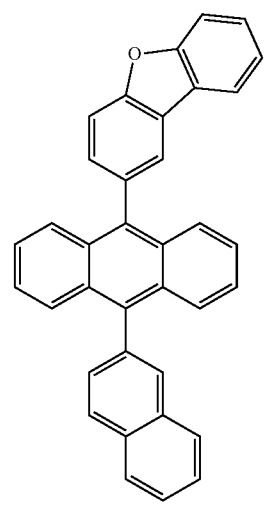
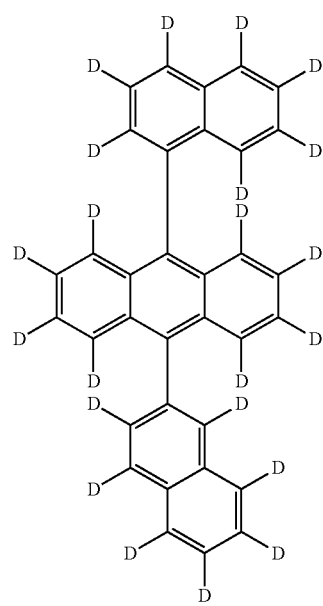

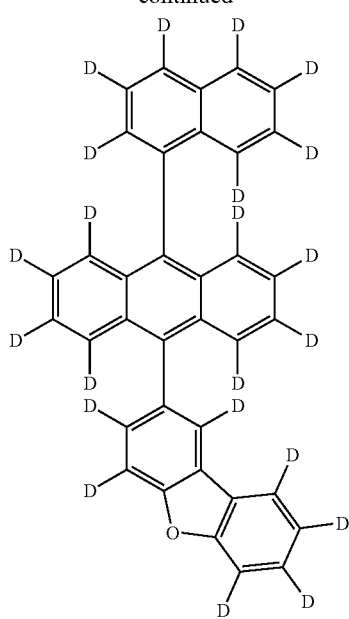
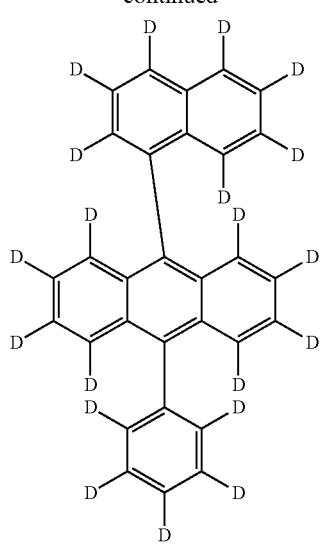
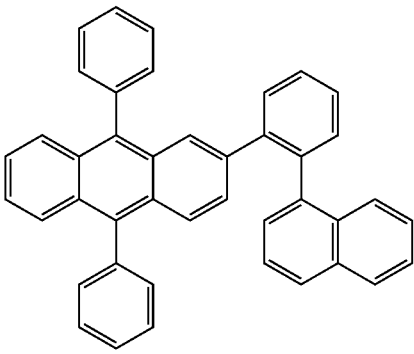
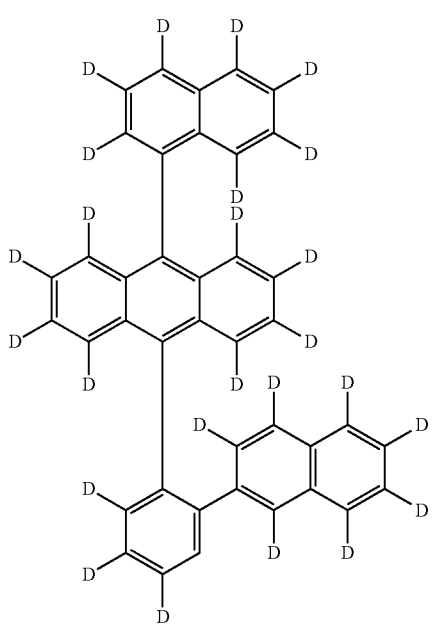
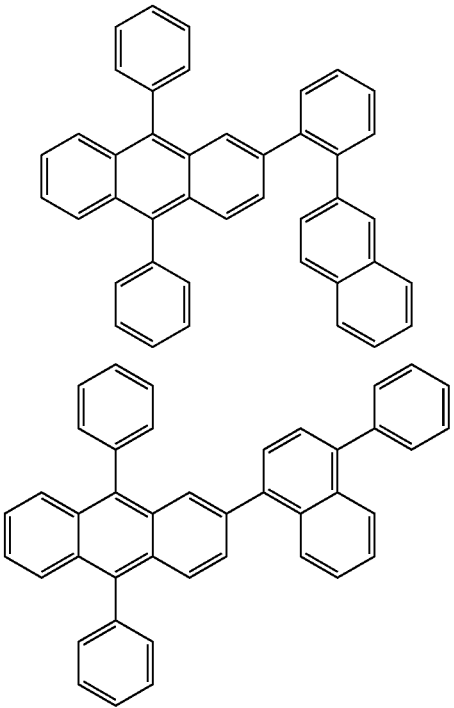

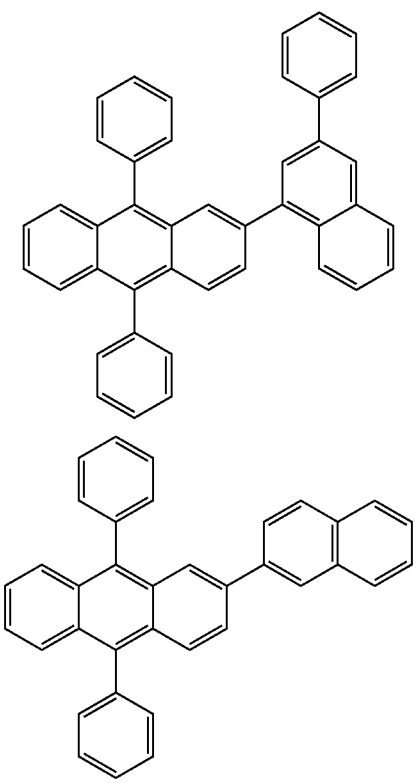
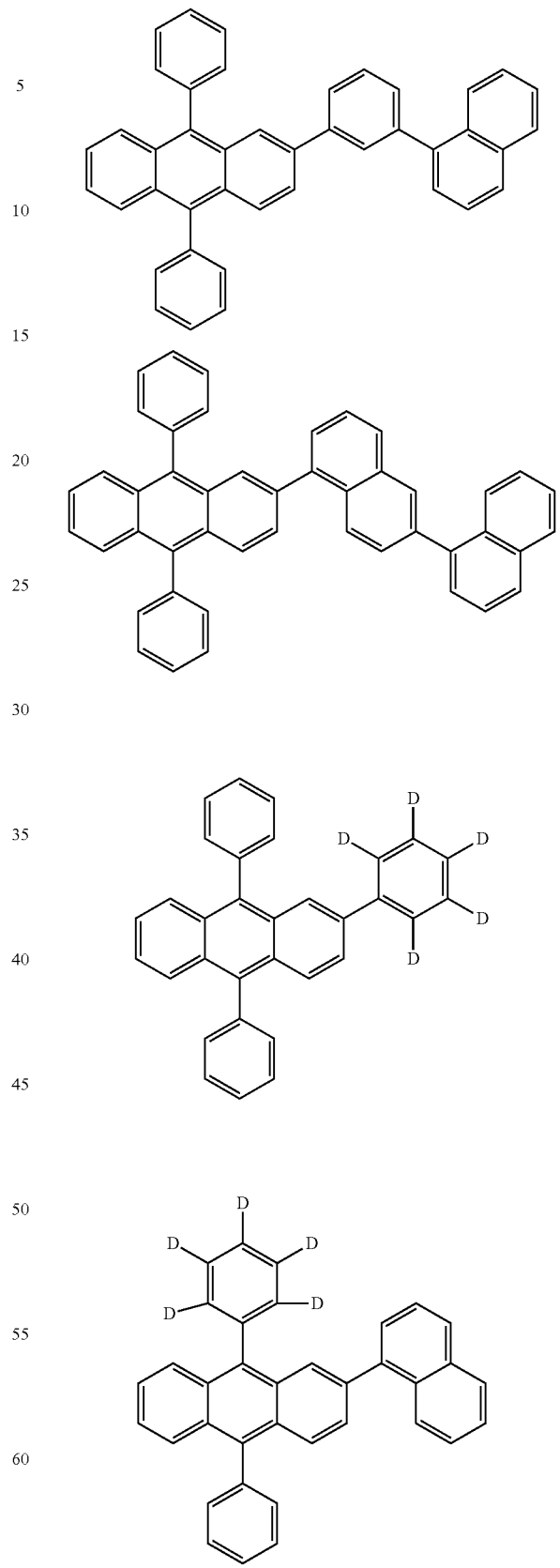

61
-continued
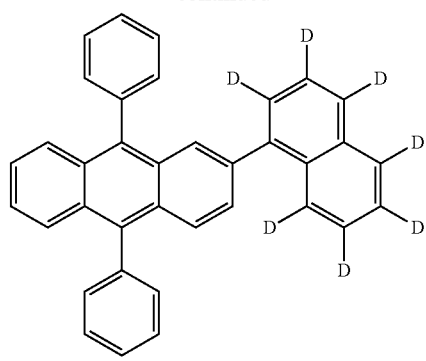
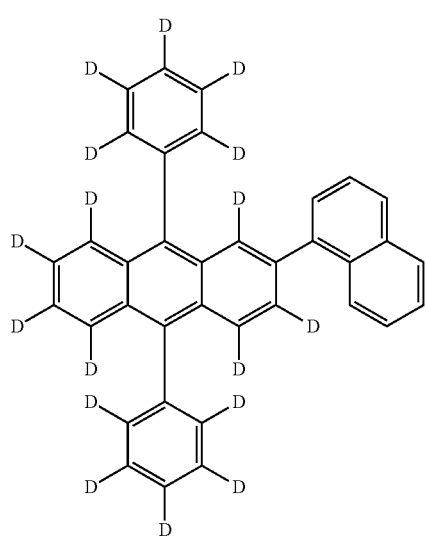
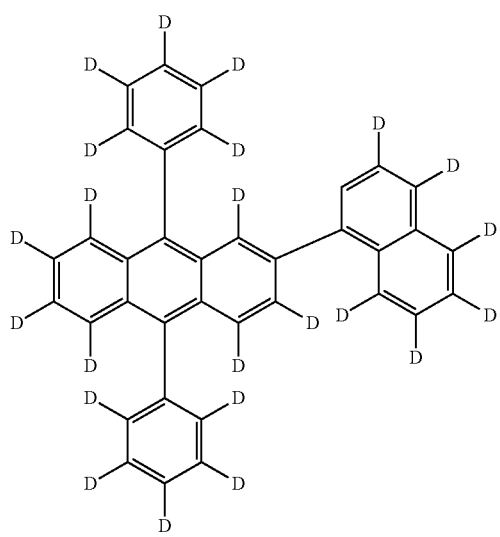
62
-continued
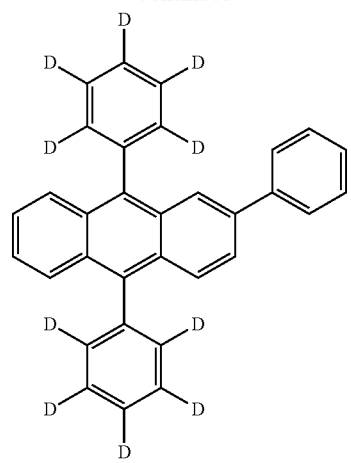
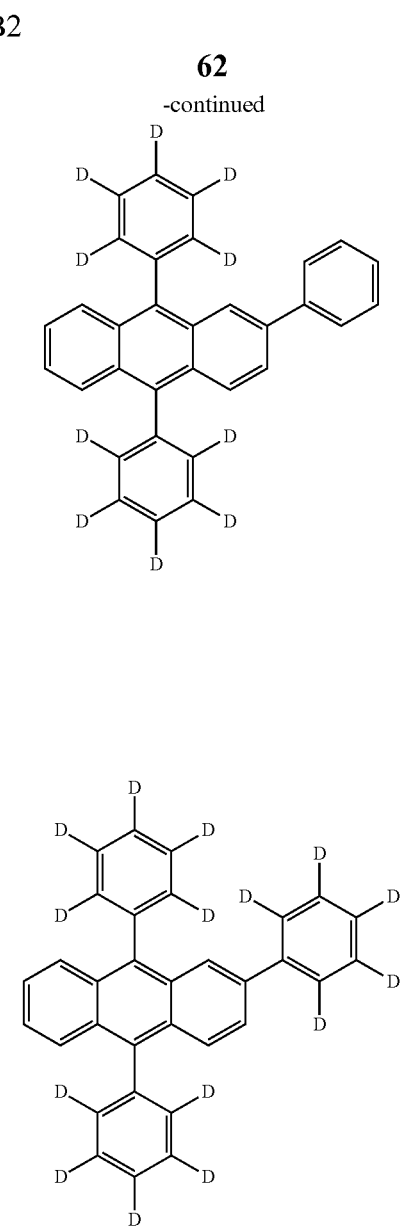
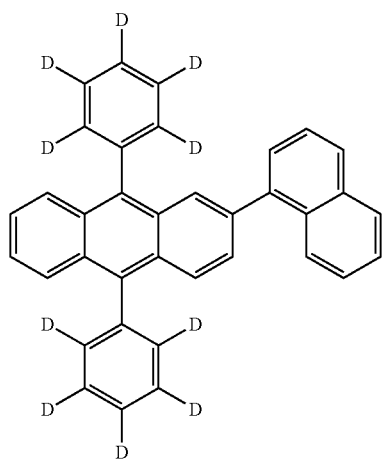

63
-continued
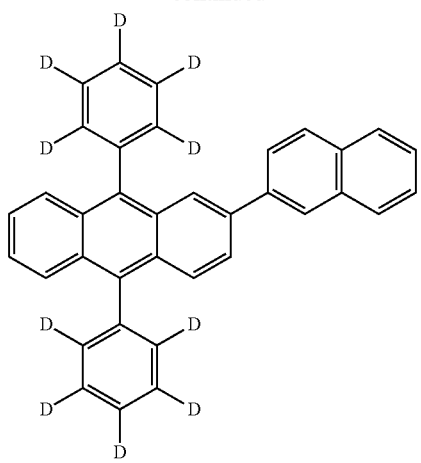
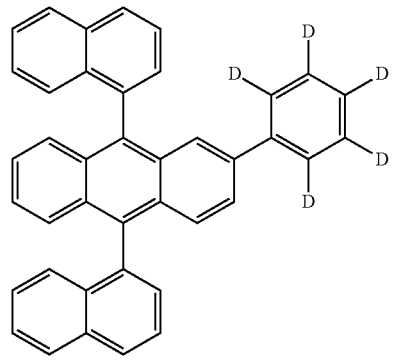
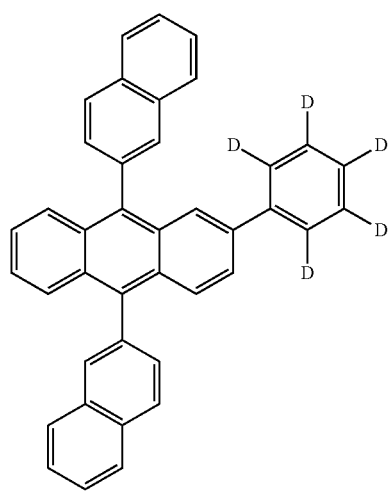
64
-continued
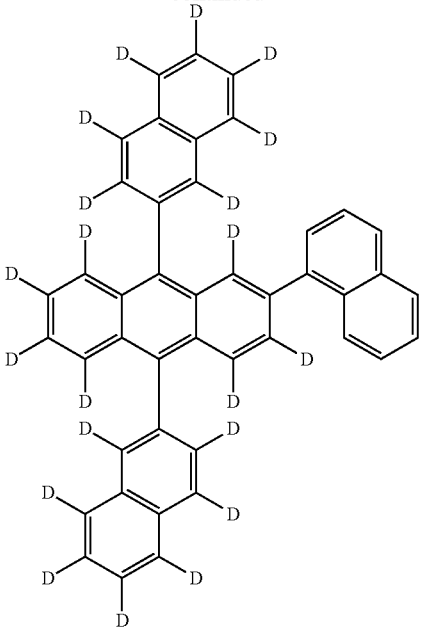
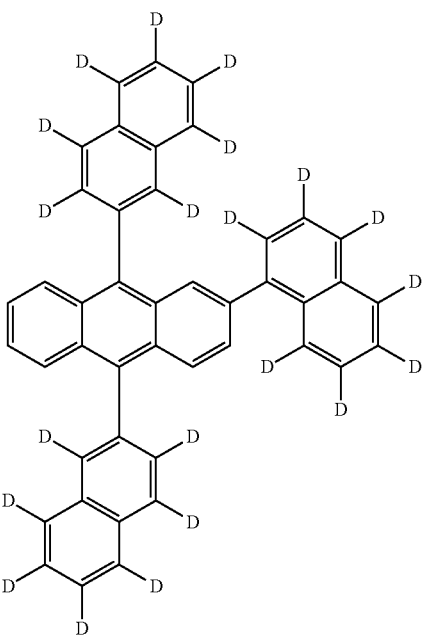

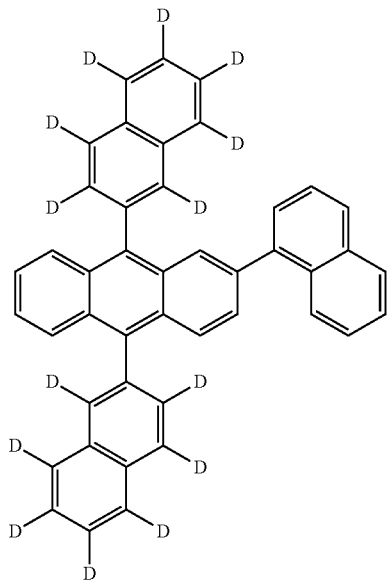
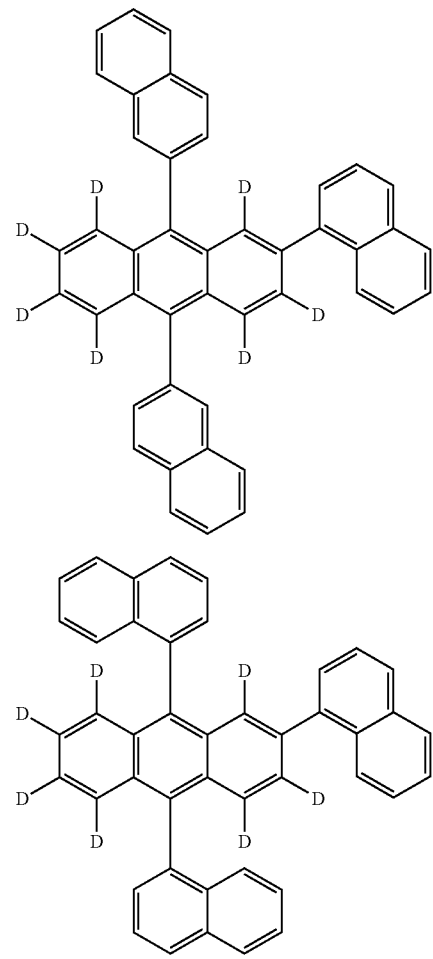
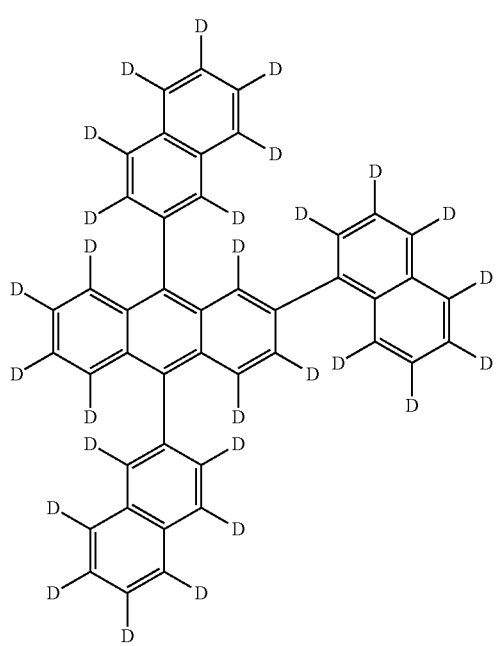
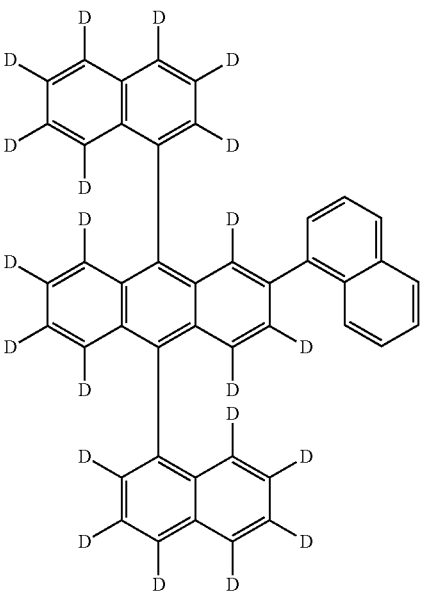

67
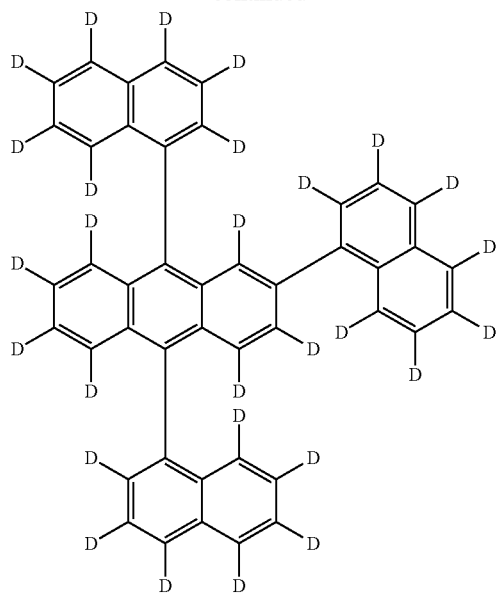
68
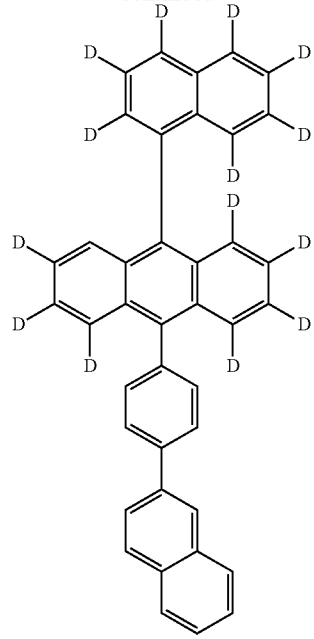
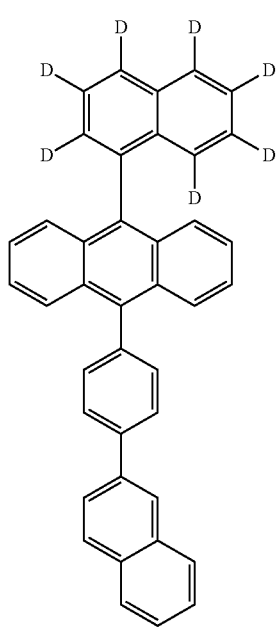
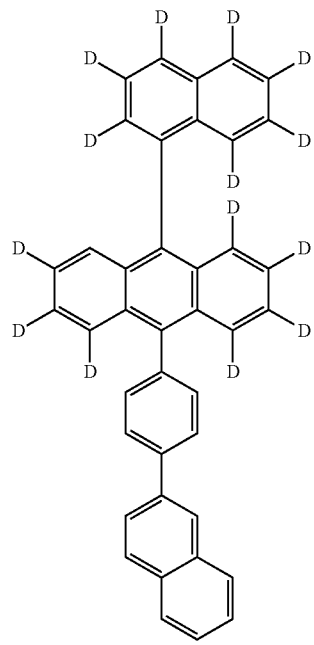

69
-continued
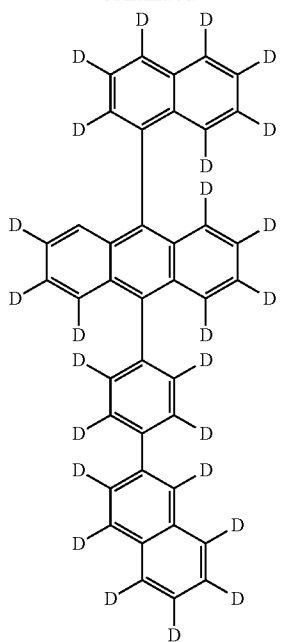
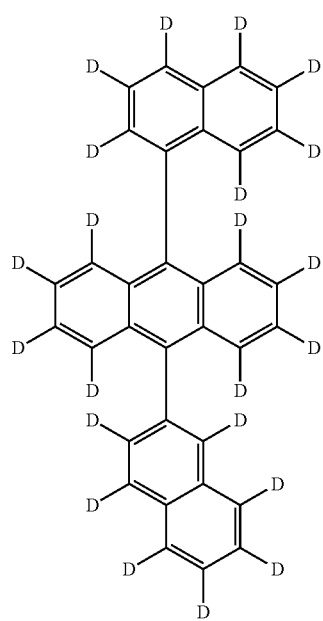
70
-continued
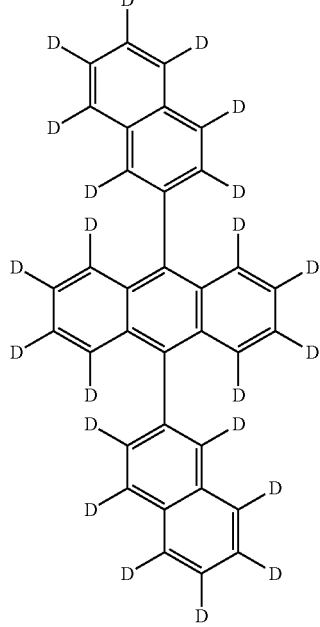
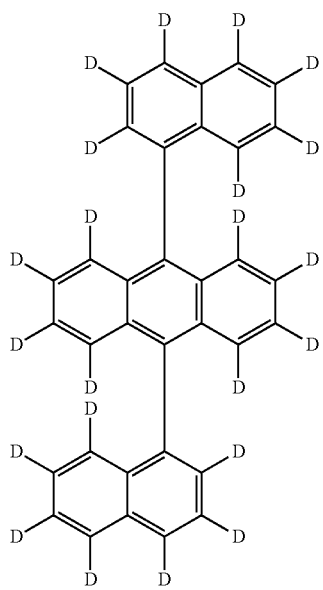

-continued
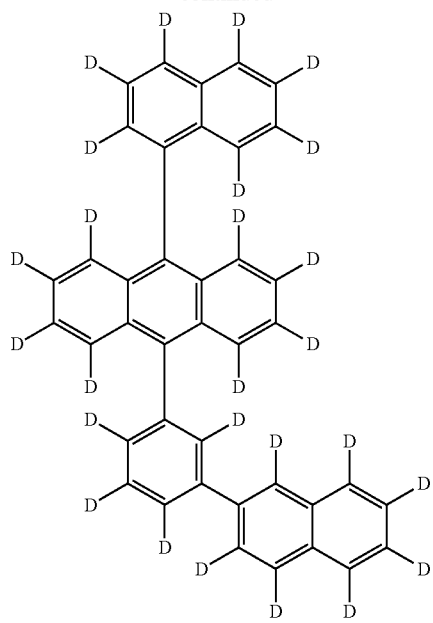
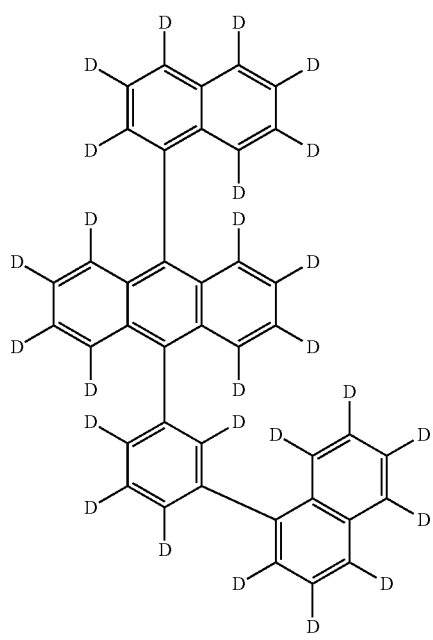
-continued
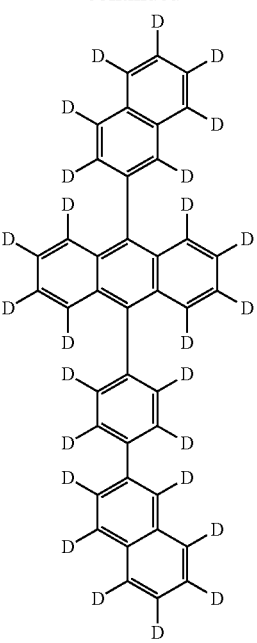
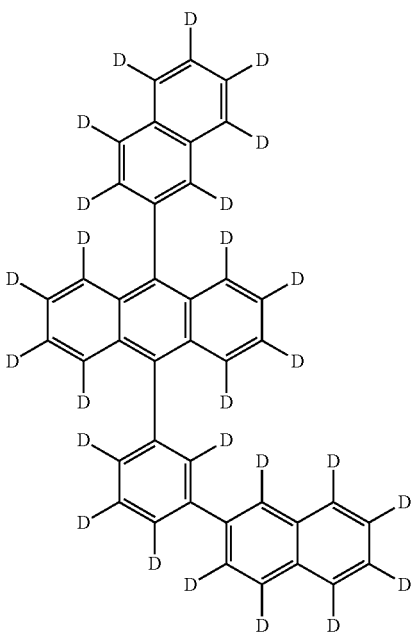

-continued
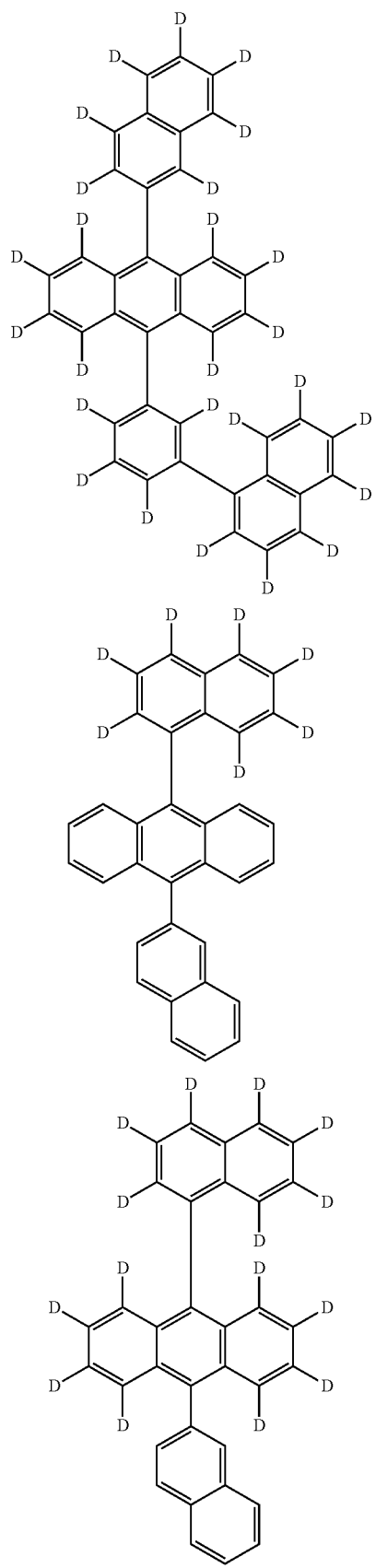
-continued
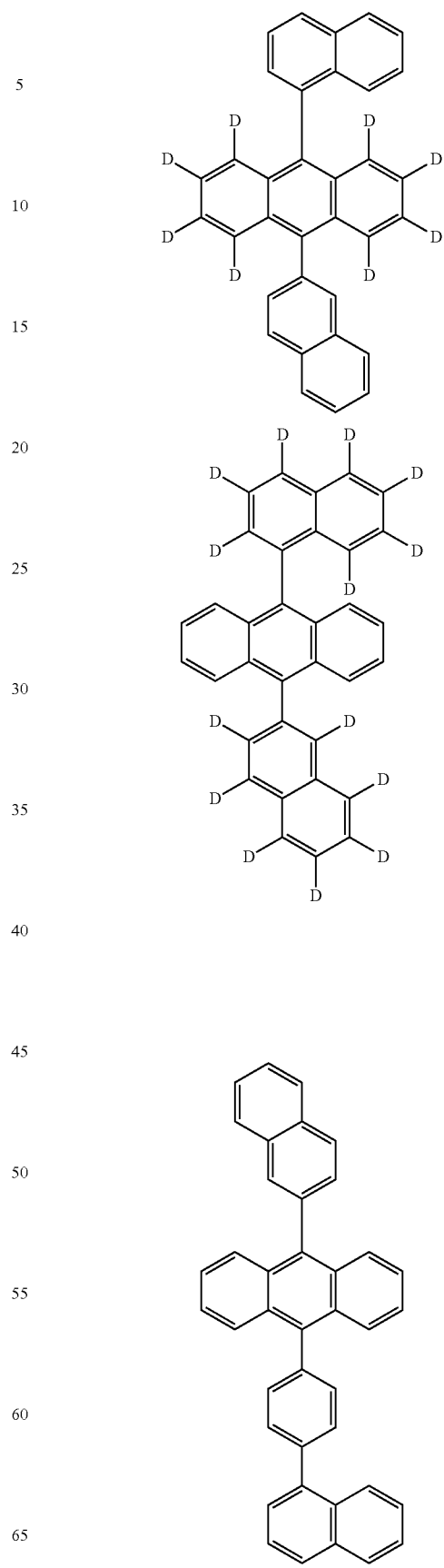

-continued

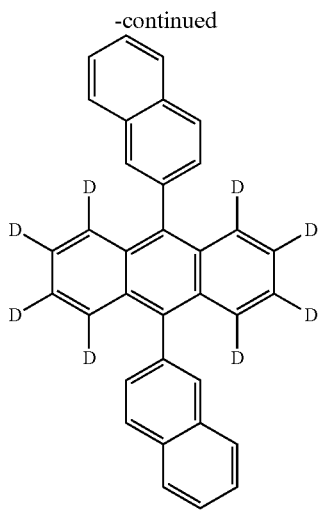

The organic light emitting device according to an exemplary embodiment of the present specification includes a light emitting layer, and the light emitting layer includes the compound represented by Formula 1 as a dopant of the light emitting layer, and includes the compound represented by Formula H as a host of the light emitting layer.

In an exemplary embodiment of the present specification, the content of the compound represented by Formula 1 is 0.01 part by weight to 30 parts by weight; 0.1 part by weight to 20 parts by weight; or 0.5 part by weight to 10 parts by weight, based on 100 parts by weight of the compound represented by Formula H.

One compound or two or more compounds represented by Formula H may be included in an organic material layer (specifically, a light emitting layer). Specifically, a first host represented by Formula H and a second host represented by Formula H may be included in the organic material layer.

A weight ratio of the first host represented by Formula H to the second host represented by Formula H is 95:5 to 5:95, and more preferably 30:70 to 70:30.

In an exemplary embodiment of the present specification, the first host and the second host are different from each other.

In an exemplary embodiment of the present specification, the light emitting layer includes one or two or more compounds represented by Formula H.

In an exemplary embodiment of the present specification, the light emitting layer including the compound represented by Formula 1 and the compound represented by Formula H takes on a blue color.

The organic light emitting device according to an exemplary embodiment of the present specification includes a light emitting layer having two or more layers, and at least one of the light emitting layer having two or more layers includes the compound represented by Formula 1 and the compound represented by Formula H. The light emitting layer including the compound represented by Formula 1 and the compound represented by Formula H takes on a blue color, and a light emitting layer which does not include the compound represented by Formula 1 and the compound represented by Formula H may include a blue, red, or green light emitting compound known in the art.

In an exemplary embodiment of the present specification, the organic material layer includes an electron blocking layer, a hole injection layer, or a hole transport layer, and the electron blocking layer, the hole injection layer, or the hole transport layer includes the compound represented by Formula 1.

In an exemplary embodiment of the present specification, the organic material layer includes a hole blocking layer, an electron injection layer, or an electron transport layer, and the hole blocking layer, the electron injection layer, or the electron transport layer includes the compound represented by Formula 1.

In an exemplary embodiment of the present specification, the organic material layer further includes one or two or more layers selected from the group consisting of a hole injection layer, a hole transport layer, a light emitting layer, an electron transport layer, an electron injection layer, a hole blocking layer, and an electron blocking layer.

In an exemplary embodiment of the present specification, the organic light emitting device includes: a first electrode; a second electrode provided to face the first electrode; a light emitting layer provided between the first electrode and the second electrode; and an organic material layer having two or more layers provided between the light emitting layer and the first electrode, or between the light emitting layer and the second electrode.

In an exemplary embodiment of the present specification, as the organic material layer having two or more layers, two or more may be selected from the group consisting of a light emitting layer, a hole transport layer, a hole injection layer, a layer which simultaneously transports and injects holes, and an electron blocking layer.

In an exemplary embodiment of the present specification, the first electrode is an anode, and the second electrode is a cathode.

In an exemplary embodiment of the present specification, the first electrode is a cathode, and the second electrode is an anode.

In an exemplary embodiment of the present specification, the organic light emitting device may be a normal type organic light emitting device in which an anode, an organic material layer having one or more layers, and a cathode are sequentially stacked on a substrate.

In an exemplary embodiment of the present specification, the organic light emitting device may be an inverted type organic light emitting device in which a cathode, an organic material layer having one or more layers, and an anode are sequentially stacked on a substrate.

Figure 2:
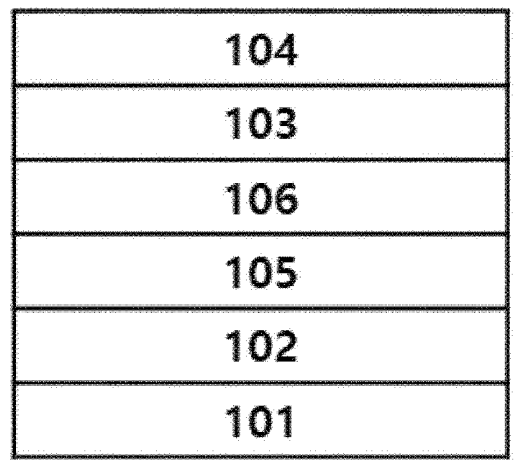
Figures 3, 4:
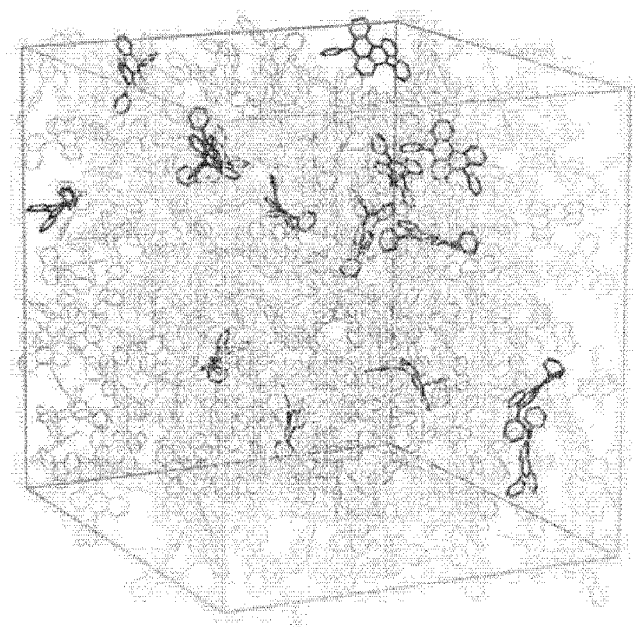
FIGS. 4 and 5 illustrate a system including Comparative Compounds BD-Y1 and BD-Y2.

For example, the structure of the organic light emitting device according to an exemplary embodiment of the present specification is exemplified in FIGS. 1 to 3. FIGS. 1 to 3 exemplify an organic light emitting device, and the organic light emitting device is not limited thereto.

FIG. 1 exemplifies the structure of an organic light emitting device in which an anode 102, a light emitting layer 103, and a cathode 104 are sequentially stacked on a substrate 101. The compound represented by Formula 1 is included in the light emitting layer. According to an exemplary embodiment of the present specification, the compound represented by Formula H may be additionally included in the light emitting layer.

FIG. 2 exemplifies the structure of an organic light emitting device in which an anode 102, a hole injection layer 105, a hole transport layer 106, a light emitting layer 103, and a cathode 104 are sequentially stacked on a substrate 101. According to an exemplary embodiment of the present specification, the compound represented by Formula 1 is included in the light emitting layer. According to an exemplary embodiment of the present specification, the compound represented by Formula H may be additionally included in the light emitting layer. According to another exemplary embodiment, the compound represented by Formula 1 is included in the hole injection layer or the hole transport layer.

FIG. 3 exemplifies the structure of an organic light emitting device in which an anode 102, a hole injection layer 105, a first hole transport layer 106a, a second hole transport layer 106b, a light emitting layer 103, a layer 107 which simultaneously injects and transports electrons, and a cathode 104 are sequentially stacked on a substrate 101. According to an exemplary embodiment of the present specification, the compound represented by Formula 1 is included in the light emitting layer. According to an exemplary embodiment of the present specification, the compound represented by Formula H may be additionally included in the light emitting layer. According to another exemplary embodiment, the compound represented by Formula 1 is included in the hole injection layer, the first hole transport layer, the second hole transport layer, the light emitting layer, or the layer which simultaneously injects and transports electrons.

The organic light emitting device of the present specification may be manufactured by the materials and methods known in the art, except that a light emitting layer includes the compound, that is, the compound represented by Formula 1 and the compound represented by Formula H.

When the organic light emitting device includes a plurality of organic material layers, the organic material layers may be formed of the same material or different materials.

For example, the organic light emitting device of the present specification may be manufactured by sequentially stacking a first electrode, an organic material layer, and a second electrode on a substrate. In this case, the organic light emitting device of the present specification may be manufactured by depositing a metal or a metal oxide having conductivity, or an alloy thereof on a substrate to form an anode, forming an organic material layer including a hole injection layer, a hole transport layer, a light emitting layer, and an electron transport layer thereon, and then depositing a material, which may be used as a cathode, thereon, by using a physical vapor deposition (PVD) method such as sputtering or e-beam evaporation. Further, the compound represented by Formula 1 or the compound represented by Formula H may be formed as an organic material layer by not only a vacuum deposition method, but also a solution application method when an organic light emitting device is manufactured. Here, the solution application method means spin coating, dip coating, doctor blading, inkjet printing, screen printing, a spray method, roll coating, and the like, but is not limited thereto.

In addition to the method as described above, an organic light emitting device may also be made by sequentially depositing a cathode material, an organic material layer, and an anode material on a substrate. However, the manufacturing method is not limited thereto.

As the anode material, materials having a high work function are usually preferred so as to facilitate the injection of holes into an organic material layer. Examples thereof include: a metal, such as vanadium, chromium, copper, zinc, and gold, or an alloy thereof; a metal oxide, such as zinc oxide, indium oxide, indium tin oxide (ITO), and indium zinc oxide (IZO); a combination of a metal and an oxide, such as $ZnO:Al$ or $SnO_2:Sb$; a conductive polymer, such as poly(3-methylthiophene), poly[3,4-(ethylene-1,2-dioxy)thiophene] (PEDOT), polypyrrole, and polyaniline; and the like, but are not limited thereto.

As the cathode material, materials having a low work function are usually preferred so as to facilitate the injection of electrons into an organic material layer. Examples thereof include: a metal, such as magnesium, calcium, sodium, potassium, titanium, indium, yttrium, lithium, gadolinium, aluminum, silver, tin, and lead, or an alloy thereof; a multi-layer structured material, such as $LiF/Al$ or $LiO_2/Al$; and the like, but are not limited thereto.

The organic light emitting device according to the present specification may include an additional light emitting layer in addition to the light emitting layer including the compound represented by Formula 1 or the compound represented by Formula H. The additional light emitting layer may include a host material and a dopant material. Examples of the host material include a fused aromatic ring derivative, or a hetero ring-containing compound, and the like. Specific examples of the fused aromatic ring derivative include anthracene derivatives, pyrene derivatives, naphthalene derivatives, pentacene derivatives, phenanthrene compounds, fluoranthene compounds, and the like, and specific examples of the hetero ring-containing compound include dibenzofuran derivatives, ladder-type furan compounds, pyrimidine derivatives, and the like, but the examples are not limited thereto.

Examples of the dopant material include an aromatic amine derivative, a styrylamine compound, a boron complex, a fluoranthene compound, a metal complex, and the like. Specifically, the aromatic amine derivative is a fused aromatic ring derivative having a substituted or unsubstituted arylamine group, and examples thereof include pyrene, anthracene, chrysene, periflanthene, and the like having an arylamine group. Further, the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamine group are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

The hole injection layer is a layer which accepts holes from an electrode. It is preferred that hole injection material has an ability to transport holes, and has an effect of accepting holes from an anode and an excellent hole injection effect for a light emitting layer or a light emitting material. Further, the hole injection material is preferably a material which is excellent in ability to prevent excitons produced from a light emitting layer from moving to an electron injection layer or an electron injection material. In addition, the hole injection material is preferably a material which is excellent in ability to form a thin film. In addition, the highest occupied molecular orbital (HOMO) of the hole injection material is preferably a value between the work function of the anode material and the HOMO of the neighboring organic material layer. Specific examples of the hole injection material include: metal porphyrin, oligothiophene, and arylamine-based organic materials; hexanitrile hexaazatriphenylene-based organic materials; quinacridone-based organic materials; perylene-based organic materials; polythiophene-based conductive polymers such as anthraquinone and polyaniline; and the like, but are not limited thereto.

The hole transport layer is a layer which accepts holes from a hole injection layer and transports the holes to a light emitting layer, and may have a single-layer structure or a multi-layer structure having two or more layers. A hole transport material is preferably a material having high hole mobility which may accept holes from an anode or a hole injection layer and transfer the holes to a light emitting layer. Specific examples thereof include arylamine-based organic materials, conductive polymers, block copolymers having both conjugated portions and non-conjugated portions, and the like, but are not limited thereto.

In an exemplary embodiment of the present specification, the hole transport layer has a multi-layered structure. Specifically, the hole transport layer has a two-layer structure.

The electron transport layer is a layer which accepts electrons from an electron injection layer and transports the electrons to a light emitting layer. An electron transport material is preferably a material having high electron mobility which may proficiently accept electrons from a cathode and transfer the electrons to a light emitting layer. Specific examples thereof include: Al complexes of 8-hydroxyquinoline; complexes including Alq3; organic radical compounds; hydroxyflavone-metal complexes; and the like, but are not limited thereto. An electron transport layer may be used with any desired cathode material, as used according to the related art. In particular, an appropriate cathode material is a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which accepts electrons from an electrode. It is preferred that an electron injection material is excellent in ability to transport electrons and has an effect of accepting electrons from the second electrode and an excellent electron injection effect for a light emitting layer or a light emitting material. Further, the electron injection material is preferably a material which prevents excitons produced from a light emitting layer from moving to a hole injection layer and is excellent in ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris(2-methyl-8-hydroxyquinolinato) aluminum, tris(8-hydroxyquinolinato) gallium, bis(10-hydroxybenzo[h]quinolinato) beryllium, bis(10-hydroxybenzo[h]quinolinato) zinc, bis(2-methyl-8-quinolinato) chlorogallium, bis(2-methyl-8-quinolinato)(o-cresolato) gallium, bis(2-methyl-8-quinolinato) (1-naphtholato) aluminum, bis(2-methyl-8-quinolinato) (2-naphtholato) gallium, and the like, but are not limited thereto.

The electron blocking layer is a layer which may improve the service life and efficiency of a device by preventing electrons injected from an electron injection layer from passing through a light emitting layer and entering a hole injection layer. As the electron blocking layer, the publicly-known material can be used without limitation, and the electron blocking layer may be formed between a light emitting layer and a hole injection layer, or between a light emitting layer and a layer which simultaneously injects and transports holes.

The hole blocking layer is a layer which blocks holes from reaching a cathode, and may be generally formed under the same conditions as those of the electron injection layer.

Specific examples thereof include oxadiazole derivatives or triazole derivatives, phenanthroline derivatives, aluminum complexes, and the like, but are not limited thereto.

The organic light emitting device according to the present specification may be a top emission type, a bottom emission type, or a dual-sided emission type according to the materials to be used.

MODE FOR INVENTION

Hereinafter, the present disclosure will be described in detail with reference to Examples, Comparative Examples, and the like for specifically describing the present specification. However, the Examples and the Comparative Examples according to the present specification may be modified in various forms, and it is not interpreted that the scope of the present specification is limited to the Examples and the Comparative Examples described below in detail. The Examples and the Comparative Examples of the present specification are provided to more completely explain the present specification to a person with ordinary skill in the art.

Synthesis Example 1. Synthesis of Compound 1

1) Synthesis of Intermediate 1

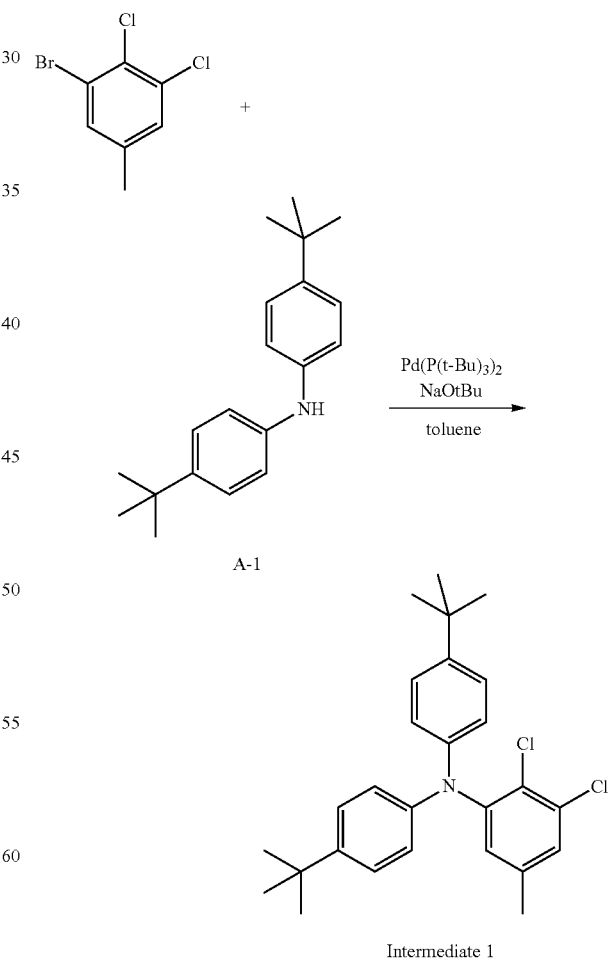

Intermediate 1

After 100 g of 1-bromo-2,3-dichloro-5-methylbenzene, 124 g of Compound A-1, 48 g of sodium tert-butoxide, and 2.2 g of bis(tri-tert-butylphosphine)palladium(0) were put into 2.0 L of toluene under a nitrogen atmosphere, the resulting mixture was heated at 120° C. and stirred for 5 hours. After the reaction was terminated, the reaction solution was cooled to room temperature, aliquoted by adding water and NH$_4$Cl thereto, and then filtered by treatment with MgSO$_4$(anhydrous). The filtered solution was distilled off under reduced pressure and purified with recrystallization to obtain 130 g of Intermediate 1.

2) Synthesis of Intermediate 2

After 50 g of Intermediate 1, 47 g of Compound A-2, 22 g of sodium tert-butoxide, and 1.7 g of bis(tri-tert-butylphosphine)palladium(0) were put into 1.0 L of toluene under a nitrogen atmosphere, the resulting mixture was heated at 120° C. and stirred for 8 hours. After the reaction was terminated, the reaction solution was cooled to room temperature, aliquoted by adding water and NH$_4$Cl thereto, and then filtered by treatment with MgSO$_4$(anhydrous). The filtered solution was distilled off under reduced pressure and purified with recrystallization (toluene/acetonitrile) to obtain 75 g of Intermediate 2. As a result of measuring the mass spectrum of the obtained solid, a peak was confirmed at [M+H]+=809.

3) Synthesis of Compound 1

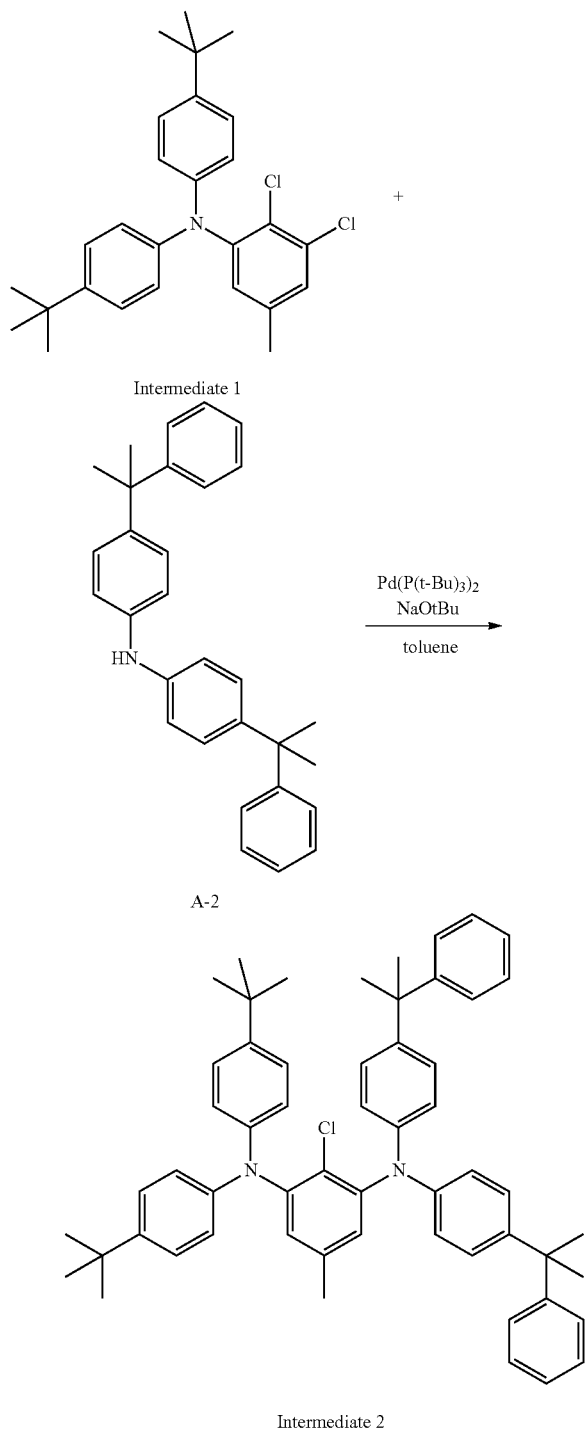

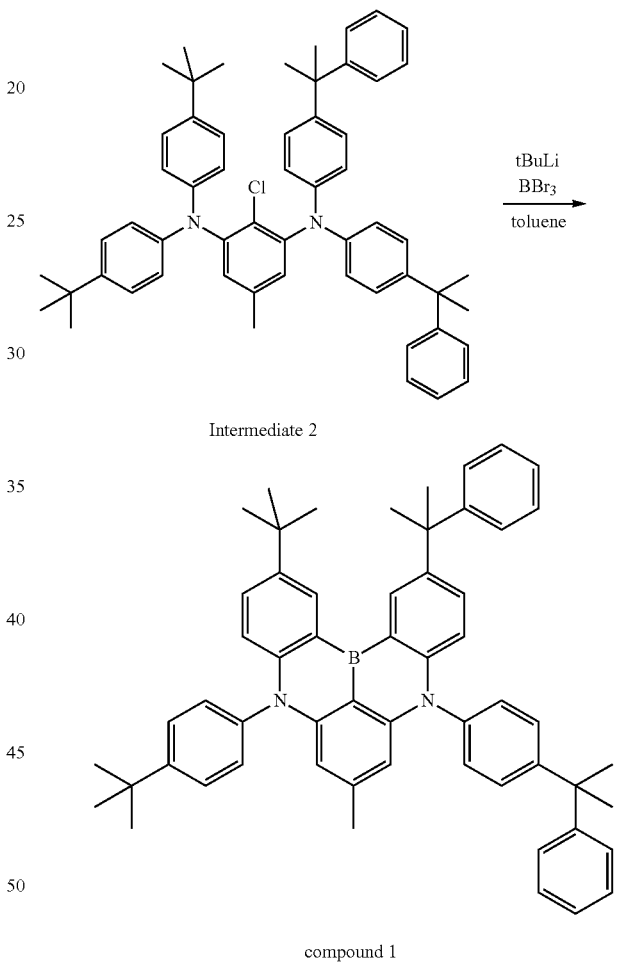

118 mL of tert-butyllithium was slowly added dropwise to a flask containing 40 g of Intermediate 2 dissolved in 250 mL of toluene (anhydrous) cooled to 0° C. under a nitrogen atmosphere, and then the resulting mixture was stirred at 60° C. for 3 hours. When a lithium-halogen exchange reaction was completed, the resulting product was cooled again to 0° C., 9.6 mL of boron tribromide was slowly added dropwise thereto, and then the temperature was increased to 70° C., and the resulting solution was stirred for 10 hours. After the reaction was terminated, the reaction solution was cooled to room temperature, aliquoted by adding water and NH$_4$Cl thereto, and then filtered by treatment with MgSO$_4$ (anhydrous). The filtered solution was distilled off under reduced pressure and purified with recrystallization (toluene/hexane) to obtain 10 g of Compound 1.

Synthesis Example 2. Synthesis of Compound 2

1) Synthesis of Intermediate 3

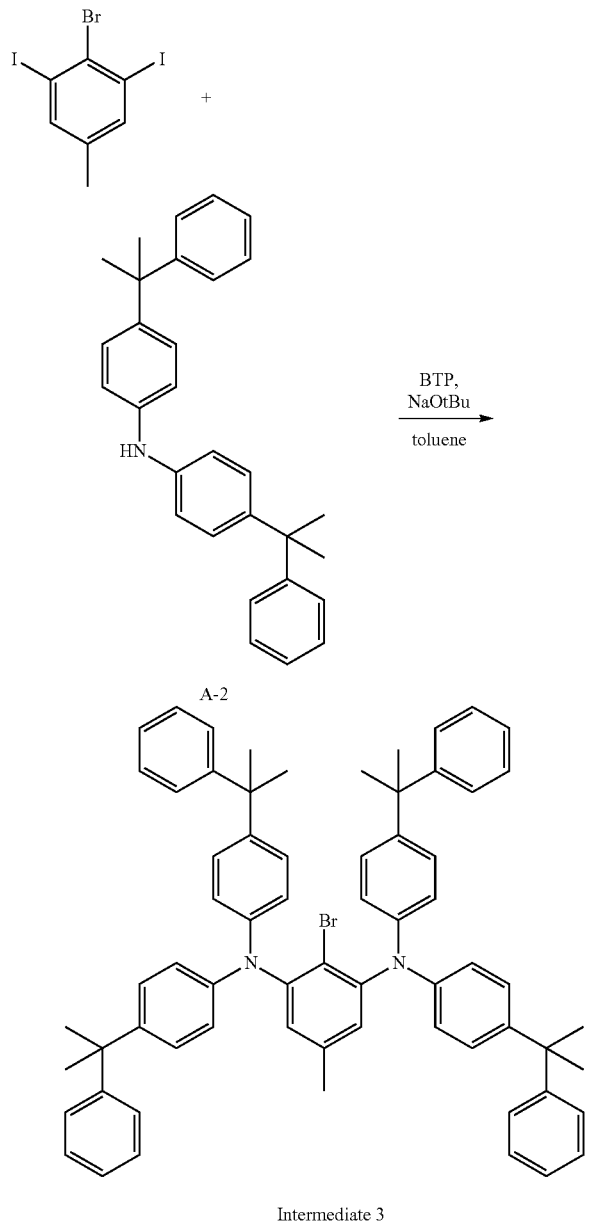

After 50 g of 2-bromo-1,3-diiodo-5-methylbenzene, 98 g of Compound A-2, 34 g of sodium tert-butoxide, and 1.2 g of bis(tri-tert-butylphosphine)palladium(0) were put into 500 mL of toluene under a nitrogen atmosphere, the resulting mixture was heated at 120° C. and stirred for 4 hours. After the reaction was terminated, the reaction solution was cooled to room temperature, aliquoted by adding water and NH$_4$Cl thereto, and then filtered by treatment with MgSO$_4$ (anhydrous). The filtered solution was distilled off under reduced pressure and purified with recrystallization (toluene/acetonitrile) to obtain 75 g of Intermediate 3.

2) Synthesis of Compound 2

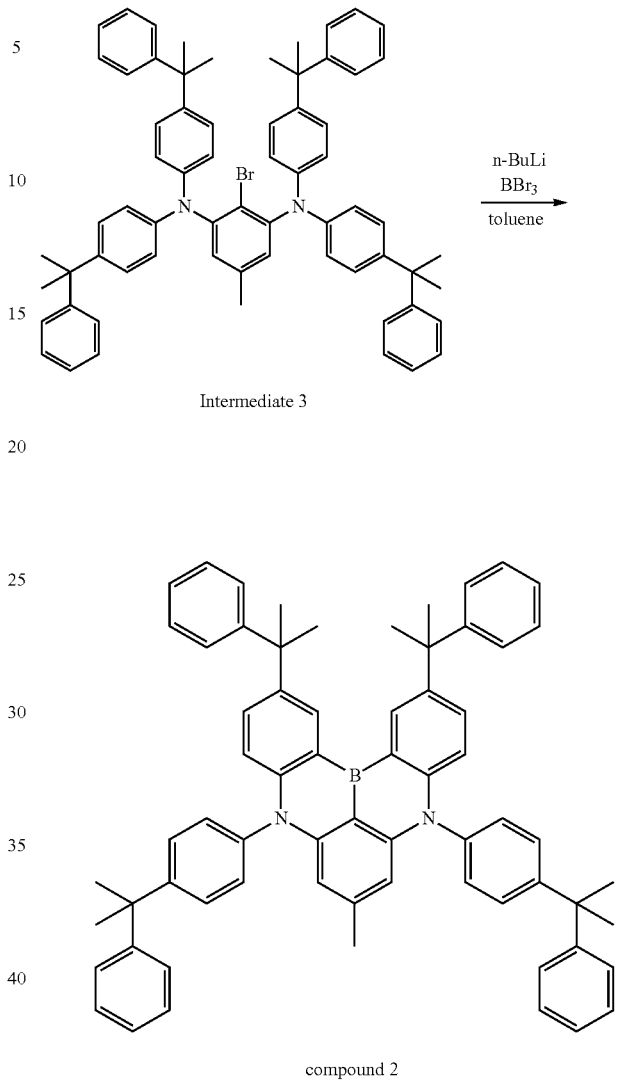

31 mL of n-butyllithium was slowly added dropwise to a flask containing 30 g of Intermediate 3 dissolved in 150 mL of toluene (anhydrous) cooled to 0° C. under a nitrogen atmosphere, and then the resulting mixture was stirred at 60° C. for 1 hour. When a lithium-halogen exchange reaction was completed, the resulting product was cooled again to 0° C., 6.0 mL of boron tribromide was slowly added dropwise thereto, and then the temperature was increased to 70° C., and the resulting solution was stirred for 6 hours. After the reaction was terminated, the reaction solution was cooled to room temperature, aliquoted by adding water and NH$_4$Cl thereto, and then filtered by treatment with MgSO$_4$ (anhydrous). The filtered solution was distilled off under reduced pressure and purified with recrystallization (toluene/hexane) to obtain 5.7 g of Compound 2.

85

Synthesis Example 3. Synthesis of Compound 3

1) Synthesis of Intermediates 4 and 5

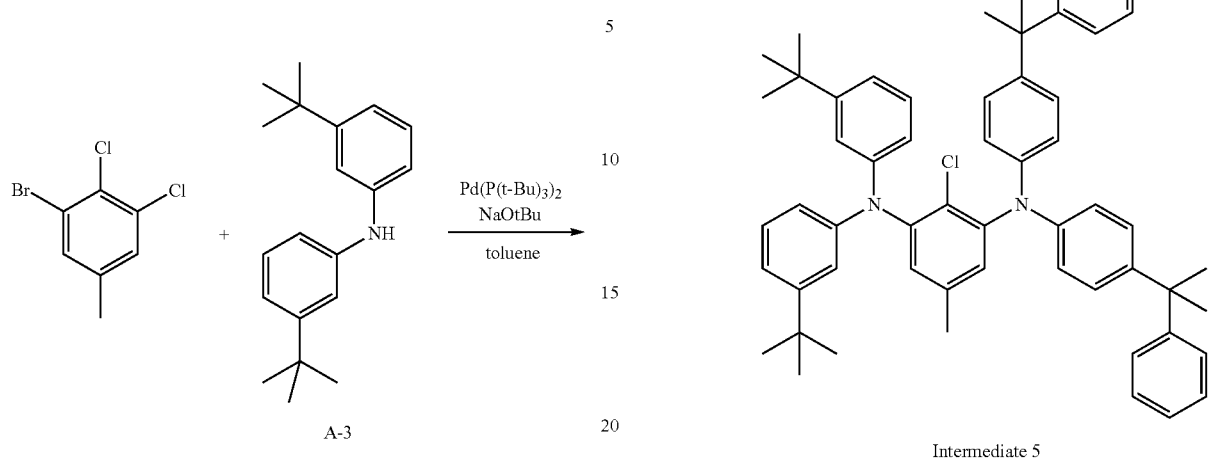

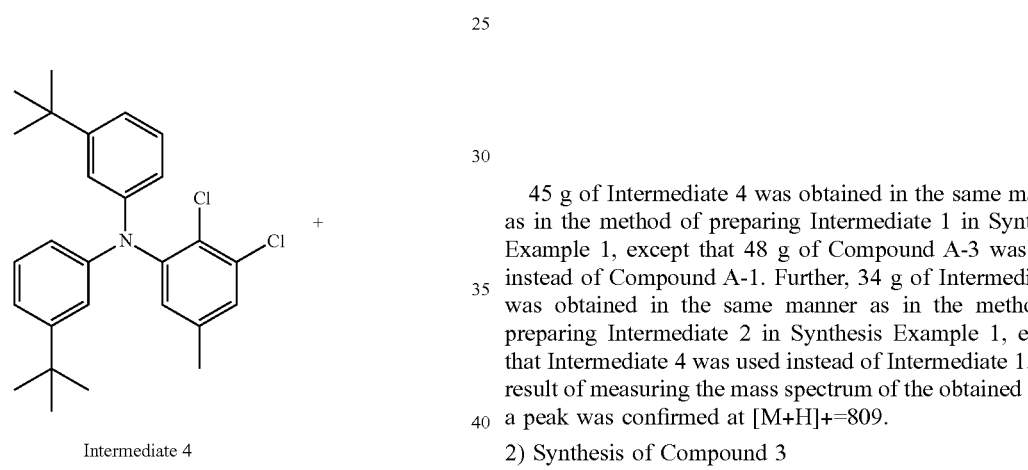

86

-continued

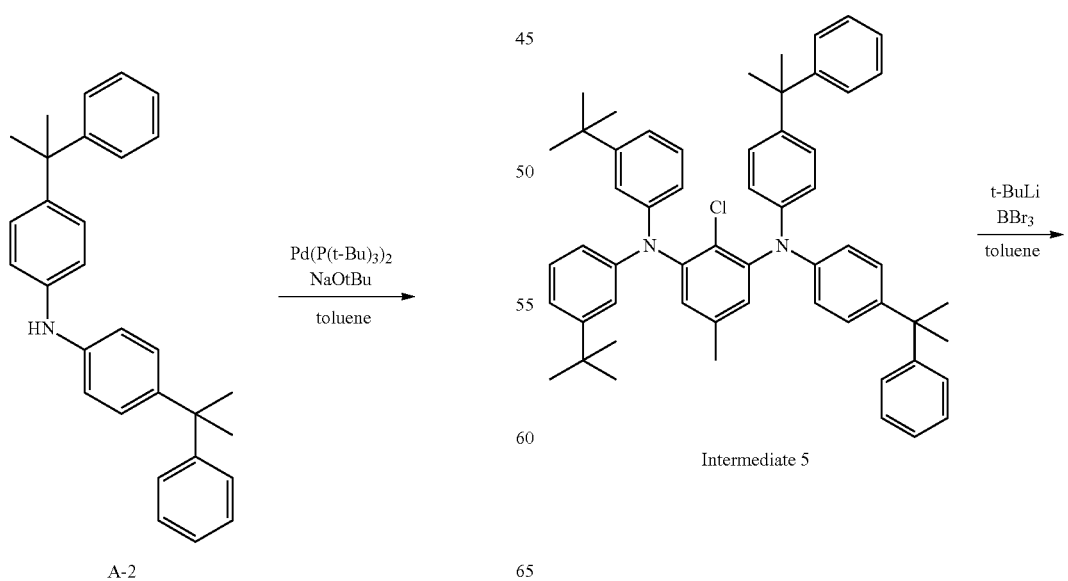

Intermediate 5

45 g of Intermediate 4 was obtained in the same manner as in the method of preparing Intermediate 1 in Synthesis Example 1, except that 48 g of Compound A-3 was used instead of Compound A-1. Further, 34 g of Intermediate 5 was obtained in the same manner as in the method of preparing Intermediate 2 in Synthesis Example 1, except that Intermediate 4 was used instead of Intermediate 1. As a result of measuring the mass spectrum of the obtained solid, a peak was confirmed at [M+H]+=809.

2) Synthesis of Compound 3

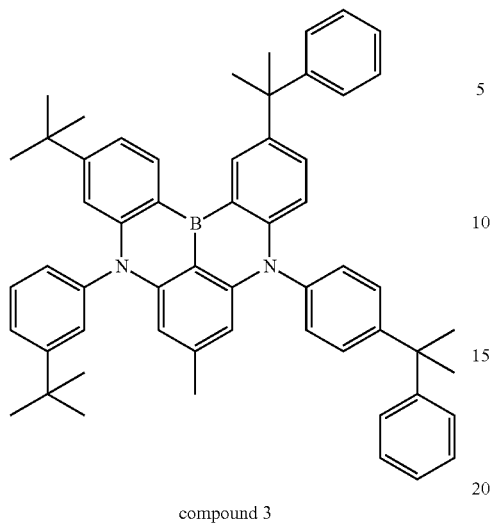

compound 3

65 mL of tert-butyllithium was slowly added dropwise to a flask containing 30 g of Intermediate 5 dissolved in 150 mL of toluene (anhydrous) cooled to 0° C. under a nitrogen atmosphere, and then the resulting mixture was stirred at 70° C. for 4 hours. When a lithium-halogen exchange reaction was completed, the resulting product was cooled again to 0° C., 5.4 mL of boron tribromide was slowly added dropwise thereto, and then the temperature was increased to 70° C., and the resulting solution was stirred for 8 hours. After the reaction was terminated, the reaction solution was cooled to room temperature, aliquoted by adding water and NH$_4$Cl thereto, and then filtered by treatment with MgSO$_4$ (anhydrous). The filtered solution was distilled off under reduced pressure and purified twice with recrystallization (toluene/hexane) to obtain 7.1 g of Compound 3.

Synthesis Example 4. Synthesis of Compound 4

1) Synthesis of Compound A-4

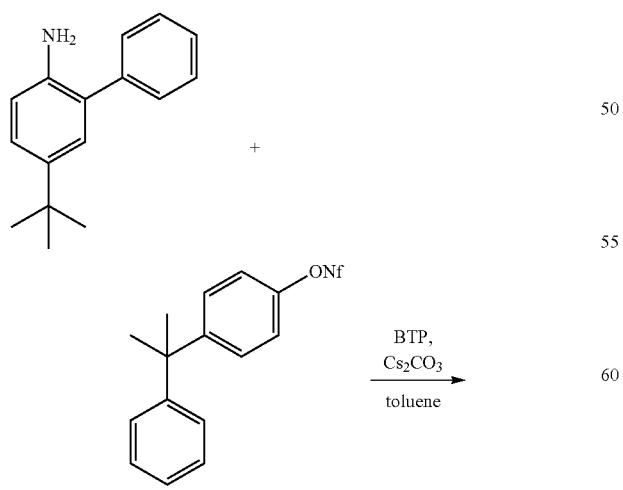

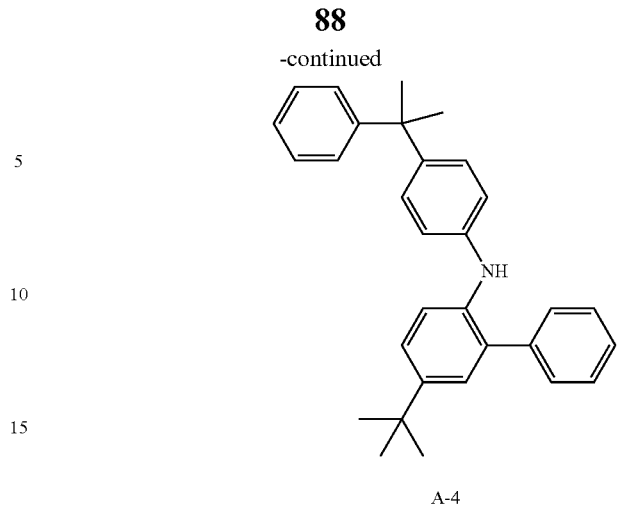

A-4

After 50 g of 5-tert-butyl-[1,1'-biphenyl]-2-amine, 112 g of 4-(2-phenylpropanyl)phenyl nonaflate, 146 g of cesium carbonate, and 1.7 g of bis(tri-tert-butylphosphine)palladium(0) were put into 700 mL of toluene under a nitrogen atmosphere, the resulting mixture was heated at 120° C. and stirred for 8 hours. After the reaction was terminated, the reaction solution was cooled to room temperature, aliquoted by adding water and NaCl thereto, and then filtered by treatment with MgSO$_4$ (anhydrous). The filtered solution was distilled off under reduced pressure and purified with column chromatography (toluene/hexane) to obtain 85 g of Compound A-4.

2) Synthesis of Intermediates 6 and 7

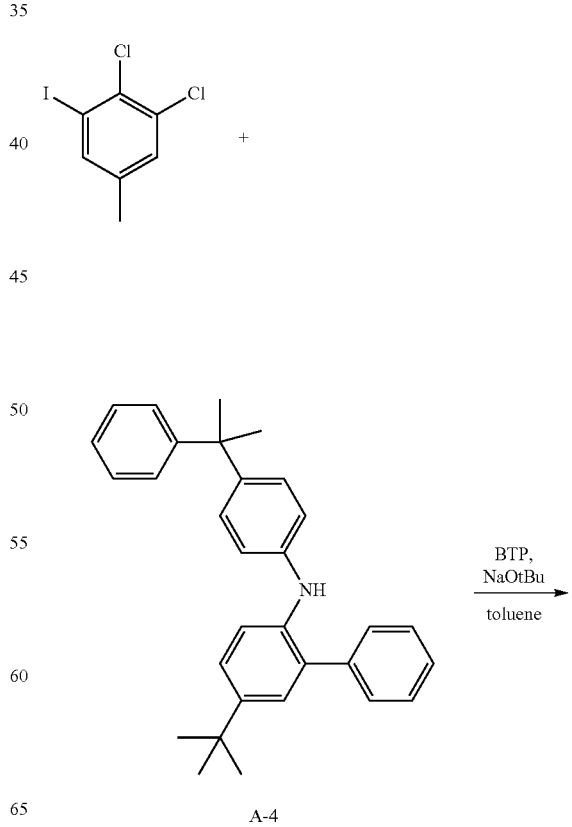

A-4

-continued

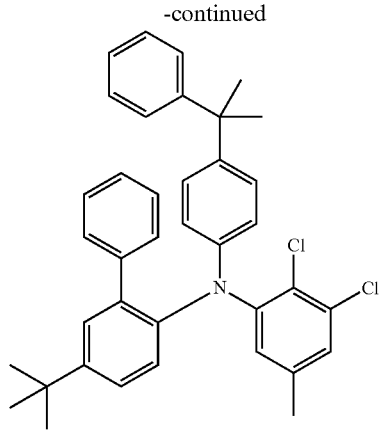

Intermediate 6

BTP, NaOtBu
─────────→
toluene

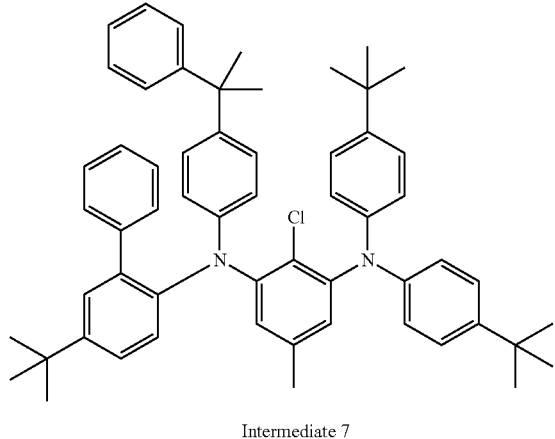 [SMILES: Cc1cc(N(c2ccc(C(C)(C)C)cc2)c2ccc(C(C)(C)C)cc2)c(Cl)c(N(c2ccc(C(C)(C)c3ccccc3)cc2)c2ccc(C(C)(C)C)cc2-c2ccccc2)c1 ; "Intermediate 7"]

Intermediate 7

48 g of Intermediate 6 was obtained in the same manner as in the method of preparing Intermediate 1 in Synthesis Example 1, using 34 g of 1,2-dichloro-3-iodo-5-methylbenzene instead of 1-bromo-2,3-dichloro-5-methylbenzene and 50 g of Compound A-4 instead of Compound A-1. Further, 30 g of Intermediate 7 was obtained in the same manner as in the method of preparing Intermediate 2 in Synthesis Example 1, using 35 g of Intermediate 6 instead of Intermediate 1 and 17 g of Compound A-1 instead of Compound A-2. As a result of measuring the mass spectrum of the obtained solid, a peak was confirmed at [M+H]+=823.

3) Synthesis of Compound 4

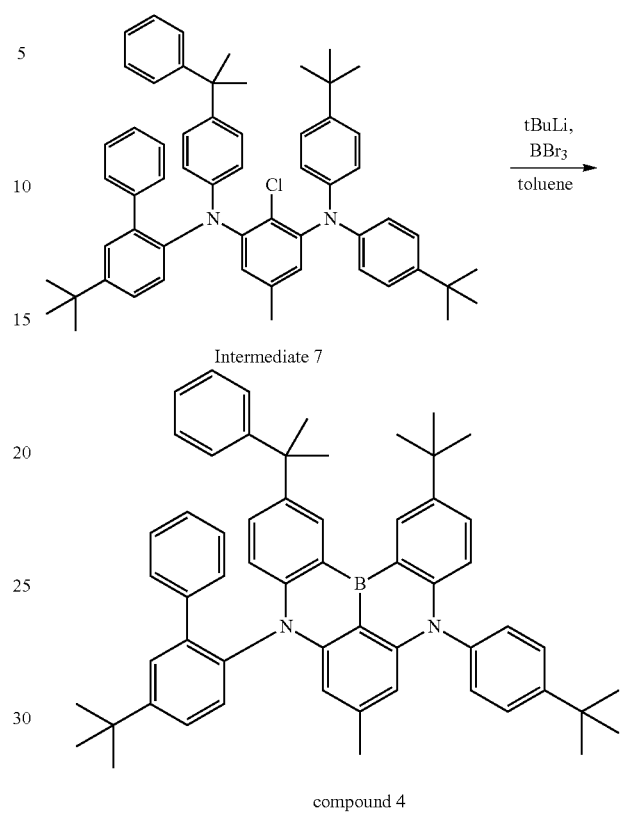

5 g of Compound 4 was obtained in the same manner as in the method of preparing Compound 1 in Synthesis Example 1, using 25 g of Intermediate 7 instead of Intermediate 2. As a result of measuring the mass spectrum of the obtained solid, a peak was confirmed at [M+H]+=797.

Synthesis Example 5. Synthesis of Compound 5

1) Synthesis of Compound A-5

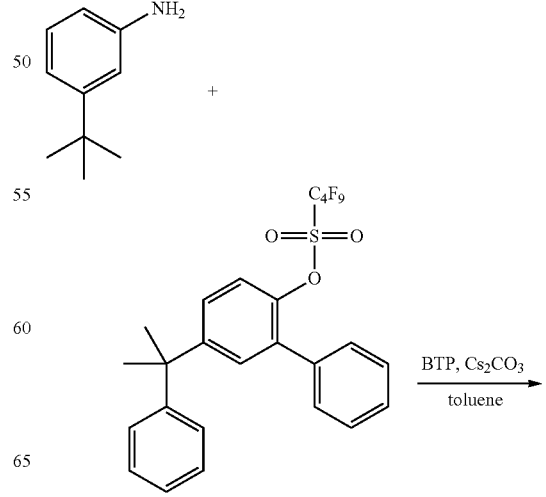

-continued

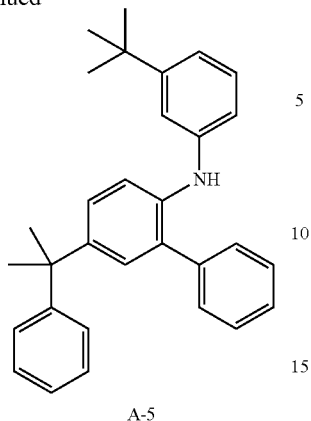

A-5

80 g of Compound A-5 was obtained in the same manner as in the method of preparing Compound A-4 in Synthesis Example 4, using 40 g of 3-tert-butylaniline and 156 g of 5-(2-phenylpropanyl 1,1'-biphenyl nonaflate. As a result of measuring the mass spectrum of the obtained solid, a peak was confirmed at [M+H]+=420.

2) Synthesis of Intermediates 8 and 9

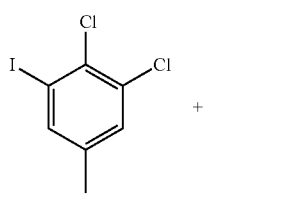

+

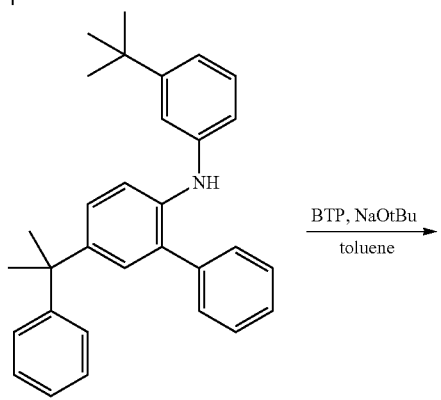

A-5

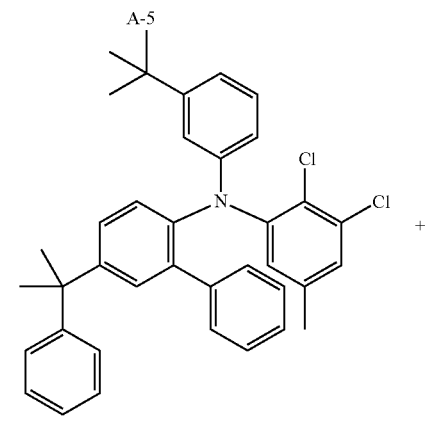

Intermediate 8

-continued

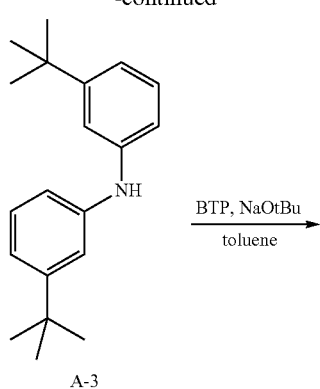

A-3

BTP, NaOtBu
toluene

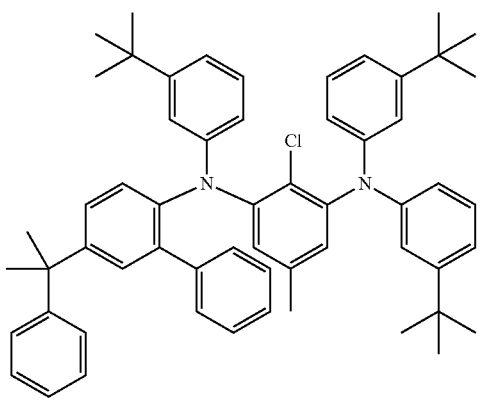

Intermediate 9

28 g of Intermediate 8 was obtained in the same manner as in the method of preparing Intermediate 1 in Synthesis Example 1, using 21 g of 1,2-dichloro-3-iodo-5-methylbenzene instead of 1-bromo-2,3-dichloro-5-methylbenzene and 30 g of Compound A-5 instead of Compound A-2. Further, 18 g of Intermediate 9 was obtained in the same manner as in the method of preparing Intermediate 2 in Synthesis Example 1, using 20 g of Intermediate 8 instead of Intermediate 1 and 9.7 g of Compound A-3 instead of Compound A-2. As a result of measuring the mass spectrum of the obtained solid, a peak was confirmed at [M+H]+=823.

3) Synthesis of Compound 5

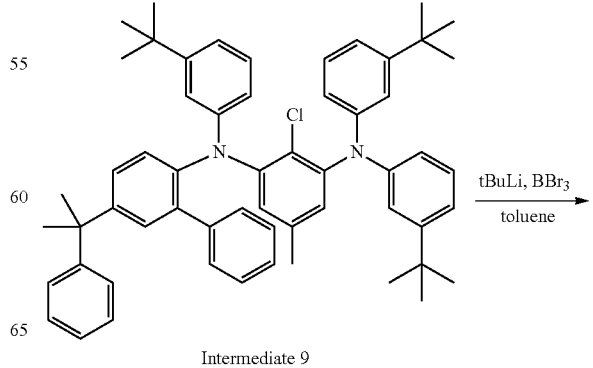

Intermediate 9 tBuLi, BBr₃
toluene

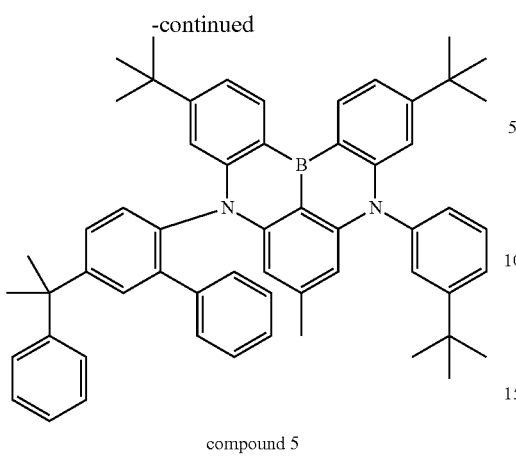

compound 5

4.2 g of Compound 5 was obtained in the same manner as in the method of preparing Compound 1 in Synthesis Example 1, using 15 g of Intermediate 9 instead of Intermediate 2. As a result of measuring the mass spectrum of the obtained solid, a peak was confirmed at [M+H]+=797.

Synthesis Example 6. Synthesis of Compound 6

1) Synthesis of Compound A-6

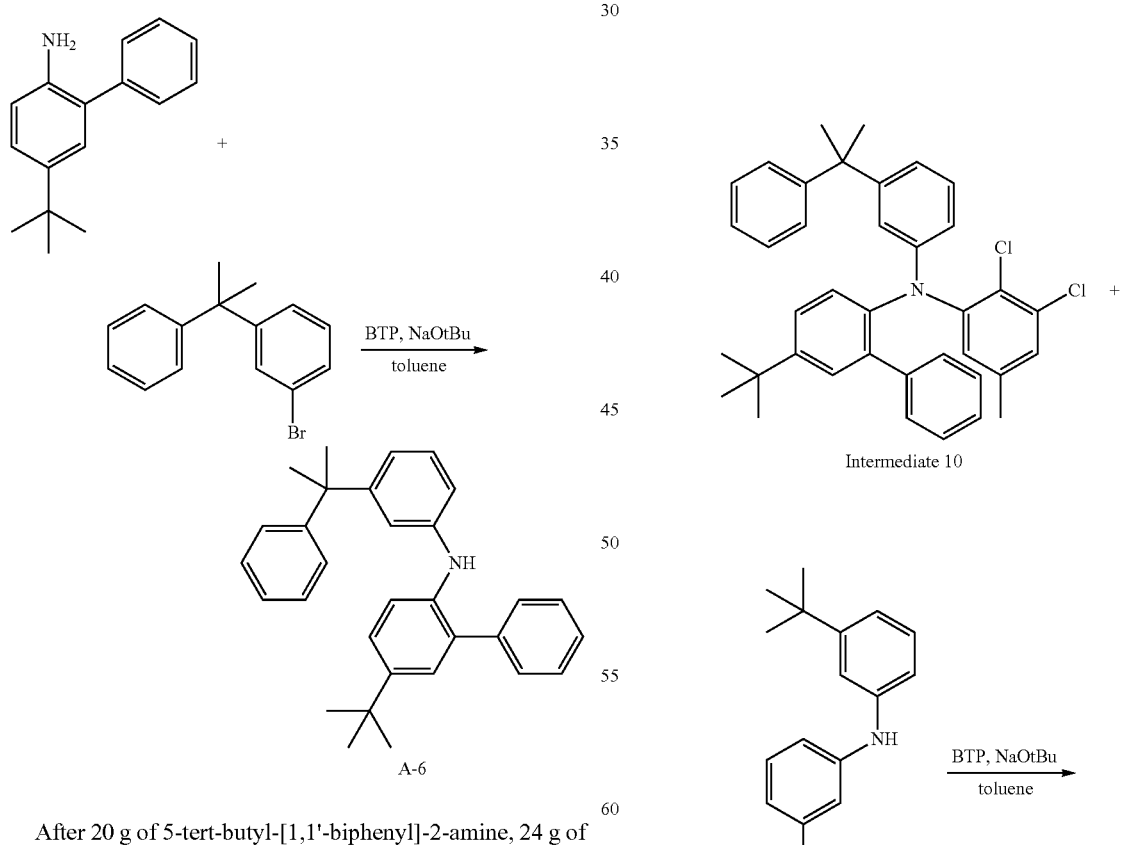

After 20 g of 5-tert-butyl-[1,1'-biphenyl]-2-amine, 24 g of 1-bromo-3-(2-phenylpropanyl)benzene, 17 g of sodium tert-butoxide, and 0.9 g of bis(tri-tert-butylphosphine)palladium (0) were put into 300 mL of toluene under a nitrogen atmosphere, the resulting mixture was heated at 120° C. and stirred for 4 hours. After the reaction was terminated, the reaction solution was cooled to room temperature, aliquoted by adding water and NH₄Cl thereto, and then filtered by treatment with MgSO₄ (anhydrous). The filtered solution was distilled off under reduced pressure and purified with column chromatography (toluene/hexane) to obtain 30 g of Compound A-6.

2) Synthesis of Intermediates 10 and 11

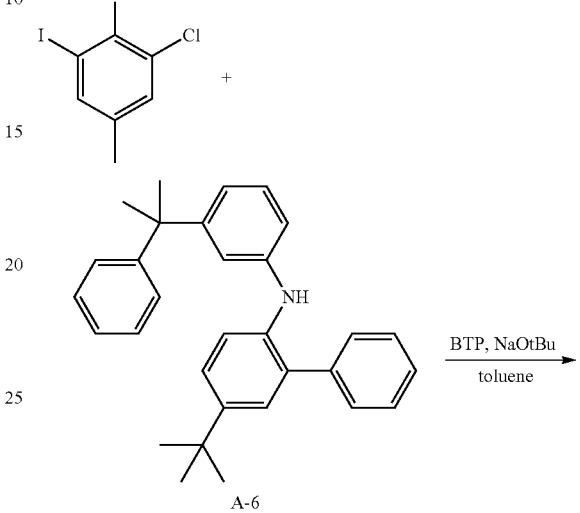

3) Synthesis of Compound 6

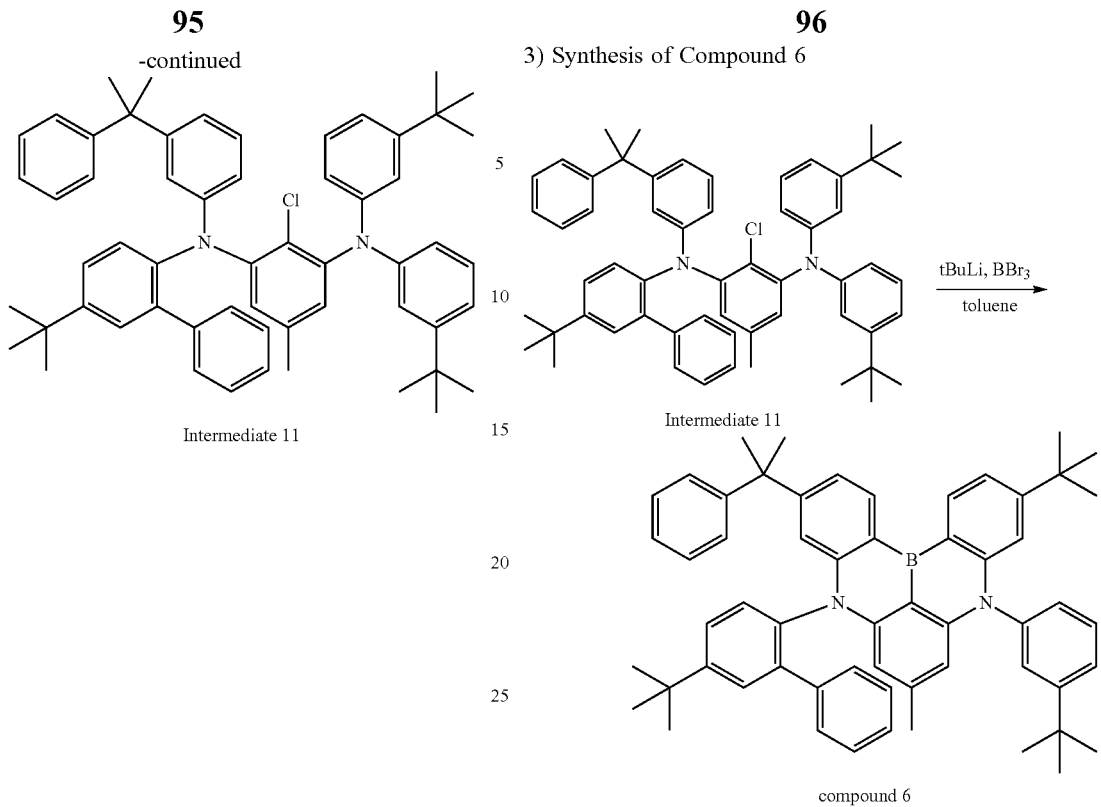

Intermediate 11 compound 6

24 g of Intermediate 10 was obtained in the same manner as in the method of preparing Intermediate 1 in Synthesis Example 1, using 17 g of 1,2-dichloro-3-iodo-5-methylbenzene instead of 1-bromo-2,3-dichloro-5-methylbenzene and 25 g of Compound A-6 instead of Compound A-1. Further, 14 g of Intermediate 11 was obtained in the same manner as in the method of preparing Intermediate 2 in Synthesis Example 1, using 20 g of Intermediate 10 instead of Intermediate 1 and 9.7 g of Compound A-3 instead of Compound A-2. As a result of measuring the mass spectrum of the obtained solid, a peak was confirmed at [M+H]+=823.

2.3 g of Compound 6 was obtained in the same manner as in the method of preparing Compound 1 in Synthesis Example 1, using 10 g of Intermediate 11 instead of Intermediate 2. As a result of measuring the mass spectrum of the obtained solid, a peak was confirmed at [M+H]+=797.

Synthesis Example 7. Synthesis of Compound 7

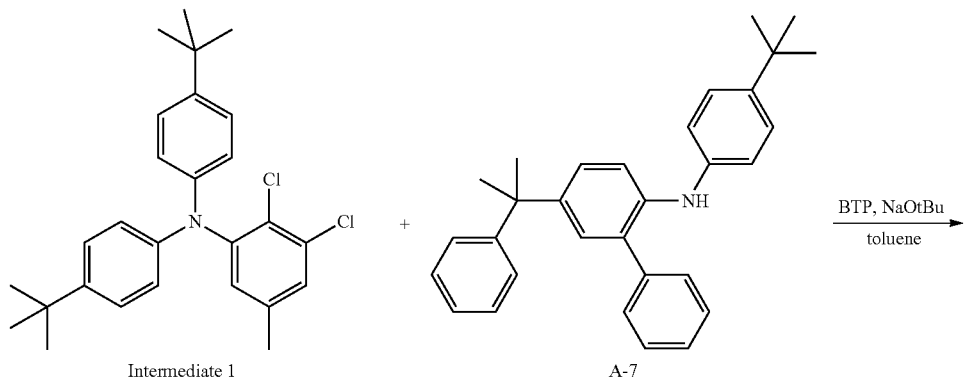

Intermediate 1

A-7

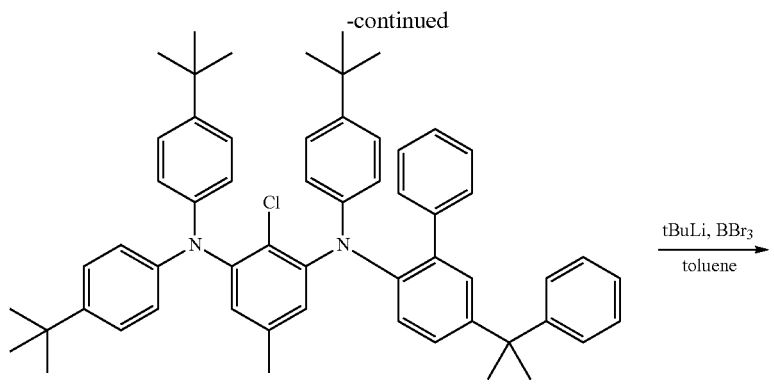

Intermediate 12 tBuLi, BBr₃
toluene compound 7

12 g of Intermediate 12 was obtained in the same manner as in the method of preparing Intermediate 2 in Synthesis Example 1, using 9.5 g of Compound A-7 instead of Compound A-2. As a result of measuring the mass spectrum of the obtained solid, a peak was confirmed at [M+H]+=823. Next, 1.1 g of Compound 7 was obtained in the same manner as in the method of preparing Compound 1 in Synthesis Example 1, using 5.0 g of Intermediate 12 instead of Intermediate 2. As a result of measuring the mass spectrum of the obtained solid, a peak was confirmed at [M+H]+=797.

Synthesis Example 8. Synthesis of Compound 8

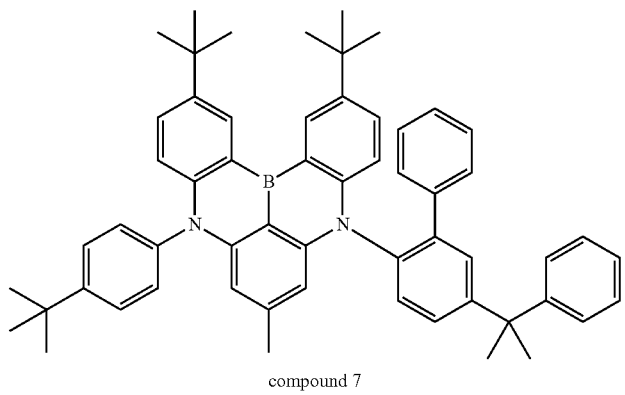

Intermediate 1 + A-8

BTP, NaOtBu
toluene

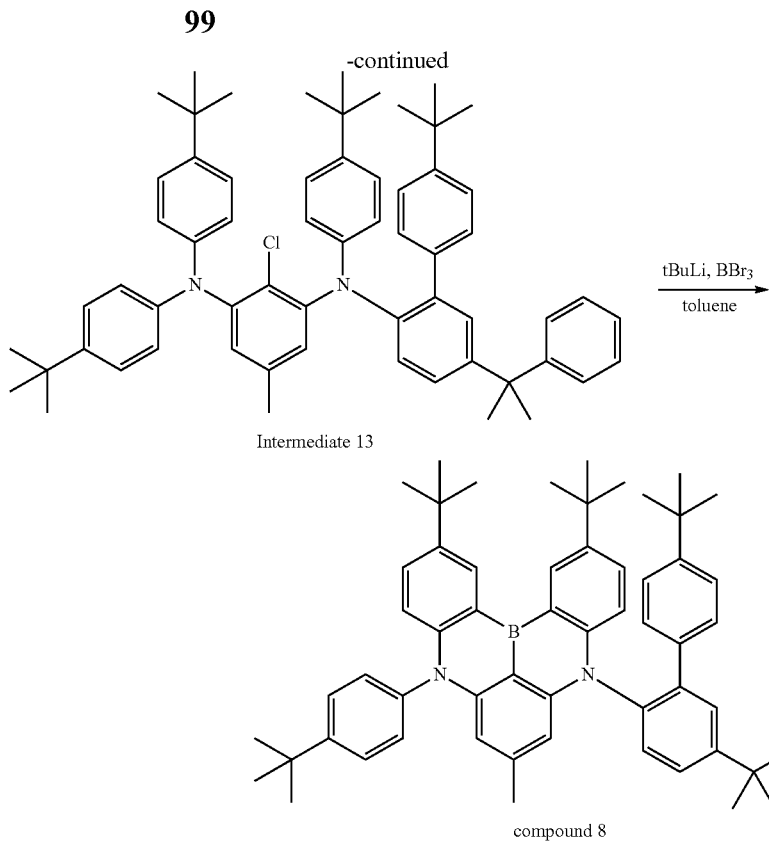
Intermediate 13 compound 8

14 g of Intermediate 13 was obtained in the same manner as in the method of preparing Intermediate 2 in Synthesis Example 1, using 11 g of Compound A-8 instead of Compound A-2. As a result of measuring the mass spectrum of the obtained solid, a peak was confirmed at [M+H]+=879. Next, 0.7 g of Compound 8 was obtained in the same manner as in the method of preparing Compound 1 in Synthesis Example 1, using 3.0 g of Intermediate 13 instead of Intermediate 2. As a result of measuring the mass spectrum of the obtained solid, a peak was confirmed at [M+H]+=853.

Synthesis Example 9. Synthesis of Compound 9

1) Synthesis of Intermediate 14

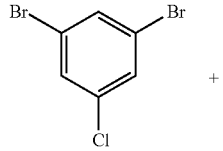

+

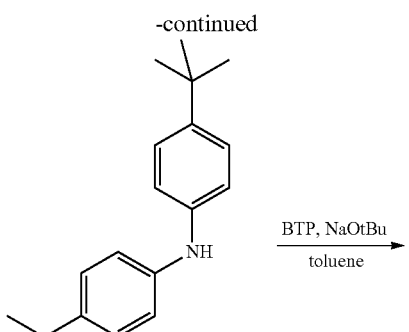

A-1

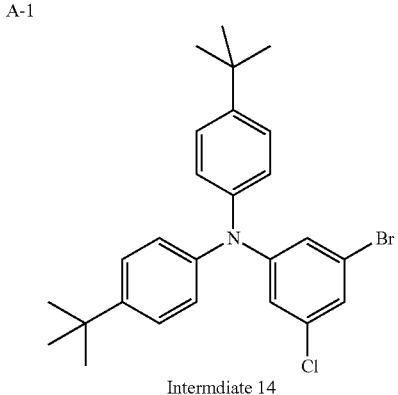

Intermdiate 14

After 30 g of 1,3-dibromo-5-chlorobenzene, 32 g of Compound A-1, 16 g of sodium tert-butoxide, and 1.1 g of bis(tri-tert-butylphosphine)palladium(0) were put into 500 mL of toluene under a nitrogen atmosphere, the resulting mixture was heated at 120° C. and stirred for 2 hours. After the reaction was terminated, the reaction solution was cooled to room temperature, aliquoted by adding water and NH₄Cl thereto, and then filtered by treatment with MgSO₄ (anhydrous). The filtered solution was distilled off under reduced pressure and purified with recrystallization (toluene/hexane) to obtain 42 g of Intermediate 14.

2) Synthesis of Intermediate 15

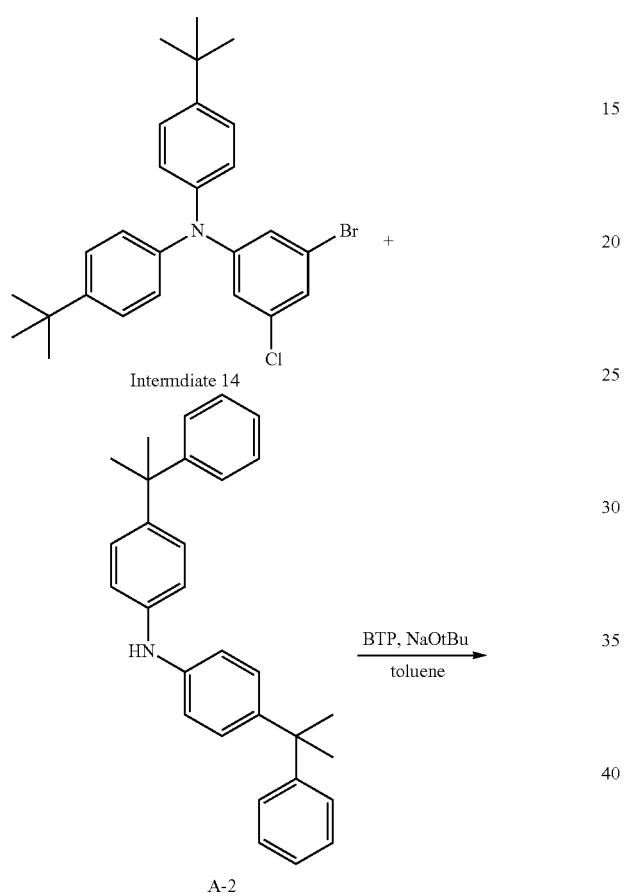

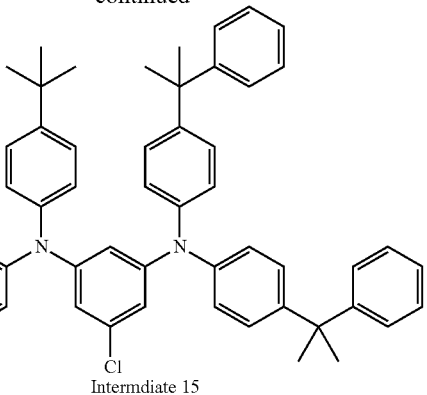

After 30 g of Intermediate 14, 25 g of Compound A-2, 9.2 g of sodium tert-butoxide, and 0.7 g of bis(tri-tert-butylphosphine)palladium(0) were put into 250 mL of toluene under a nitrogen atmosphere, the resulting mixture was heated at 120° C. and stirred for 3 hours. After the reaction was terminated, the reaction solution was cooled to room temperature, aliquoted by adding water and NH₄Cl thereto, and then filtered by treatment with MgSO₄ (anhydrous). The filtered solution was distilled off under reduced pressure and purified with column chromatography (ethyl acetate/hexane) to obtain 33 g of Intermediate 15. As a result of measuring the mass spectrum of the obtained solid, a peak was confirmed at [M+H]+=795.

3) Synthesis of Intermediate 16

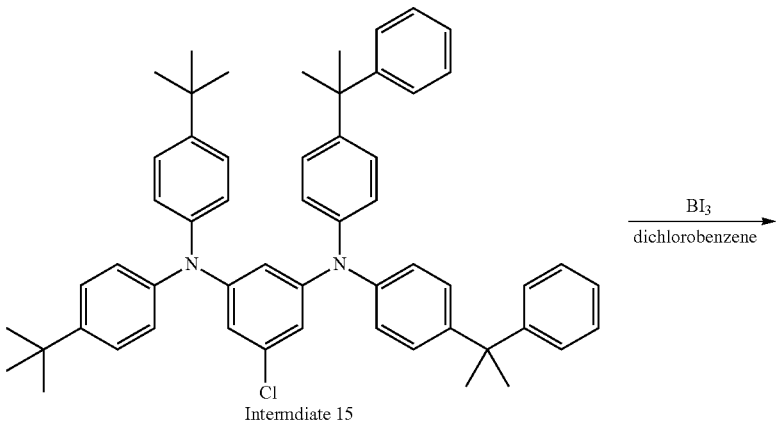

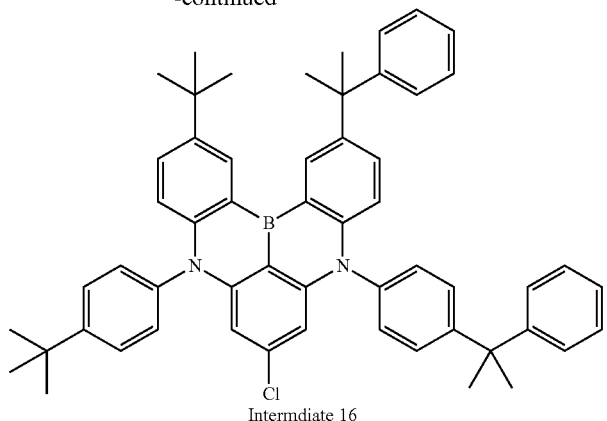

Intermdiate 16

20 g of Intermediate 15 and 11 g of boron triiodide were dissolved in dichlorobenzene under a nitrogen atmosphere, and the resulting solution was stirred at 130° C. for 3 hours. After the reaction was terminated, the reaction solution was cooled to room temperature, extracted, and filtered by treatment with MgSO$_4$ (anhydrous). The filtered solution was distilled off under reduced pressure, purified with column chromatography (toluene/hexane), and then recrystallized to obtain 4.5 g of Intermediate 16. As a result of measuring the mass spectrum of the obtained solid, a peak was confirmed at [M+H]+=803.

4) Synthesis of Compound 9

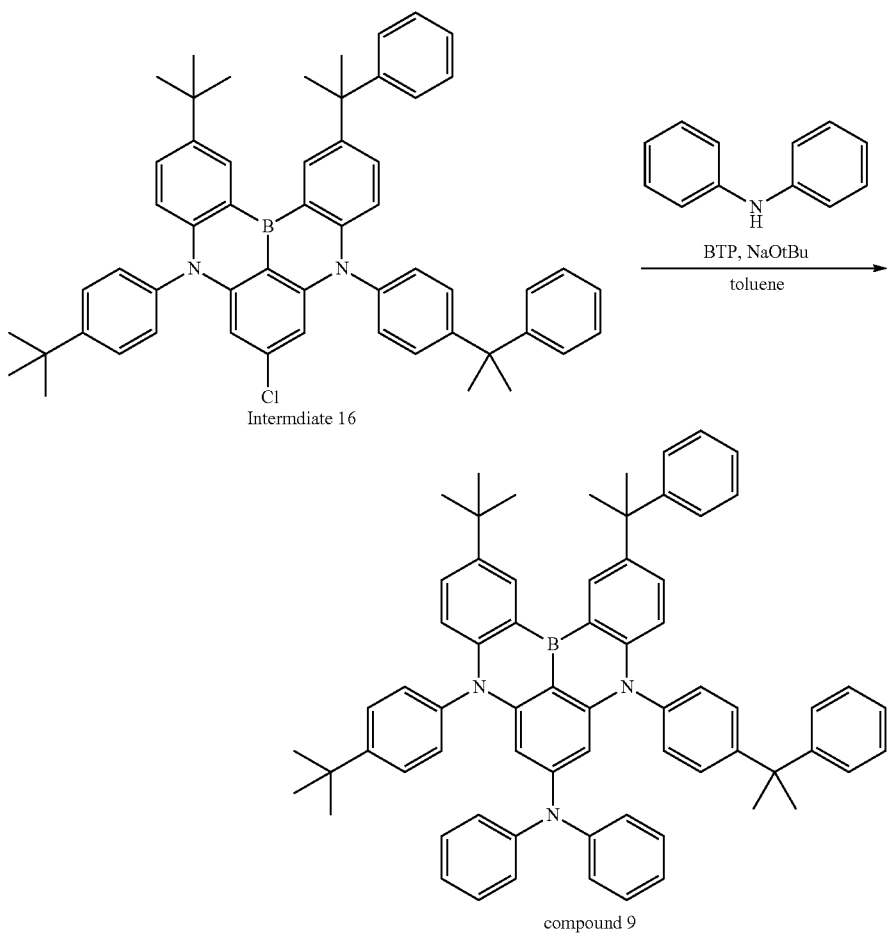

After 3 g of Intermediate 16, 0.7 g of diphenylamine, 0.7 g of sodium tert-butoxide, and 0.4 g of bis(tri-tert-butylphosphine)palladium(0) were put into 30 mL of toluene under a nitrogen atmosphere, the resulting mixture was heated at 120° C. and stirred for 5 hours. After the reaction was terminated, the reaction solution was cooled to room temperature, aliquoted by adding water and NH₄Cl thereto, and then filtered by treatment with MgSO₄ (anhydrous). The filtered solution was distilled off under reduced pressure and purified with recrystallization (toluene/hexane) to obtain 1.1 g of Compound 9. As a result of measuring the mass spectrum of the obtained solid, a peak was confirmed at [M+H]+=936.

Synthesis Example 10. Synthesis of Compound 10

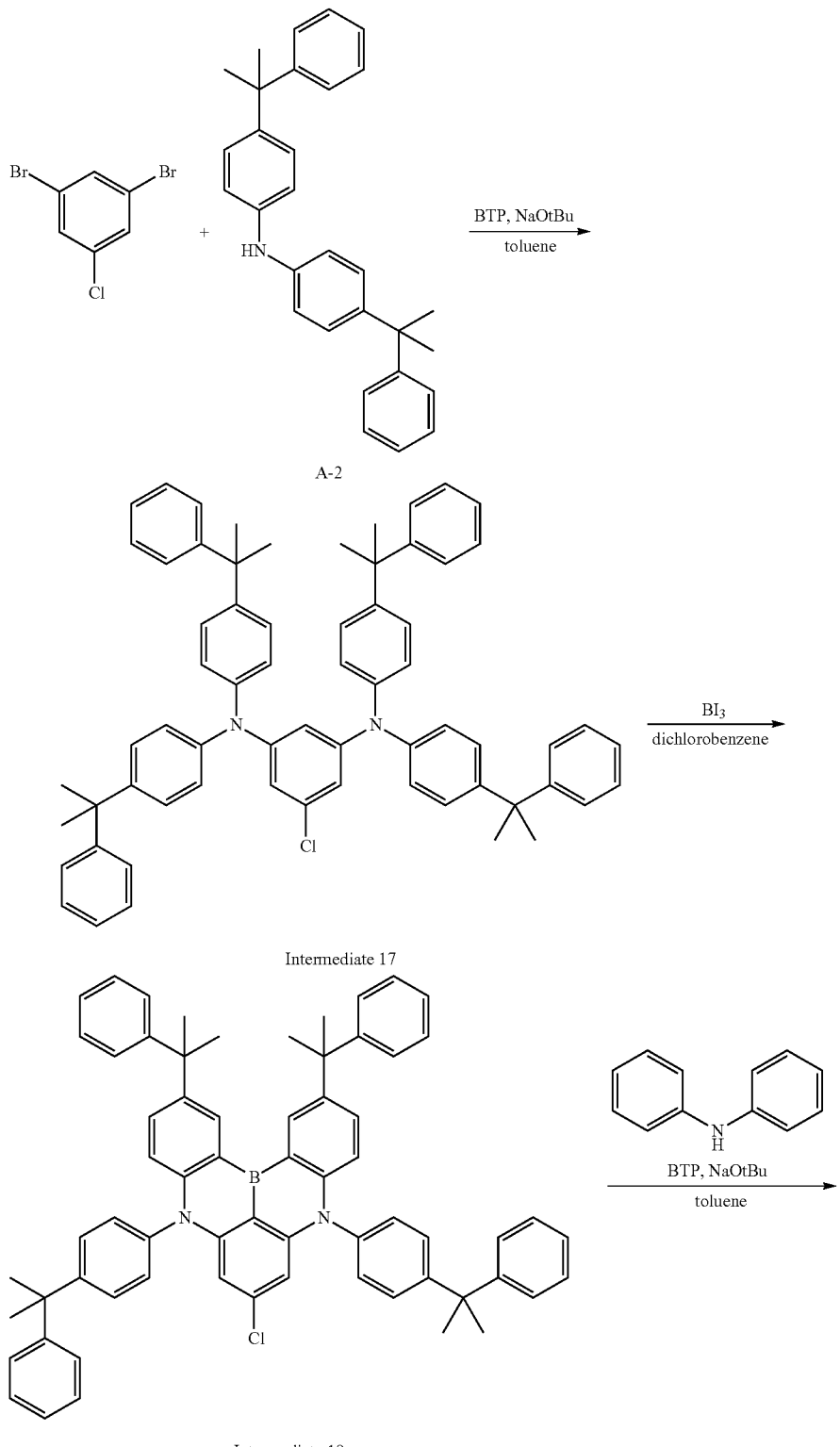

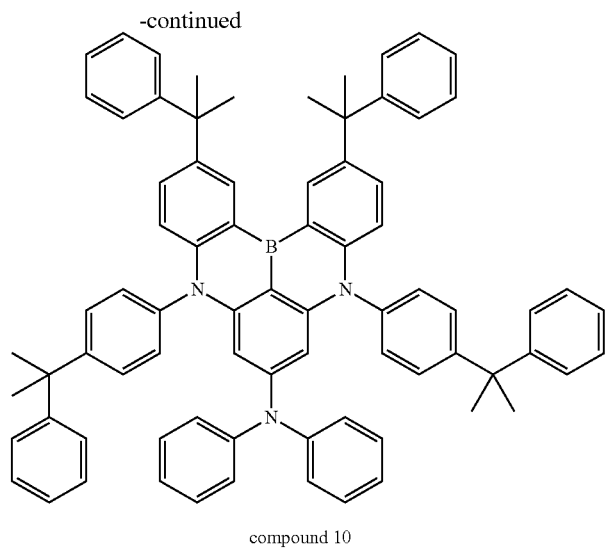

compound 10

48 g of Intermediate 17 was obtained in the same manner as in the method of preparing Intermediate 14 in Synthesis Example 9, using 30 g of Compound A-2 instead of Compound A-1. As a result of measuring the mass spectrum of the obtained solid, a peak was confirmed at [M+H]+=919. Subsequently, 8.0 g of Intermediate 18 was obtained in the same manner as in the method of preparing Intermediate 16 in Synthesis Example 9, using 40 g of Intermediate 17 instead of Intermediate 15. As a result of measuring the mass spectrum of the obtained solid, a peak was confirmed at [M+H]+=927.

3.5 g of Compound 10 was obtained in the same manner as in the method of preparing Compound 9 in Synthesis Example 9, using 5.0 g of Intermediate 18 instead of Intermediate 16. As a result of measuring the mass spectrum of the obtained solid, a peak was confirmed at [M+H]+=1060.

Synthesis Example 11. Synthesis of Compound 11

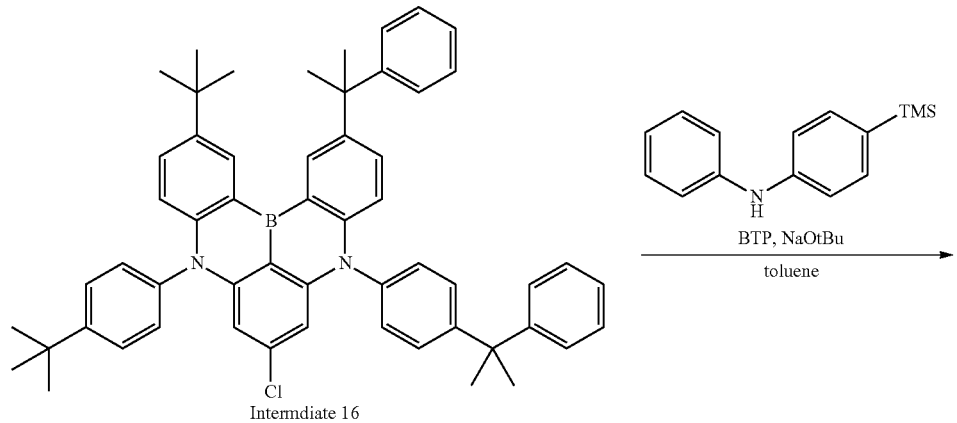

Intermdiate 16

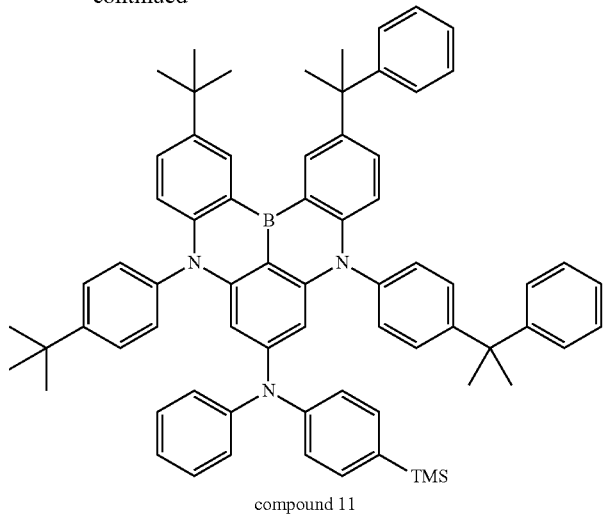

compound 11

0.8 g of Compound 11 was obtained in the same manner as in the method of preparing Compound 9 in Synthesis Example 9, using 0.9 g of N-phenyl-4-trimethylsilylaniline instead of diphenylamine. As a result of measuring the mass spectrum of the obtained solid, a peak was confirmed at [M+H]+=1008.

Synthesis Example 12. Synthesis of Compound 12

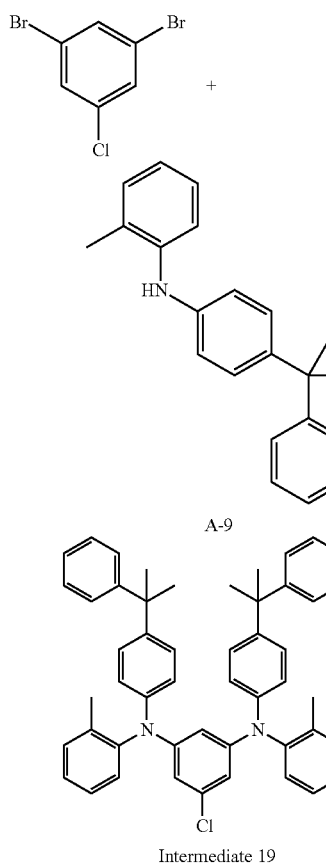

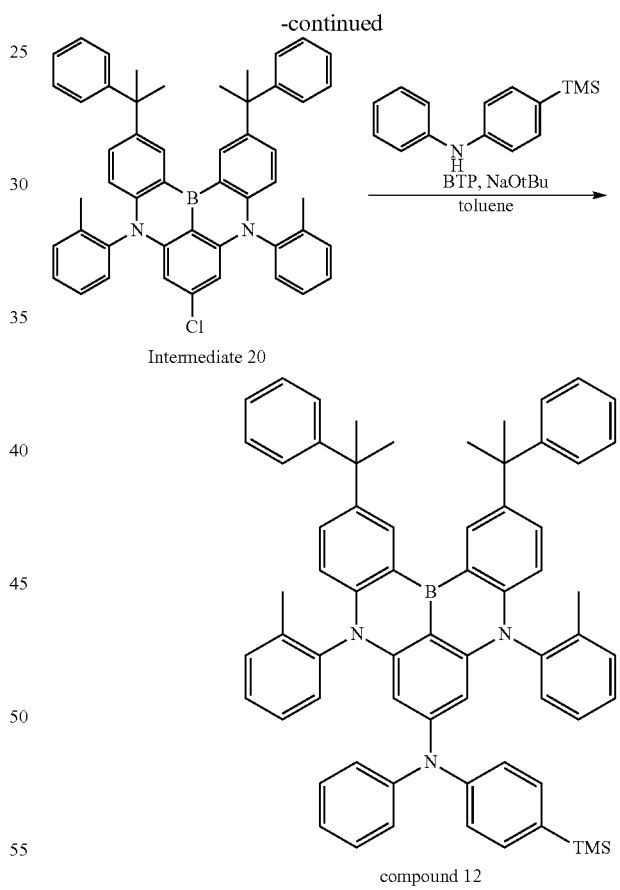

compound 12

58 g of Intermediate 19 was obtained in the same manner as in the method of preparing Intermediate 14 in Synthesis Example 9, using 67 g of Compound A-9 instead of Compound A-1. As a result of measuring the mass spectrum of the obtained solid, a peak was confirmed at [M+H]+=711. Subsequently, 4.6 g of Intermediate 20 was obtained in the same manner as in the method of preparing Intermediate 16 in Synthesis Example 9, using 20 g of Intermediate 19 instead of Intermediate 15. As a result of measuring the mass spectrum of the obtained solid, a peak was confirmed at [M+H]+=719.

2.8 g of Compound 12 was obtained in the same manner as in the method of preparing Compound 9 in Synthesis Example 9, using 3.0 g of Intermediate 20 instead of Intermediate 16 and 0.9 g of N-phenyl-4-trimethylsilylaniline instead of diphenylamine. As a result of measuring the mass spectrum of the obtained solid, a peak was confirmed at [M+1-1]+=924.

Synthesis Example 13. Synthesis of Compound 13

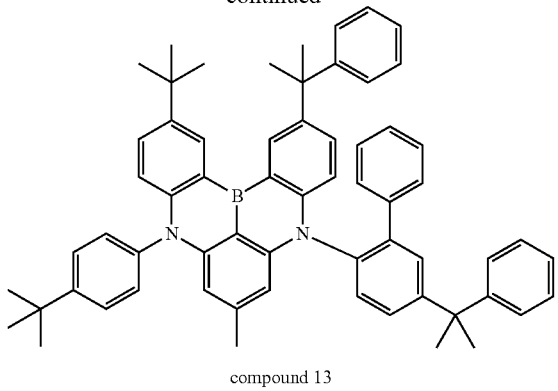

compound 13

12 g of Intermediate 21 was obtained in the same manner as in the method of preparing Intermediate 2 in Synthesis Example 1, using 11 g of Compound A-10 instead of Compound A-2. As a result of measuring the mass spectrum of the obtained solid, a peak was confirmed at [M+H]+=885. Subsequently, 2.8 g of Compound 13 was obtained in the same manner as in the method of preparing Compound 1 in Synthesis Example 1, using 10 g of Intermediate 21 instead of Intermediate 2. As a result of measuring the mass spectrum of the obtained solid, a peak was confirmed at [M+H]+=859.

Synthesis Example 14. Synthesis of Compound 14

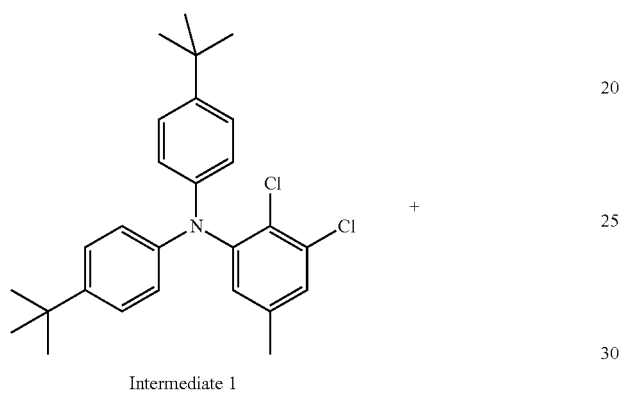

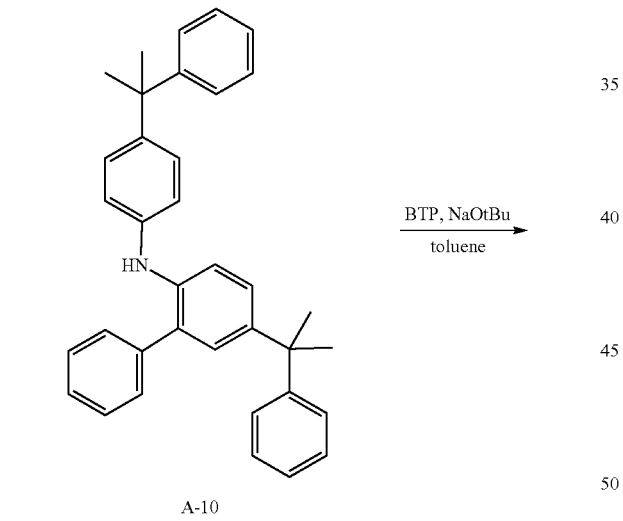

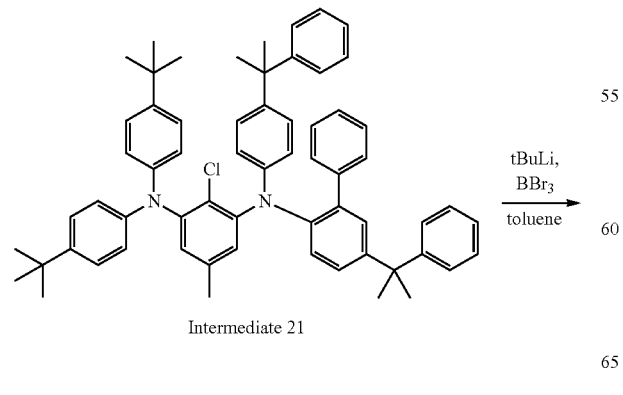

Synthesis Example 15. Synthesis of Compound 15

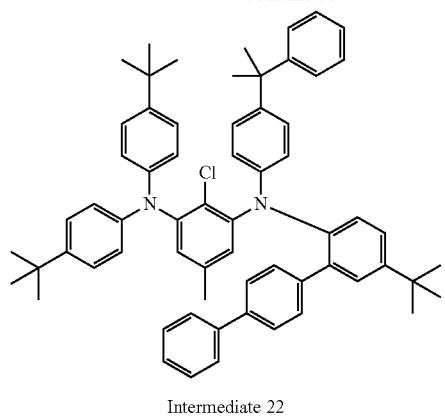

Intermediate 22

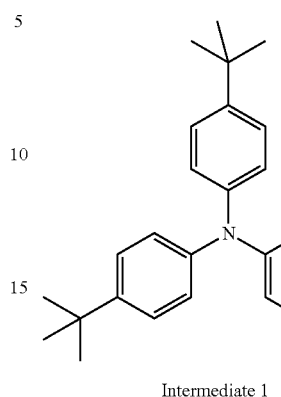

Intermediate 1

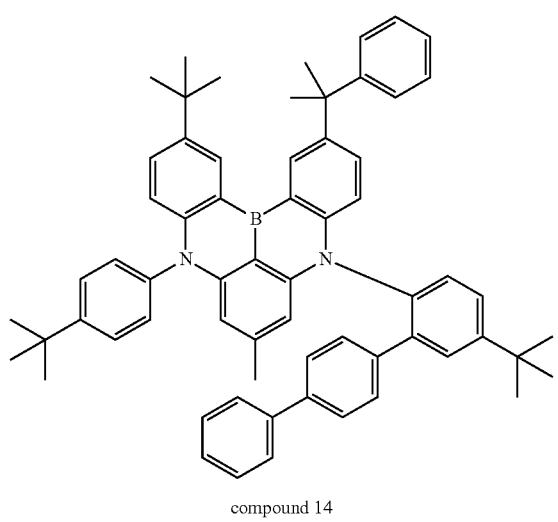

compound 14

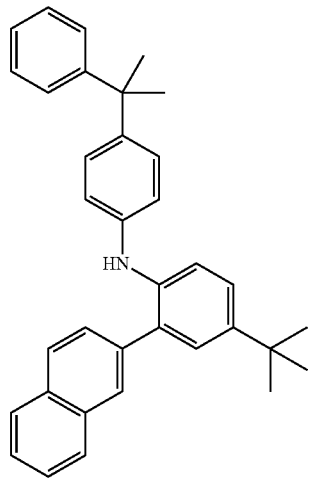

A-12

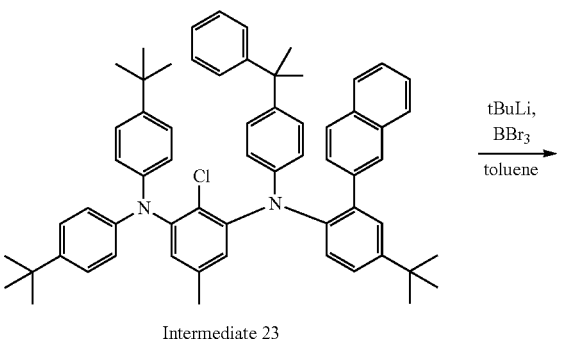

Intermediate 23

9.0 g of Intermediate 22 was obtained in the same manner as in the method of preparing Intermediate 2 in Synthesis Example 1, using 11 g of Compound A-11 instead of Compound A-2. As a result of measuring the mass spectrum of the obtained solid, a peak was confirmed at [M+1-1]+=899.

1.5 g of Compound 14 was obtained in the same manner as in the method of preparing Compound 1 in Synthesis Example 1, using 5.0 g of Intermediate 22 instead of Intermediate 2. As a result of measuring the mass spectrum of the obtained solid, a peak was confirmed at [M+H]+=873.

115

-continued

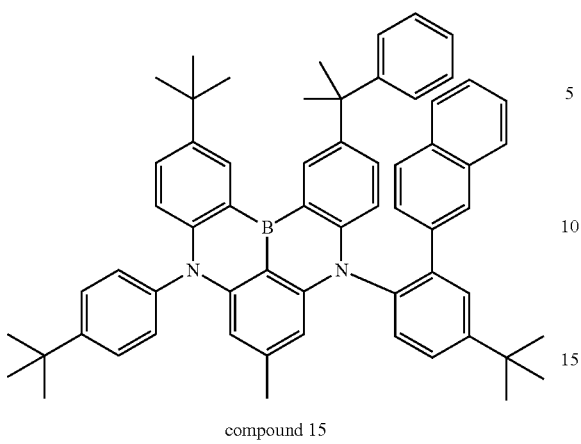

compound 15

20 g of Intermediate 23 was obtained in the same manner as in the method of preparing Intermediate 2 in Synthesis Example 1, using 16 g of Compound A-12 instead of Compound A-2. As a result of measuring the mass spectrum of the obtained solid, a peak was confirmed at [M+H]+=873.

2.1 g of Compound 15 was obtained in the same manner as in the method of preparing Compound 1 in Synthesis Example 1, using 10 g of Intermediate 23 instead of Intermediate 2. As a result of measuring the mass spectrum of the obtained solid, a peak was confirmed at [M+H]+=847.

Synthesis Example 16. Synthesis of Compound 16

1) Synthesis of Intermediate 24

116

-continued

Intermediate 24

After 50 g of 1-bromo-2,3-dichloro-5-methylbenzene, 71 g of Compound A-13, 30 g of sodium tert-butoxide, and 2.0 g of bis(tri-tert-butylphosphine)palladium(0) were put into 1.0 L of toluene under a nitrogen atmosphere, the resulting mixture was heated at 120° C. and stirred for 6 hours. After the reaction was terminated, the reaction solution was cooled to room temperature, aliquoted by adding water and NH$_4$Cl thereto, and then filtered by treatment with MgSO$_4$ (anhydrous). The filtered solution was distilled off under reduced pressure and purified with recrystallization (ethyl acetate/hexane) to obtain 80 g of Intermediate 24.

2) Synthesis of Intermediate 25 and Compound 16

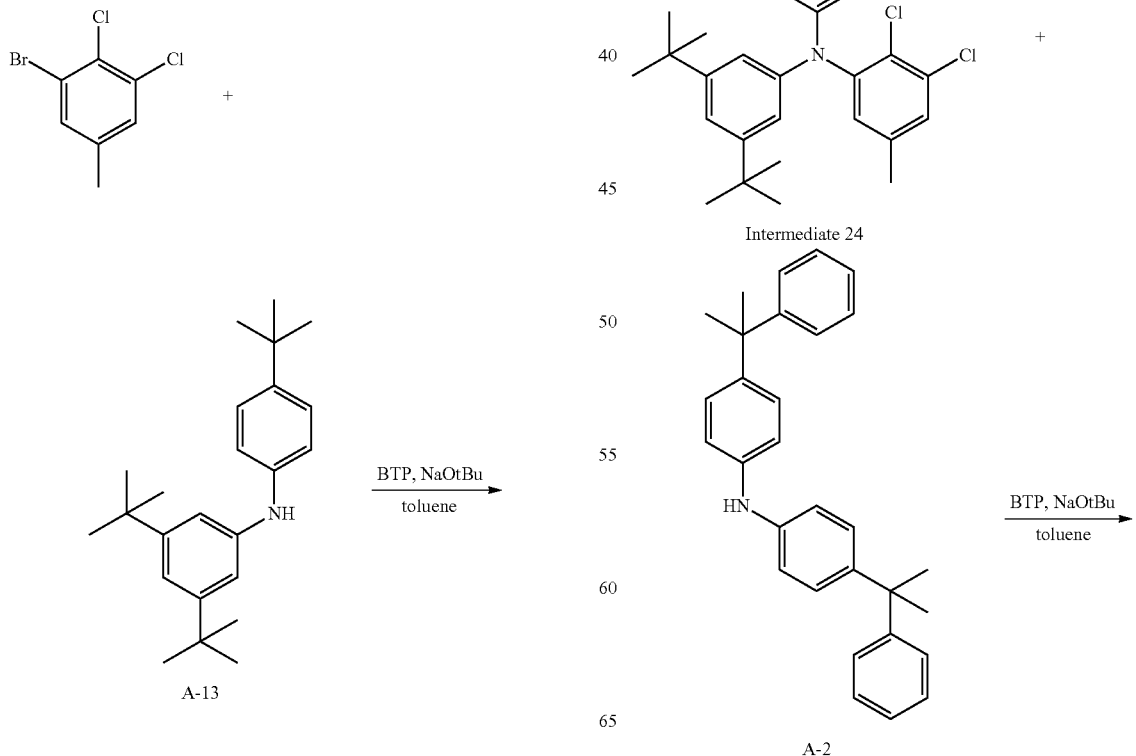

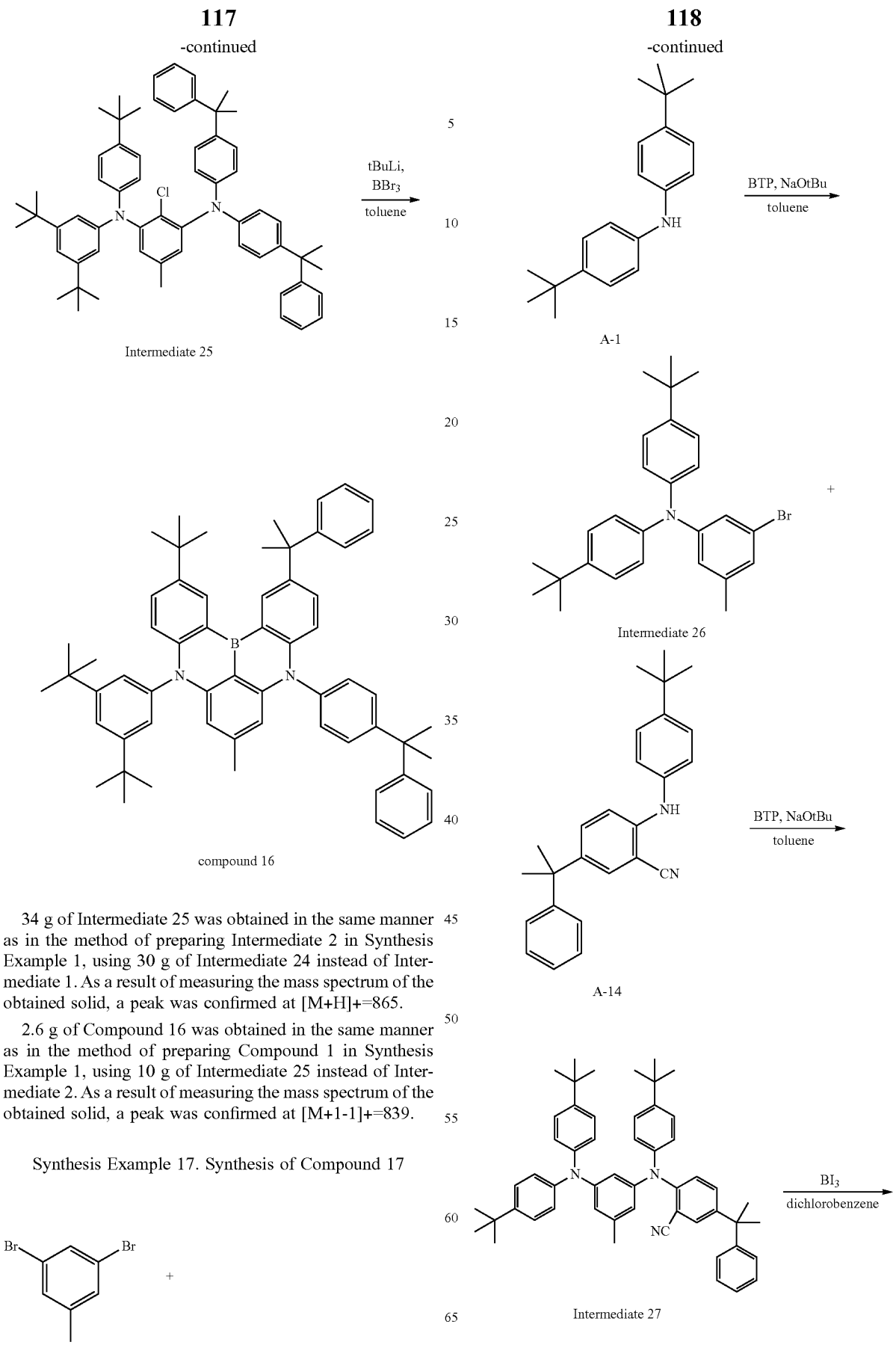

34 g of Intermediate 25 was obtained in the same manner as in the method of preparing Intermediate 2 in Synthesis Example 1, using 30 g of Intermediate 24 instead of Intermediate 1. As a result of measuring the mass spectrum of the obtained solid, a peak was confirmed at [M+H]+=865.

2.6 g of Compound 16 was obtained in the same manner as in the method of preparing Compound 1 in Synthesis Example 1, using 10 g of Intermediate 25 instead of Intermediate 2. As a result of measuring the mass spectrum of the obtained solid, a peak was confirmed at [M+1-1]+=839.

Synthesis Example 17. Synthesis of Compound 17

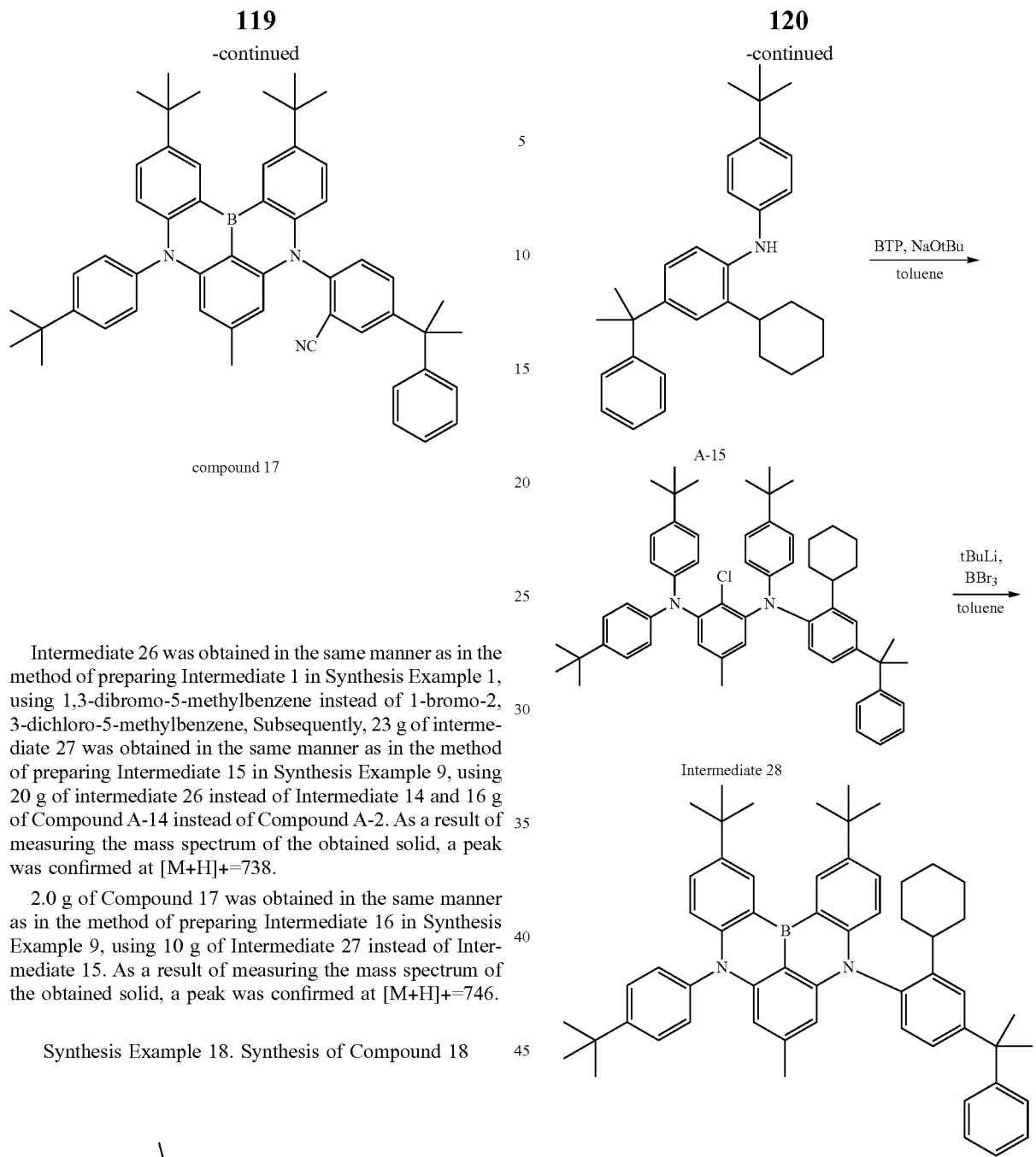

Intermediate 26 was obtained in the same manner as in the method of preparing Intermediate 1 in Synthesis Example 1, using 1,3-dibromo-5-methylbenzene instead of 1-bromo-2,3-dichloro-5-methylbenzene, Subsequently, 23 g of intermediate 27 was obtained in the same manner as in the method of preparing Intermediate 15 in Synthesis Example 9, using 20 g of intermediate 26 instead of Intermediate 14 and 16 g of Compound A-14 instead of Compound A-2. As a result of measuring the mass spectrum of the obtained solid, a peak was confirmed at [M+H]+=738.

2.0 g of Compound 17 was obtained in the same manner as in the method of preparing Intermediate 16 in Synthesis Example 9, using 10 g of Intermediate 27 instead of Intermediate 15. As a result of measuring the mass spectrum of the obtained solid, a peak was confirmed at [M+H]+=746.

Synthesis Example 18. Synthesis of Compound 18

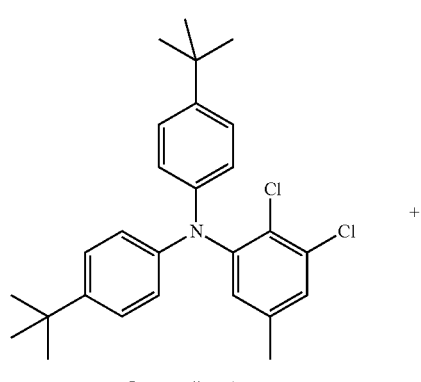

Intermediate 1

12 g of Intermediate 28 was obtained in the same manner as in the method of preparing Intermediate 2 in Synthesis Example 1, using 9.8 g of Compound A-15 instead of Compound A-2. As a result of measuring the mass spectrum of the obtained solid, a peak was confirmed at [M+H]+=839.

1.4 g of Compound 18 was obtained in the same manner as in the method of preparing Compound 1 in Synthesis Example 1, using 5.0 g of Intermediate 28 instead of Intermediate 2. As a result of measuring the mass spectrum of the obtained solid, a peak was confirmed at [M+H]+=803.

Synthesis Example 19. Synthesis of Compound 19

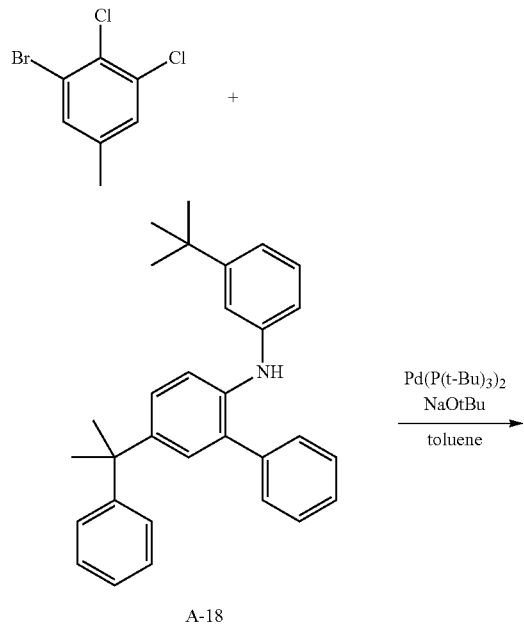

A-18

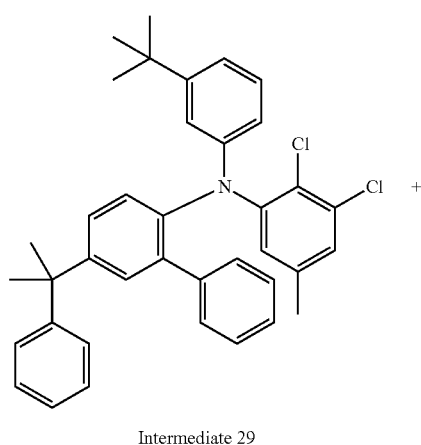

Intermediate 29

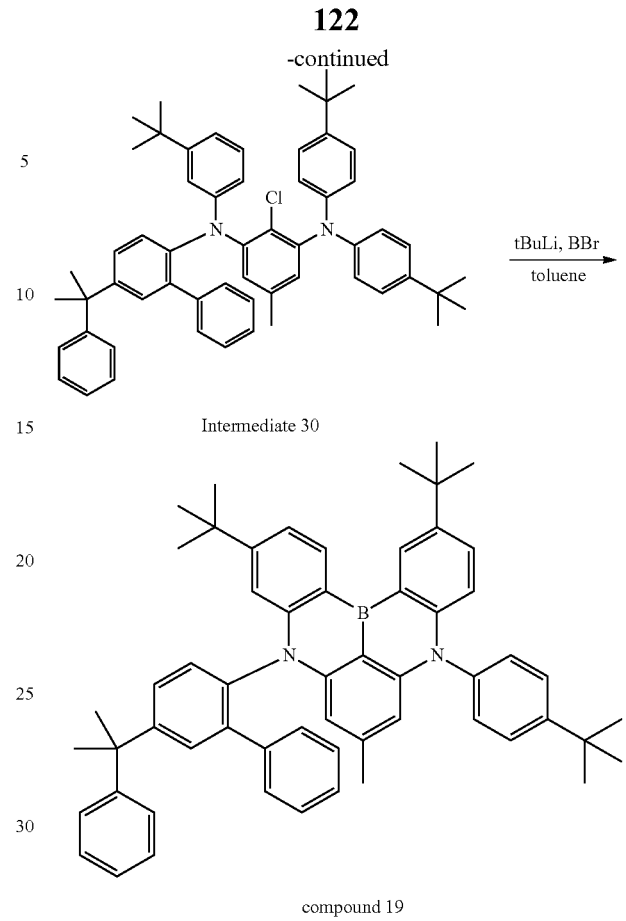

Intermediate 30 compound 19

Intermediate 29 was obtained in the same manner as in the method of preparing Intermediate 1 in Synthesis Example 1, using Compound A-18 instead of Compound A-1. 5.7 g of Intermediate 30 was obtained in the same manner as in the method of preparing Intermediate 2 in Synthesis Example 1, using 5.0 g of Intermediate 29 instead of Intermediate 1. As a result of measuring the mass spectrum of the obtained solid, a peak was confirmed at [M+H]+=823.

1.2 g of Compound 19 was obtained in the same manner as in the method of preparing Compound 1 in Synthesis Example 1, using 5.0 g of Intermediate 30 instead of Intermediate 2. As a result of measuring the mass spectrum of the obtained solid, a peak was confirmed at [M+H]+=797.

Synthesis Example 20. Synthesis of Compound 20

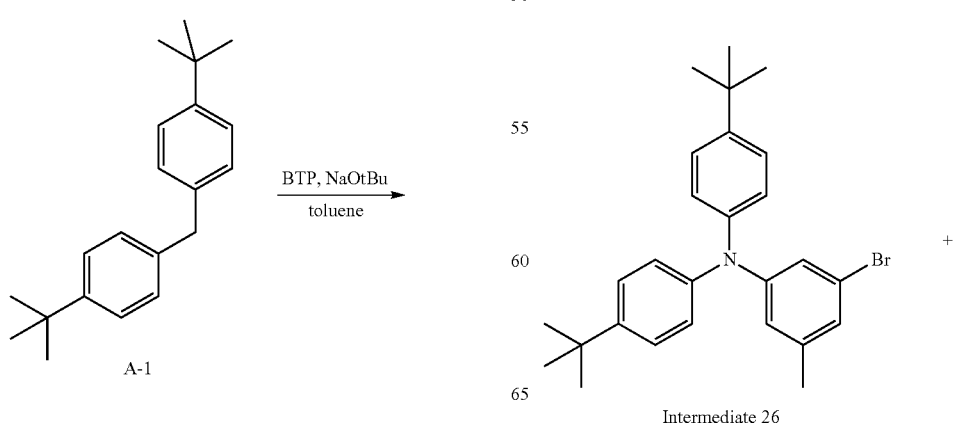

A-1

Intermediate 26

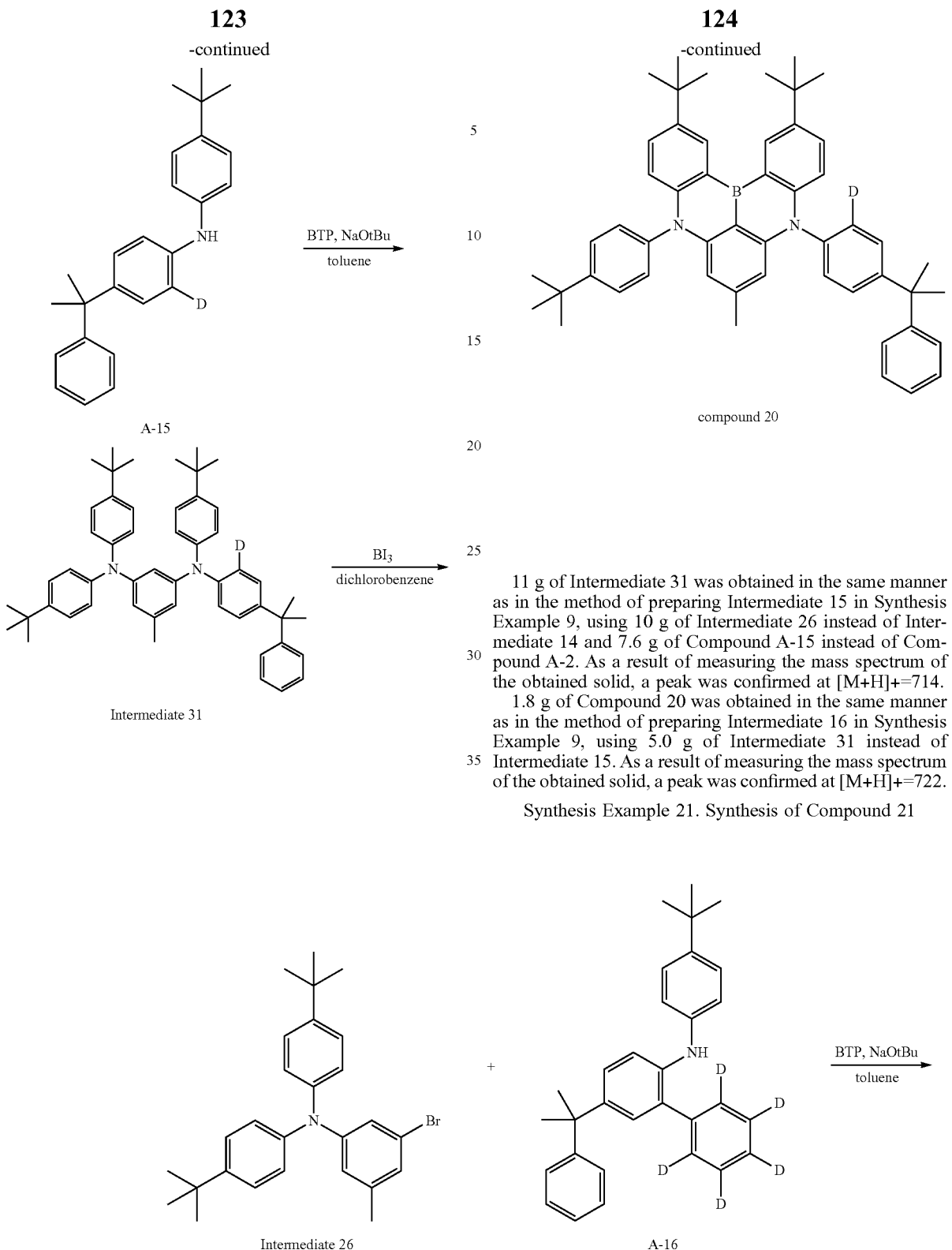

11 g of Intermediate 31 was obtained in the same manner as in the method of preparing Intermediate 15 in Synthesis Example 9, using 10 g of Intermediate 26 instead of Intermediate 14 and 7.6 g of Compound A-15 instead of Compound A-2. As a result of measuring the mass spectrum of the obtained solid, a peak was confirmed at [M+H]+=714.

1.8 g of Compound 20 was obtained in the same manner as in the method of preparing Intermediate 16 in Synthesis Example 9, using 5.0 g of Intermediate 31 instead of Intermediate 15. As a result of measuring the mass spectrum of the obtained solid, a peak was confirmed at [M+H]+=722.

Synthesis Example 21. Synthesis of Compound 21

-continued

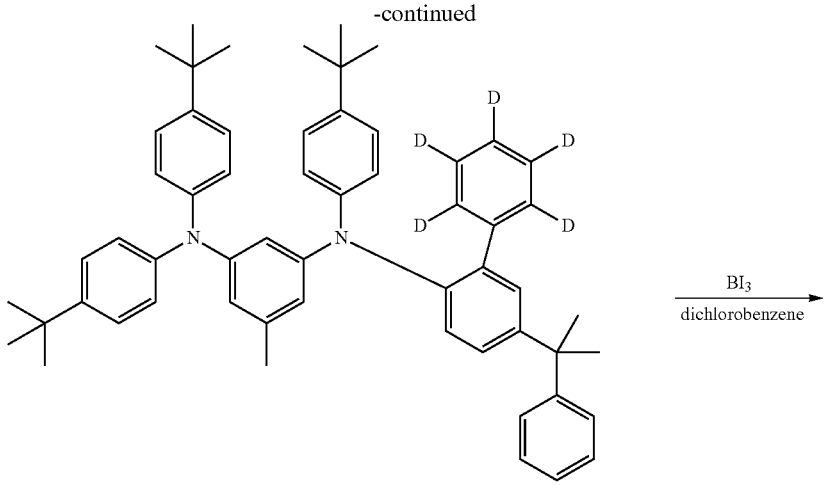

Intermediate 32

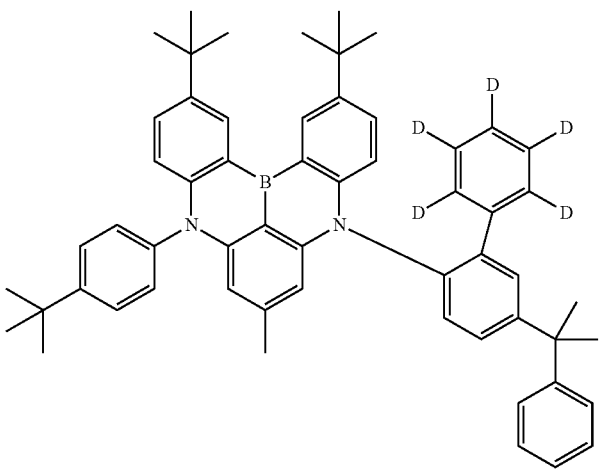

compound 21

10 g of Intermediate 32 was obtained in the same manner as in the method of preparing Intermediate 15 in Synthesis Example 9, using 10 g of Intermediate 26 instead of Intermediate 14 and 9.3 g of Compound A-16 instead of Compound A-2. As a result of measuring the mass spectrum of the obtained solid, a peak was confirmed at [M+H]+=794.

2.4 g of Compound 21 was obtained in the same manner as in the method of preparing Intermediate 16 in Synthesis Example 9, using 7.0 g of Intermediate 32 instead of Intermediate 15. As a result of measuring the mass spectrum of the obtained solid, a peak was confirmed at [M+1-1]+=802.

Synthesis Example 22. Synthesis of Compound 22
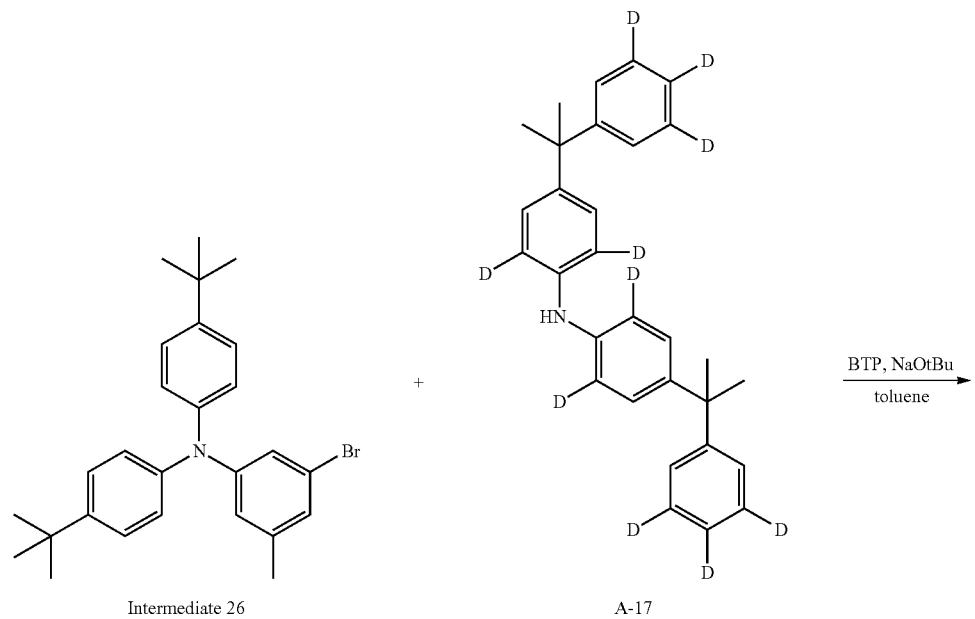
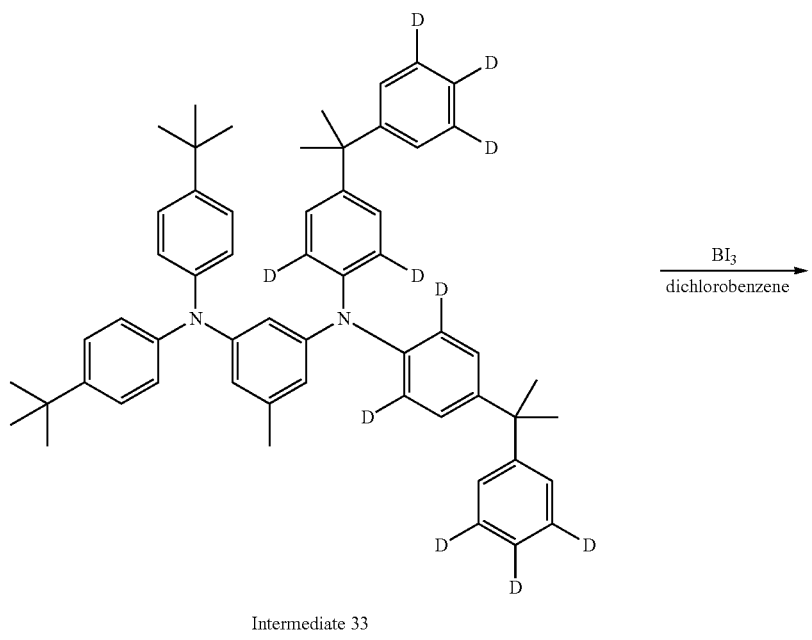

-continued

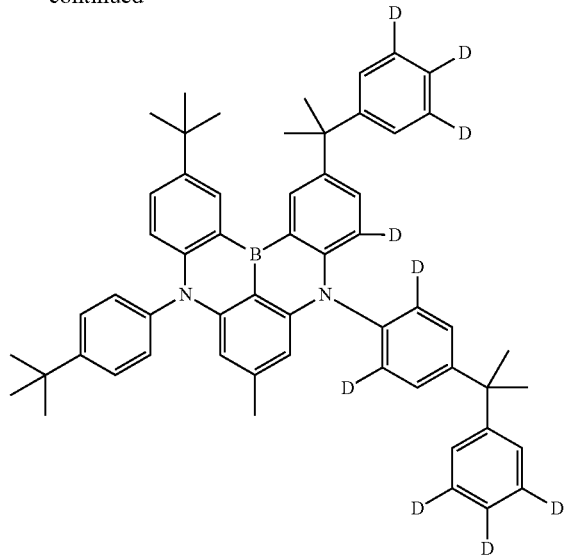

compound 22

13 g of Intermediate 33 was obtained in the same manner as in the method of preparing Intermediate 15 in Synthesis Example 9, using 10 g of Intermediate 26 instead of Intermediate 14 and 9.1 g of Compound A-17 instead of Compound A-2. As a result of measuring the mass spectrum of the obtained solid, a peak was confirmed at [M+H]+=785.

2.6 g of Compound 22 was obtained in the same manner as in the method of preparing Intermediate 16 in Synthesis Example 9, using 10 g of Intermediate 33 instead of Intermediate 15. As a result of measuring the mass spectrum of the obtained solid, a peak was confirmed at [M+H]+=792.

Synthesis Example 23. Synthesis of Compound 23

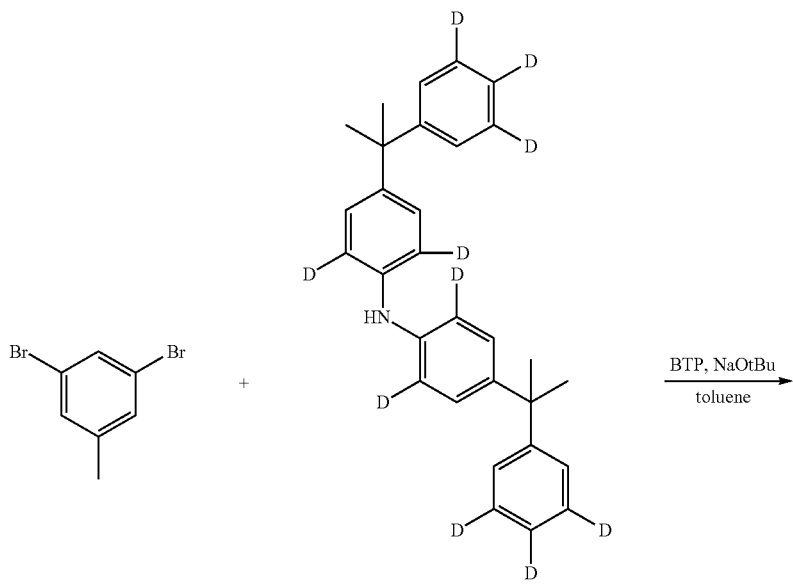

A-17

-continued

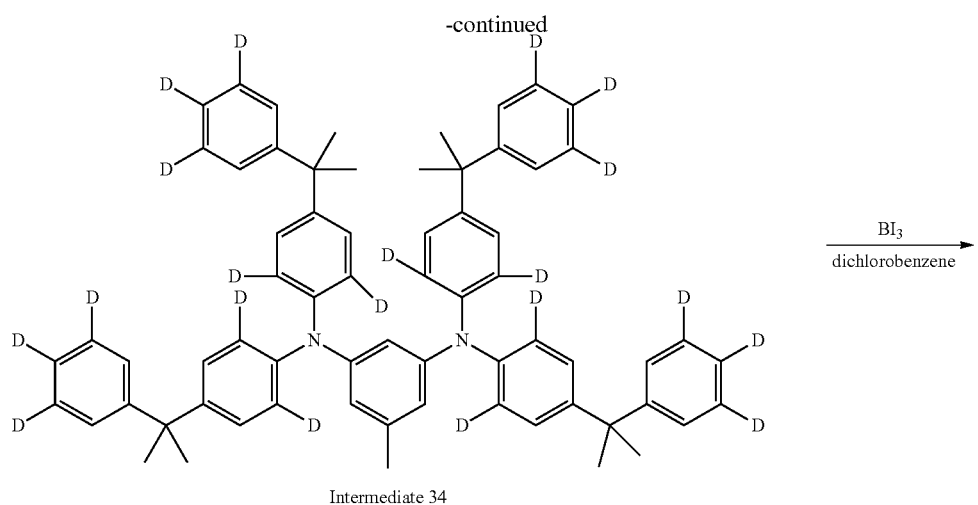
Intermediate 34

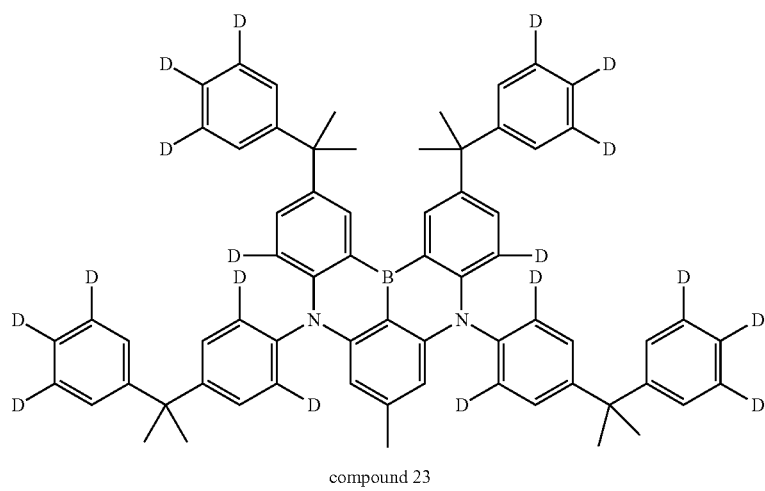
compound 23

52 g of Intermediate 34 was obtained in the same manner as in the method of preparing Intermediate 14 in Synthesis Example 9, using 20 g of 1,3-dibromo-5-methylbenzene instead of 1,3-dibromo-5-chlorobenzene and 34 g of Compound A-17 instead of Compound A-1. As a result of measuring the mass spectrum of the obtained solid, a peak was confirmed at [M+H]+=917.

2.1 g of Compound 23 was obtained in the same manner as in the method of preparing Intermediate 16 in Synthesis Example 9, using 10 g of Intermediate 34 instead of Intermediate 15. As a result of measuring the mass spectrum of the obtained solid, a peak was confirmed at [M+H]+=925.

Synthesis Example 24. Synthesis of Compound 24
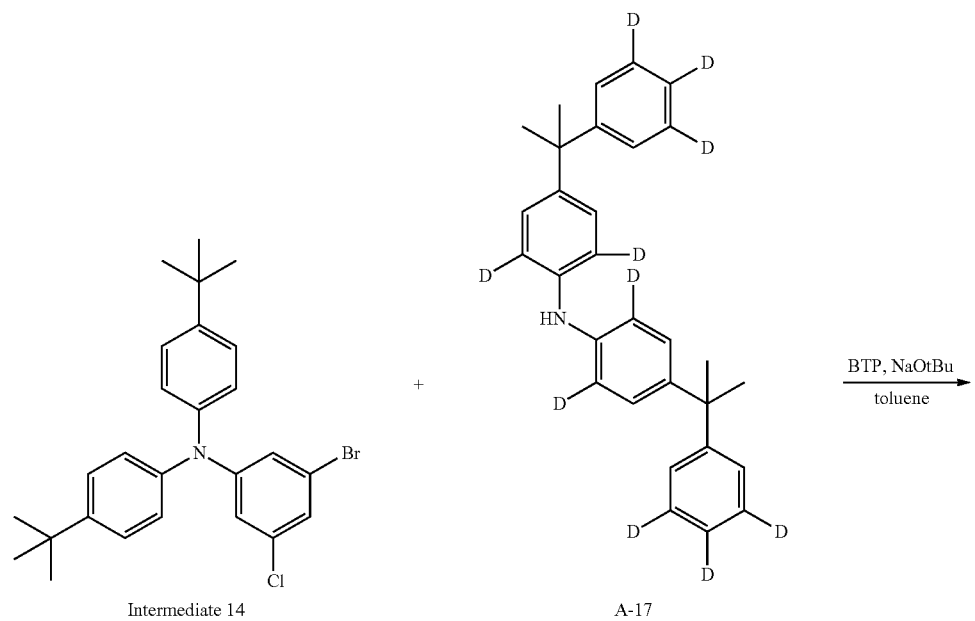
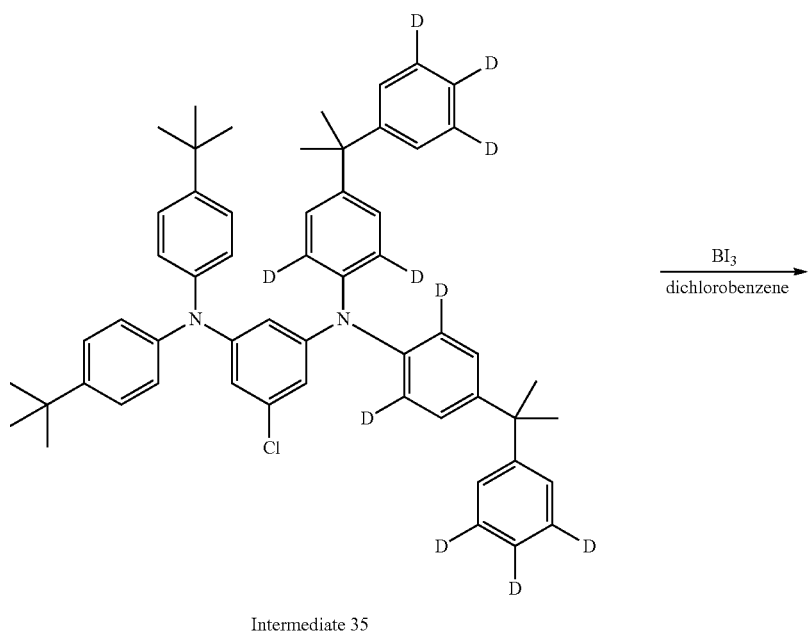

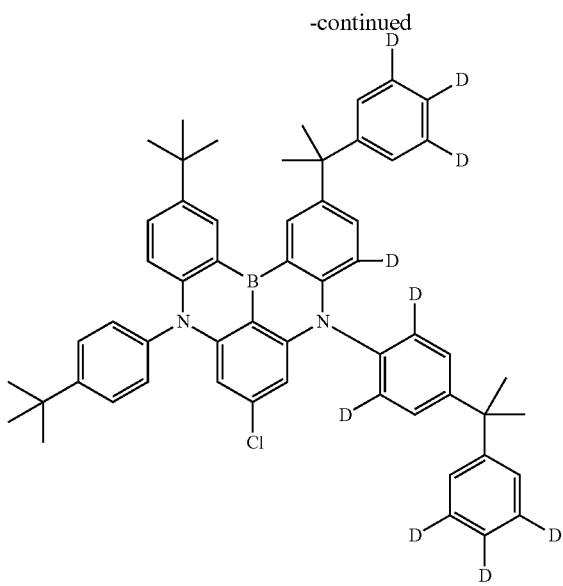
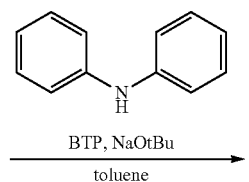

Intermediate 36

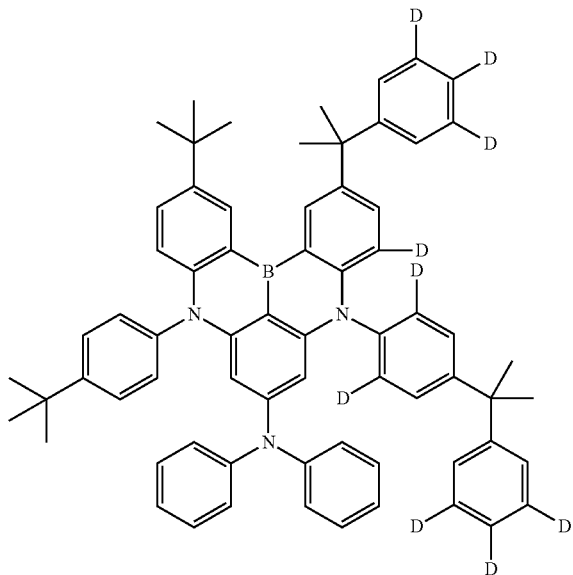

compound 24

12 g of Intermediate 35 was obtained in the same manner as in the method of preparing Intermediate 15 in Synthesis Example 9, using 8.8 g of Compound A-17 instead of Compound A-2. As a result of measuring the mass spectrum of the obtained solid, a peak was confirmed at [M+H]+=805. Subsequently, 2.1 g of Intermediate 36 was obtained in the same manner as in the method of preparing Intermediate 16 in Synthesis Example 9, using 10 g of Intermediate 35 instead of Intermediate 15. As a result of measuring the mass spectrum of the obtained solid, a peak was confirmed at [M+H]+=812.

2.0 g of Compound 24 was obtained in the same manner as in the method of preparing Compound 9 in Synthesis Example 9, using 2.0 g of Intermediate 36 instead of Intermediate 16. As a result of measuring the mass spectrum of the obtained solid, a peak was confirmed at [M+H]+=945.

Synthesis Example 25. Synthesis of Compound 25
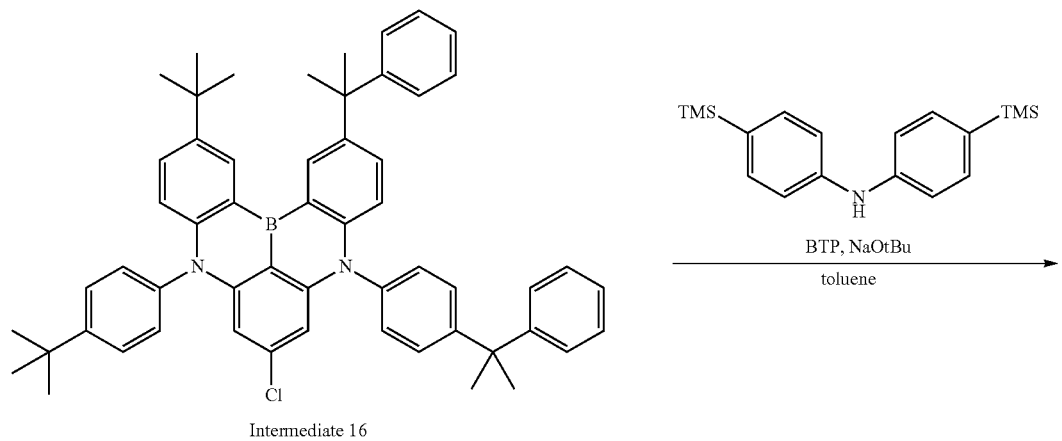
Intermediate 16
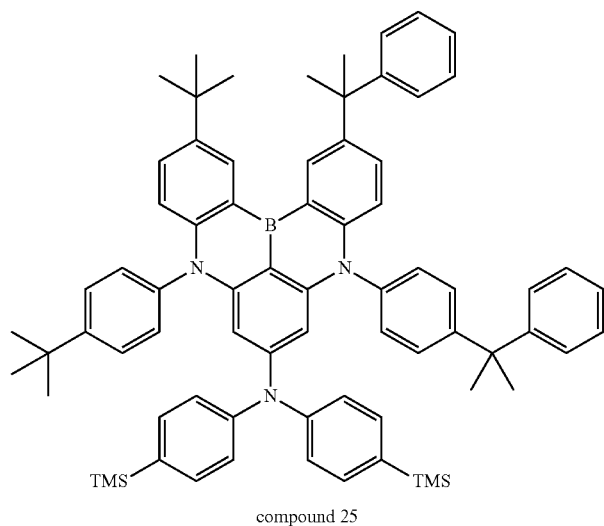
compound 25
2.8 g of Compound 25 was obtained in the same manner as in the method of preparing Compound 9 in Synthesis Example 9, using 1.2 g of bis-4-trimethylsilylaniline instead of diphenylamine. As a result of measuring the mass spectrum of the obtained solid, a peak was confirmed at [M+H]+=1080.

Synthesis Example 26. Synthesis of Compound 26
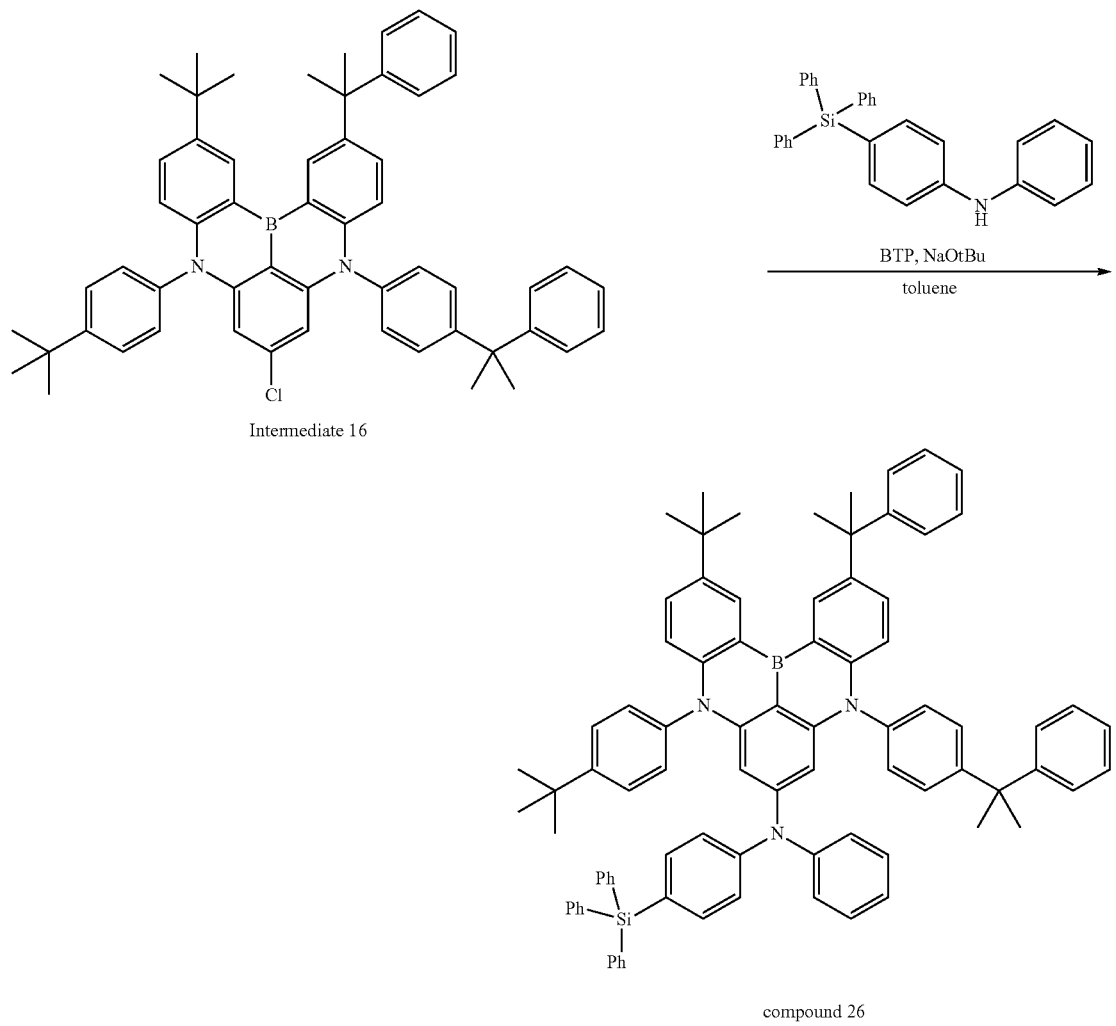
3.0 g of Compound 26 was obtained in the same manner as in the method of preparing Compound 9 in Synthesis Example 9, using 1.6 g of N-phenyl-4-triphenylsilylaniline instead of diphenylamine.
Synthesis Example 27. Synthesis of Compound 27
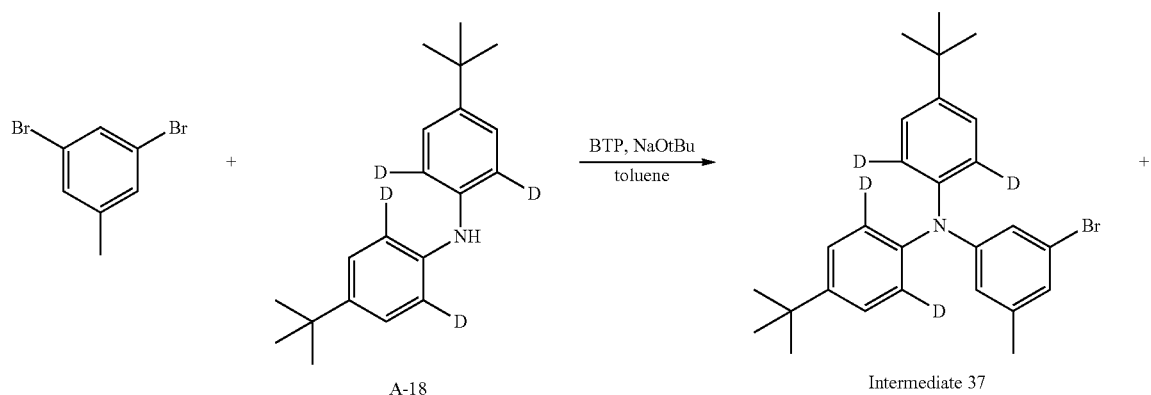

-continued
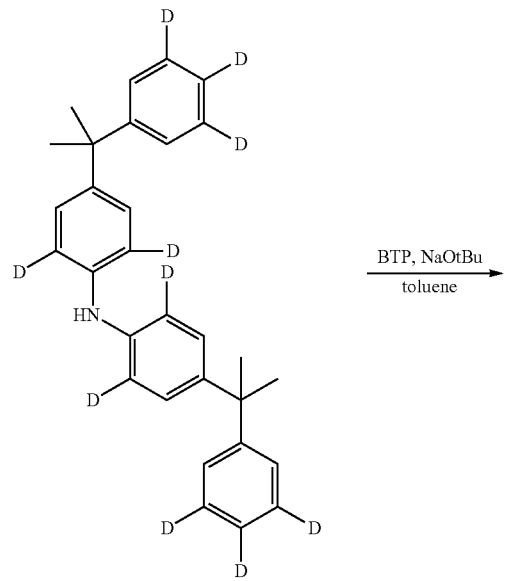
A-17
$\xrightarrow{\text{BTP, NaOtBu}}{\text{toluene}}$
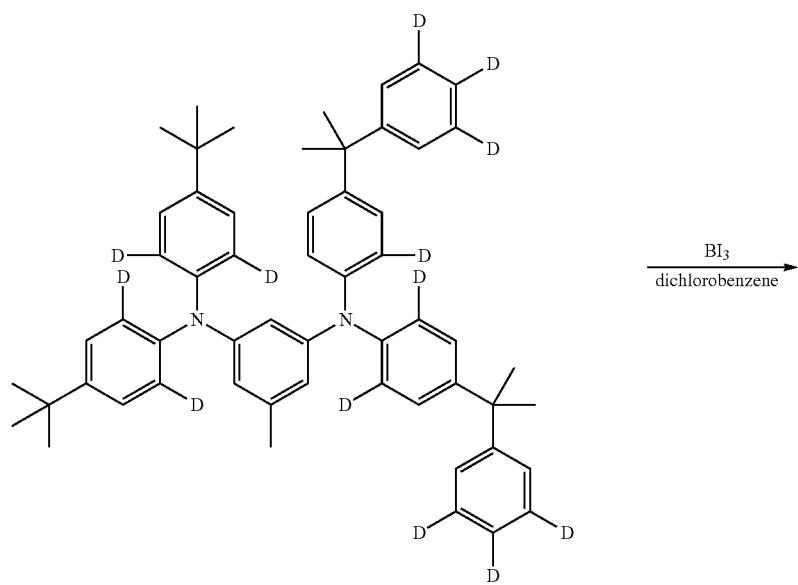
Intermediate 38
$\xrightarrow{\text{BI}_3}{\text{dichlorobenzene}}$

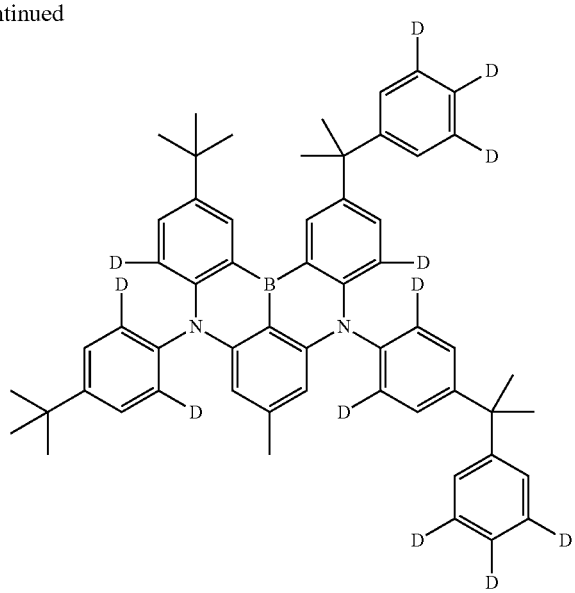

compound 27

14 g of Intermediate 37 was obtained in the same manner as in the method of preparing Intermediate 14 in Synthesis Example 9, using 10 g of 1,3-dibromo-5-methylbenzene instead of 1,3-dibromo-5-chlorobenzene and 11 g of Compound A-18 instead of Compound A-1. As a result of measuring the mass spectrum of the obtained solid, a peak was confirmed at [M+H]+=454.

11 g of Intermediate 38 was obtained in the same manner as in the method of preparing Intermediate 15 in Synthesis Example 9, using 10 g of Intermediate 37 instead of Intermediate 14 and 9.2 g of Compound A-17 instead of Compound A-2. As a result of measuring the mass spectrum of the obtained solid, a peak was confirmed at [M+H]+=788.

1.5 g of Compound 27 was obtained in the same manner as in the method of preparing Intermediate 16 in Synthesis Example 9, using 5.0 g of Intermediate 38 instead of Intermediate 15. As a result of measuring the mass spectrum of the obtained solid, a peak was confirmed at [M+H]+=795.

Synthesis Example 28. Synthesis of Compound 28

1) Synthesis of Intermediate 39

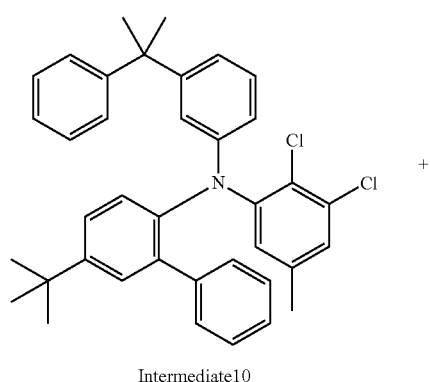

Intermediate10

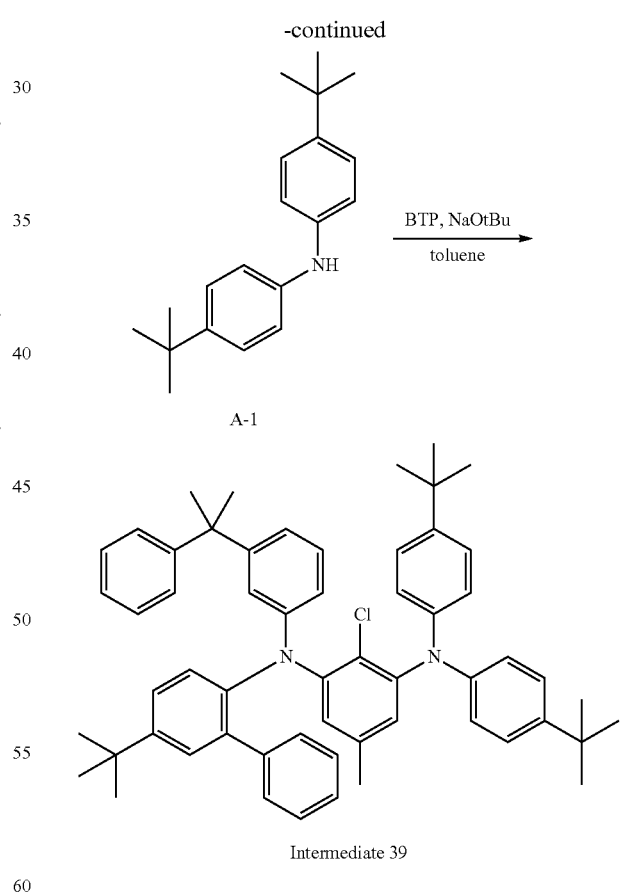

A-1

Intermediate 39

14 g of Intermediate 39 was obtained in the same manner as in the method of preparing Intermediate 2 in Synthesis Example 1, using 20 g of Intermediate 10 instead of Intermediate 1 and 9.7 g of Compound A-1 instead of Compound A-2. As a result of measuring the mass spectrum of the obtained solid, a peak was confirmed at [M+H]+=824.

2) Synthesis of Compound 28
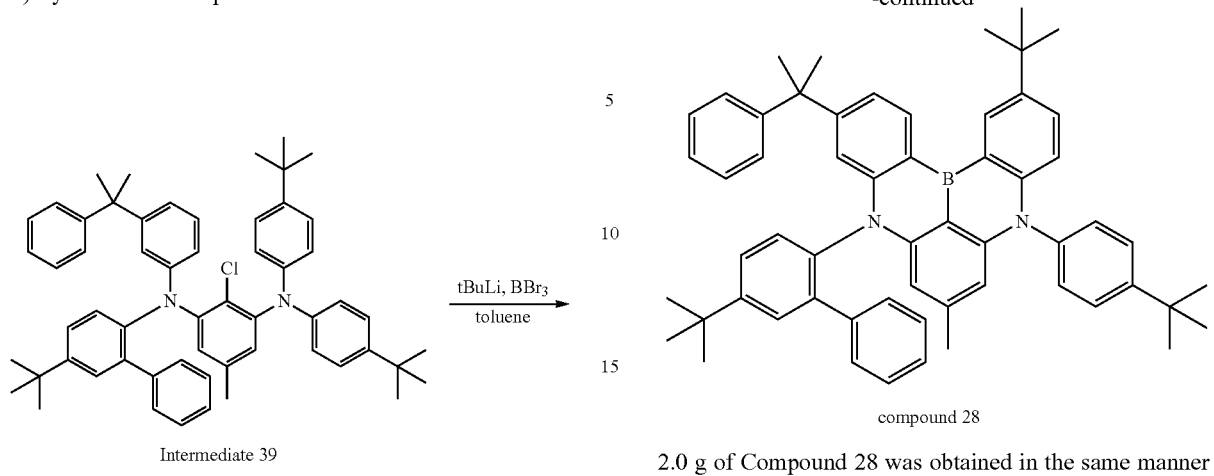
2.0 g of Compound 28 was obtained in the same manner as in the method of preparing Compound 1 in Synthesis Example 1, using 10 g of Intermediate 39 instead of Intermediate 2. As a result of measuring the mass spectrum of the obtained solid, a peak was confirmed at [M+H]+=797.
Synthesis Example 29. Synthesis of Compound 29
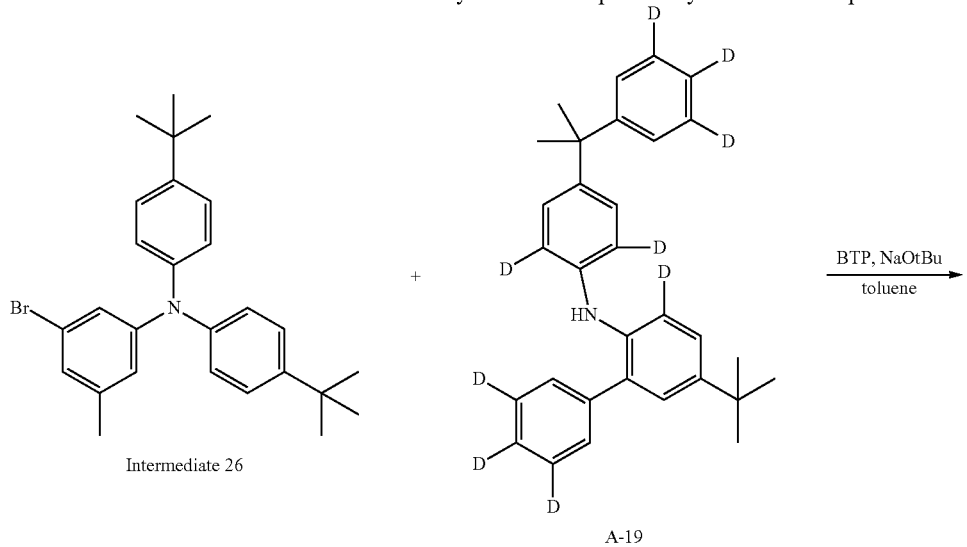
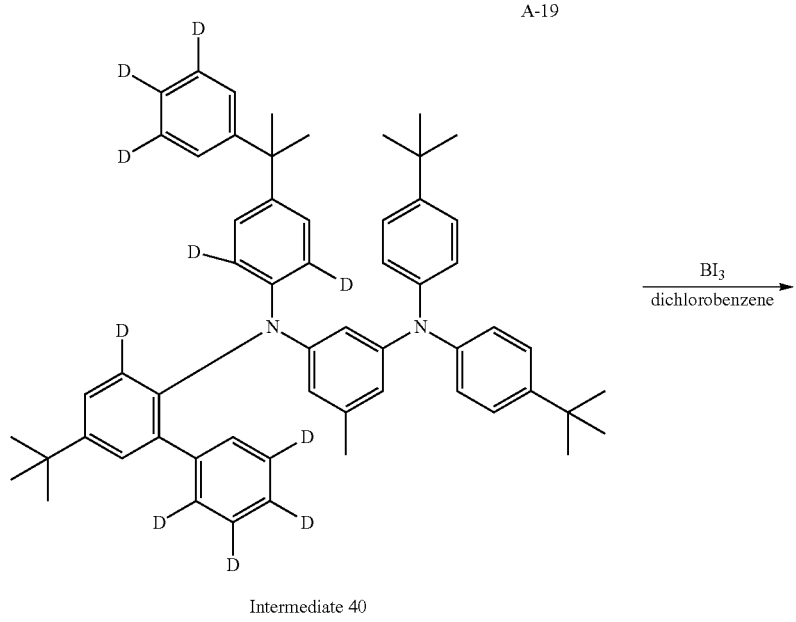

-continued

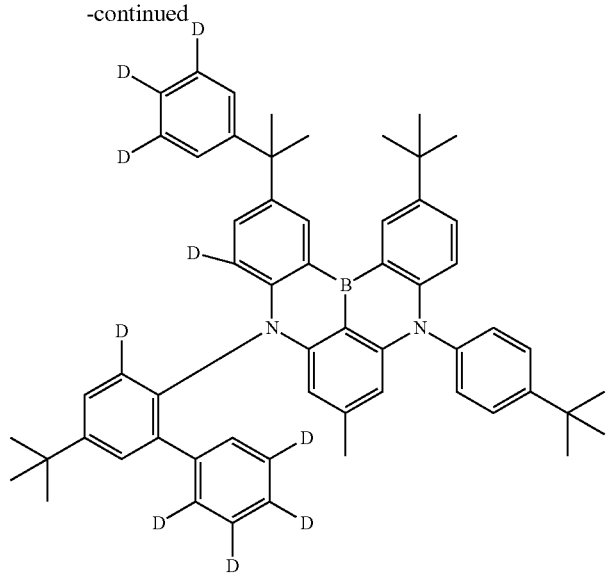

compound 29

12 g of Intermediate 40 was obtained in the same manner as in the method of preparing Intermediate 15 in Synthesis Example 9, using 10 g of Intermediate 26 instead of Intermediate 14 and 9.7 g of Compound A-19 instead of Compound A-2. As a result of measuring the mass spectrum of the obtained solid, a peak was confirmed at [M+H]+=799.

2.4 g of Compound 29 was obtained in the same manner as in the method of preparing Intermediate 16 in Synthesis Example 9, using 12 g of Intermediate 40 instead of Intermediate 15. As a result of measuring the mass spectrum of the obtained solid, a peak was confirmed at [M+H]+=806.

Synthesis Example 30. Synthesis of Compound 30

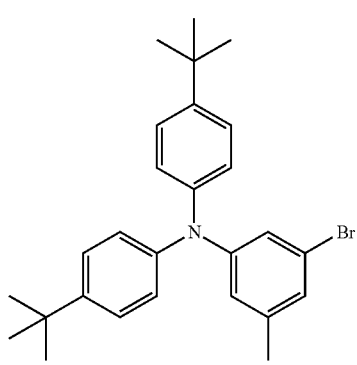

Intermediate 26

+

-continued

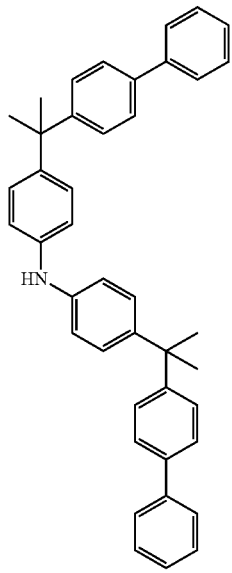

A-20

→ BTP, NaOtBu
toluene

Synthesis Example 31. Synthesis of Compound 31

1) Synthesis of Intermediates 41 and 42

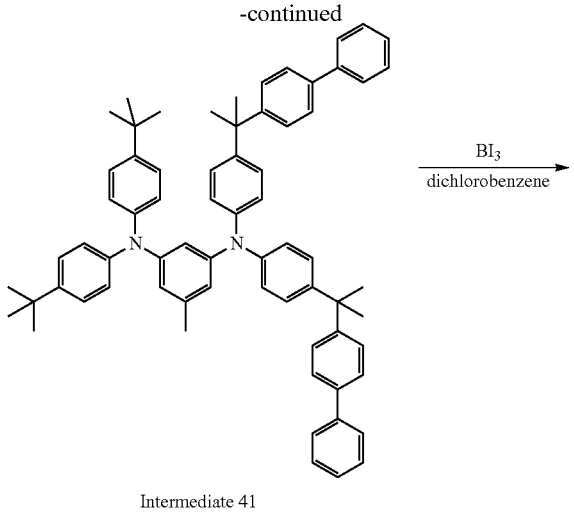

Intermediate 41

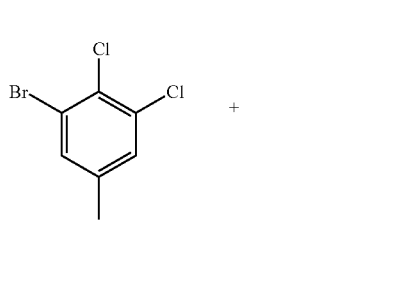

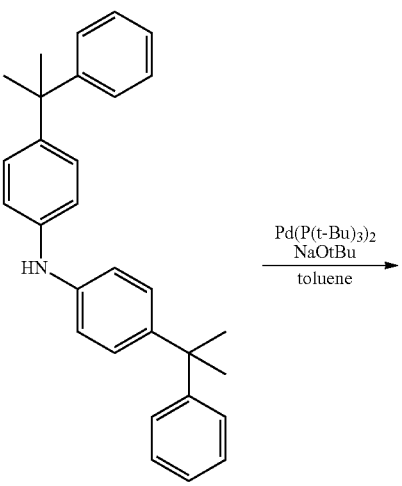

A-2

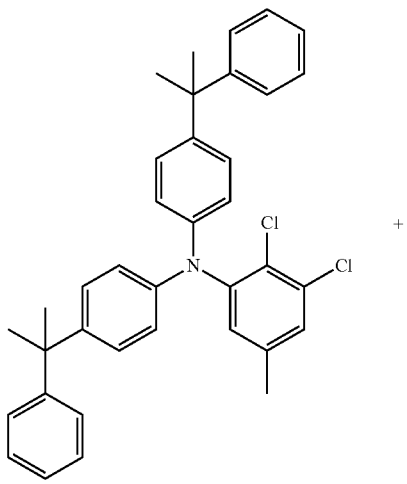

Intermediate 41 compound 30

6.1 g of Intermediate 41 was obtained in the same manner as in the method of preparing Intermediate 15 in Synthesis Example 9, using 5.0 g of Intermediate 26 instead of Intermediate 14 and 6.2 g of Compound A-20 instead of Compound A-2. As a result of measuring the mass spectrum of the obtained solid, a peak was confirmed at [M+H]+=927.

1.5 g of Compound 30 was obtained in the same manner as in the method of preparing Intermediate 16 in Synthesis Example 9, using 6.0 g of Intermediate 41 instead of Intermediate 15. As a result of measuring the mass spectrum of the obtained solid, a peak was confirmed at [M+H]+=935.

2) Synthesis of Compound 31

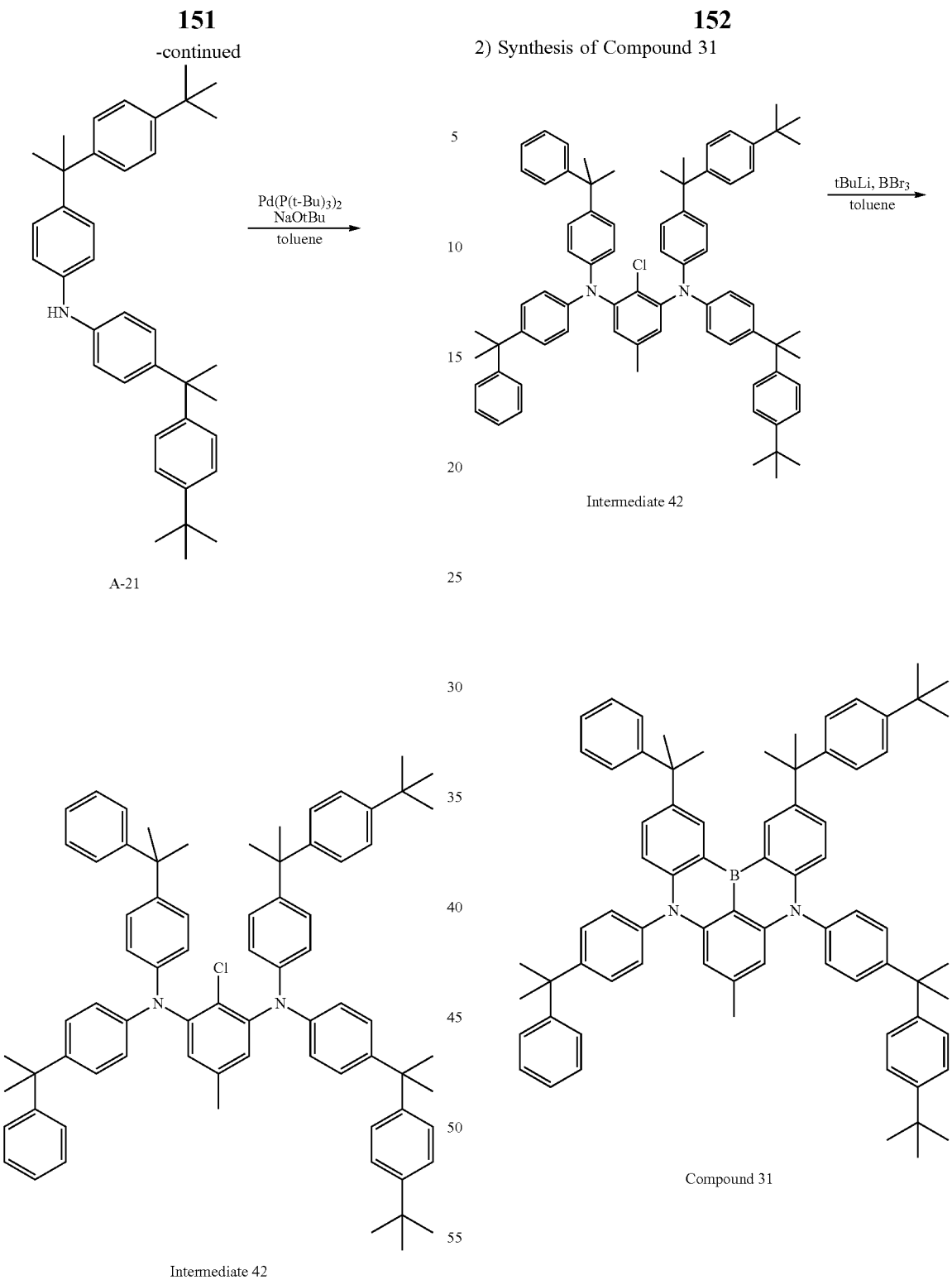

Intermediate 41 was obtained in the same manner as in the method of preparing Intermediate 1 in Synthesis Example 1, using Compound A-2 instead of Compound A-1. 5.1 g of Intermediate 42 was obtained in the same manner as in the method of preparing Intermediate 2 in Synthesis Example 1, using 4.0 g of Intermediate 41 instead of Intermediate 1. As a result of measuring the mass spectrum of the obtained solid, a peak was confirmed at [M+H]+=1045.

1.3 g of Compound 31 was obtained in the same manner as in the method of preparing Compound 1 in Synthesis Example 1, using 5.0 g of Intermediate 42 instead of Intermediate 2. As a result of measuring the mass spectrum of the obtained solid, a peak was confirmed at [M+1-1]+=1019.

Synthesis Example 32. Synthesis of Compound 32

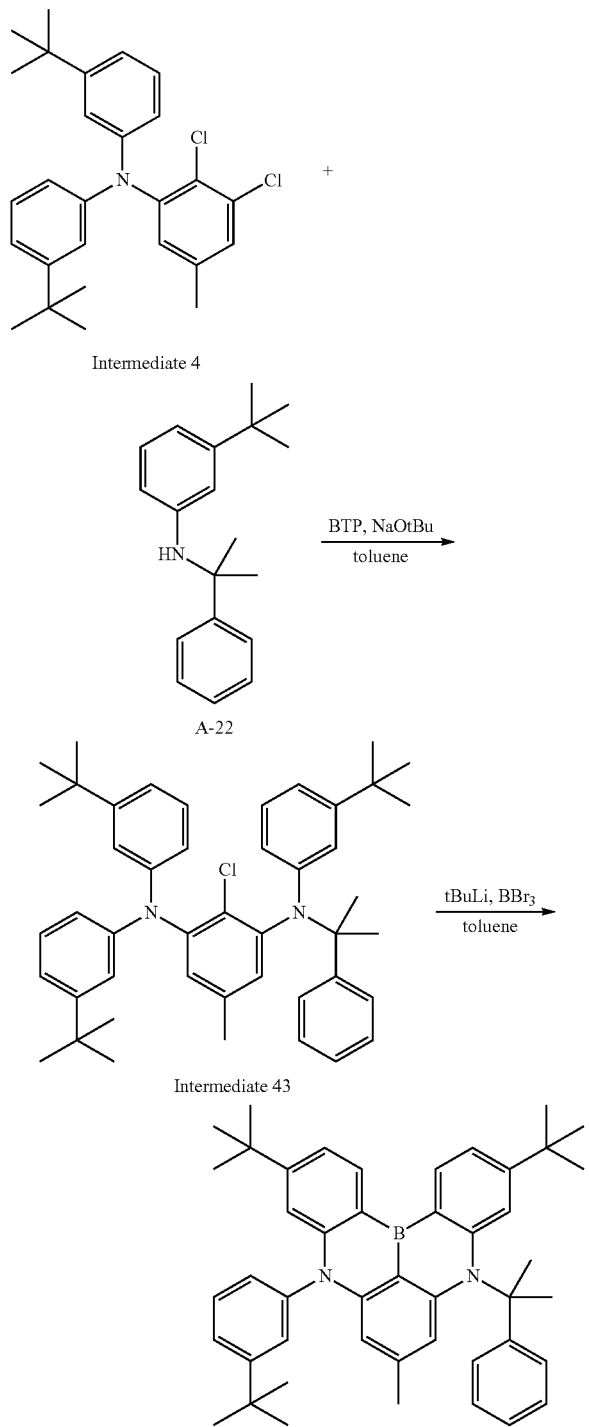

Intermediate 4

A-22

Intermediate 43 compound 32

5.1 g of Intermediate 43 was obtained in the same manner as in the method of preparing Intermediate 2 in Synthesis Example 1, using 5.0 g of Intermediate 4 instead of Intermediate 1 and 3.1 g of Compound A-22 instead of Compound A-2. As a result of measuring the mass spectrum of the obtained solid, a peak was confirmed at [M+H]+=672.

1.2 g of Compound 32 was obtained in the same manner as in the method of preparing Compound 1 in Synthesis Example 1, using 5.1 g of Intermediate 43 instead of Intermediate 2. As a result of measuring the mass spectrum of the obtained solid, a peak was confirmed at [M+H]+=645.

Synthesis Example 33. Synthesis of Compound 33

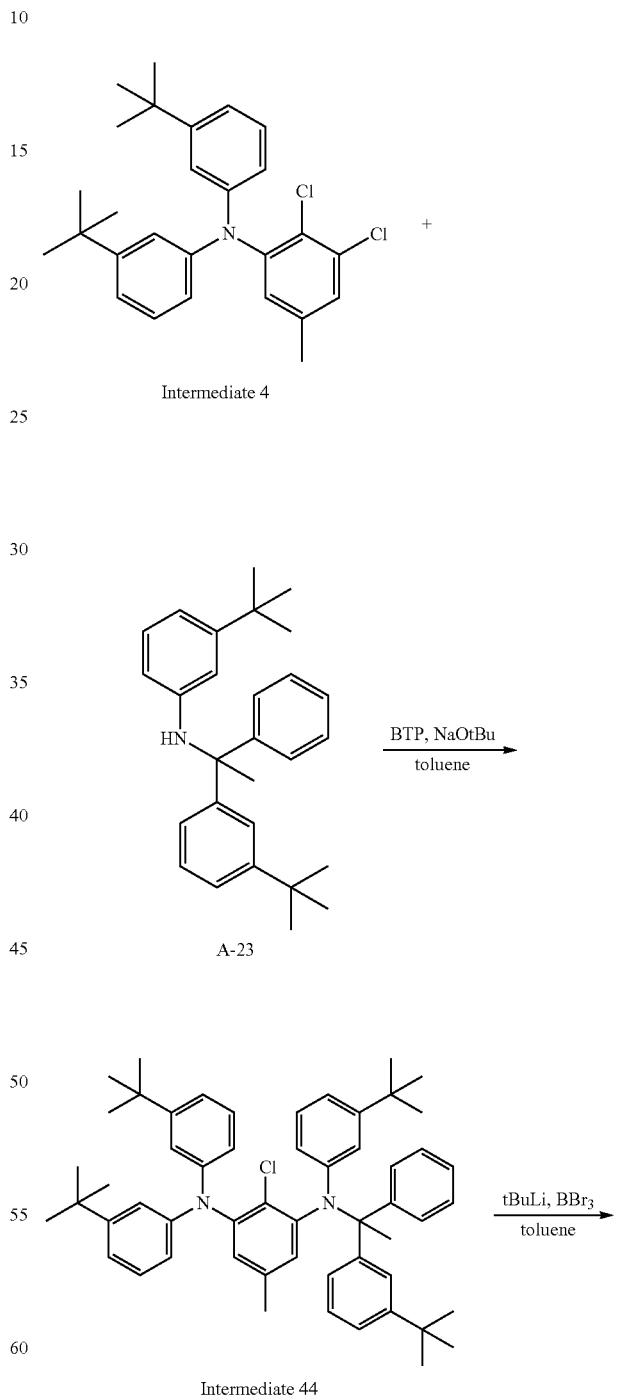

Intermediate 4

A-23

Intermediate 44

-continued

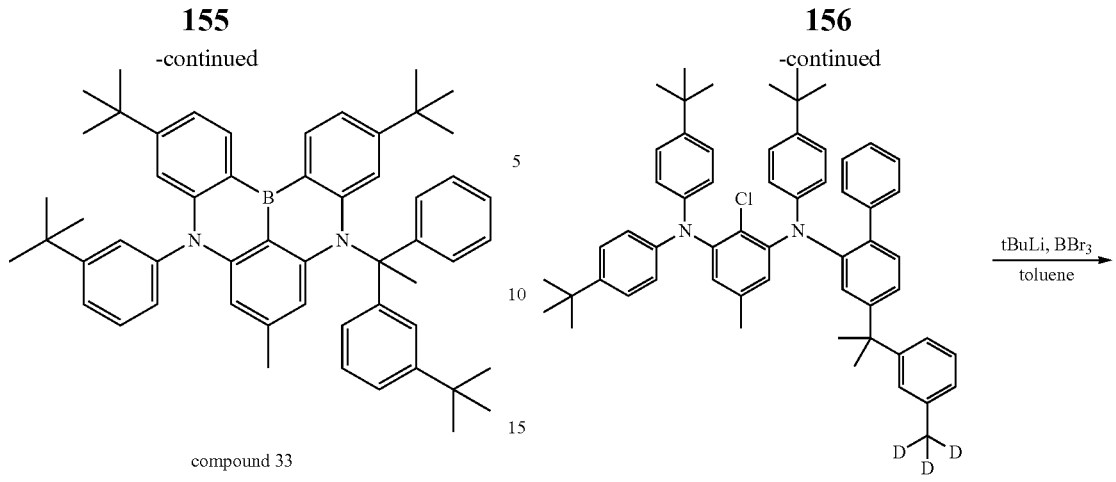

compound 33

6.2 g of Intermediate 44 was obtained in the same manner as in the method of preparing Intermediate 2 in Synthesis Example 1, using 5.0 g of Intermediate 4 instead of Intermediate 1 and 4.5 g of Compound A-23 instead of Compound A-2. As a result of measuring the mass spectrum of the obtained solid, a peak was confirmed at [M+H]+=790.

1.5 g of Compound 33 was obtained in the same manner as in the method of preparing Compound 1 in Synthesis Example 1, using 6.2 g of Intermediate 44 instead of Intermediate 2. As a result of measuring the mass spectrum of the obtained solid, a peak was confirmed at [M+H]+=763.

Synthesis Example 34. Synthesis of Compound 34

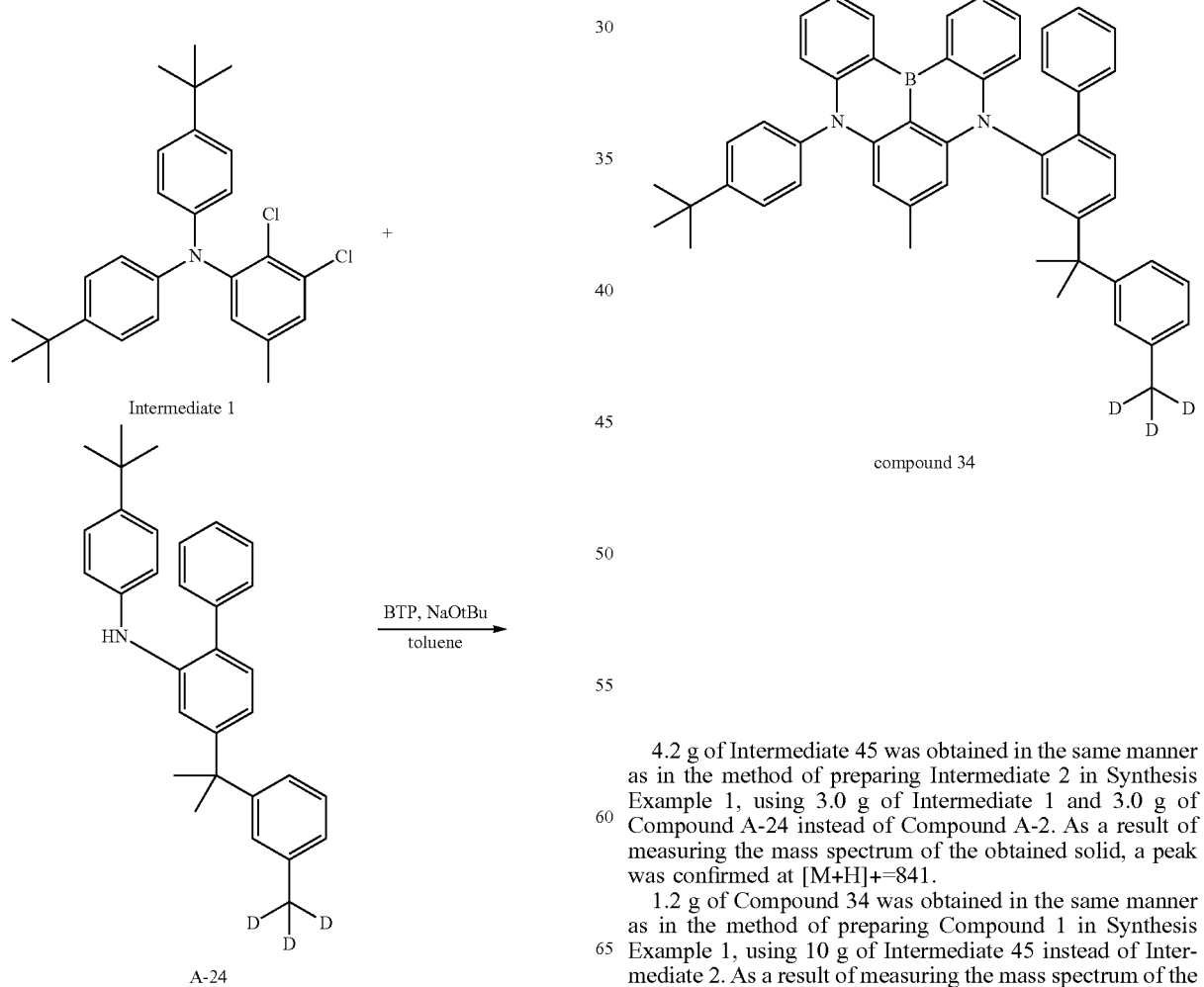

4.2 g of Intermediate 45 was obtained in the same manner as in the method of preparing Intermediate 2 in Synthesis Example 1, using 3.0 g of Intermediate 1 and 3.0 g of Compound A-24 instead of Compound A-2. As a result of measuring the mass spectrum of the obtained solid, a peak was confirmed at [M+H]+=841.

1.2 g of Compound 34 was obtained in the same manner as in the method of preparing Compound 1 in Synthesis Example 1, using 10 g of Intermediate 45 instead of Intermediate 2. As a result of measuring the mass spectrum of the obtained solid, a peak was confirmed at [M+H]+=815.

Synthesis Example 35. Synthesis of Compound 35

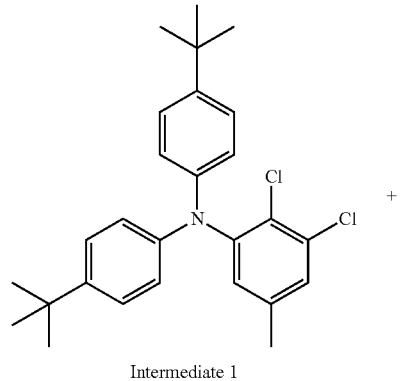

Intermediate 1

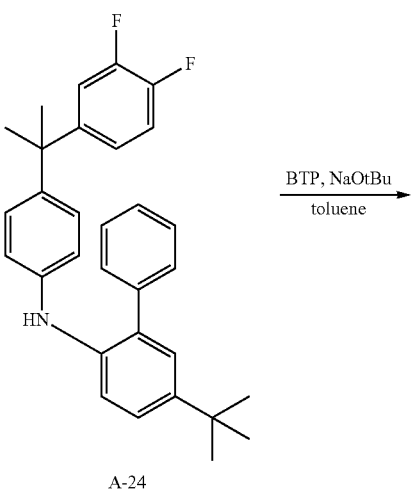

A-24

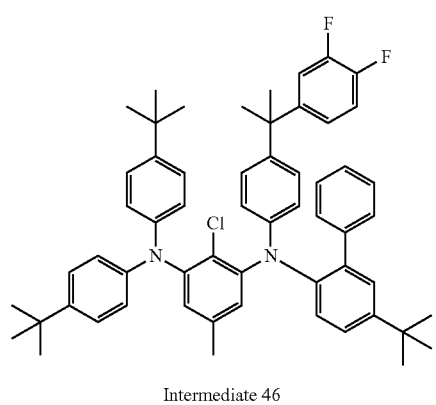

Intermediate 46

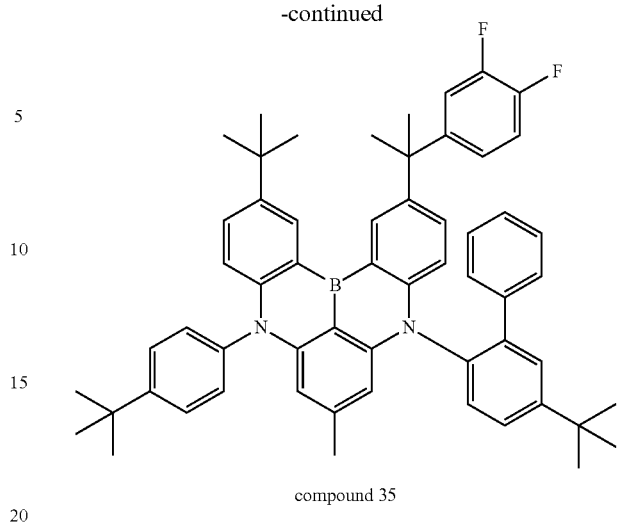

compound 35

3.8 g of Intermediate 46 was obtained in the same manner as in the method of preparing Intermediate 2 in Synthesis Example 1, using 3.0 g of Intermediate 1 and 3.2 g of Compound A-24 instead of Compound A-2. As a result of measuring the mass spectrum of the obtained solid, a peak was confirmed at [M+H]+=860.

0.9 g of Compound 35 was obtained in the same manner as in the method of preparing Compound 1 in Synthesis Example 1, using 3.8 g of Intermediate 46 instead of Intermediate 2. As a result of measuring the mass spectrum of the obtained solid, a peak was confirmed at [M+1-1]+ =833.

Synthesis Example 36. Synthesis of Compound 36

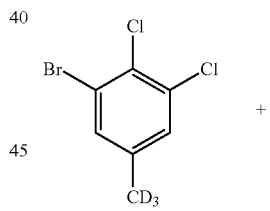

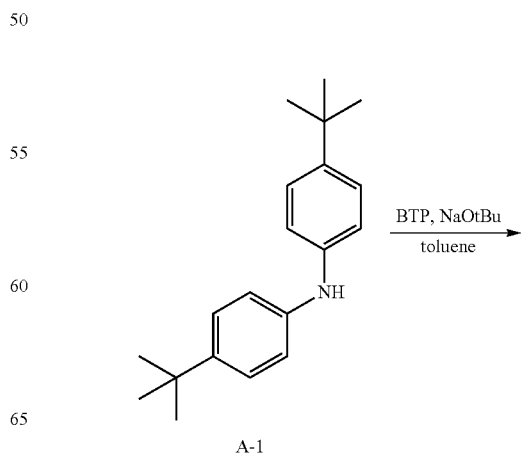

A-1

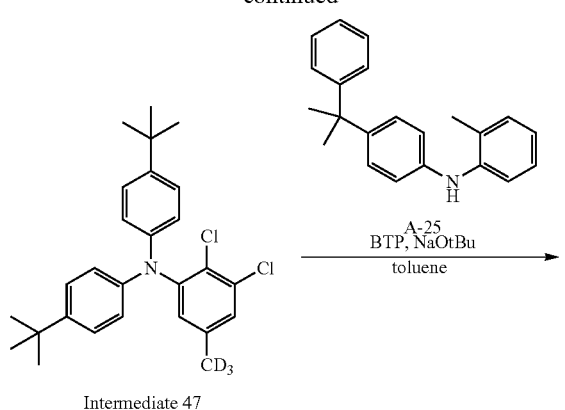

Intermediate 47

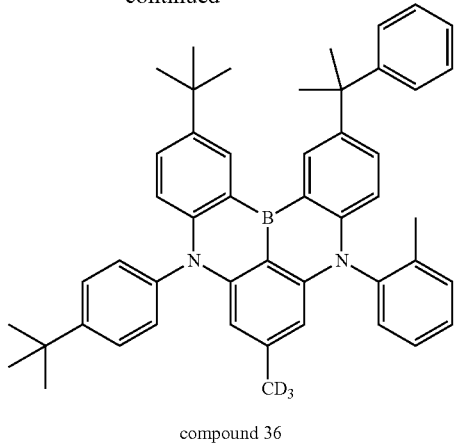

compound 36

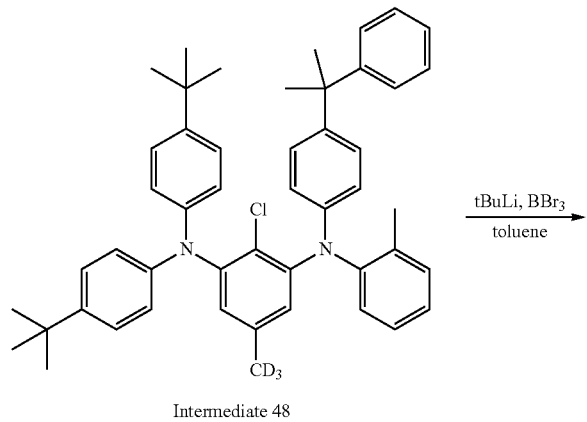

Intermediate 48

7.2 g of Intermediate 47 was obtained in the same manner as in the method of preparing Intermediate 1 in Synthesis Example 1, using 5.0 g of 1-bromo-2,3-dichloro-5-(methyl-d3)-benzene and 5.9 g of Compound A-1. 8.2 g of Intermediate 48 was obtained in the same manner as in the method of preparing Intermediate 2 in Synthesis Example 1, using 7.0 g of Intermediate 47 instead of Intermediate 1. As a result of measuring the mass spectrum of the obtained solid, a peak was confirmed at [M+H]+=709.

3.2 g of Compound 36 was obtained in the same manner as in the method of preparing Compound 1 in Synthesis Example 1, using 8.2 g of Intermediate 48 instead of Intermediate 2. As a result of measuring the mass spectrum of the obtained solid, a peak was confirmed at [M+1-1]+=682.

Synthesis Example 37. Synthesis of Compound 37

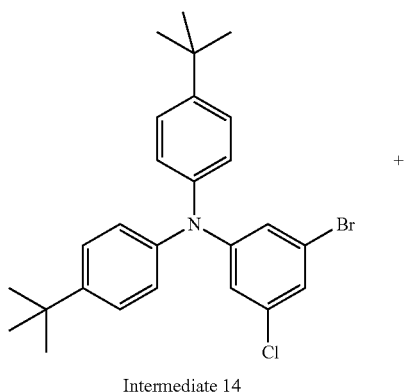

Intermediate 14

-continued
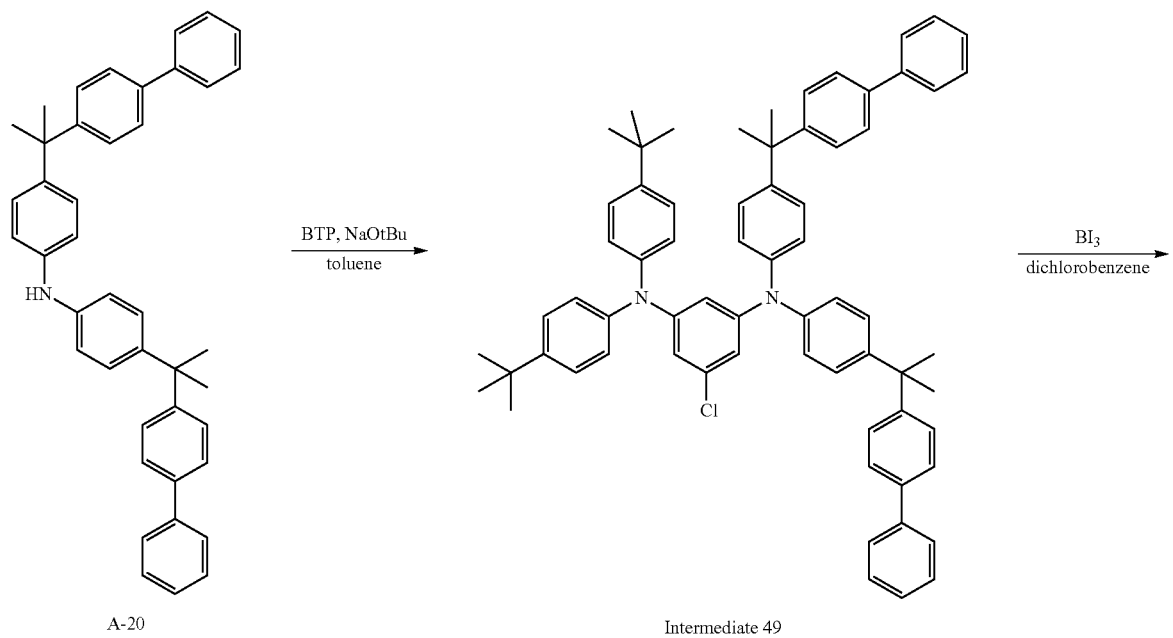
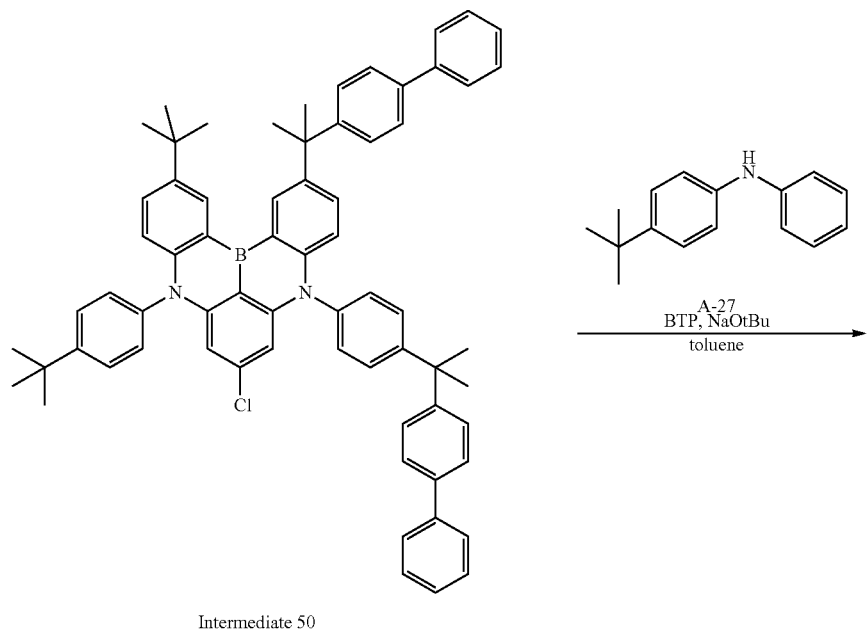

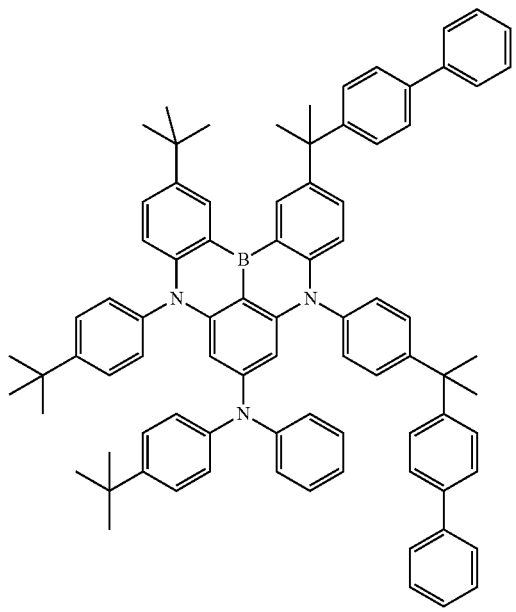

compound 37

4.2 g of Intermediate 49 was obtained in the same manner as in the method of preparing Intermediate 15 in Synthesis Example 9, using 3.6 g of Compound A-20 instead of Compound A-2. As a result of measuring the mass spectrum of the obtained solid, a peak was confirmed at [M+H]+=948. Subsequently, 1.2 g of Intermediate 50 was obtained in the same manner as in the method of preparing Intermediate 16 in Synthesis Example 9, using 4.2 g of Intermediate 49 instead of Intermediate 15. As a result of measuring the mass spectrum of the obtained solid, a peak was confirmed at [M+H]+=956.

1.1 g of Compound 37 was obtained in the same manner as in the method of preparing Compound 9 in Synthesis Example 9, using 1.2 g of Intermediate 50 instead of Intermediate 16 and 0.29 g of Compound A-27 instead of diphenylamine. As a result of measuring the mass spectrum of the obtained solid, a peak was confirmed at [M+1-1]+=1145.

Synthesis Example 38. Synthesis of Compound 38

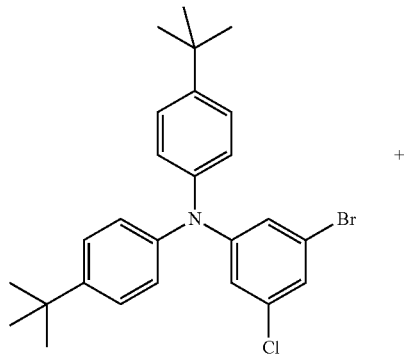

Intermediate 14

-continued
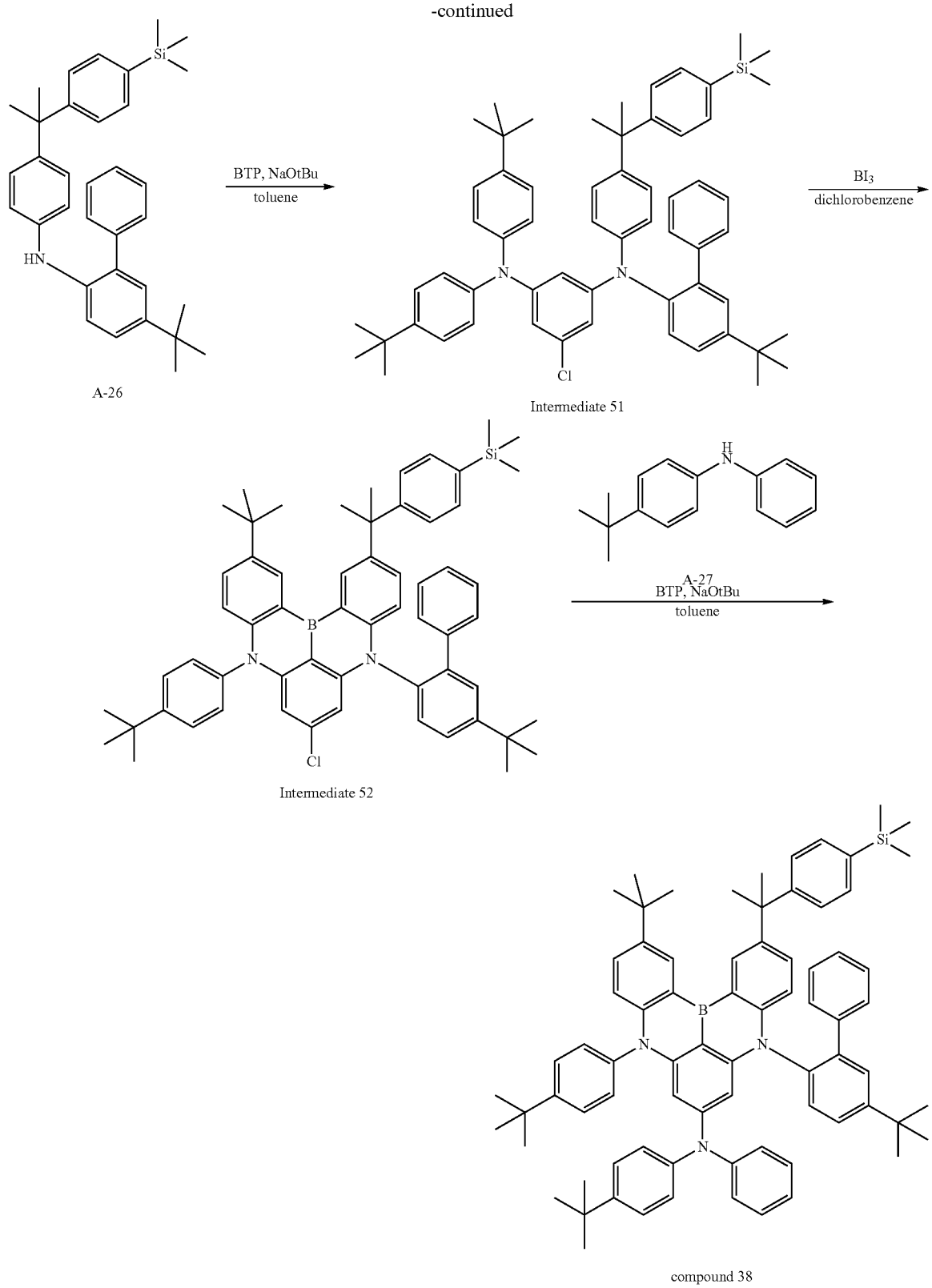
4.0 g of Intermediate 51 was obtained in the same manner as in the method of preparing Intermediate 15 in Synthesis Example 9, using 3.2 g of Compound A-17 instead of Compound A-2. As a result of measuring the mass spectrum of the obtained solid, a peak was confirmed at [M+H]+=882. Subsequently, 1.0 g of Intermediate 52 was obtained in the same manner as in the method of preparing Intermediate 16 in Synthesis Example 9, using 4.0 g of Intermediate 51 instead of Intermediate 15. As a result of measuring the mass spectrum of the obtained solid, a peak was confirmed at [M+H]+=890. 0.9 g of Compound 38 was obtained in the same manner as in the method of preparing Compound 9 in Synthesis Example 9, using 1.0 g of Intermediate 52 instead of Intermediate 16. As a result of measuring the mass spectrum of the obtained solid, a peak was confirmed at [M+H]+=1079.

Synthesis Example 39. Synthesis of Compound 39

Next, 1.5 g of Compound 39 was obtained in the same manner as in the method of preparing Compound 1 in Synthesis Example 1, using 7.0 g of Intermediate 53 instead of Intermediate 2. As a result of measuring the mass spectrum of the obtained solid, a peak was confirmed at [M+H]+=814.

Experimental Example 1

Example 1

A glass substrate thinly coated with indium tin oxide (ITO) to have a thickness of 1,300 Å was put into distilled

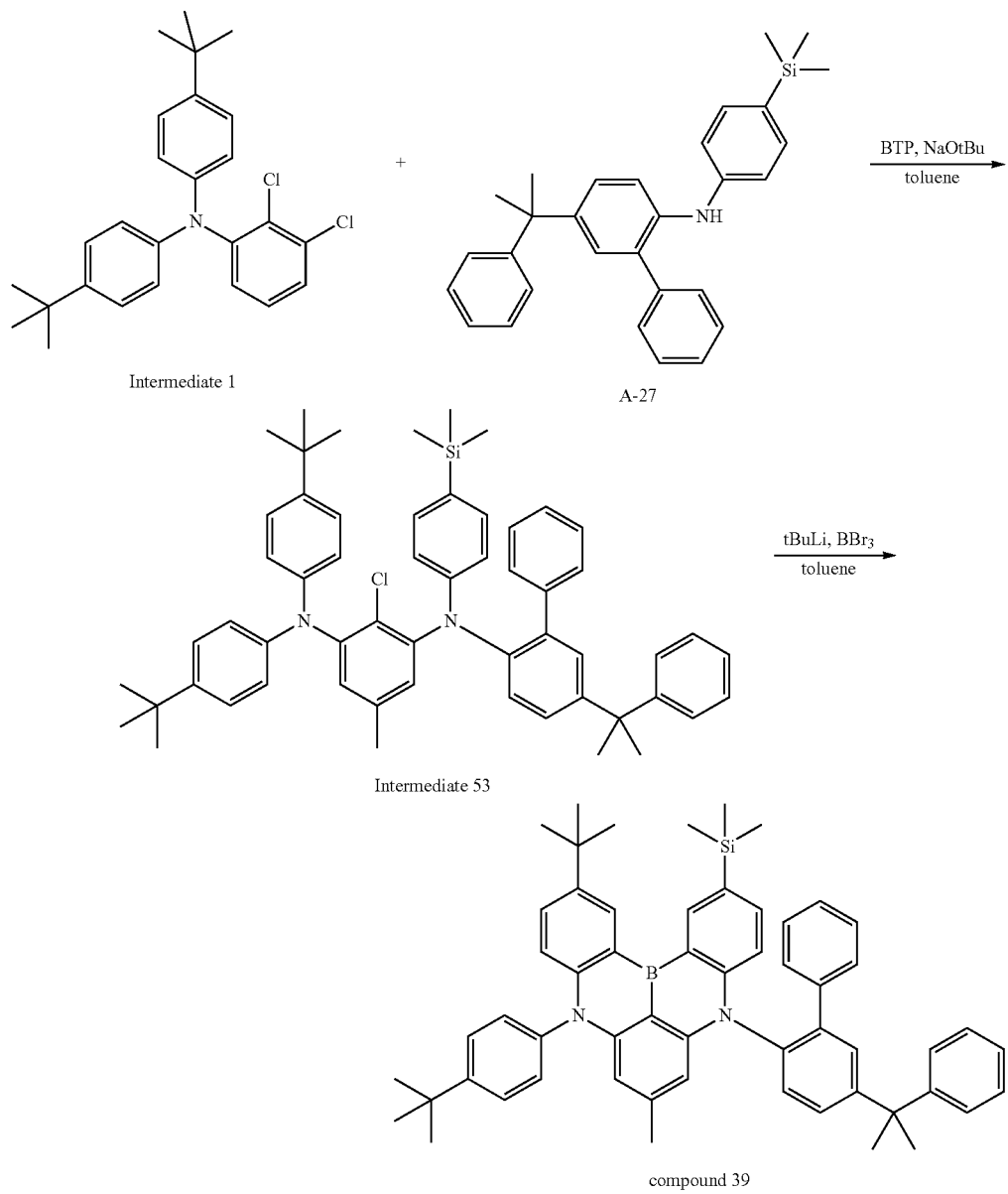

7.2 g of Intermediate 53 was obtained in the same manner as in the method of preparing Intermediate 2 in Synthesis Example 1, using 5.0 g of Compound A-27 instead of Compound A-2. As a result of measuring the mass spectrum of the obtained solid, a peak was confirmed at [M+H]+=840.

water in which a detergent was dissolved, and ultrasonically washed. In this case, a product manufactured by Fischer Co., was used as the detergent, and distilled water, which had been filtered twice with a filter manufactured by Millipore Co., was used as the distilled water. After the ITO was washed for 30 minutes, ultrasonic washing was repeated twice by using distilled water for 10 minutes. After the washing using distilled water was completed, ultrasonic washing was conducted by using isopropyl alcohol, acetone, and methanol solvents, and the resulting product was dried and then transported to a plasma washing machine. Furthermore, the substrate was cleaned by using oxygen plasma for 5 minutes, and then was transported to a vacuum deposition machine.

The following compound HAT was thermally vacuum-deposited to have a thickness of 50 Å on the ITO transparent electrode thus prepared, thereby forming a hole injection layer. The following compound HT-A was vacuum-deposited as a first hole transport layer to have a thickness of 1,000 Å thereon, and subsequently, the following compound HT-B was deposited to have a thickness of 100 Å as a second hole transport layer. A light emitting host BH-1 was vacuum deposited to have a thickness of 200 Å thereon, thereby forming a light emitting layer. Compound 1 was used as a blue light emitting dopant in an amount of 3 wt % based on the 100% total weight of a host while depositing the light emitting layer.

Next, the following compound ET-A and the following compound Liq were deposited to have a thickness of 300 Å, as a layer which simultaneously injects and transports electrons, at a ratio of 1:1, and lithium fluoride (LiF) and aluminum were sequentially deposited to have a thickness of 10 Å and 1,000 Å, respectively, thereon to form a cathode, thereby manufacturing an organic light emitting device.

In the aforementioned procedure, the deposition rates of the organic materials were maintained at 0.4 to 1.0 Å/sec, the deposition rates of lithium fluoride and aluminum of the cathode were maintained at 0.3 Å/sec and at 2 Å/sec, respectively, and the degree of vacuum during the deposition was maintained at $1\times10^{-7}$ to $5\times10^{-8}$ torr, thereby manufacturing an organic light emitting device.

HAT

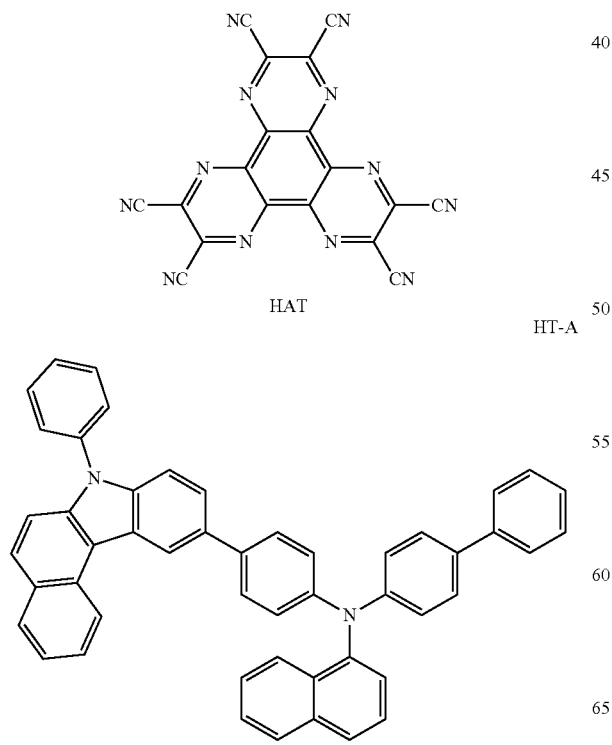

HT-A

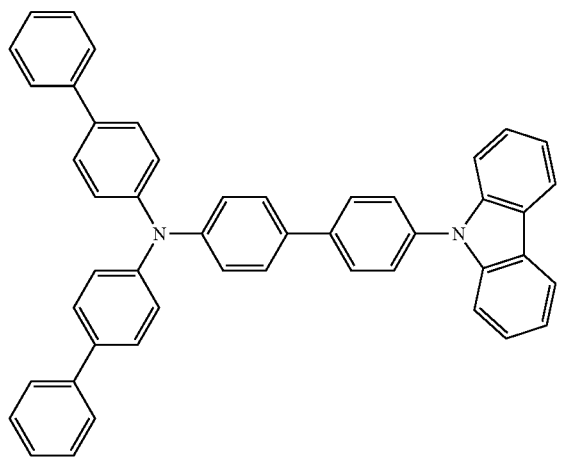

HT-B

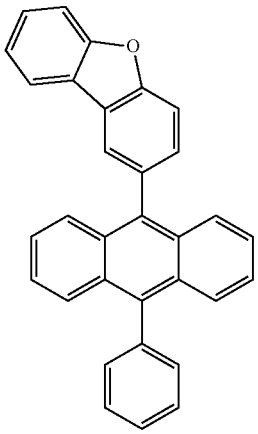

BH-1

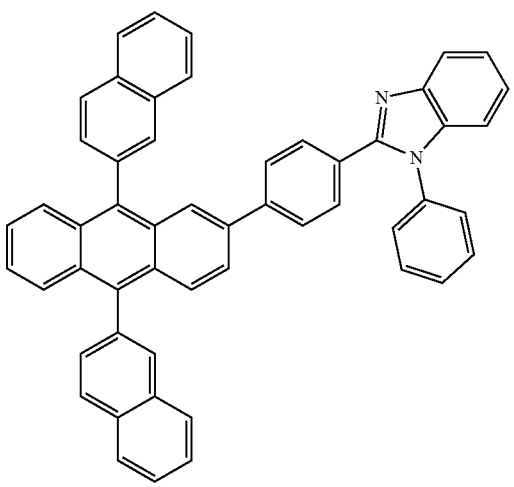

ET-A compound 1

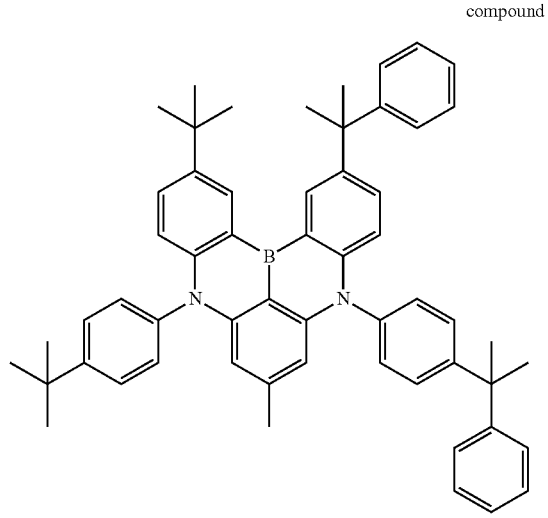

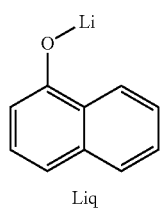

Liq

Examples 2 to 28 and Comparative Examples 1 to 6

Organic light emitting devices were manufactured in the same manner as in Example 1, except that the host and dopant compounds described in the following Table 1 were used as materials for a light emitting layer in Example 1.

Examples 29 to 32 and Comparative Examples 7 and 8

Organic light emitting devices were manufactured in the same manner as in Example 1, except that in Example 1, a first host and a second host (a weight ratio of 48.5:48.5) were used instead of a host BH-1 (a weight ratio of 97) as a material for a light emitting layer, and the following dopant compound (a weight ratio of 3) was used instead of a Compound 1 (a weight ratio of 3).

compound 1

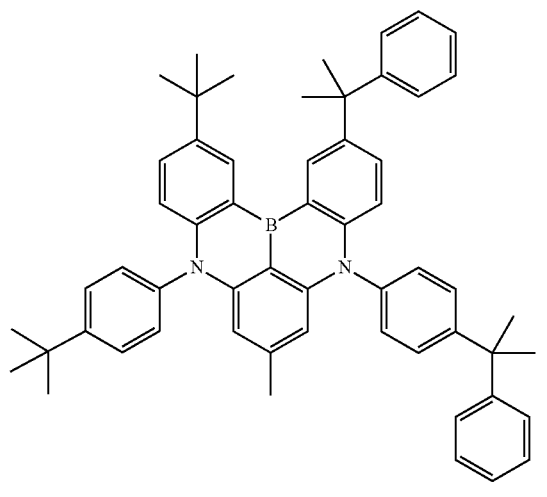

compound 27

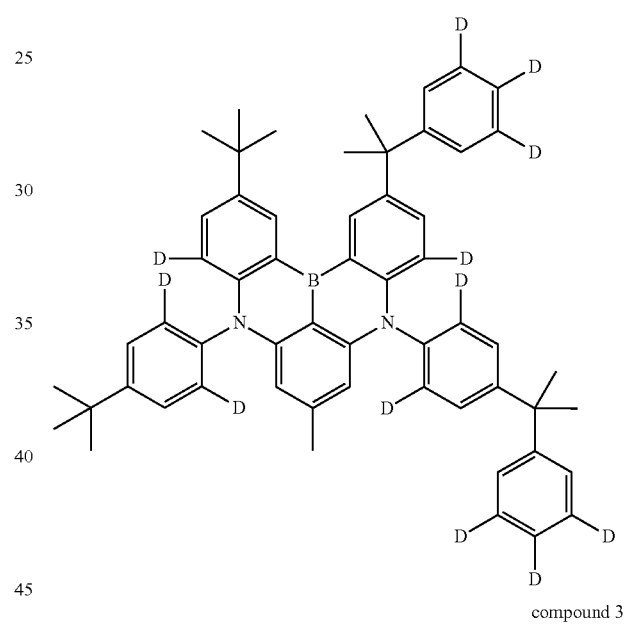

compound 3

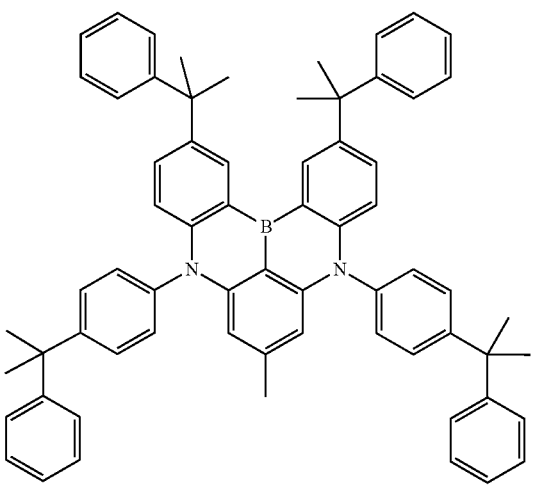

compound 10
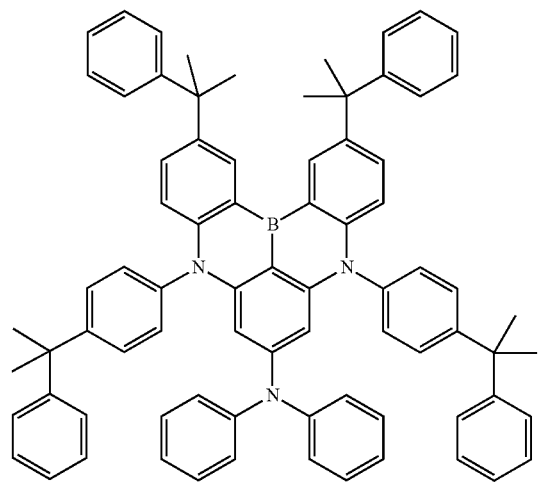
compound 30
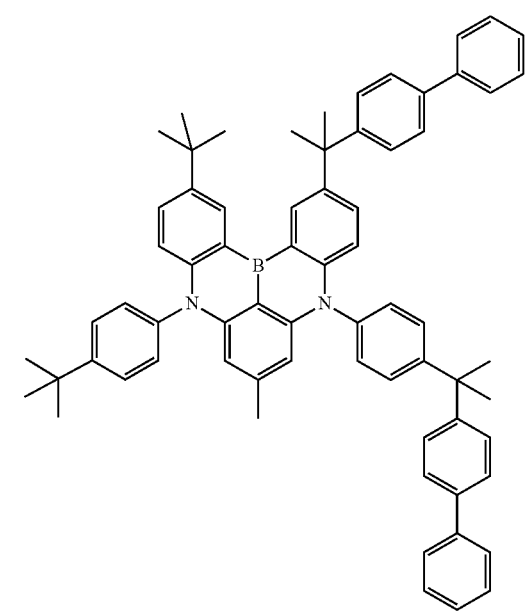
compound 28
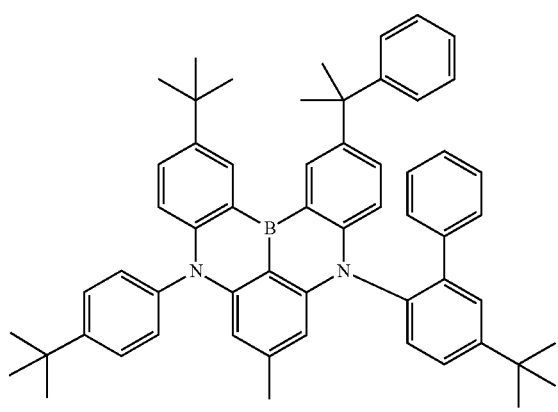
compound 29
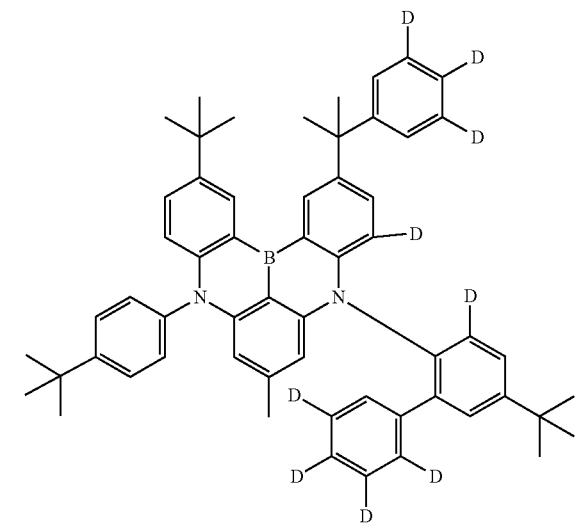
compound 4
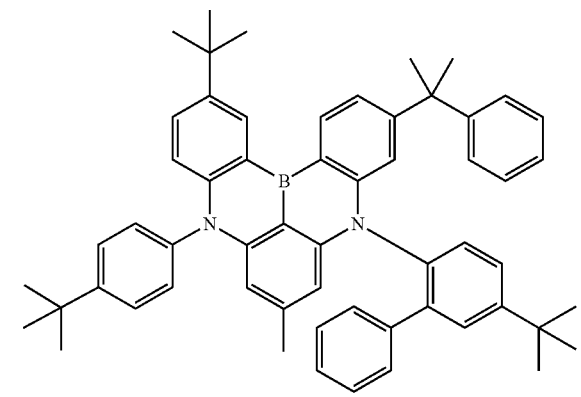
compound 19
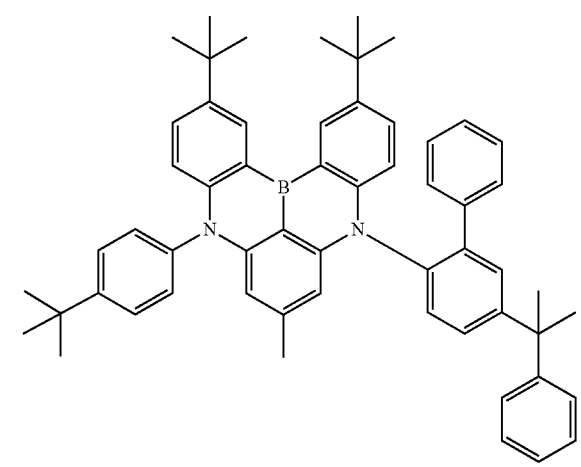

compound 2
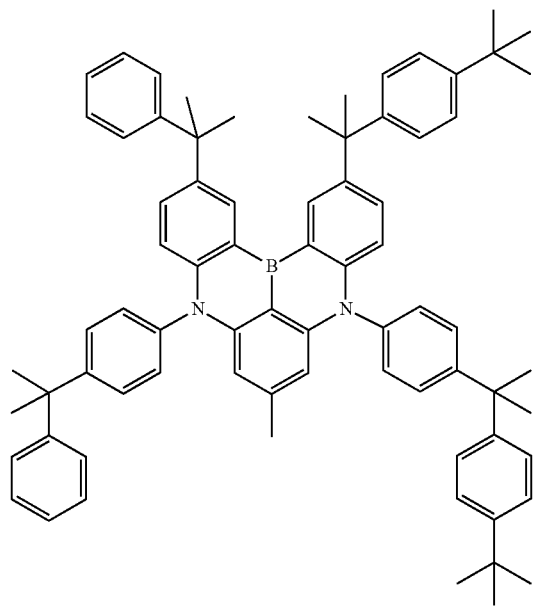
compound 32
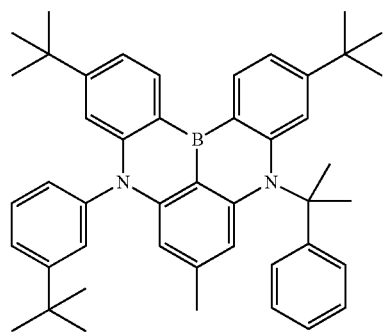
compound 33
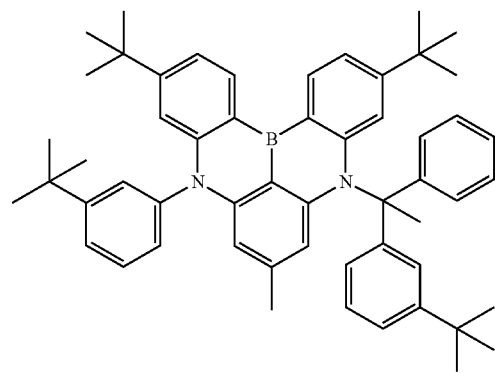
compound 34
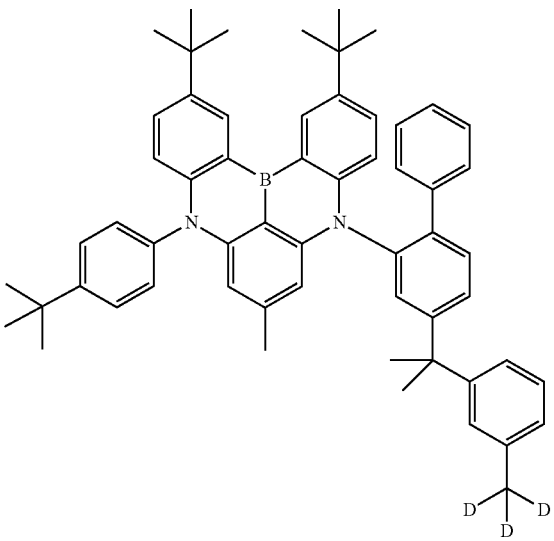
compound 35
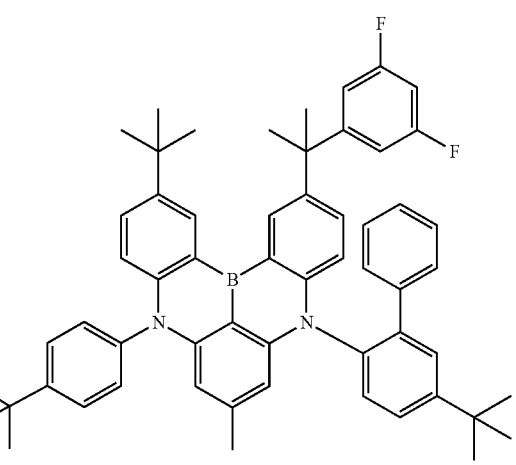
compound 36
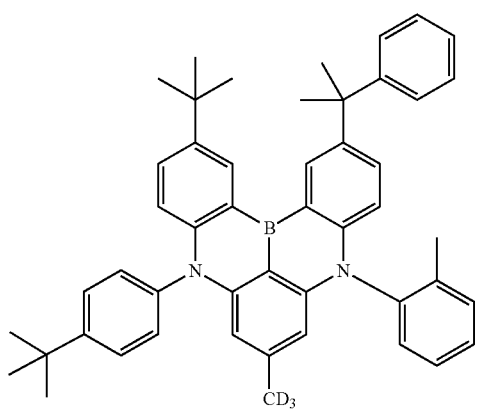

compound 39
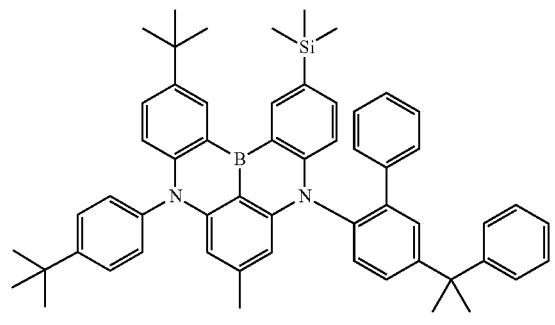
compound 18
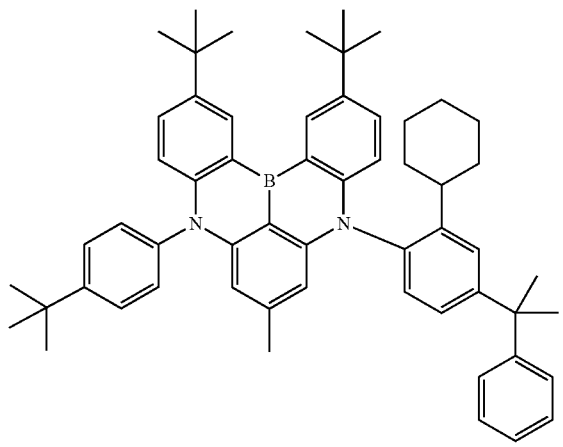
compound 37
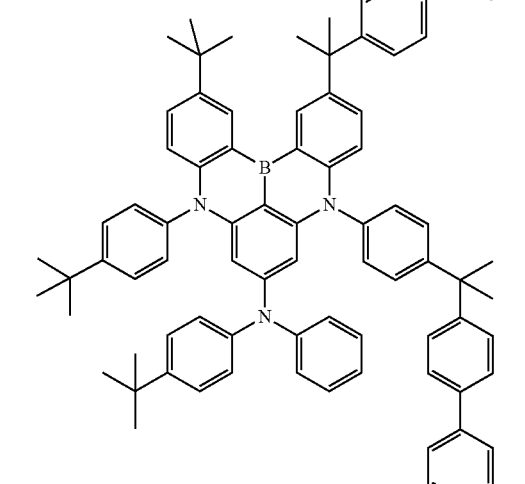
compound 17
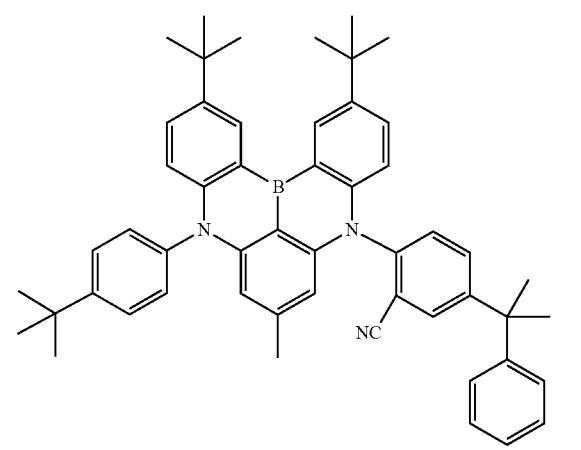
compound 38
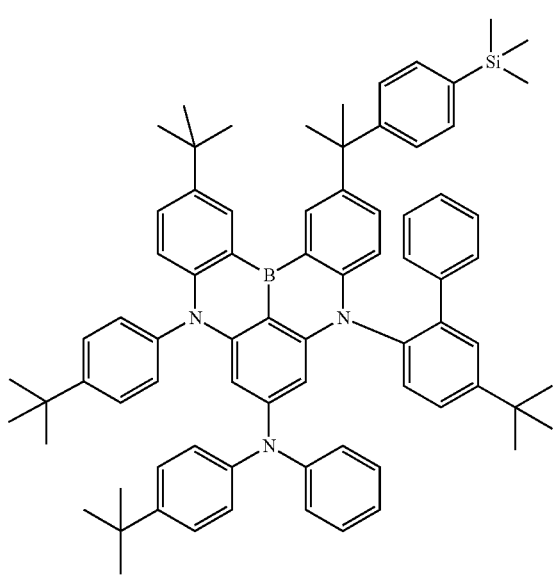
compound 11
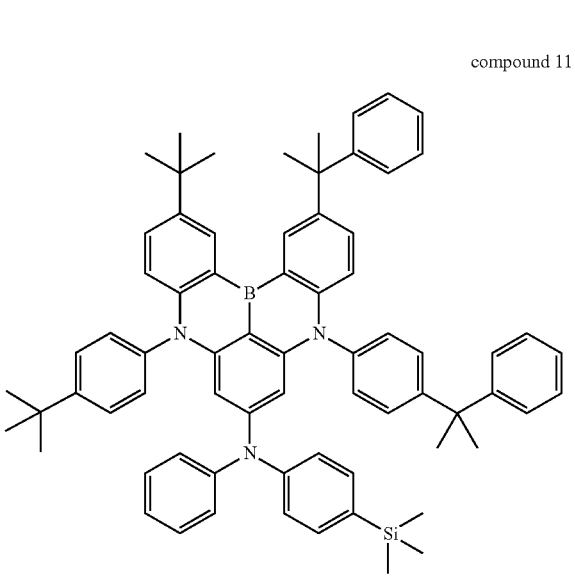

compound 26
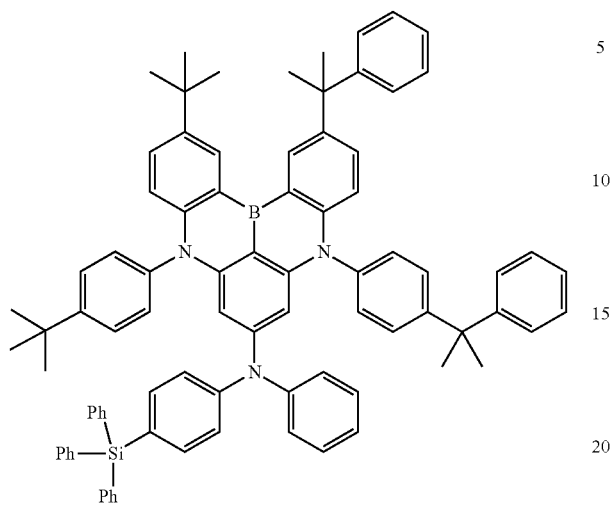
BH-1
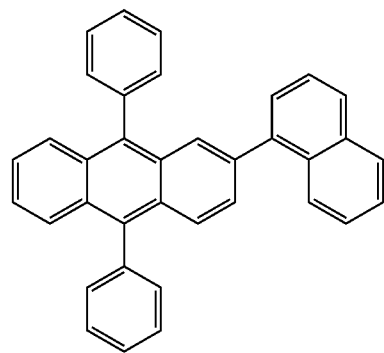
BH-2
BH-3
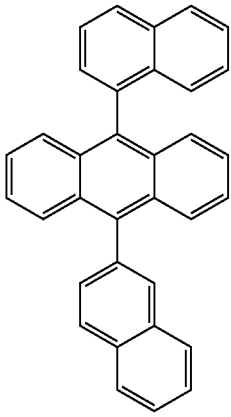
BH-4
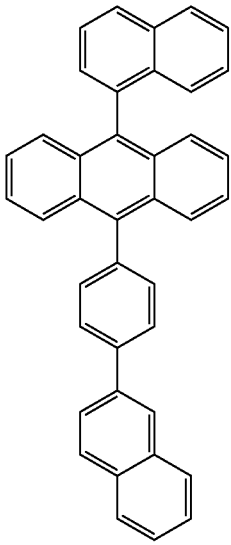
BH-5
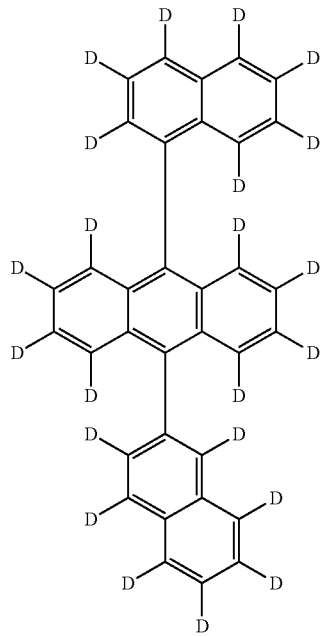

BD-A

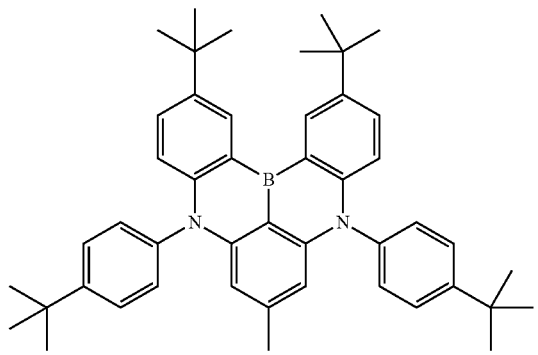

BD-B

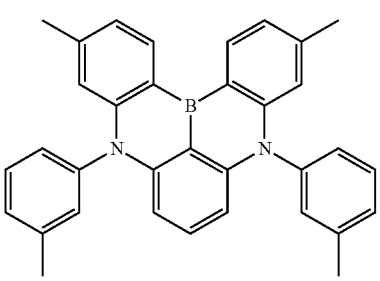

BD-C

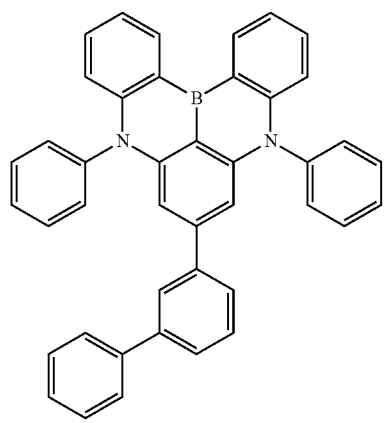

BD-D

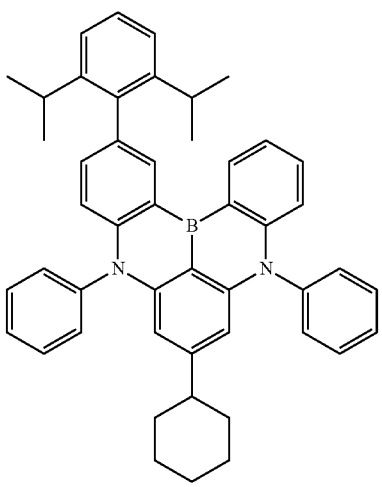

BD-E

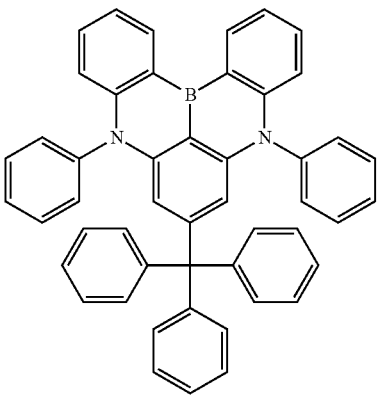

For each of the organic light emitting devices manufactured by Examples 1 to 32 and Comparative Examples 1 to 8, the driving voltage and the efficiency were measured at a current density of 10 mA/cm². The results are shown in the following Table 1.

TABLE 1

| | First host (Light emitting layer) | Second host (Light emitting layer) | Dopant (Light emitting layer) | 10 mA/cm² | |
|---|---|---|---|---|---|
| | | | | Driving voltage (V) | Light emitting efficiency (Cd/A) |
| Example 1 | BH-1 | — | Compound 1 | 3.80 | 6.14 |
| Example 2 | BH-1 | — | Compound 27 | 3.81 | 6.20 |
| Example 3 | BH-1 | — | Compound 3 | 3.76 | 6.42 |
| Example 4 | BH-1 | — | Compound 10 | 3.72 | 6.40 |
| Example 5 | BH-1 | — | Compound 28 | 3.80 | 6.69 |
| Example 6 | BH-1 | — | Compound 29 | 3.77 | 6.72 |
| Example 7 | BH-1 | — | Compound 4 | 3.76 | 6.81 |
| Example 8 | BH-1 | — | Compound 19 | 3.80 | 6.58 |
| Example 9 | BH-1 | — | Compound 35 | 3.81 | 6.41 |
| Example 10 | BH-1 | — | Compound 18 | 3.78 | 6.46 |
| Example 11 | BH-1 | — | Compound 34 | 3.80 | 6.30 |
| Comparative Example 1 | BH-1 | — | BD-A | 4.00 | 5.48 |
| Comparative Example 2 | BH-1 | — | BD-B | 3.92 | 5.29 |
| Example 12 | BH-2 | — | Compound 27 | 3.80 | 6.56 |
| Example 13 | BH-2 | — | Compound 3 | 3.81 | 6.65 |
| Example 14 | BH-2 | — | Compound 28 | 3.75 | 6.20 |
| Example 15 | BH-2 | — | Compound 4 | 3.75 | 6.31 |
| Example 16 | BH-2 | — | Compound 2 | 3.81 | 6.25 |
| Example 17 | BH-2 | — | Compound 32 | 3.82 | 5.90 |
| Example 18 | BH-5 | — | Compound 33 | 3.80 | 6.02 |
| Example 19 | BH-5 | — | Compound 17 | 3.79 | 6.05 |
| Example 20 | BH-5 | — | Compound 36 | 3.79 | 6.20 |
| Example 21 | BH-5 | — | Compound 39 | 3.82 | 6.02 |
| Comparative Example 3 | BH-2 | — | BD-C | 4.05 | 5.12 |
| Comparative Example 4 | BH-2 | — | BD-E | 4.00 | 5.05 |
| Comparative Example 5 | BH-5 | — | BD-C | 3.85 | 4.95 |
| Example 22 | BH-3 | — | Compound 1 | 3.76 | 6.47 |
| Example 23 | BH-3 | — | Compound 30 | 3.75 | 6.45 |
| Example 24 | BH-3 | — | Compound 4 | 3.71 | 6.61 |
| Example 25 | BH-3 | — | Compound 37 | 3.78 | 6.53 |
| Example 26 | BH-4 | — | Compound 38 | 3.81 | 6.41 |
| Example 27 | BH-4 | — | Compound 11 | 3.81 | 6.12 |
| Example 28 | BH-4 | — | Compound 26 | 3.81 | 6.24 |
| Comparative Example 6 | BH-4 | — | BD-D | 4.00 | 5.10 |
| Example 29 | BH-3 | BH-4 | Compound 4 | 3.82 | 6.33 |
| Example 30 | BH-3 | BH-2 | Compound 2 | 3.80 | 6.42 |

TABLE 1-continued

| | First host (Light emitting layer) | Second host (Light emitting layer) | Dopant (Light emitting layer) | 10 mA/cm² | |
|---|---|---|---|---|---|
| | | | | Driving voltage (V) | Light emitting efficiency (Cd/A) |
| Example 31 | BH-3 | BH-1 | Compound 27 | 3.74 | 6.35 |
| Example 32 | BH-3 | BH-2 | Compound 27 | 3.76 | 6.51 |
| Comparative Example 7 | BH-3 | BH-4 | BD-D | 4.02 | 4.98 |
| Comparative Example 8 | BH-3 | BH-4 | BD-A | 3.86 | 5.66 |

As observed in Table 1, the devices in Examples 1 to 32 in which the compound having the structure of Formula 1 is used have lower voltage and higher efficiency characteristics than those of the devices in Comparative Examples 1 to 8.

Experimental Example 2 MD Calculation (Calculation of Distance Between Molecules in Host-Dopant System)

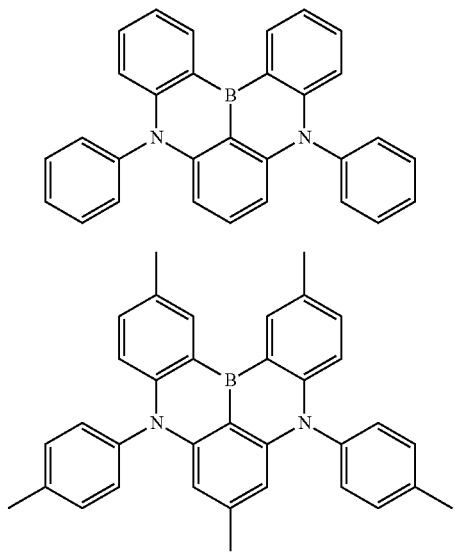

BD-Y1

BD-Y2

BD-X1

Host-1

Figure 5:
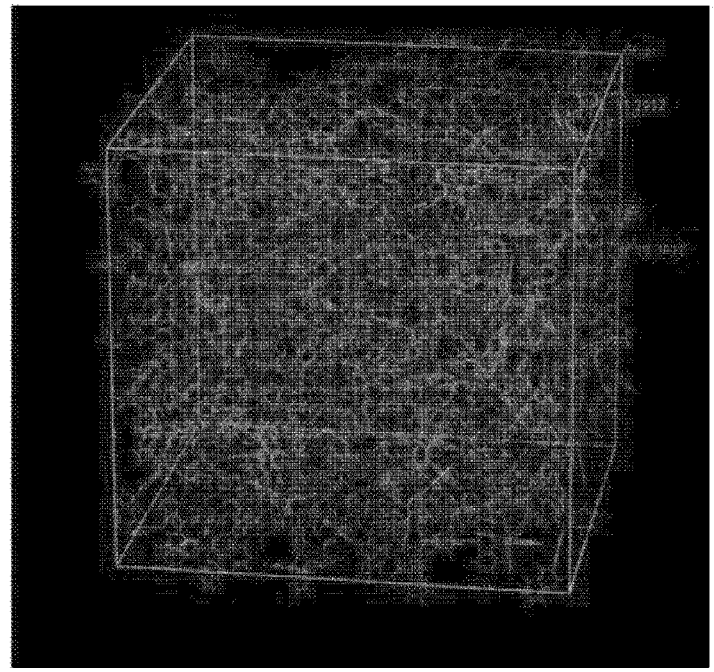
Figure 6:
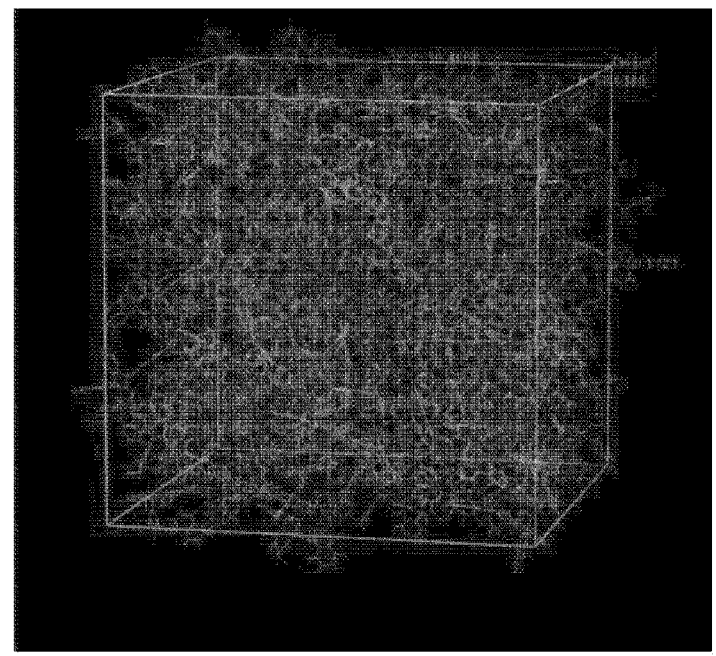
FIG. 6 illustrates a system including Compound BD-X1 according to an exemplary embodiment of the present specification.

A system including Compound BD-Y1, BD-Y2 or BD-X1, and Host-1 at a ratio of 5% and 95% was implemented. Specifically, by setting 300 molecules (a ratio of 95% of Host-1 and 5% of BD-Y1, BD-Y2 or BD-X1), simulation temperature at 300 K, and simulation time at 30 ns using OPLS3e force field, the environment of the device doped through calculation of NVT and NPT was implemented by computational chemistry. The implemented molecular models are illustrated in FIGS. 4 to 6. FIGS. 4, 5, and 6 illustrate a system of BD-Y1 and Host-1, a system of BD-Y2 and Host-1, and a system of BD-X1 and Host-1, respectively. In this case, the total volume and density of the molecules and the average distance between different molecules were obtained by calculation. The results are shown in the following Table 2.

TABLE 2

| | Comparative Example 9 (Host-1/BD-Y1 system) | Comparative Example 10 (Host-1/BD-Y2 system) | Example 33 (Host-1/BD-X1 system) |
|---|---|---|---|
| Total volume | $193.60 \times 10^{-27}$ cm³ | $196.32 \times 10^{-27}$ cm³ | $208.51 \times 10^{-27}$ cm³ |
| Total density | 1.107 g/cm³ | 1.100 g/cm³ | 1.090 g/cm³ |
| Average distance between molecules | 7.1 Å | 14.8 Å | 15.5 Å |

BD-X1 is a compound corresponding to Formula 1 of the present disclosure, and has a structure in which an aralkyl group is linked to the core structure thereof. When Table 2 and FIGS. 4 to 6 are observed, it can be confirmed that in the BD-X1 (FIG. 6) compound in which a bulky substituent is introduced, the distance from the host is further increased than that in BD-Y1 (FIG. 4) and BD-Y2 (FIG. 5). Therefore, the Dexter energy transfer with the triplet energy of a host of a device into which a relatively bulky substituent is introduced occurs less frequently, so that the efficiency of the device is increased.

Experimental Example 3 Measurement of Molecular Orientation

The molecular orientation was measured after a host and a dopant were deposited to have a thickness of 30 nm onto a quartz cell at a weight ratio of 97:3. As the host, 9-naphthalenyl-10-(4-(naphthalenylphenyl)anthracene (BH-4) was used, and as the dopant, Compound 3 or 28 or Comparative Compound BD-E was used.

Figure 7:
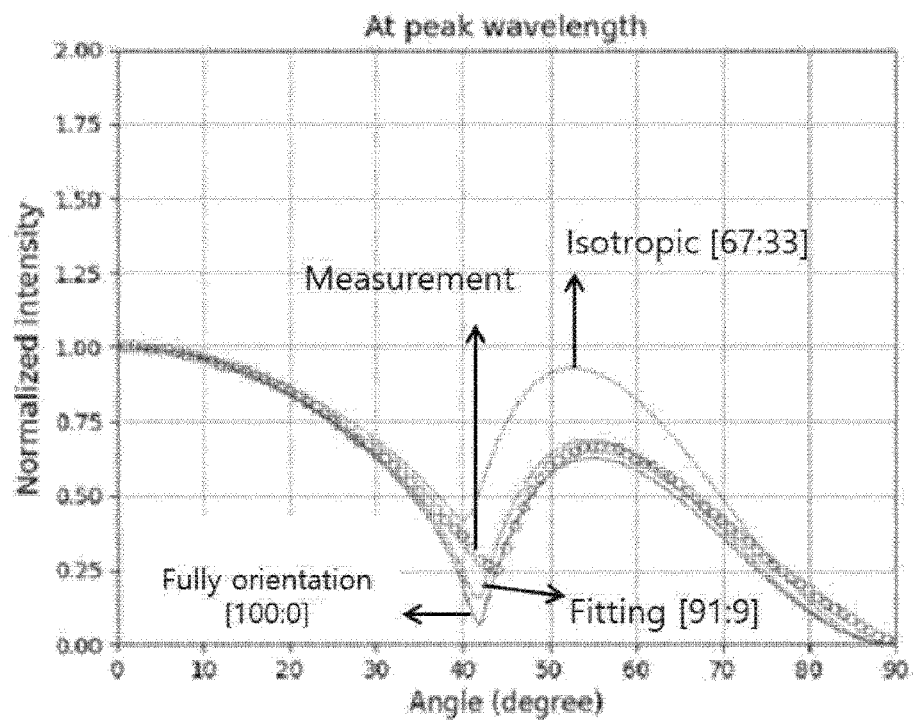
FIGS. 7 and 8 illustrate the molecular orientation results of Compounds 3 and 28 according to an exemplary embodiment of the present specification.
Figure 8:
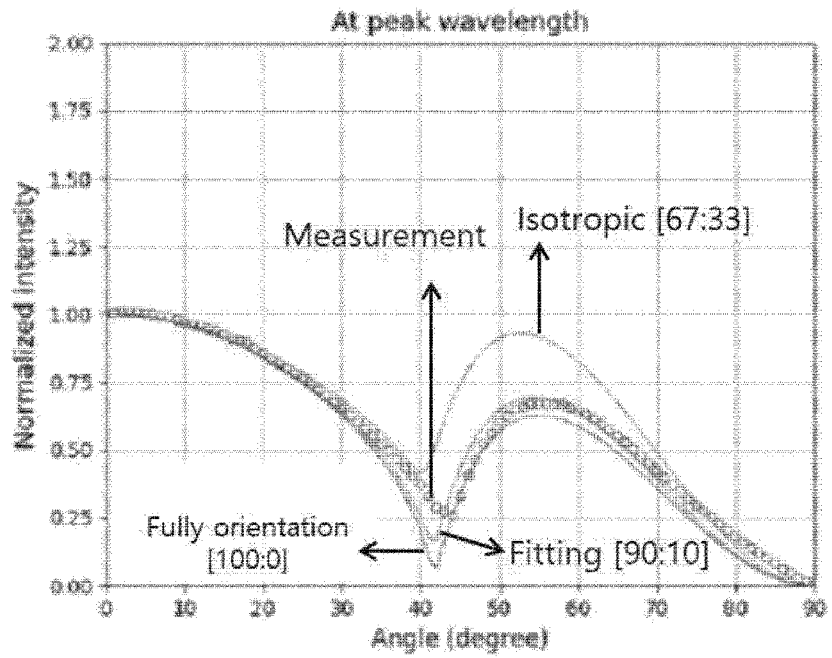
Figure 9:
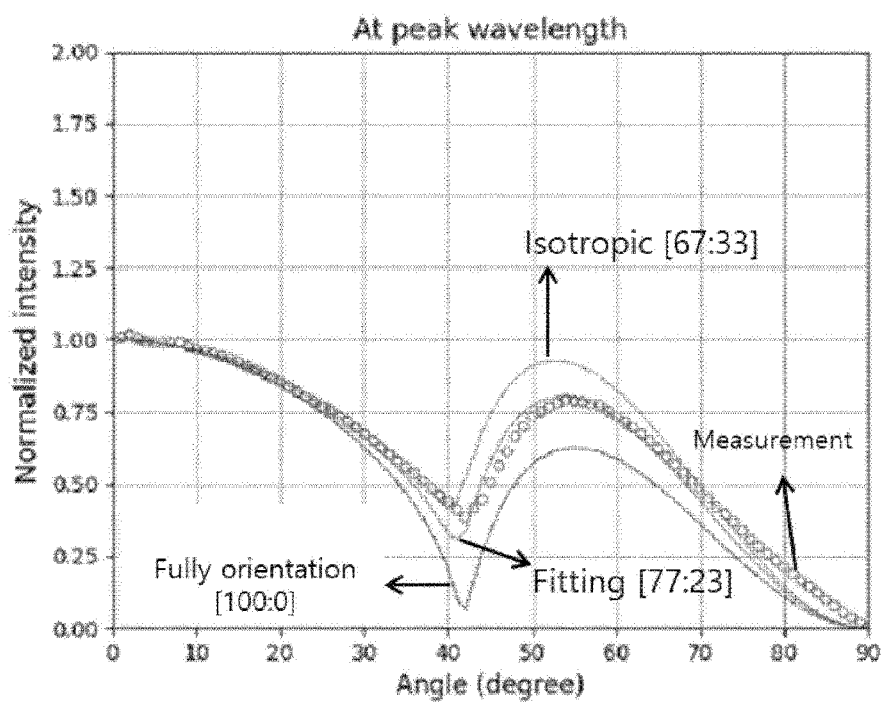
FIG. 9 illustrates the molecular orientation result of Comparative Compound BD-E.

The result of measuring the molecular orientation of Compound 3 is shown in FIG. 7, the result of measuring the molecular orientation of Compound 28 is shown in FIG. 8, and the result of measuring the molecular orientation of Comparative Compound BD-E is shown in FIG. 9. In FIGS. 7 to 9, each graph relates to the dipole orientation, and the numerical value in the [ ] means [h:v].

The molecular orientation measurement results (Fitting) of Compounds 3 and 28 represented by Formula 1 of the present disclosure are 91% and 90%, respectively, showing a very high level result value compared to 77% of Comparative Compound BD-E. The molecular orientation is one of the factors of determining external quantum efficiency, and the higher the molecular orientation is, the higher the efficiency is. Therefore, Compounds 3 and 28 having high molecular orientation exhibit efficiency higher than Comparative Compound BD-E.

The invention claimed is:

1. A compound of Formula 1:

[Formula 1]

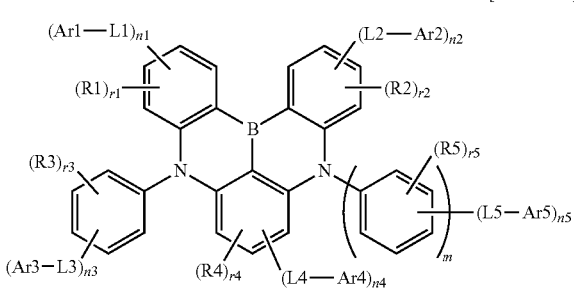

wherein, in Formula 1:
L1 to L5 are the same as or different from each other, and are each independently a substituted or unsubstituted alkylene group,
Ar1 to Ar5 are the same as or different from each other, and are each independently a substituted or unsubstituted aryl group or a substituted or unsubstituted heteroaryl group;
R1 to R3 and R5 are the same as or different from each other, and are each independently hydrogen, deuterium, a halogen group, a nitrile group, a substituted or unsubstituted alkyl group, a substituted or unsubstituted cycloalkyl group, a substituted or unsubstituted silyl group, a substituted or unsubstituted arylamine group, a substituted or unsubstituted arylheteroarylamine group, a substituted or unsubstituted aryl group, or a substituted or unsubstituted heteroaryl group;
R4 is hydrogen; deuterium; an alkyl group having 1 to 6 carbon atoms, which is unsubstituted or substituted with deuterium; or an arylamine group having 6 to 40 carbon atoms, which is unsubstituted or substituted with a substituent selected from the group consisting of deuterium, an alkyl group having 1 to 6 carbon atoms, a trialkylsilyl group having 3 to 30 carbon atoms, and a triarylsilyl group having 6 to 50 carbon atoms;
r1, r2, n1, and n2 are the same as or different from each other, and are each independently an integer from 0 to 4;
r4 is an integer from 0 to 3;
n4 is 0;
r3, r5, n3, and n5 are the same as or different from each other, and are each independently an integer from 0 to 5;
m is 0 or 1, and when m is 0, L5 is directly linked to N;
a value of n1+n2+n3+n5 is an integer from 1 to 21;
a value of r1+n1 is an integer from 0 to 4, a value of r2+n2 is an integer from 0 to 4, a value of r3+n3 is an integer from 0 to 5, a value of r4+n4 is an integer from 0 to 3, and a value of r5+n5 is an integer from 0 to 5; and
substituents in the parenthesis are the same as or different from each other, provided that r1 to r5, n1 to n3, and n5 is 2 or higher.

2. The compound of claim 1, wherein the compound of Formula 1 is represented by the following Formula 2 or 3:

[Formula 2]

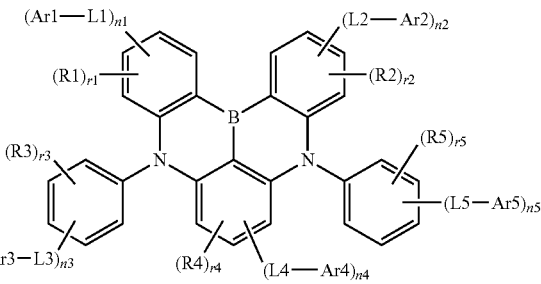

[Formula 3]

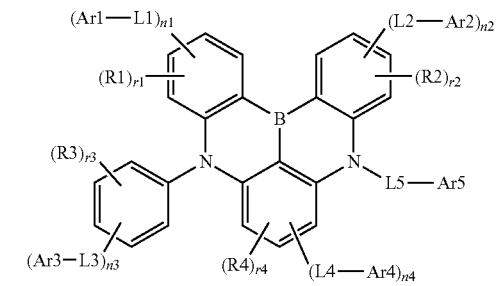

wherein, in Formulae 2 and 3,
L1 to L5, Ar1 to Ar5, R1 to R5, r1 to r5, and n1 to n5 are the same as defined in Formula 1.

3. The compound of claim 1, wherein the compound of Formula 1 is represented by any one of the following Formulae 401 to 407:

[Formula 401]

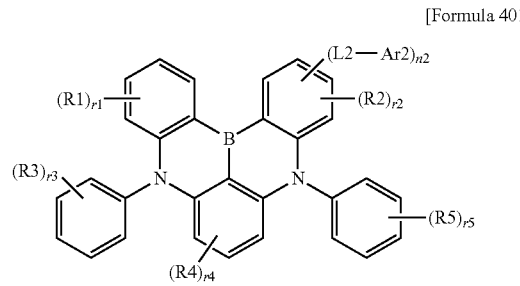

[Formula 402]

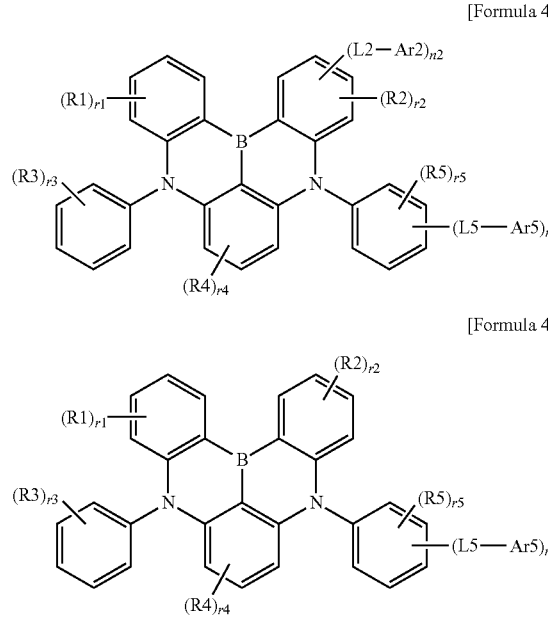

[Formula 403]

[Formula 404]

[Formula 405]

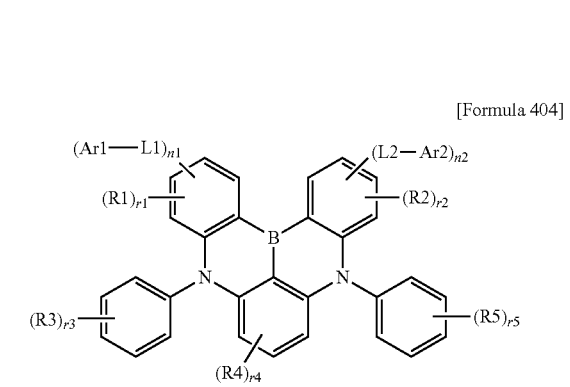

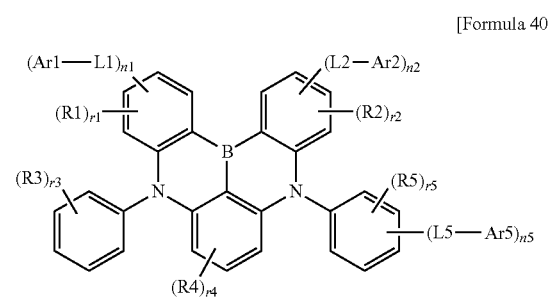

[Formula 406]

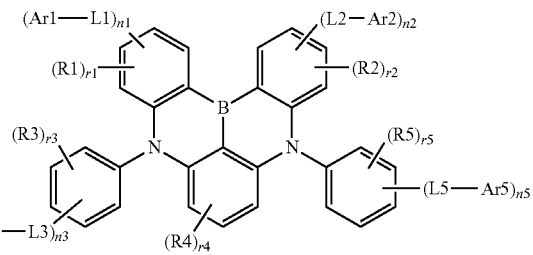

[Formula 407]

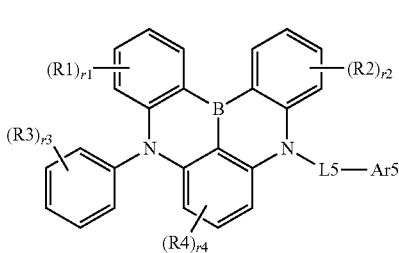

wherein, in Formulae 401 to 407,

L1, L2, L3, L5, Ar1, Ar2, Ar3, Ar5, R1 to R5, r1 to r5, n1, n2, n3, and n5 are the same as defined in Formula 1.

4. The compound of claim 1, wherein L1 to L5 are the same as or different from each other, and are each independently a methylene group which is unsubstituted or substituted with an alkyl group or an aryl group.

5. The compound of claim 1, wherein Ar1 to Ar5 are the same as or different from each other, and are each independently a substituted or unsubstituted phenyl group; or a substituted or unsubstituted biphenyl group.

6. The compound of claim 1, wherein R1 to R5 are the same as or different from each other, and are each independently hydrogen; deuterium; a nitrile group; an alkyl group having 1 to 6 carbon atoms, which is unsubstituted or substituted with deuterium; a cycloalkyl group having 3 to 20 carbon atoms; an aryl group having 6 to 20 carbon atoms, which is unsubstituted or substituted with a substituent selected from the group consisting of deuterium and an alkyl group having 1 to 6 carbon atoms or a substituent formed by linking two or more groups thereof; or an arylamine group having 6 to 40 carbon atoms, which is unsubstituted or substituted with a substituent selected from the group consisting of deuterium, an alkyl group having 1 to 6 carbon atoms, a trialkylsilyl group having 3 to 30 carbon atoms, and a triarylsilyl group having 6 to 50 carbon atoms, or a substituent formed by linking two or more groups thereof.

7. The compound of claim 1, wherein n1 to n3 and n5 are the same as or different from each other, and are each independently 0 or 1.

8. The compound of claim 1, wherein the compound represented by Formula 1 is any one selected from the following compounds:

189
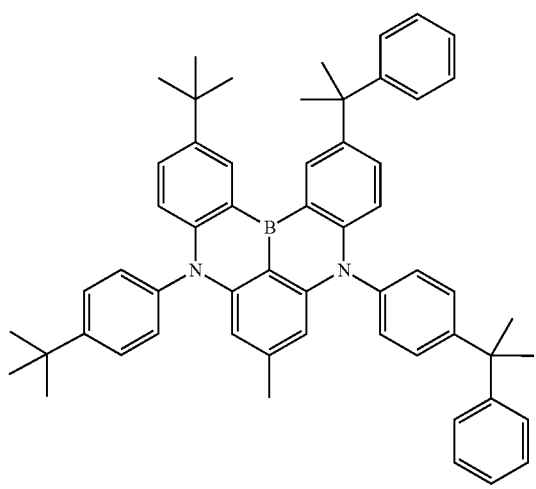
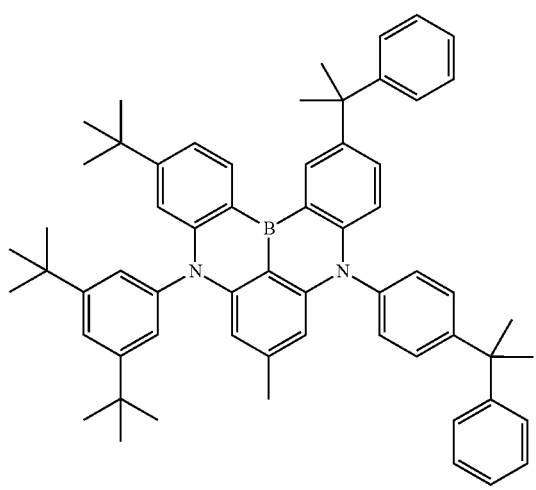
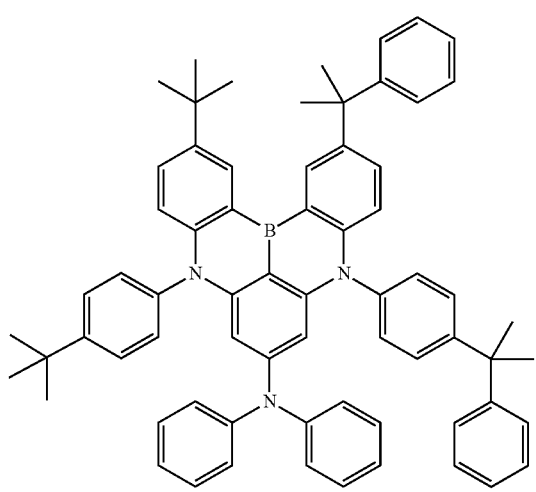
190
-continued
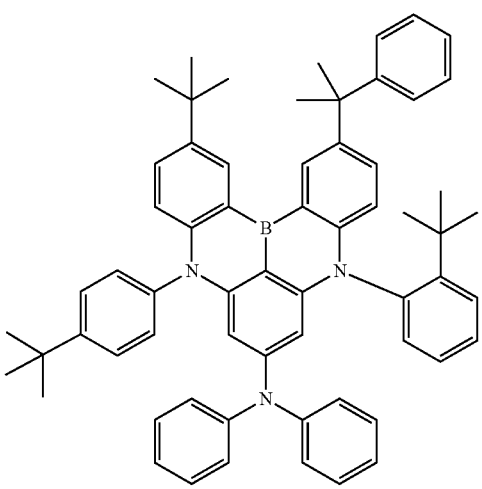
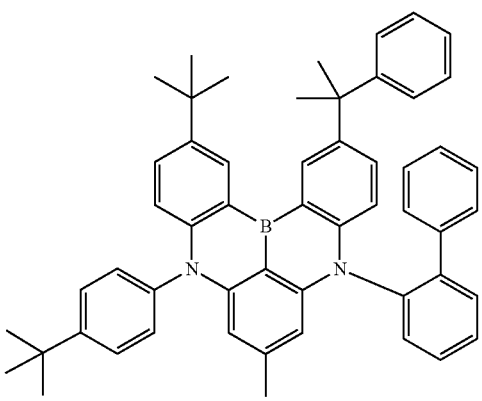
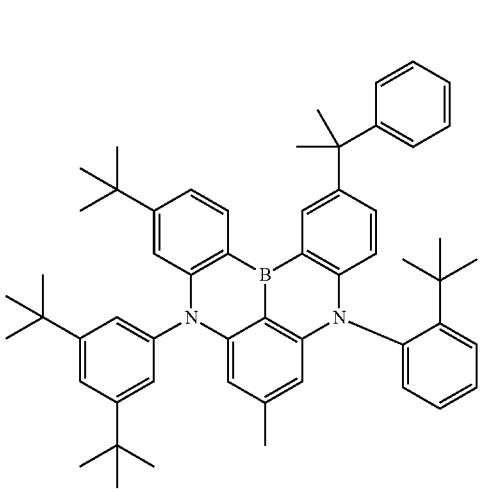

191
-continued
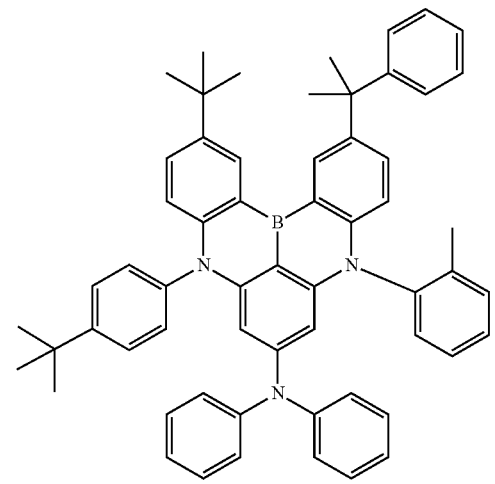
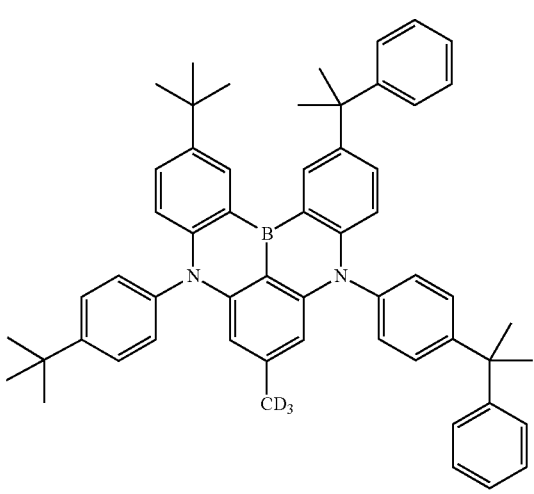
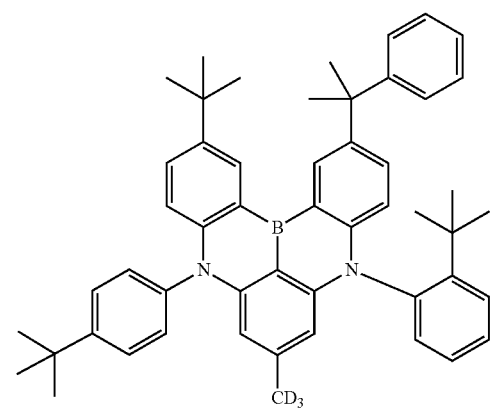
192
-continued
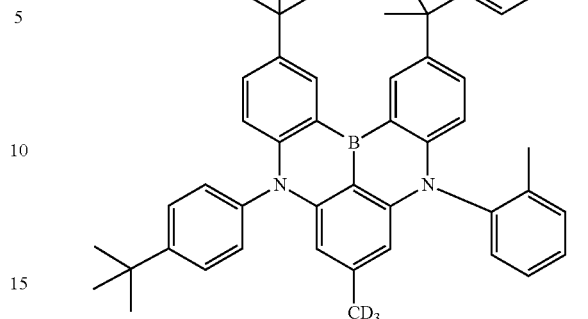
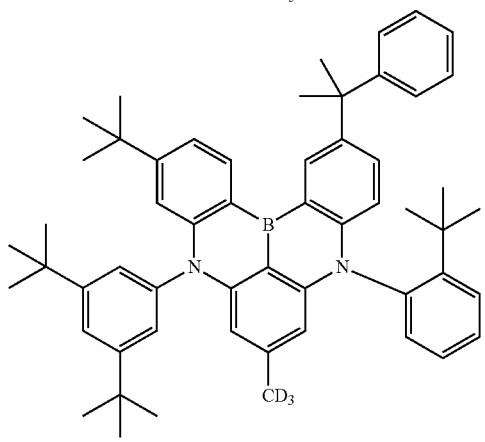
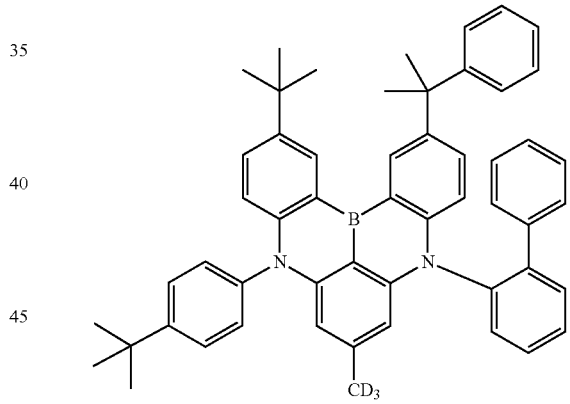
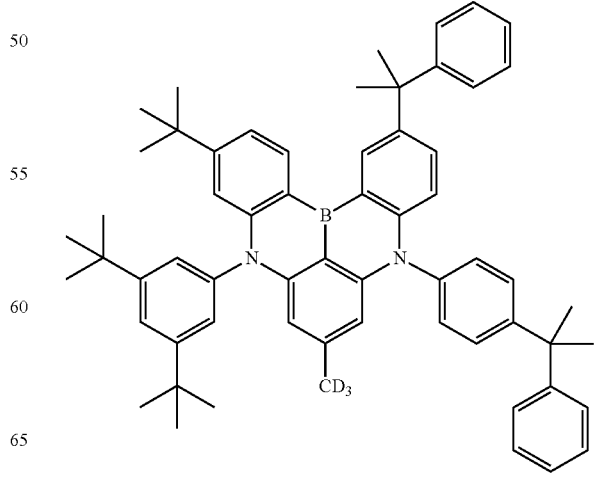

193
-continued
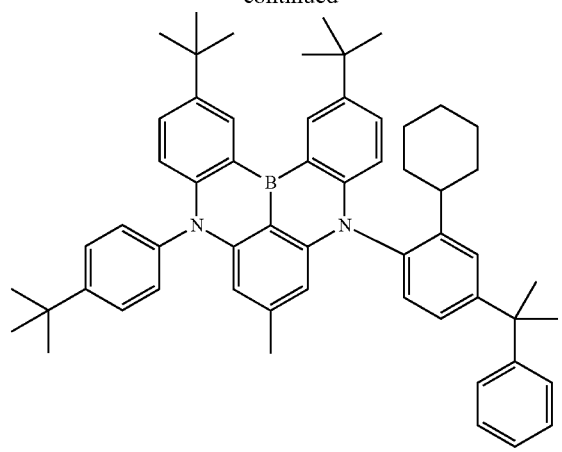
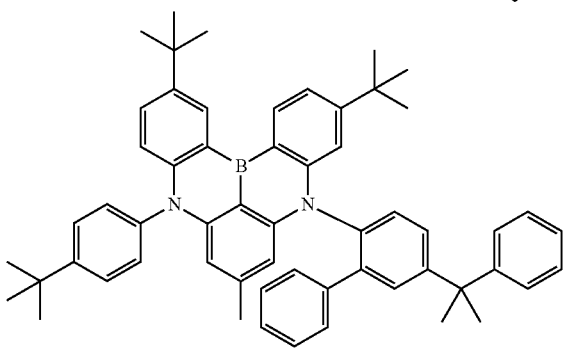
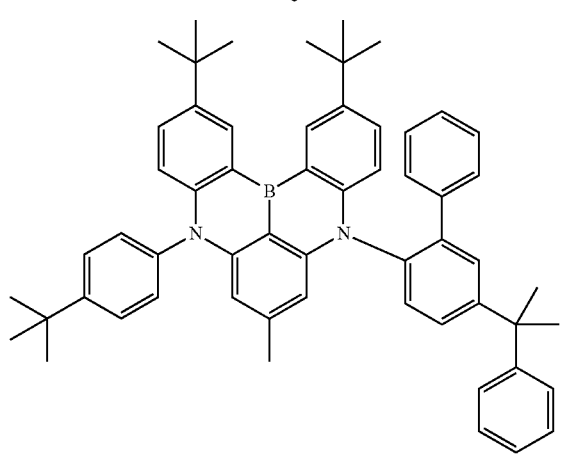
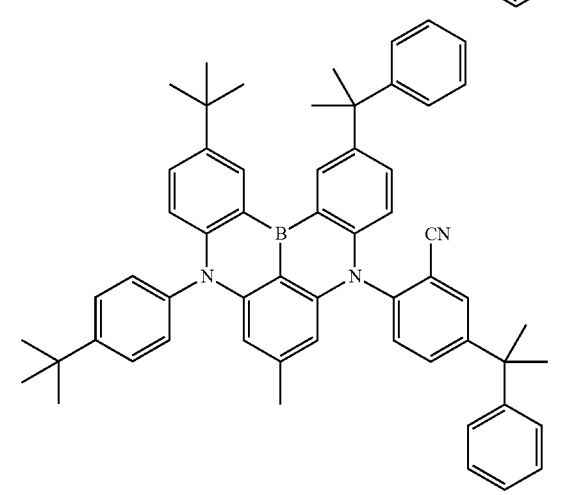
194
-continued
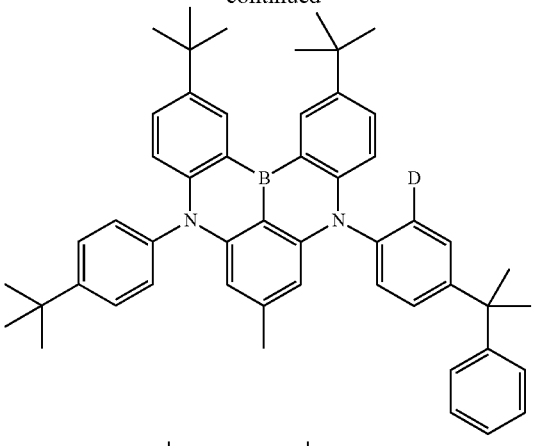
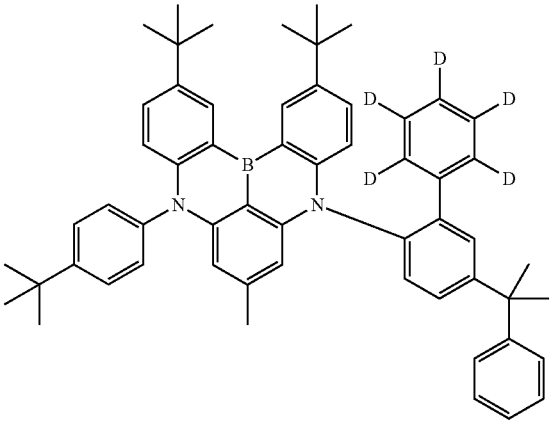
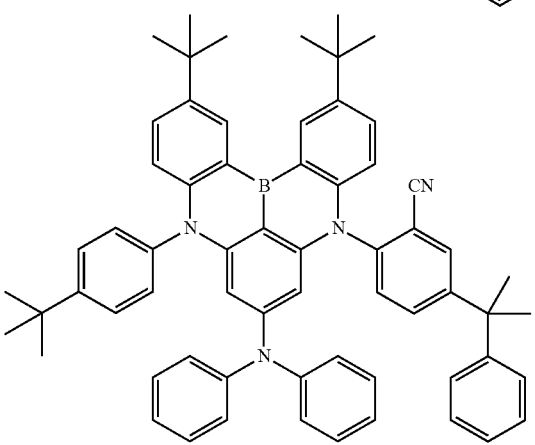
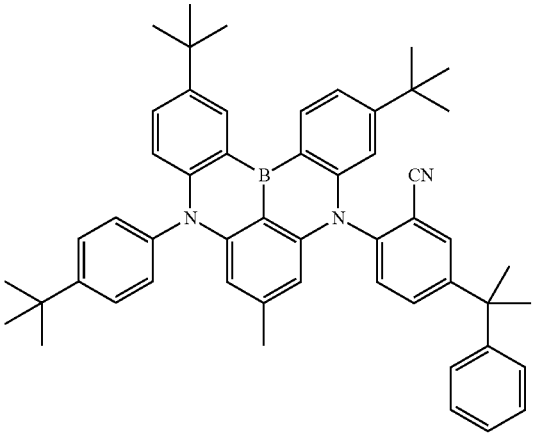 [SMILES: [2H]c1cc(C(C)(C)c2ccccc2)ccc1N1c2cc(C(C)(C)C)ccc2B2c3cc(C(C)(C)C)ccc3N(c3ccc(C(C)(C)C)cc3)c3cc(C)cc1c32]

195
-continued
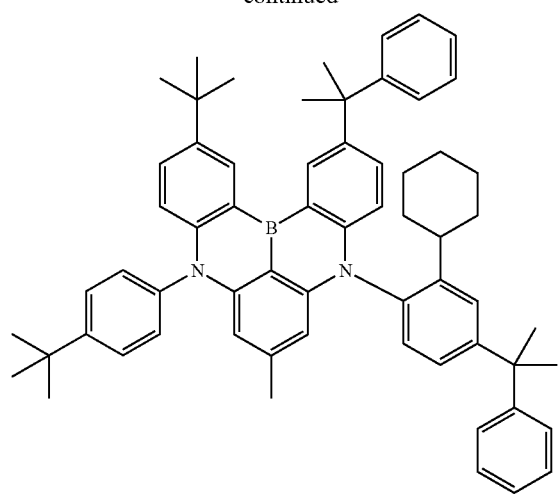
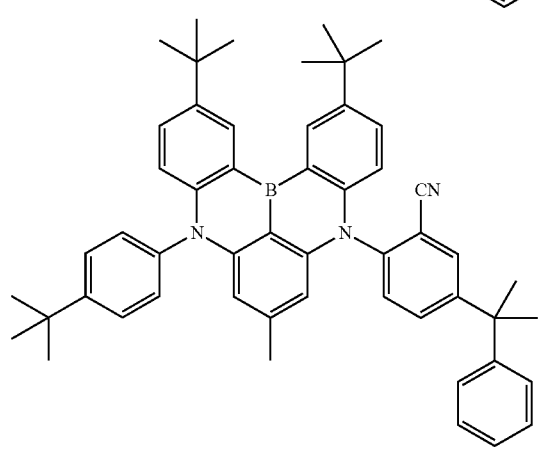
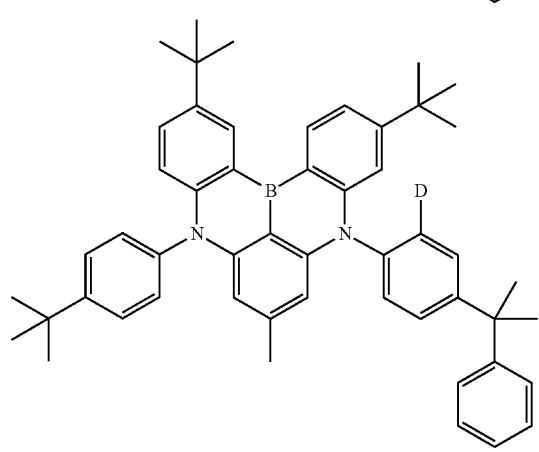
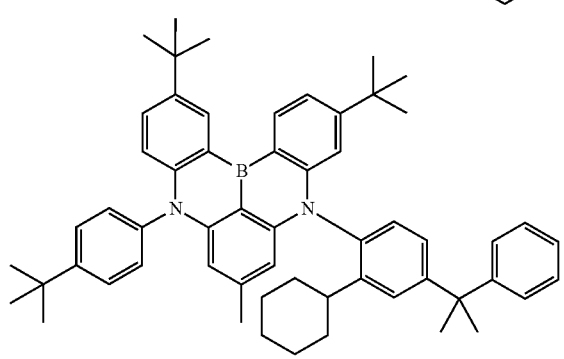
196
-continued
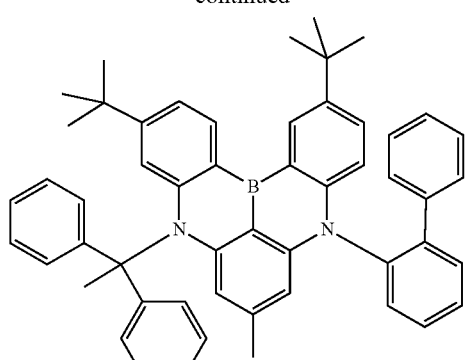
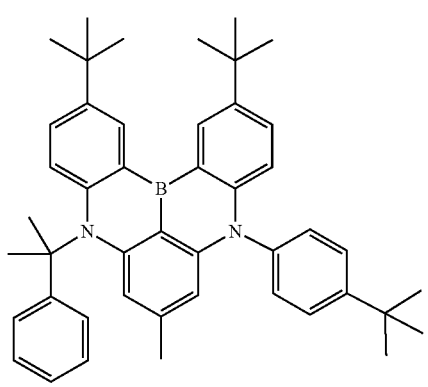
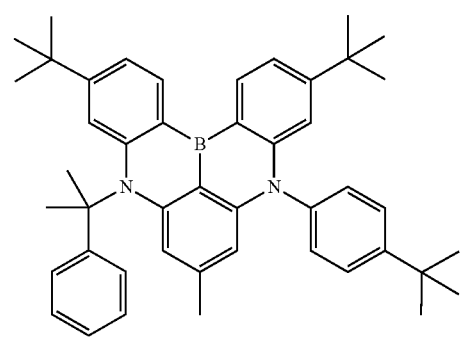
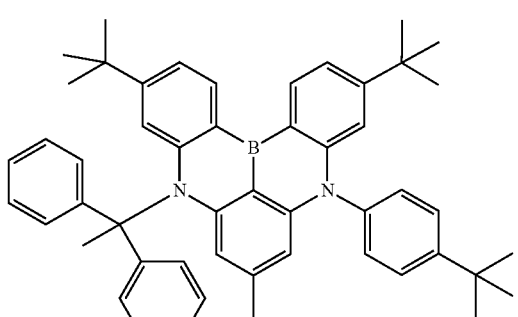

197
-continued
198
-continued
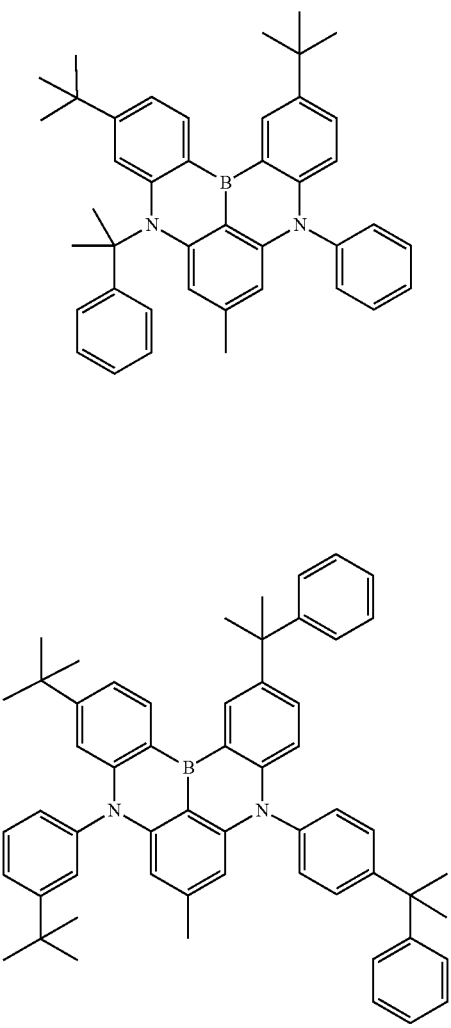
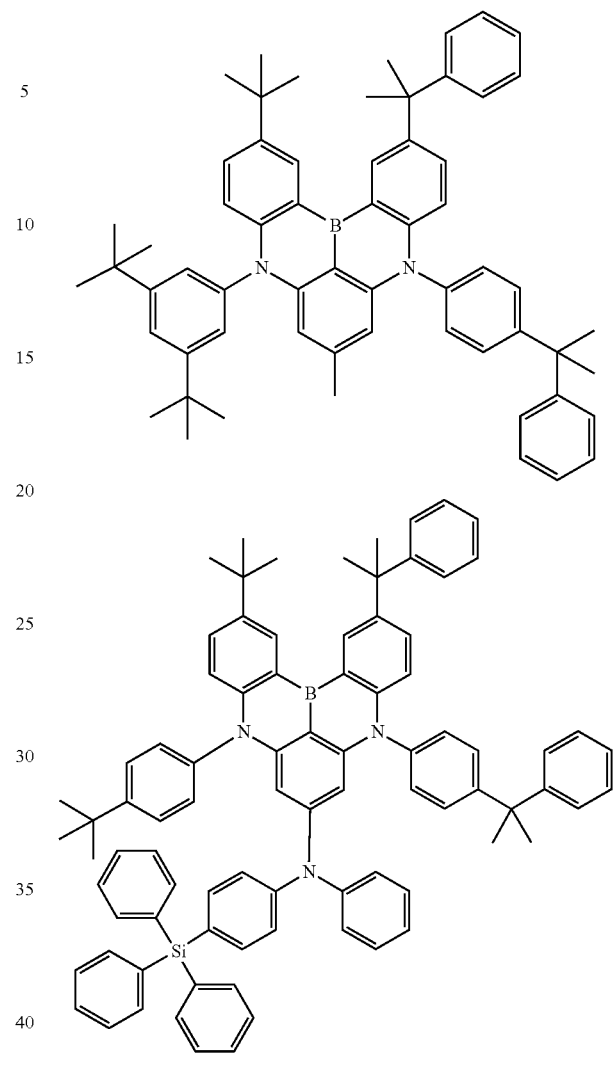
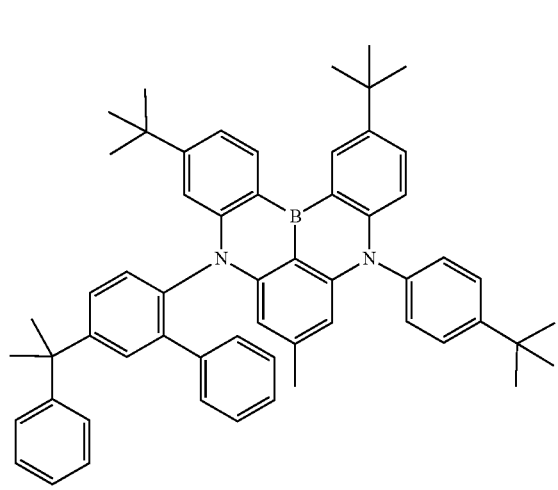

199
-continued
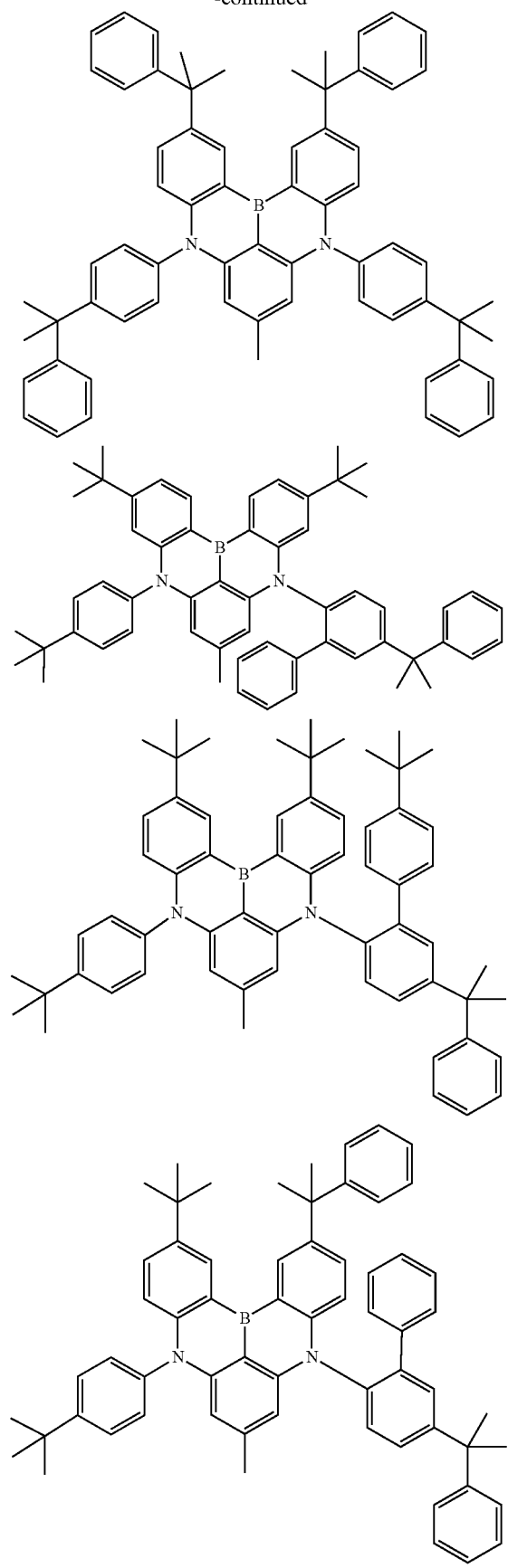
200
-continued
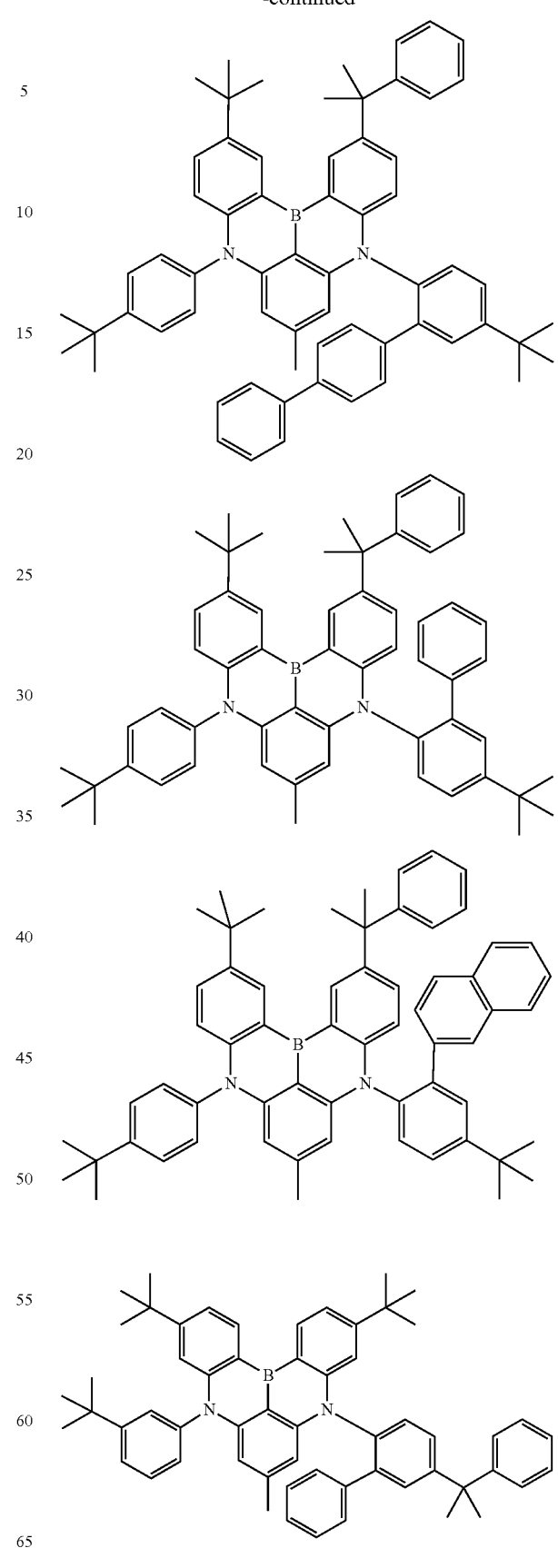

201
-continued
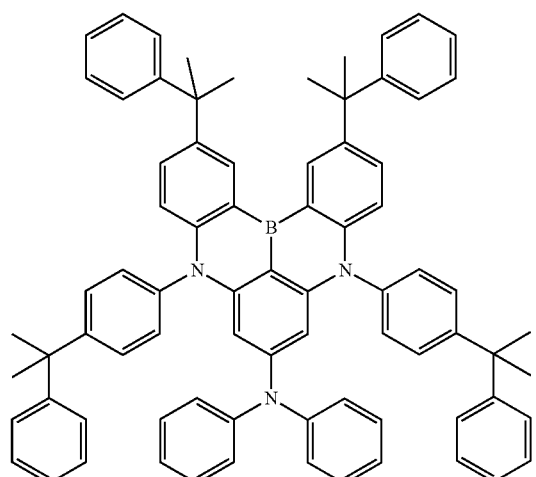
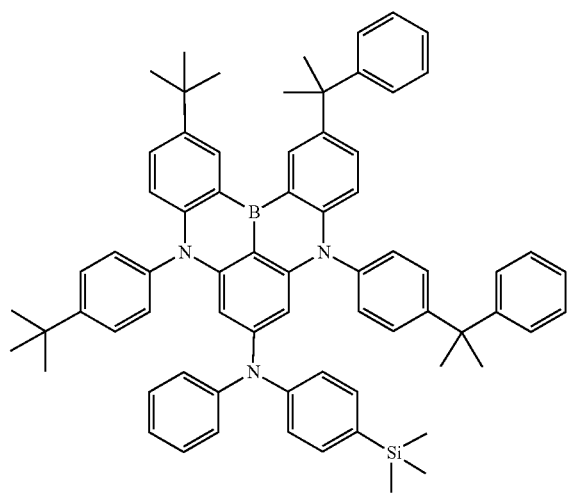
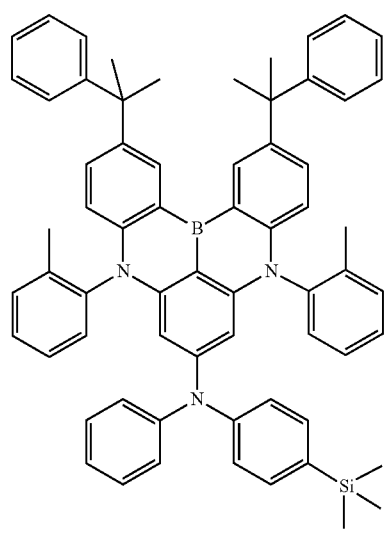
202
-continued
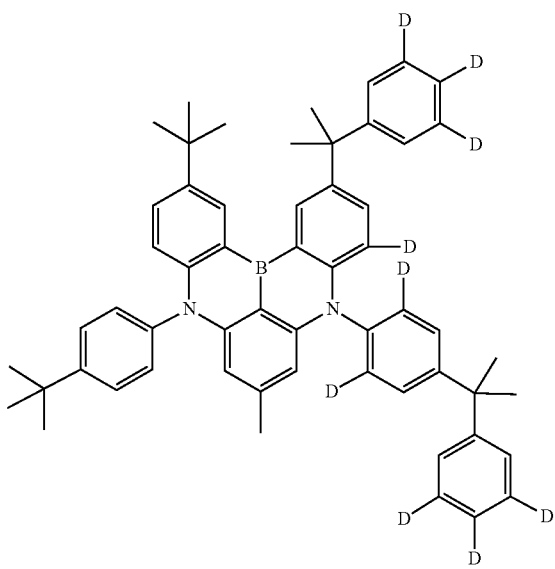
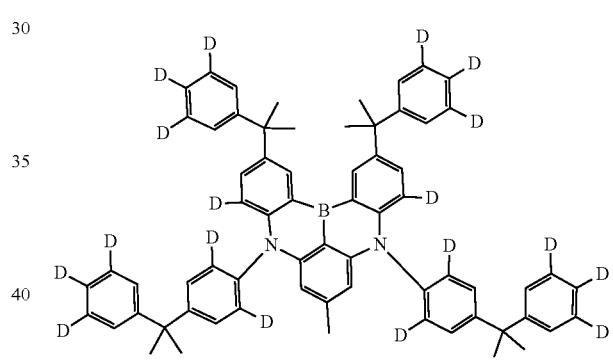
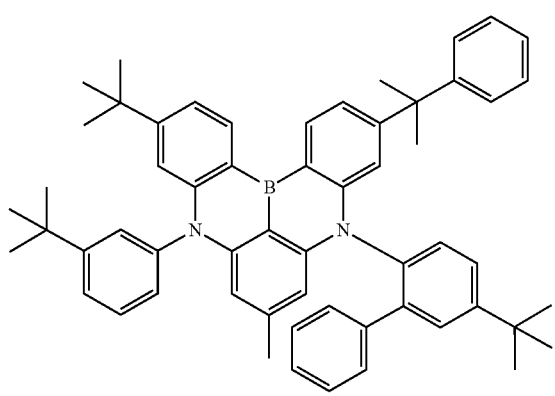

203
-continued
204
-continued
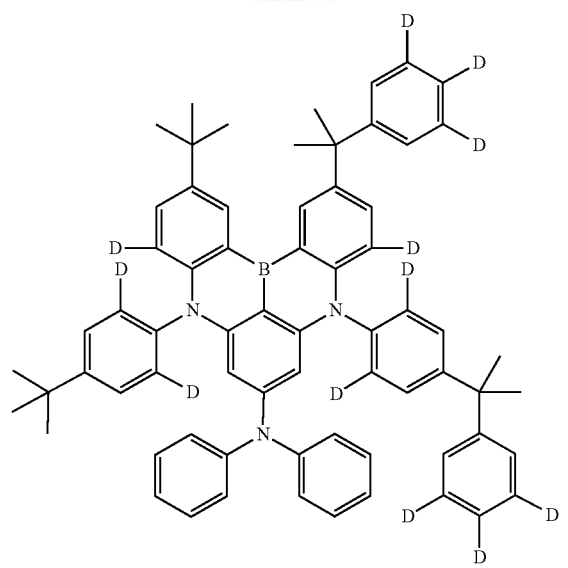
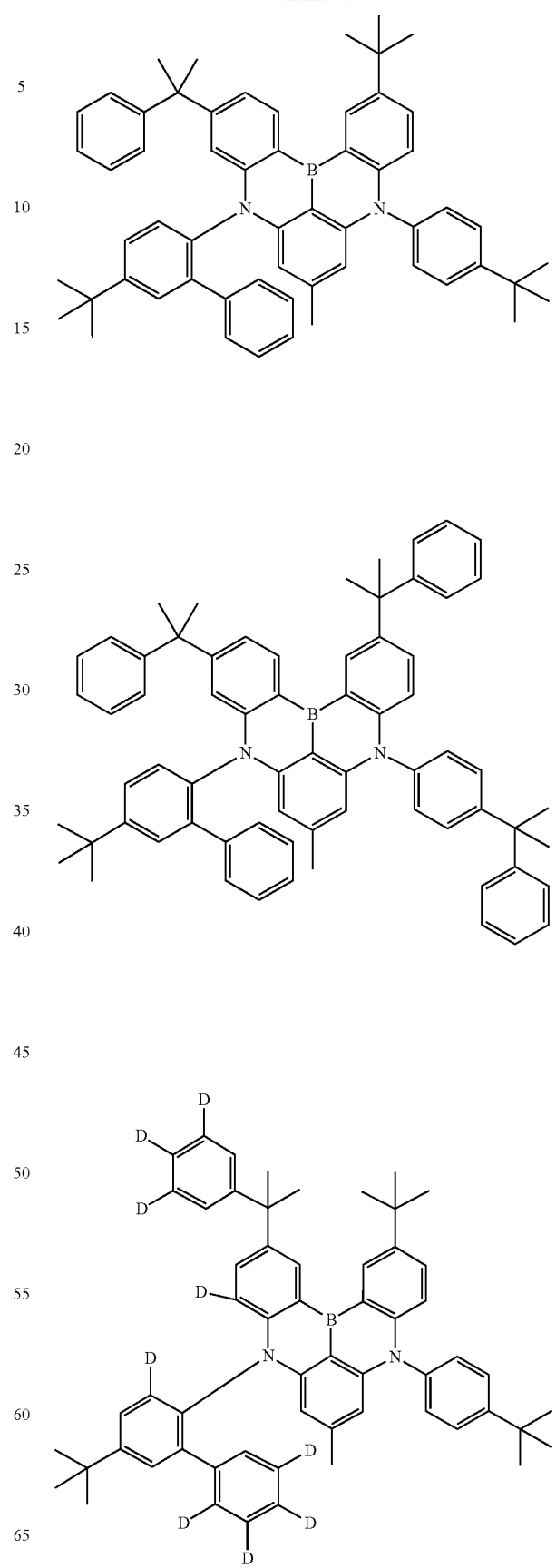

205
-continued
206
-continued
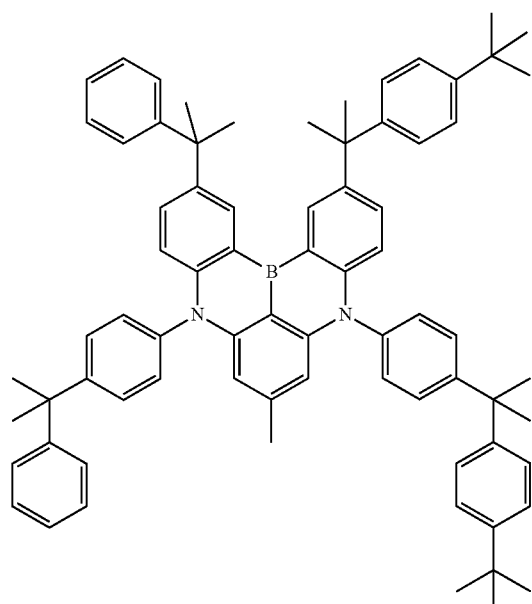
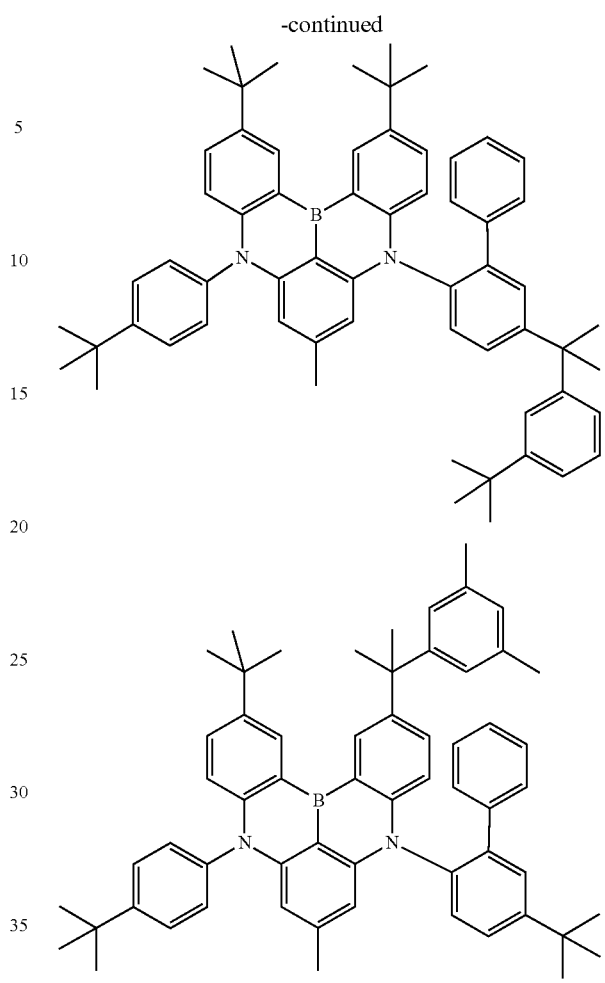
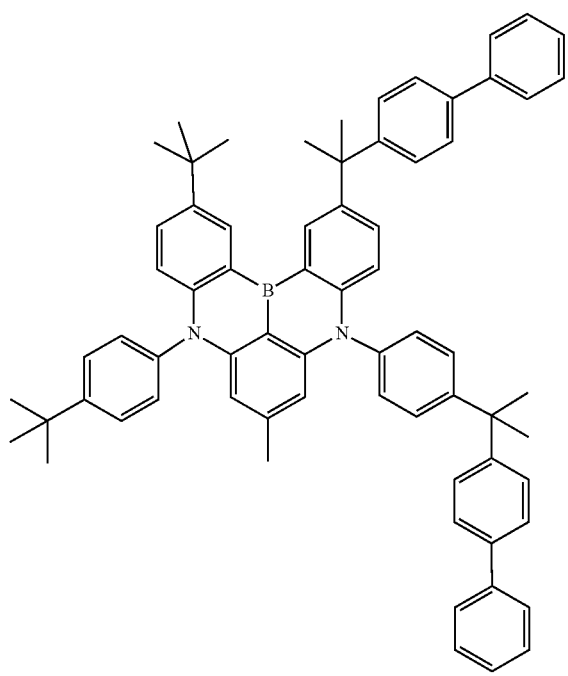

207
-continued
208
-continued
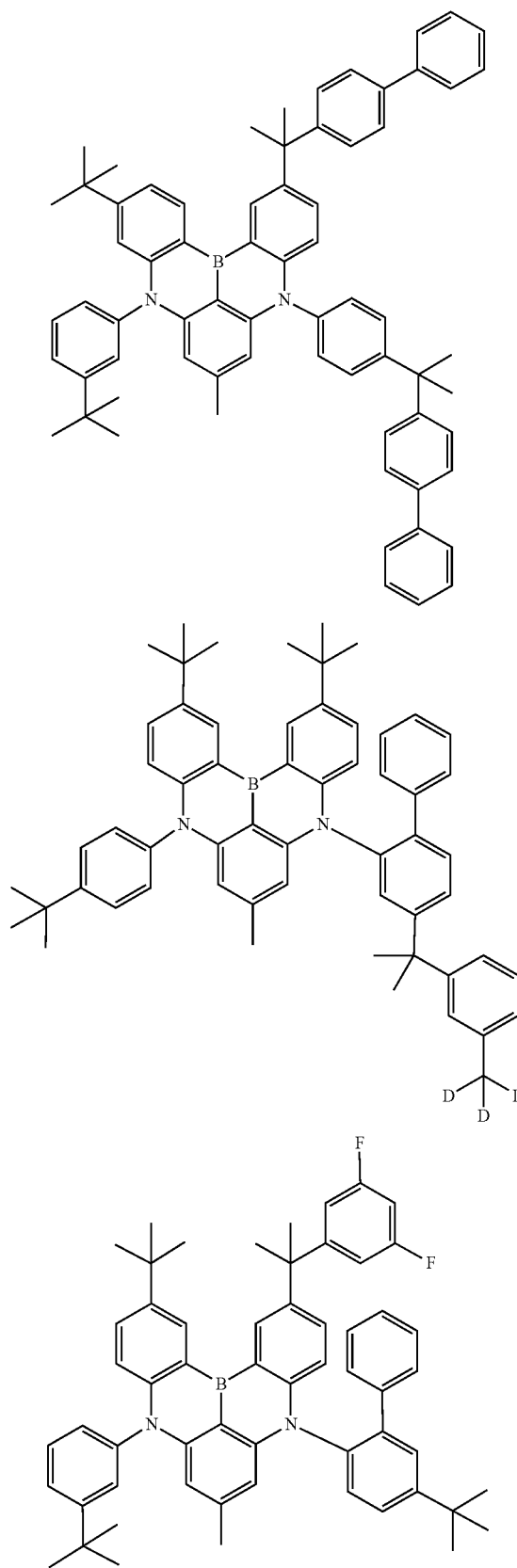
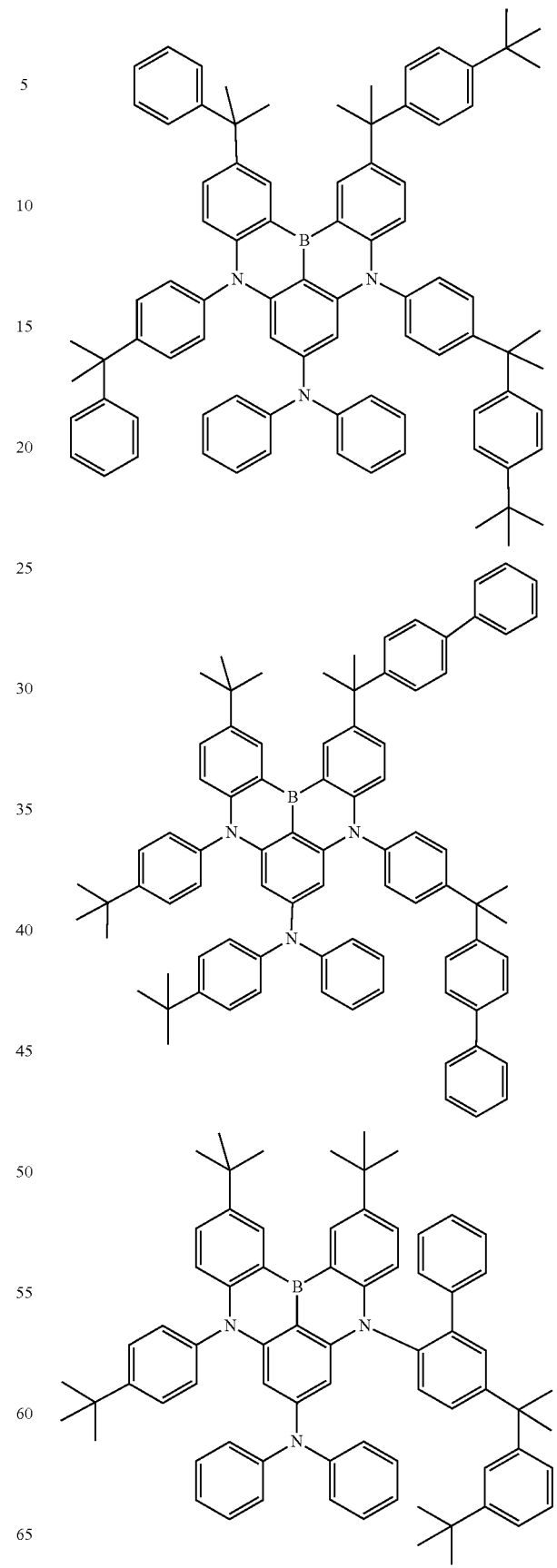

209
-continued
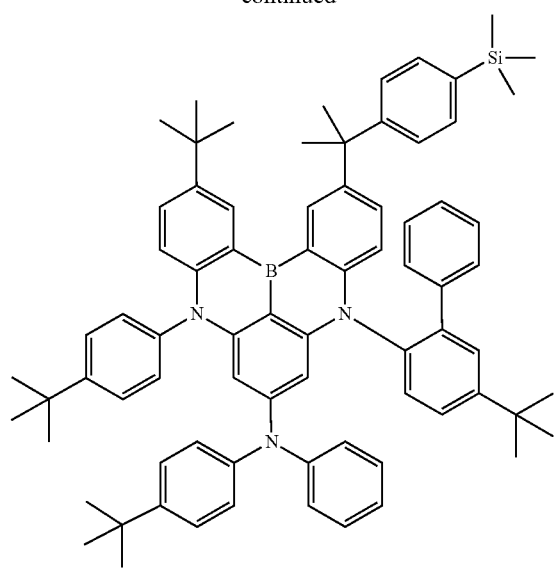
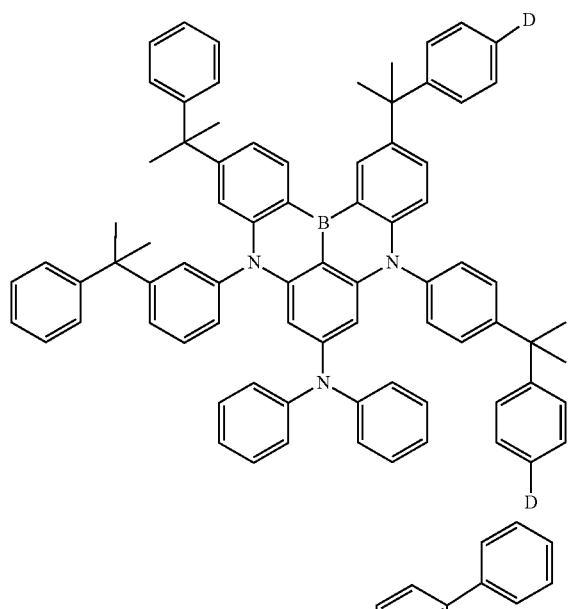
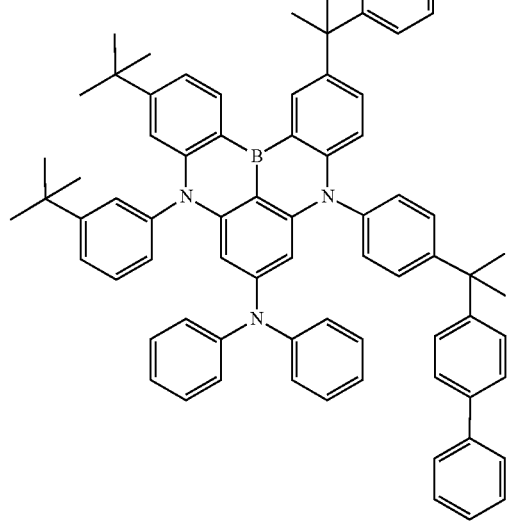
210
-continued
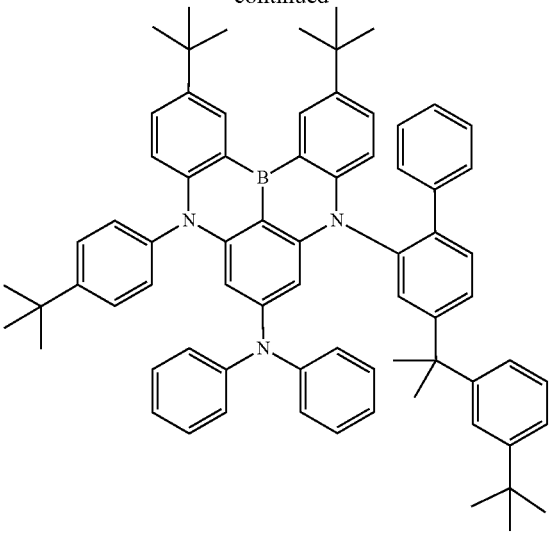
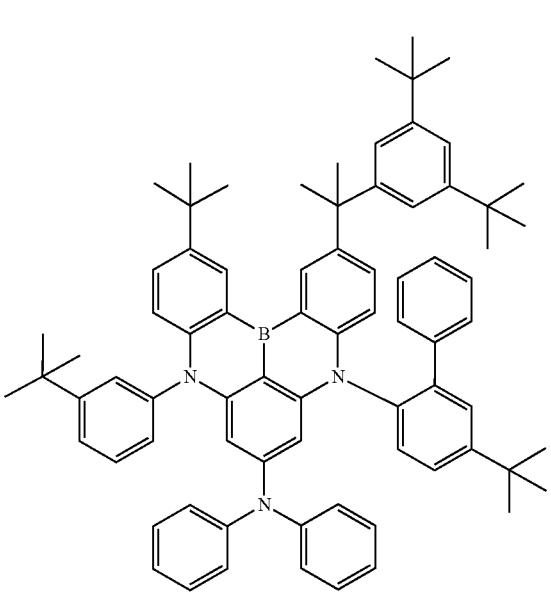
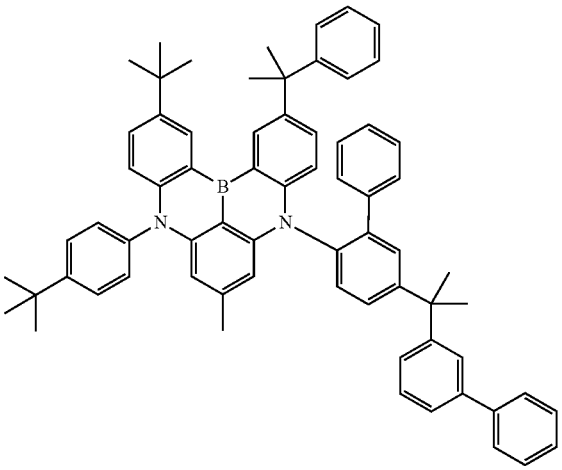

211
-continued

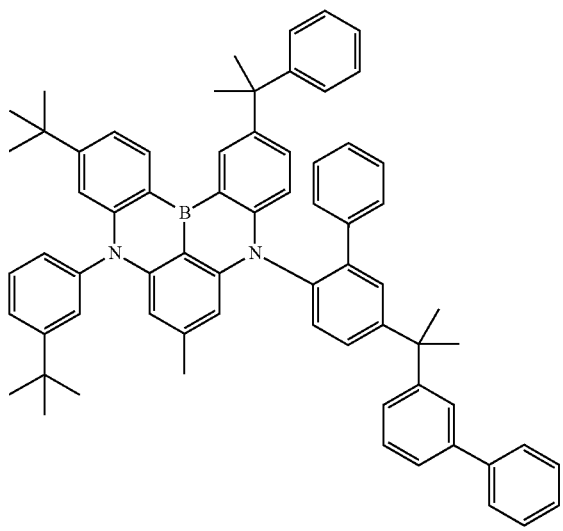

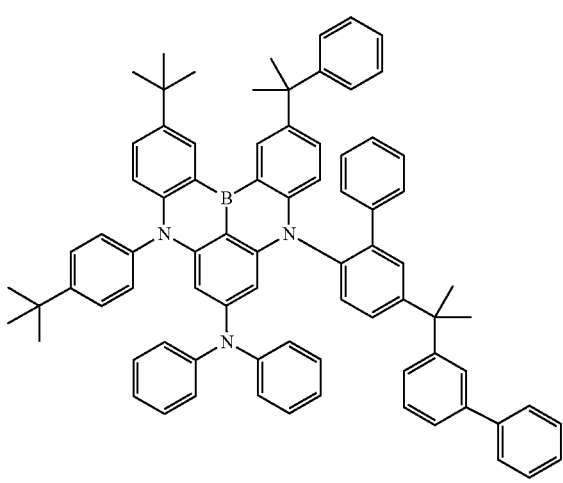

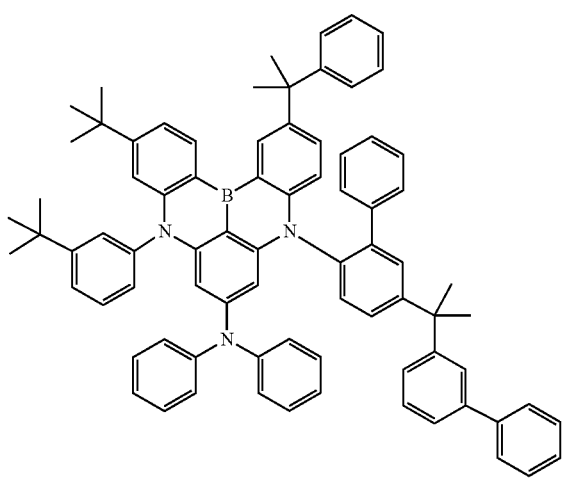

212
-continued

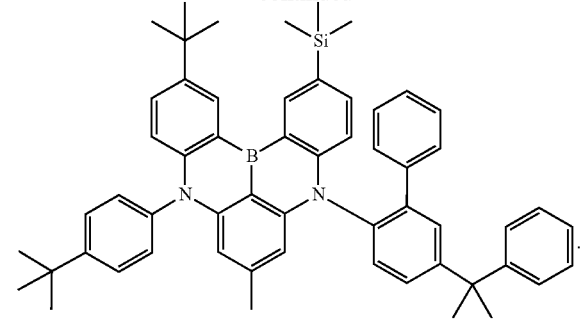

9. An organic light emitting device comprising:
a first electrode;
a second electrode provided to face the first electrode; and
an organic material layer having one or more layers provided between the first electrode and the second electrode,
wherein the one or more layers of the organic material layer comprise the compound of claim 1.

10. The organic light emitting device of claim 9, wherein the organic material layer comprises a light emitting layer, and the light emitting layer comprises the compound.

11. The organic light emitting device of claim 9, wherein the organic material layer comprises a light emitting layer, the light emitting layer comprises a dopant material, and the dopant material is the compound.

12. The organic light emitting device of claim 9, wherein the organic material layer comprises a light emitting layer, and the light emitting layer comprises the compound and a compound represented by the following Formula H:

[Formula H]

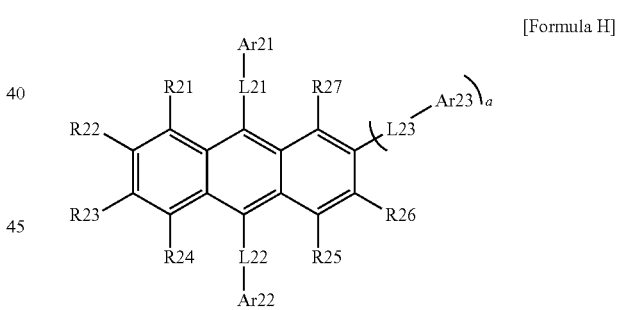

wherein, in Formula H,
L21 to L23 are the same as or different from each other, and are each independently a direct bond; a substituted or unsubstituted arylene group; or a substituted or unsubstituted heteroarylene group,
R21 to R27 are the same as or different from each other, and are each independently hydrogen; deuterium; a substituted or unsubstituted alkyl group; a substituted or unsubstituted cycloalkyl group; a substituted or unsubstituted silyl group; a substituted or unsubstituted aryl group; or a substituted or unsubstituted heteroaryl group,
Ar21 to Ar23 are the same as or different from each other, and are each independently a substituted or unsubstituted aryl group; or a substituted or unsubstituted heteroaryl group, and
a is 0 or 1.

13. An organic light emitting device comprising:
a first electrode;
a second electrode provided to face the first electrode; and
an organic material layer having one or more layers provided between the first electrode and the second electrode,
wherein the organic material layer comprises a hole injection layer or a hole transport layer, and the hole injection layer or the hole transport layer comprises a compound of Formula 1:

[Formula 1]

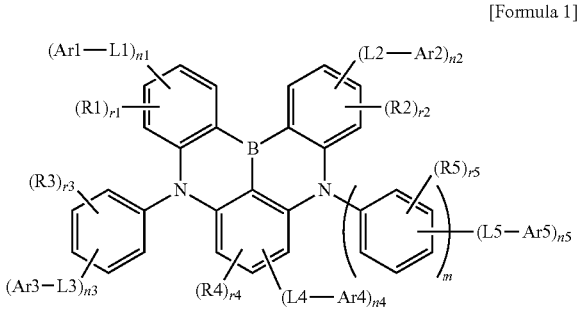

wherein, in Formula 1:
L1 to L5 are the same as or different from each other, and are each independently a substituted or unsubstituted alkylene group;
Ar1 to Ar5 are the same as or different from each other, and are each independently a substituted or unsubstituted aryl group or a substituted or unsubstituted heteroaryl group;
R1 to R5 are the same as or different from each other, and are each independently hydrogen, deuterium, a halogen group, a nitrile group, a substituted or unsubstituted alkyl group, a substituted or unsubstituted cycloalkyl group, a substituted or unsubstituted silyl group, a substituted or unsubstituted arylamine group, a substituted or unsubstituted arylheteroarylamine group, a substituted or unsubstituted aryl group, or a substituted or unsubstituted heteroaryl group;
r1, r2, n1, and n2 are the same as or different from each other, and are each independently an integer from 0 to 4;
r4 is an integer from 0 to 3;
n4 is 0;
r3, r5, n3, and n5 are the same as or different from each other, and are each independently an integer from 0 to 5;
m is 0 or 1, and L5 is directly linked to N, provided that m is 0;
a value of n1+2+n3+n4+n5 is an integer from 1 to 21;
a value of r1+n1 is an integer from 0 to 4, a value of r2+n2 is an integer from 0 to 4, a value of r3+n3 is an integer from 0 to 5, a value of r4+n4 is an integer from 0 to 3, and a value of r5+n5 is an integer from 0 to 5; and
substituents in the parenthesis are the same as or different from each other, provided that r1 to r5, n1 to n3, and n5 is 2 or higher.

14. An organic light emitting device comprising:
a first electrode;
a second electrode provided to face the first electrode; and
an organic material layer having one or more layers provided between the first electrode and the second electrode,
wherein the organic material layer comprises an electron injection layer or an electron transport layer, and the electron injection layer or the electron transport layer comprises a compound of Formula 1:

[Formula 1]

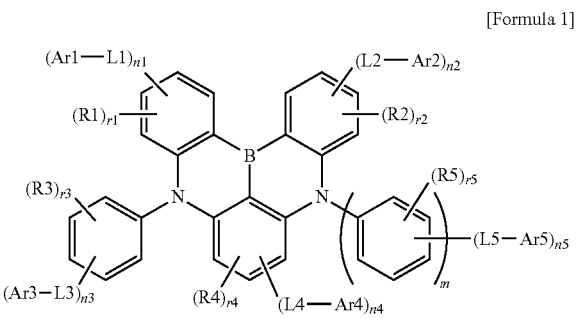

wherein, in Formula 1:
L1 to L5 are the same as or different from each other, and are each independently a substituted or unsubstituted alkylene group;
Ar1 to Ar5 are the same as or different from each other, and are each independently a substituted or unsubstituted aryl group or a substituted or unsubstituted heteroaryl group;
R1 to R5 are the same as or different from each other, and are each independently hydrogen, deuterium, a halogen group, a nitrile group, a substituted or unsubstituted alkyl group, a substituted or unsubstituted cycloalkyl group, a substituted or unsubstituted silyl group, a substituted or unsubstituted arylamine group, a substituted or unsubstituted arylheteroarylamine group, a substituted or unsubstituted aryl group, or a substituted or unsubstituted heteroaryl group;
r1, r2, n1, and n2 are the same as or different from each other, and are each independently an integer from 0 to 4;
r4 is an integer from 0 to 3;
n4 is 0;
r3, r5, n3, and n5 are the same as or different from each other, and are each independently an integer from 0 to 5;
m is 0 or 1, and L5 is directly linked to N, provided that m is 0;
a value of n1+n2+n3+n4+n5 is an integer from 1 to 21;
a value of r1+n1 is an integer from 0 to 4, a value of r2+n2 is an integer from 0 to 4, a value of r3+n3 is an integer from 0 to 5, a value of r4+n4 is an integer from 0 to 3, and a value of r5+n5 is an integer from 0 to 5; and
substituents in the parenthesis are the same as or different from each other, provided that r1 to r5, n1 to n3, and n5 is 2 or higher.

15. The organic light emitting device of claim 9, wherein the organic material layer further comprises one or two or more layers selected from the group consisting of a light emitting layer, a hole injection layer, a hole transport layer, an electron injection layer, an electron transport layer, an electron blocking layer, and a hole blocking layer.

* * * * *